(12) United States Patent
Hidaka

(10) Patent No.: US 7,719,885 B2
(45) Date of Patent: May 18, 2010

(54) THIN FILM MAGNETIC MEMORY DEVICE HAVING A HIGHLY INTEGRATED MEMORY ARRAY

(75) Inventor: Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/370,989

(22) Filed: Feb. 13, 2009

(65) Prior Publication Data

US 2009/0154225 A1 Jun. 18, 2009

Related U.S. Application Data

(60) Continuation of application No. 11/580,942, filed on Oct. 16, 2006, now Pat. No. 7,505,305, which is a continuation of application No. 11/264,090, filed on Nov. 2, 2005, now Pat. No. 7,133,310, which is a division of application No. 10/615,379, filed on Jul. 9, 2003, now Pat. No. 6,975,534, which is a division of application No. 09/832,025, filed on Apr. 11, 2001, now Pat. No. 6,608,776.

(30) Foreign Application Priority Data

Nov. 14, 2000 (JP) .............................. 2000-346896

(51) Int. Cl.
*G11C 11/00* (2006.01)

(52) U.S. Cl. .......................... 365/158; 365/63; 365/171; 365/173

(58) Field of Classification Search .................. 365/63, 365/158, 171, 173
See application file for complete search history.

(56) References Cited

U.S. PATENT DOCUMENTS

| 3,849,768 | A | | 11/1974 | Durvasula |
| 5,276,650 | A | | 1/1994 | Kubota |
| 5,323,344 | A | | 6/1994 | Katayama et al. |
| 5,448,515 | A | | 9/1995 | Fukami et al. |
| 5,619,447 | A | | 4/1997 | Tai |
| 5,640,343 | A | | 6/1997 | Gallagher et al. |
| 5,650,958 | A | | 7/1997 | Gallagher et al. |
| 5,734,605 | A | | 3/1998 | Zhu et al. |
| 5,835,314 | A | | 11/1998 | Moodera et al. |
| 5,852,574 | A | * | 12/1998 | Naji ........................... 365/158 |

(Continued)

OTHER PUBLICATIONS

Scheuerlein, et al. "A 10ns Read and Write Non-Volatile Memory Array Using a Magnetic Tunnel Junction and FET Switch in Each Cell", ISSCC Digest of Technical Papers, TA7.2, Feb. 2000, pp. 128-129, 94-95 and 409.

(Continued)

*Primary Examiner*—Richard Elms
*Assistant Examiner*—Alexander Sofocleous
(74) *Attorney, Agent, or Firm*—McDermott Will & Emery LLP

(57) ABSTRACT

Read word lines and write word lines are provided corresponding to the respective MTJ (Magnetic Tunnel Junction) memory cell rows, and bit lines and reference voltage lines are provided corresponding to the respective MTJ memory cell columns. Adjacent MTJ memory cells share at least one of these signal lines. As a result, the pitches of signal lines provided in the entire memory array can be widened. Thus, the MTJ memory cells can be efficiently arranged, achieving improved integration of the memory array.

1 Claim, 81 Drawing Sheets

U.S. PATENT DOCUMENTS

| | | | |
|---|---|---|---|
| 5,936,882 A * | 8/1999 | Dunn | .......................... 365/158 |
| 5,946,227 A | 8/1999 | Naji | |
| 6,055,178 A | 4/2000 | Naji | |
| 6,081,452 A | 6/2000 | Ohta | |
| 6,111,781 A | 8/2000 | Naji | |
| 6,226,197 B1 | 5/2001 | Nishimura | |
| 6,278,631 B1 | 8/2001 | Naji | |
| 6,301,158 B1 | 10/2001 | Iwahashi | |
| 6,349,054 B1 | 2/2002 | Hidaka | |
| 6,351,410 B1 | 2/2002 | Nakao et al. | |
| 6,359,805 B1 | 3/2002 | Hidaka | |
| 7,529,114 B2 * | 5/2009 | Asao | .......................... 365/63 |

OTHER PUBLICATIONS

Durlam et al., "Nonvolatile RAM Based on Magnetic Tunnel Junction Elements", ISSCC Digest of Technical Papers, TA7.3, Feb. 2000, pp. 130-131, 96-97, 410-411.

Scheuerlein, Roy E. et al., "Shared Word Line DRAM Cell", IEEE Journal of Solid-State Circuits, vol. 19, No. 5, Oct. 1984, pp. 640-645.

Tehrani, S. et. al., "Recent Developments in Magnetic Tunnel Junction MRAM", IEEE Transactions on Magnetics, vol. 36, No. 5, Sep. 2000, pp. 2752-2757.

* cited by examiner

FIG.15

THIN FILM MAGNETIC MEMORY DEVICE HAVING A HIGHLY INTEGRATED MEMORY ARRAY

RELATED APPLICATIONS

This application is a continuation of application Ser. No. 11/580,942, filed on Oct. 16, 2006, now U.S. Pat. No. 7,505,305 which is a continuation of application Ser. No. 11/264,090 filed on Nov. 2, 2005, now U.S. Pat. No. 7,133,310, which is a divisional of application Ser. No. 10/615,379 filed on Jul. 9, 2003, now U.S. Pat. No. 6,975,534, which is a divisional of Ser. No. 09/832,025 filed on Apr. 11, 2001, now U.S. Pat. No. 6,608,776, which in turn claims the benefit of Japanese Patent Application No. 2000-346896, filed on Nov. 14, 2000, the disclosures of which applications are incorporated by reference herein.

BACKGROUND OF THE INVENTION

1. Field of the Invention

The present invention relates to a thin film magnetic memory device. More particularly, the present invention relates to a random access memory (RAM) including memory cells having a magnetic tunnel junction (MTJ).

2. Description of the Background Art

An MRAM (Magnetic Random Access Memory) device has attracted attention as a memory device capable of non-volatile data storage with low-power consumption. The MRAM device is a memory device that stores data in a non-volatile manner a plurality of thin film magnetic elements formed in a semiconductor integrated circuit and is capable of random access to each thin film magnetic element.

In particular, recent announcement shows that significant progress in performance of the MRAM device is achieved by using thin film magnetic elements having a magnetic tunnel junction (MTJ) as memory cells. The MRAM device including memory cells having a magnetic tunnel junction is disclosed in technical documents such as "A ions Read and Write Non-Volatile Memory Array Using a Magnetic Tunnel Junction and FET Switch in each Cell", ISSCC Digest of Technical Papers, TA7.2, February 2000, and "Nonvolatile RAM based on Magnetic Tunnel Junction Elements", ISSCC Digest of Technical Papers, TA7.3, February 2000.

FIG. 88 is a schematic diagram showing the structure of a memory cell having a magnetic tunnel junction (hereinafter, also simply referred to as "MTJ memory cell").

Referring to FIG. 88, the MTJ memory cell includes a magnetic tunnel junction MTJ having its resistance value varied according to the level of storage data, and an access transistor ATR. The access transistor ATR is formed by a field effect transistor, and is coupled between the magnetic tunnel junction MTJ and ground voltage Vss.

For the MTJ memory cell are provided a write word line WWL for instructing a data write operation, a read word line RWL for instructing a data read operation, and a bit line BL serving as a data line for transmitting an electric signal corresponding to the level of storage data in the data read and write operations.

FIG. 89 is a conceptual diagram illustrating the data read operation from the MTJ memory cell.

Referring to FIG. 89, the magnetic tunnel junction MTJ has a magnetic layer FL having a fixed magnetic field of a fixed direction (hereinafter, also simply referred to as "fixed magnetic layer FL"), and a magnetic layer VL having a free magnetic field (hereinafter, also simply referred to as "free magnetic layer VL"). A tunnel barrier TB formed from an insulator film is provided between the fixed magnetic layer FL and free magnetic layer VL. According to the level of storage data, either a magnetic-field of the same direction as that of the fixed magnetic layer FL or a magnetic field of the direction different from that of the fixed magnetic layer FL is written to the free magnetic layer VL in a non-volatile manner.

In reading the data, the access transistor ATR is turned ON in response to activation of the read word line RWL. As a result, a sense current Is flows through a current path formed by the bit line BL, magnetic tunnel junction MTJ, access transistor ATR and ground voltage Vss. The sense current Is is supplied as a constant current from a not-shown control circuit.

The resistance value of the magnetic tunnel junction MTJ varies according to the relative relation of the magnetic field direction between the fixed magnetic layer FL and free magnetic layer VL. More specifically, in the case where the fixed magnetic layer FL and free magnetic layer VL have the same magnetic field direction, the magnetic tunnel junction MTJ has a smaller resistance value as compared to the case where both magnetic layers have different magnetic field directions.

Accordingly, in reading the data, a voltage level change at the magnetic tunnel junction MTJ due to the sense current Is varies according to the magnetic field direction stored in the free magnetic layer VL. Thus, by starting supply of the sense current Is after precharging the bit line BL to a prescribed voltage, the level of storage data in the MTJ memory cell can be read by monitoring a voltage level change on the bit line BL.

FIG. 90 is a conceptual diagram illustrating the data write operation to the MTJ memory cell.

Referring to FIG. 90, in writing the data, the read word line RWL is inactivated, and the access transistor ATR is turned OFF. In this state, a data write current for writing a magnetic field to the free magnetic layer VL is applied to the write word line WWL and bit line BL. The magnetic field direction of the free magnetic layer VL is determined by combination of the respective directions of the data write current flowing through the write word line WWL and bit line BL.

FIG. 91 is a conceptual diagram illustrating the relation between the respective directions of the data write current and magnetic field in the data write operation.

Referring to FIG. 91, a magnetic field Hx of the abscissa indicates the direction of a magnetic field H(WWL) produced by the data write current flowing through the write word line WWL. A magnetic field Hy of the ordinate indicates the direction of a magnetic field H(BL) produced by the data write current flowing through the bit line BL.

The magnetic field direction stored in the free magnetic layer VL is updated only when the sum of the magnetic fields H(WWL) and H(BL) reaches the region outside the asteroid characteristic line shown in the figure. In other words, the magnetic field direction stored in the free magnetic layer VL is not updated when a magnetic field corresponding to the region inside the asteroid characteristic line is applied.

Accordingly, in order to update the storage data of the magnetic tunnel junction MTJ by the data write operation, a current must be applied to both the write word line WWL and bit line BL. Once the magnetic field direction, i.e., the storage data, is stored in the magnetic tunnel junction MTJ, it is held therein in a non-volatile manner until a new data read operation is conducted.

The sense current Is flows through the bit line BL even in the data read operation. However, the sense current Is is generally set to a value that is smaller than the above-mentioned data write current by about one or two orders of magnitude. Therefore, it is less likely that the storage data in the MTJ memory cell is erroneously rewritten due to the sense current Is during the data read operation.

The above-mentioned technical documents disclose a technology of forming an MRAM device, a random access memory, with such MTJ memory cells integrated on a semiconductor substrate.

FIG. 92 is a conceptual diagram showing the MTJ memory cells arranged in rows and columns in an integrated manner.

Referring to FIG. 92, with the MTJ memory cells arranged in rows and columns on the semiconductor substrate, a highly integrated MRAM device can be realized. FIG. 92 shows the case where the MTJ memory cells are arranged in n rows by m columns (where n, m is a natural number).

As described before, the bit line BL, write word line WWL and read word line RWL must be provided for each MTJ memory cell. Accordingly, n write word lines WWL1 to WWLn, n read word lines RWL1 to RWLn, and m bit lines BL1 to BLm are required for the n×m MTJ memory cells. In other words, independent word lines must be provided for the read and write operations.

FIG. 93 is a diagram showing the structure of the MTJ memory cell formed on the semiconductor substrate.

Referring to FIG. 93, the access transistor ATR is formed in a p-type region PAR of a semiconductor main substrate SUB. The access transistor ATR has source/drain regions (n-type regions) 110, 120 and a gate 130. The source/drain region 110 is coupled to the ground voltage Vss through a metal wiring formed in a first metal wiring layer M1. A metal wiring formed in a second metal wiring layer M2 is used as the write word line WWL. The bit line BL is formed in a third metal wiring layer M3.

The magnetic tunnel junction MTJ is formed between the second metal wiring layer M2 of the write word line WWL and the third metal wiring layer M3 of the bit line BL. The source/drain region 120 of the access transistor ATR is electrically coupled to the magnetic tunnel junction MTJ through a metal film 150 formed in a contact hole, the first and second metal wiring layers M1 and M2, and a barrier metal 140. The barrier metal 140 is a buffer material for providing electrical coupling between the magnetic tunnel junction MTJ and metal wirings.

As described before, in the MTJ memory cell, the read word line RWL is provided independently of the write word line WWL. In addition, in writing the data, a data write current for generating a magnetic field equal to or higher than a predetermined value must be applied to the write word line WWL and bit line BL. Accordingly, the bit line BL and write word line WWL are each formed from a metal wiring.

On the other hand, the read word line RWL is provided in order to control the gate voltage of the access transistor ATR. Therefore, a current need not be actively applied to the read word line RWL. Accordingly, for the purpose of improving the integration degree, the read word line RWL is conventionally formed from a polysilicon layer, polycide structure, or the like in the same wiring layer as that of the gate 130 without forming an additional independent metal wiring layer.

Since a large number of wirings are required for the data read and write operations, integrating the MTJ memory cells on the semiconductor substrate results in increase in cell size due to the space required for such wirings.

Moreover, in order to integrate the MTJ memory cells, a reduced wiring pitch as well as an increased number of wiring layers are required, causing increase in manufacturing cost due to the complicated manufacturing process.

Furthermore, such increased numbers of wirings and wiring layers necessitate the use of so-called cross-point arrangement, i.e., the arrangement in which the MTJ memory cells are provided on the respective intersections of the word lines and bit lines, thereby making it difficult to ensure a sufficient margin of the read and write operations.

In writing the data, a relatively large data write current must be applied to the bit line BL. Moreover, the direction of the data write current must be controlled according to the level of write data, resulting in complicated circuitry for controlling the data write current.

SUMMARY OF THE INVENTION

It is an object of the present invention to achieve improved integration of an MRAM device having MTJ memory cells, by reducing the number of wirings provided in the entire memory array.

In summary, according to one aspect of the present invention, a thin film magnetic memory device includes a memory array, a plurality of read word lines, a plurality of data lines, a plurality of write word lines, and a plurality of reference voltage lines. The memory array has a plurality of magnetic memory cells arranged in rows and columns. Each of the plurality of magnetic memory cells includes a magnetic storage portion having a resistance value that varies according to a level of storage data to be written by first and second data write currents, and a memory cell selection gate for passing a data read current therethrough into the magnetic storage portion in a data read operation. The plurality of read word lines are provided corresponding to the respective rows of the magnetic memory cells, for actuating the corresponding memory cell selection gate according to a row selection result in the data read operation. The plurality of data lines are provided corresponding to the respective columns of the magnetic memory cells, for causing the first data write current and the data read current to flow therethrough in a data write operation and the data read operation, respectively. The plurality of write word lines are provided corresponding to the respective rows, and are selectively activated according to a row selection result in the data write operation so as to cause the second data write current to flow therethrough. The plurality of reference voltage lines are provided corresponding to either the respective rows or the respective columns, for supplying a reference voltage to be used in the data read operation. Adjacent magnetic memory cells share a corresponding one of at least one of the plurality of write word lines, the plurality of read word lines, the plurality of data lines and the plurality of reference voltage lines.

Accordingly, a primary advantage of the present invention is that the number of wirings provided in the memory array can be reduced in the thin film magnetic memory device including the magnetic memory cells for conducting the data read and write operations using the write word lines, read word lines, data lines and reference voltage lines. As a result, improved integration of the memory array as well as reduced chip area can be achieved.

According to another aspect of the present invention, a thin film magnetic memory device includes a memory array, a plurality of read word lines, a plurality of data lines, a plurality of write word lines, and a word line current control circuit. The memory array has a plurality of magnetic memory cells arranged in rows and columns. Each of the plurality of magnetic memory cells includes a magnetic storage portion having a resistance value that varies according to a level of storage data to be written by first and second data write currents, and a memory cell selection gate for passing a data read current therethrough into the magnetic storage portion in a data read operation. The plurality of read word lines are provided corresponding to the respective rows of the magnetic memory cells, for actuating the corresponding memory cell selection gate according to a row selection result in the data read operation. The plurality of data lines are provided corresponding to the respective columns of the magnetic memory cells, for causing the first data write current and the data read current to flow therethrough in a data write operation and the data read operation, respectively. The plurality of write word lines are provided corresponding to the respective rows, and are selectively activated according to a row selection result in the data write operation so as to cause the second data write current to flow therethrough. The word line current control circuit couples the plurality of write word lines to a reference voltage that is used in the data read operation. Adjacent magnetic memory cells share a corresponding one of at least one of the plurality of write word lines, the plurality of read word lines and the plurality of data lines.

Accordingly, the number of wirings can be reduced that are provided in the memory array including the magnetic memory cells for conducting the data read and write operations using the write word lines, read word lines and data lines. As a result, improved integration of the memory array as well as reduced chip area can be achieved.

According to still another aspect of the present invention, a thin film magnetic memory device includes a memory array, a plurality of read word lines, a plurality of signal lines, a read/write control circuit, a plurality of write word lines, and a plurality of control switches. The memory array has a plurality of magnetic memory cells arranged in rows and columns. Each of the plurality of magnetic memory cells includes a magnetic storage portion having a resistance value that varies according to a level of storage data to be written by first and second data write currents, and a memory cell selection gate for passing a data read current therethrough into the magnetic storage portion in a data read operation. The plurality of read word lines are provided corresponding to the respective rows of the magnetic memory cells, for actuating the corresponding memory cell selection gate according to a row selection result in the data read operation. The plurality of signal lines are provided corresponding to the respective columns of the magnetic memory cells. Adjacent magnetic memory cells in the row direction share a corresponding one of the plurality of signal lines. The read/write control circuit supplies the first data write current and the data read current to the signal lines in a data write operation and the data read operation, respectively. The plurality of write word lines are provided corresponding to the respective rows, and are selectively activated according to a row selection result in the data write operation so as to cause the second data write current to flow therethrough. The plurality of control switches are provided respectively corresponding to the plurality of signal lines, for electrically coupling a reference voltage that is used in the data read operation to a corresponding one of the plurality of signal lines. The plurality of control switches each couples a selected one of two signal lines corresponding to the respective magnetic memory cells to the reference voltage, according to the row selection result.

In such a thin film magnetic memory device, the magnetic memory cells for conducting the data read and write operations using the write word lines, read word lines, and common lines functioning both as data line and reference voltage line can be arranged in the memory array with a reduced number of common lines. As a result, improved integration of the memory array as well as reduced chip area can be achieved.

According to yet another aspect of the present invention, a thin film magnetic memory device includes a memory array, a plurality of write word lines, a plurality of read word lines, a plurality of write data lines, and a plurality of read data lines. The memory array has a plurality of magnetic memory cells arranged in rows and columns. Each of the plurality of magnetic memory cells includes a magnetic storage portion having a resistance value that varies according to a level of storage data to be written when a data write magnetic field applied by first and second data write currents is larger than a predetermined magnetic field, and a memory cell selection gate for passing a data read current therethrough into the magnetic storage portion in a data read operation. The plurality of write word lines are provided corresponding to the respective rows of the magnetic memory cells, and are selectively activated according to a row selection result in a data write operation so as to cause the first data write current to flow therethrough. The plurality of read word lines are provided corresponding to the respective rows, for actuating the corresponding memory cell selection gate according to a row selection result in the data read operation. The plurality of write data lines are provided corresponding to the respective columns of the magnetic memory cells, for causing the second data write current to flow therethrough in the data write operation. The plurality of read data lines are provided corresponding to the respective columns, for causing the data read current to flow therethrough in the data read operation. Adjacent magnetic memory cells share a corresponding one of at least one of the plurality of write word lines, the plurality of read word lines, the plurality of read data lines and the plurality of write data lines.

In such a thin film magnetic memory device, the number of wirings can be reduced that are provided in the memory array including the magnetic memory cells for conducting the data read and write operations using the write word lines, read word lines, write data lines and read data lines. As a result, improved integration of the memory array as well as reduced chip area can be achieved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 15 is a block diagram showing the structure of a memory array and its peripheral circuitry according to a first modification of the second embodiment.

DESCRIPTION OF THE PREFERRED EMBODIMENTS

Hereinafter, embodiments of the present invention will be described in detail with reference to the accompanying drawings.

First Embodiment

Figure 1:
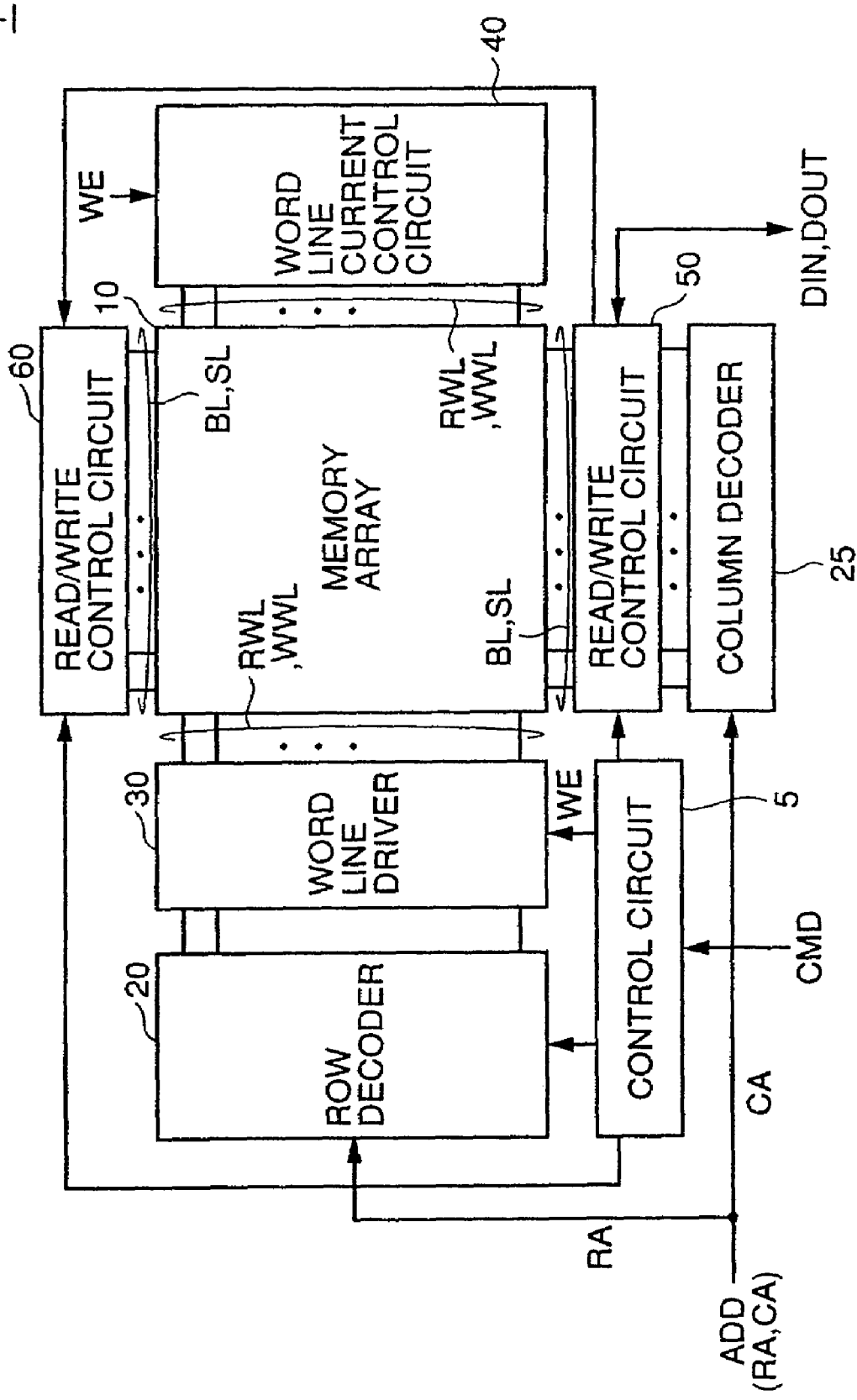
FIG. 1 is a schematic block diagram showing the overall structure of an MRAM device according to a first embodiment of the present invention.

Referring to FIG. 1, an MRAM device 1 according to the first embodiment of the present invention conducts random access in response to an external control signal CMD and address signal ADD, thereby conducting input of write data DIN and output of read data DOUT.

The MRAM device 1 includes a control circuit 5 for controlling the overall operation of the MRAM device 1 in response to the control signal CMD, and a memory array 10 having a plurality of MTJ memory cells (hereinafter, also simply referred to as "memory cells") arranged in rows and columns. In the memory array 10, a plurality of write word lines WWL and a plurality of read word lines RWL are provided corresponding to the respective MTJ memory cell rows (hereinafter, also simply referred to as "memory cell rows"). A plurality of bit lines BL and a plurality of reference voltage lines SL are provided corresponding to the MTJ memory cell columns (hereinafter, also simply referred to as "memory cell columns"). The structure of the memory array 10 will be described later in detail.

The MRAM device 1 further includes a row decoder 20 for conducting row selection of the memory array 10 according to the decode result of a row address RA indicated by the address signal ADD, a column decoder 25 for conducting column selection of the memory array 10 according to the decode result of a column address CA indicated by the address signal ADD, a word line driver 30 for selectively activating the read word line RWL and write word line WWL based on the row selection result of the row decoder 20, a word line current control circuit 40 for applying a data write current to the write word line WWL in the data write operation, and read/write control circuits 50, 60 for applying a data write current and a sense current in the data write and read operations, respectively.

The read/write control circuits 50, 60 control the voltage level on the bit line BL at both ends of the memory array 10 and apply to the bit line BL the data write current and sense current for conducting the data write and read operations, respectively.

Structure and Operation of Memory Cell

Figure 2:
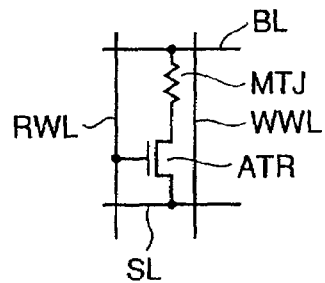
FIG. 2 is a circuit diagram showing the connection between an MTJ memory cell and signal wirings according to the first embodiment.

Referring to FIG. 2, a read word line RWL, write word line WWL, bit line BL and reference voltage line SL are provided for the MTJ memory cell of the first embodiment.

The memory cell includes a magnetic tunnel junction MTJ and an access transistor ATR which are coupled in series with each other. As described before, a MOS transistor, i.e., a field-effect transistor formed on the semiconductor substrate, is typically used as the access transistor ATR.

The access transistor has its gate coupled to the read word line RWL. The access transistor ATR is turned ON (actuated) in response to activation of the read word line RWL to the selected state (H level, power supply voltage Vcc) so as to electrically couple the magnetic tunnel junction MTJ to the reference voltage line SL. The reference voltage line SL supplies a ground voltage Vss. The magnetic tunnel junction MTJ is electrically coupled between the bit line BL and access transistor ATR.

Accordingly, in response to turning-ON of the access transistor ATR, a current path is formed by the bit line BL, magnetic tunnel junction MTJ, access transistor ATR and reference voltage line SL. When a sense current Is is supplied to this current path, a voltage change corresponding to the storage data level of the magnetic tunnel junction MTJ is produced on the bit line BL.

On the other hand, the access transistor is turned OFF in response to inactivation of the read word line RWL to the non-selected state (L level, ground voltage Vss) so as to electrically disconnect the magnetic tunnel junction MTJ from the reference voltage line SL.

The write word line WWL is provided near the magnetic tunnel junction MTJ so as to extend in parallel with the read word line RWL. In writing the data, a data write current is supplied to the write word line WWL and bit line BL. The storage data level of the memory cell is rewritten by the sum of the respective magnetic fields produced by these data write currents.

Hereinafter, the data write and read operations to and from the memory cells according to the first embodiment will be described with reference to FIG. 3.

First, the data write operation will be described.

According to the row selection result of the row decoder 20, the word line driver 30 drives the voltage on the write word line WWL of the selected row to the selected state (H level). In the non-selected rows, the respective voltage levels on the write word lines WWL are retained in the non-selected state (L level).

In the data write operation, the read word lines RWL are retained in the non-selected state (L level) without being activated. Since each write word line WWL is coupled to the ground voltage Vss by the word line current control circuit 40, a data write current Ip is applied to the write word line WWL of the selected row. The data write current does not flow through the write word lines WWL of the non-selected rows.

The read/write control circuits 50 and 60 control the voltage on the bit line BL at both ends of the memory array 10, thereby producing a data write current in the direction corresponding to the write data level. For example, in order to write the storage data "1", the bit line voltage at the read/write control circuit 60 is set to the high voltage state (power supply voltage Vcc), and the bit line voltage at the opposite read/write control circuit 50 is set to the low voltage state (ground voltage Vss). As a result, a data write current +Iw flows through the bit line BL from the read/write control circuit 60 toward 50. In order to write the storage data "0", the bit line voltages at the read/write control circuits 50 and 60 are respectively set to the high voltage state (power supply voltage Vcc) and low voltage state (ground voltage Vss), whereby a data write current −Iw flows through the bit line BL from the read/write control circuit 50 toward 60.

At this time, the data write current ±Iw need not be supplied to every bit line. The read/write control circuits 50 and 60 need only control the voltage on the bit line BL so as to selectively supply the data write current ±Iw to at least one of the bit lines corresponding to the selected row according to the row selection result of the row decoder 25.

By setting the directions of the data write currents Ip and ±Iw as such, one of the data write currents +Iw and −Iw of the opposite directions is selected according to the storage data level "1" or "0" to be written, and the direction of the data write current Ip on the write word line WWL is fixed regardless of the data level. Thus, the data write current Ip can always be applied to the write word line WWL in the fixed direction. As a result, the structure of the word line current control circuit 40 can be simplified, as described below.

The data read operation will now be described.

In the data read operation, the word line driver 30 drives the read word line RWL corresponding to the selected row to the selected state (H level) according to the row selection result of the row decoder 20. The voltage levels on the read word lines RWL corresponding to the non-selected rows are retained in the non-selected state (L level). In the data read operation, the write word lines WWL are retained in the non-selected state (L level) without being activated.

Prior to the data read operation, the bit lines BL are precharged to, e.g., the high voltage state (lower supply voltage Vcc). The data read operation is started in this state. When the read word line RWL of the selected row is activated to H level, a corresponding access transistor ATR is responsively turned ON.

As a result, in the memory cell, a current path of the sense current Is is formed between the reference voltage line SL (which supplies the ground voltage Vss) and bit line BL through the access transistor ATR. Due to the sense current Is, a voltage drop corresponding to the storage data level of the memory cell is produced on the bit line BL. For example, it is now assumed in FIG. 3 that the fixed magnetic layer FL and free magnetic layer VL have the same magnetic field direction when the storage data level is "1". In this case, the bit line BL has a small voltage drop ΔV1 when the storage data is "1", and has a voltage drop ΔV2 larger than ΔV1 when the storage data is "0". The data level stored in the memory cell can be read by sensing the difference between the voltage drops ΔV1 and ΔV2.

In the data read operation, the voltage level on the reference voltage line SL must be set to the ground voltage Vss in order to supply the sense current Is. In the data write operation, however, since the access transistor ATR is turned OFF, the reference voltage line SL does not particularly affect the magnetic tunnel junction MTJ. Accordingly, the voltage level on the reference voltage line SL can be set to the ground voltage Vss as in the data read operation. Thus, the reference voltage line SL is coupled to a node for supplying the ground voltage Vss.

Figure 4:
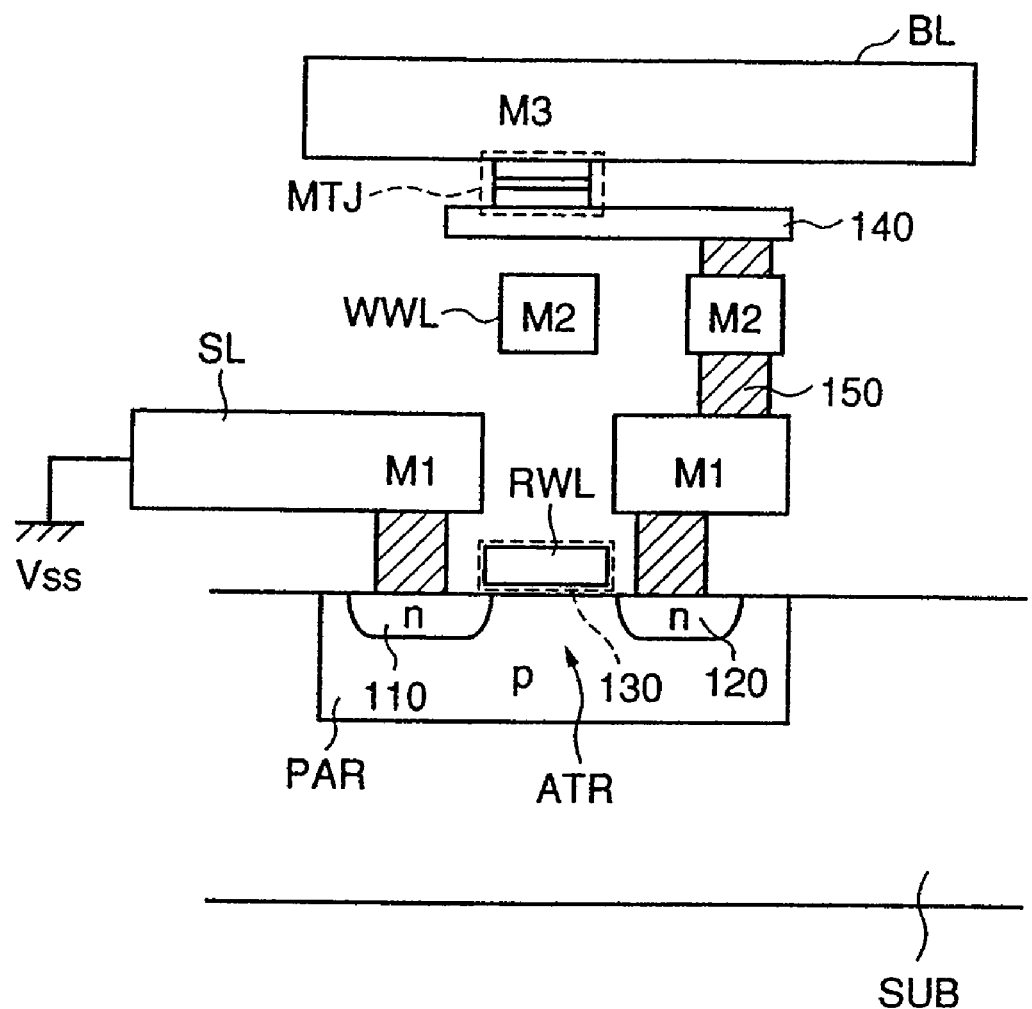
FIG. 4 is a structural diagram illustrating the arrangement of the memory cell according to the first embodiment.

Referring to FIG. 4, the access transistor ATR is formed in a p-type region PAR of a semiconductor main substrate SUB. The reference voltage line SL is provided in a first metal wiring layer M1 so as to be electrically coupled to one source/drain region 110 of the access transistor ATR. The reference voltage line SL is also coupled to a node for supplying the ground voltage Vss among the nodes on the semiconductor substrate.

The other source/drain region 120 is coupled to the magnetic tunnel junction MTJ through metal wirings provided in the first and second metal wiring layers M1 and M2, a metal film 150 formed in a contact hole, and a barrier metal 140. The write word line WWL is provided in the second metal wiring layer M2 near the magnetic tunnel junction MTJ. The read word line RWL is provided in the same layer as that of the gate 130 of the access transistor ATR.

The bit line BL is provided in a third metal wiring layer M3 so as to be electrically coupled to the magnetic tunnel junction MTJ.

Sharing of Signal Line in Memory Array

Figure 5:
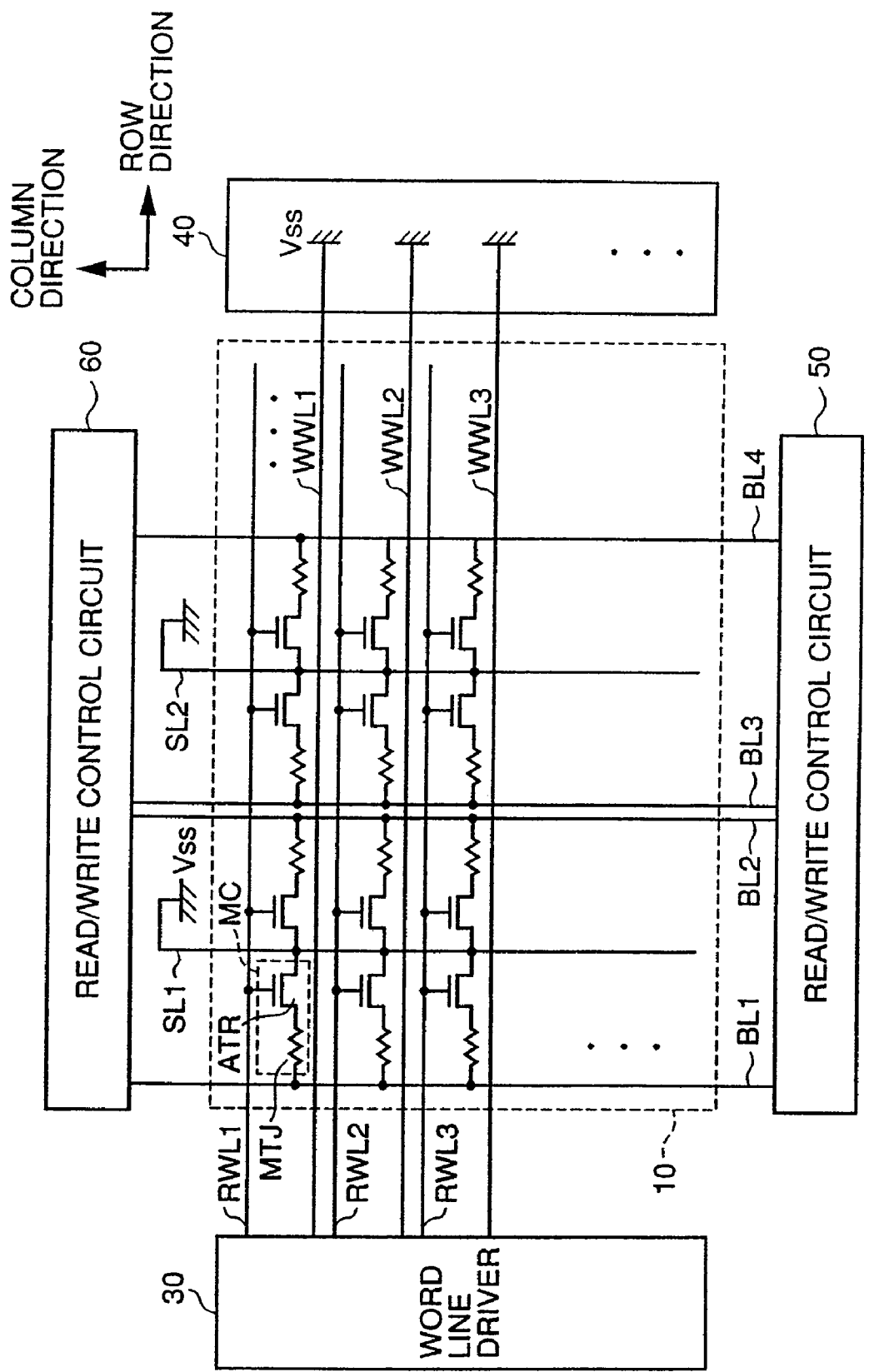
FIG. 5 is a block diagram showing the structure of a memory array according to the first embodiment.

Referring to FIG. 5, the memory array 10 according to the first embodiment has a plurality of memory cells MC arranged in rows and columns. According to the first embodiment, the read word lines RWL and write word lines WWL are provided corresponding to the respective memory cell rows. The bit lines BL and reference voltage lines SL are provided corresponding to the respective memory cell columns. The read word lines RWL and write word lines WWL extend in the row direction. The bit lines BL and reference voltage lines SL extend in the column direction.

Adjacent memory cells in the row direction share the same reference voltage line SL. For example, the memory cell group of the first and second memory cell columns shares a single reference voltage line SL1. In the other memory cell columns as well, the reference voltage lines SL are arranged similarly. Basically, the reference voltage lines SL supply a constant voltage (ground voltage Vss in the present embodiment). Therefore, the reference voltage lines BL can be shared as such without any special voltage control or the like.

The word line current control circuit 40 couples every write word line WWL to the ground voltage Vss. Accordingly, the data write current Ip can be applied to the write word line WWL when it is activated to the selected state (H level, power supply voltage Vcc).

Note that, hereinafter, the write word lines, read word lines, bit lines and reference voltage lines are generally denoted with WWW, RWL, BL and SL, respectively. A specific write word line, read word line, bit line, and reference voltage line are denoted with, for example, WWL1, RWL1, BL1 and SL1, respectively.

Sharing the reference voltage line SL between adjacent memory cells in the row direction enables reduction in the number of wirings provided in the whole memory array 10, thereby achieving improved integration of the memory array 10 as well as reduced chip area of the MRAM device.

First Modification of First Embodiment

Figure 6:
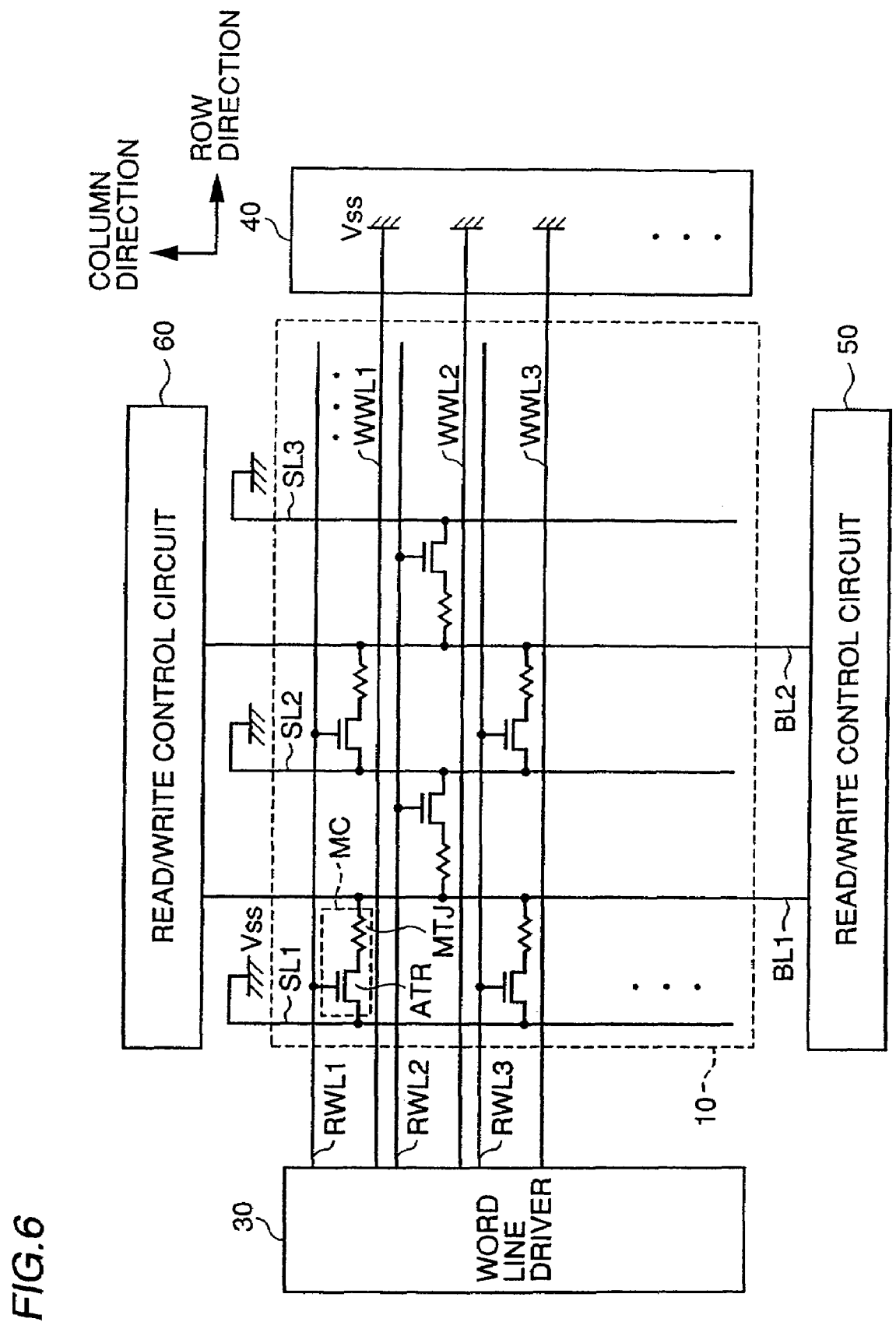
FIG. 6 is a block diagram showing the structure of a memory array according to a first modification of the first embodiment.

Referring to FIG. 6, in the memory array 10 according to the first modification of the first embodiment, adjacent memory cells in the row direction share the same bit line BL. For example, the memory cell group of the first and second memory cell columns shares a single bit line BL1. In the other memory cell columns as well, the bit lines BL are arranged similarly.

In this case, if the data is to be read from or written to a plurality of memory cells MC corresponding to the same bit line BL, data conflict occurs, causing malfunctioning of the MRAM device. Accordingly, in the memory array 10 according to the first modification of the first embodiment, the memory cells MC are provided in every other memory cell row and every other memory cell column. Hereinafter, such memory cell arrangement in the memory array 10 is also referred to as "alternate arrangement". The reference voltage line SL is provided in every memory cell column.

Since the structure of the other portions and the memory cell operation in reading and writing the data are the same as those of the first embodiment, detailed description thereof will not be repeated.

With such a structure, the pitch of the bit lines BL in the memory array 10 can be widened. As a result, the memory cells MC can be efficiently arranged, whereby improved integration of the memory array 10 as well as reduced chip area of the MRAM device can be achieved.

Second Modification of First Embodiment

Figure 7:
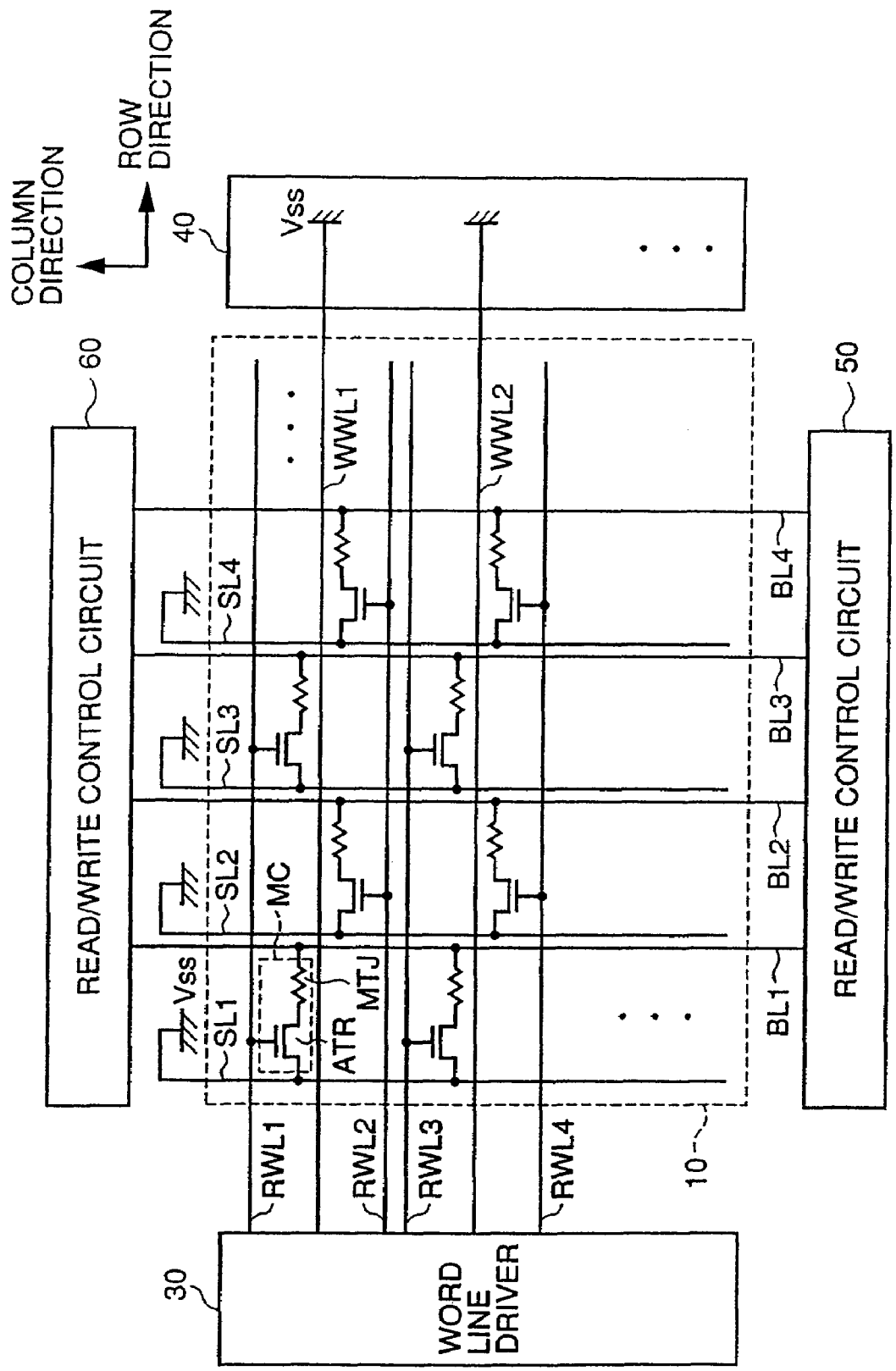
FIG. 7 is a block diagram showing the structure of a memory array according to a second modification of the first embodiment.

Referring to FIG. 7, in the memory array 10 according to the second modification of the first embodiment, adjacent memory cells in the column direction share the same write word line WWL. For example, the memory cell group of the first and second memory cell rows shares a single write word line WWL1. In the other memory cell rows as well, the write word lines WWL are arranged similarly.

In order to conduct the data write operation normally, a plurality of memory cells MC must not be provided at the intersection of the same write word line WWL and the same bit line BL. Accordingly, as in the first modification of the first embodiment, the memory cells MC are arranged alternately.

In FIG. 7, the reference voltage line SL is provided in every memory cell column. However, as in the structure of FIG. 5, every set of adjacent two memory cell columns may alternatively share a single reference voltage line SL.

Since the structure of the other portions and the memory cell operation in reading and writing the data are the same as those of the first embodiment, detailed description thereof will not be repeated.

With such a structure, the pitch of the write word lines WWL in the memory array 10 can be widened. As a result, the memory cells MC can be efficiently arranged, whereby improved integration of the memory array 10 as well as reduced chip area of the MRAM device can be achieved.

Such widened the pitch of the write word lines WWL can ensure a larger width of the write word lines WWL. Thus, the following effects can further be obtained.

Figure 8A:
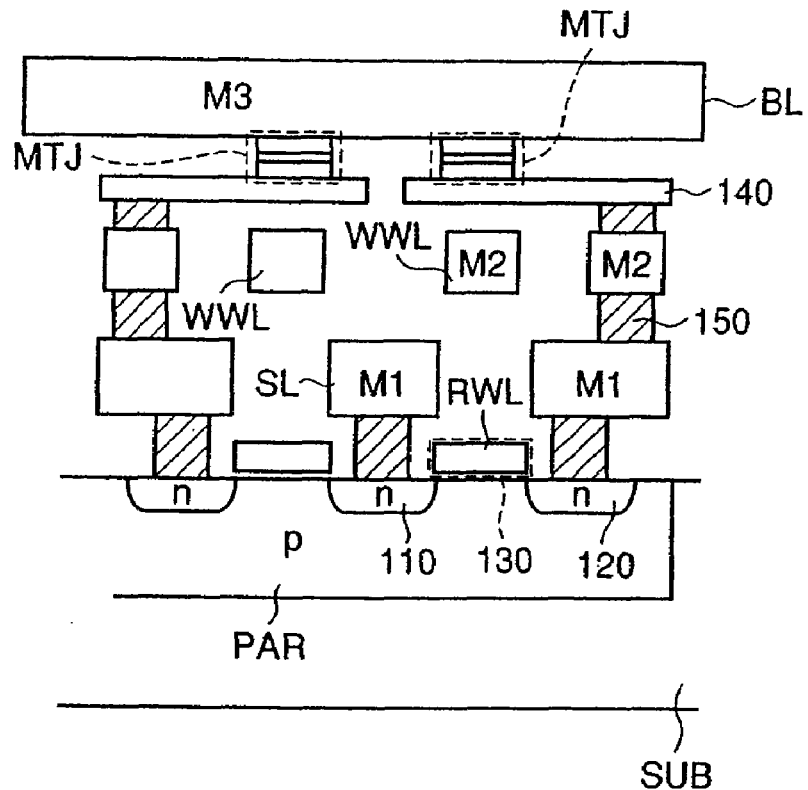
FIGS. 8A and 8B are structural diagrams illustrating the arrangement of a write word line WWL.

FIG. 8A shows the memory cell structure corresponding to the arrangements of FIGS. 5 and 6. In the structure of FIG. 8A, the write word line WWL is not shared between adjacent memory cell columns. Therefore, it is difficult to ensure the width of each write word line WWL.

As described before, in the data write operation, a data write current must be supplied to both the bit line BL and write word line WWL. The write word line WWL and magnetic tunnel junction MTJ are provided with an interlayer insulating film interposed therebetween. Therefore, the vertical distance between the write word line WWL and magnetic tunnel junction MTJ is larger than that between the bit line BL and magnetic tunnel junction MTJ. Accordingly, in order to generate a magnetic field of the same intensity at the magnetic tunnel junction MTJ in the data write operation, a larger current must be supplied to the write word line WWL having a larger distance to the magnetic tunnel junction MTJ.

In the metal wirings where the write word line WWL and the like are formed, an excessive current density may possibly cause disconnection or short-circuit of the wirings due to the phenomenon called electromigration. Accordingly, it is desirable to reduce the current density of the write word line WWL.

Figure 8B:
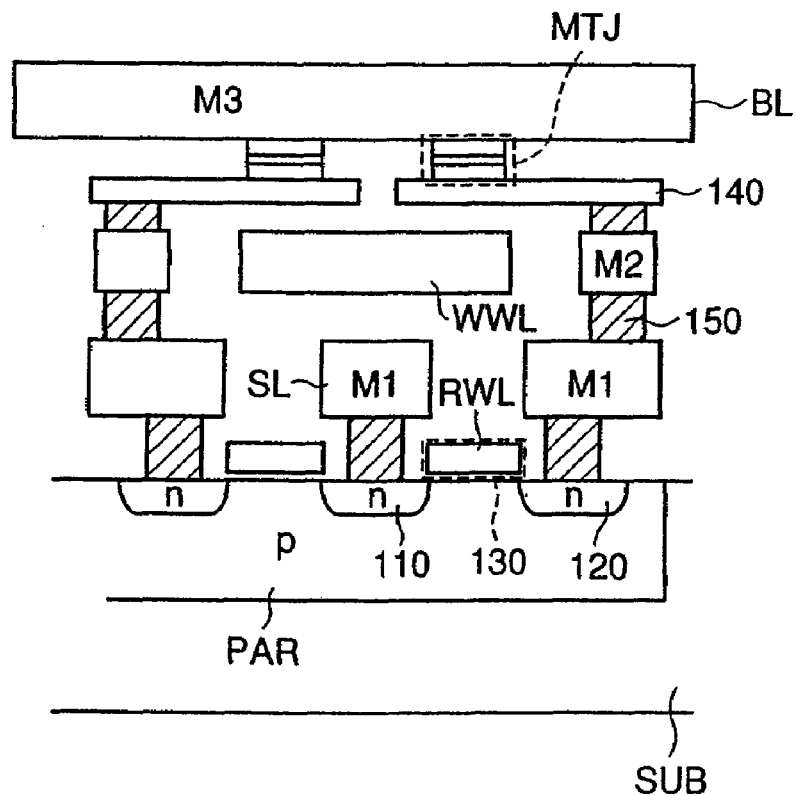

FIG. 8B shows the memory cell structure corresponding to the arrangement of FIG. 7. In the structure of FIG. 8, the write word line WWL is shared between adjacent memory cell columns. Therefore, the write word line WWL can be provided using the space for two memory cell rows, whereby the width of the write word line WWL can be increased. Thus, a width at least larger than the width of the bit line BL, i.e., a larger cross-sectional area, of the write word line WWL can be ensured. As a result, the current density of the write word line WWL is suppressed, whereby improved reliability of the MRAM device can be achieved.

For improved reliability, it is also effective to form a metal wiring having a large distance to the magnetic tunnel junction MTJ (the write word line WWL in FIGS. 8A and 8B) from a highly electromigration-resistant material. For example, in the case where the other metal wirings are formed from an aluminum alloy (Al alloy), the metal wirings that may possibly be subjected to electromigration may be formed from copper (Cu).

Third Modification of First Embodiment

Figure 9:
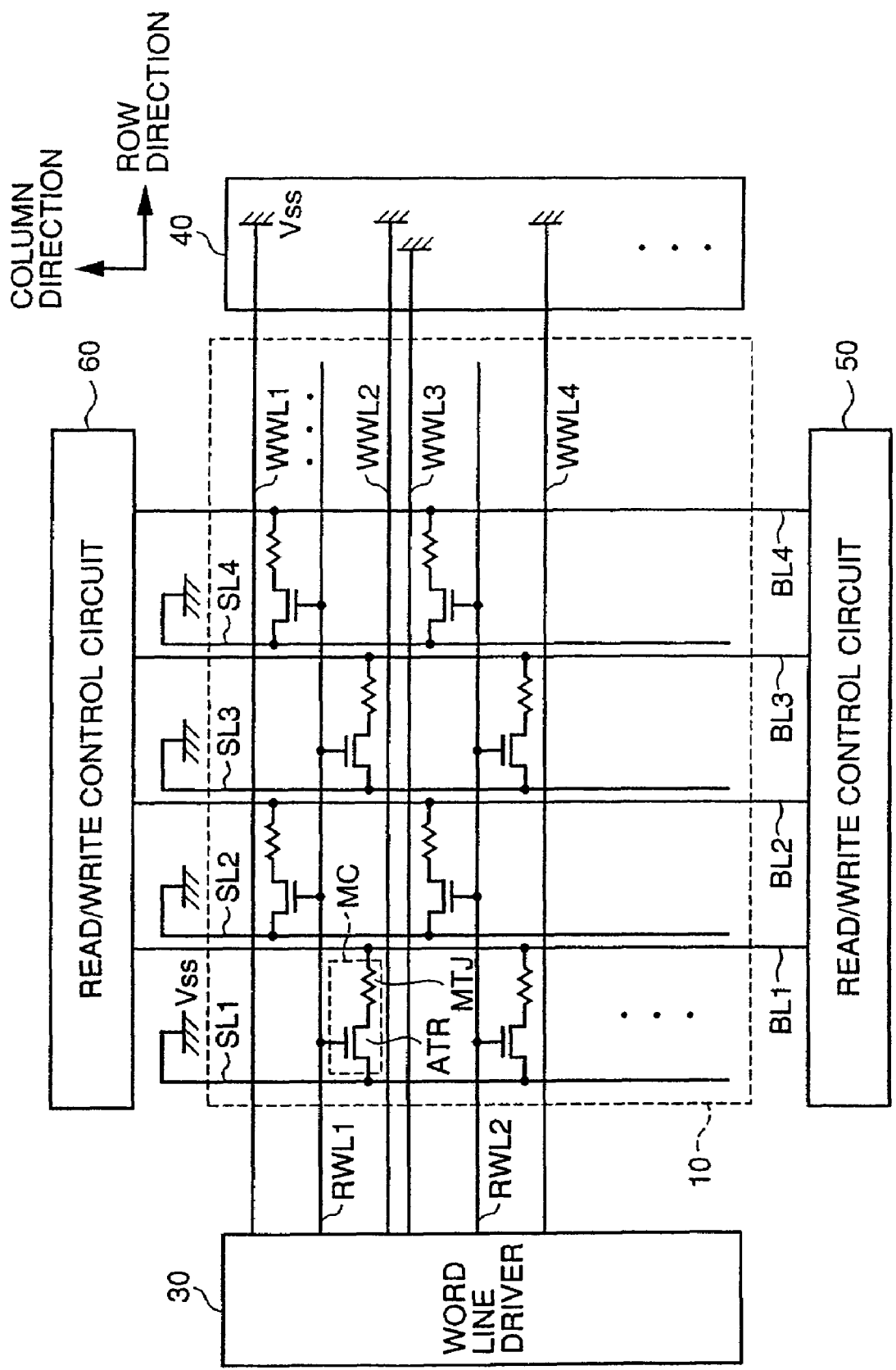
FIG. 9 is a block diagram showing the structure of a memory array according to a third modification of the first embodiment.

Referring to FIG. 9, in the memory array 10 according to the third modification of the first embodiment, adjacent memory cells in the column direction share the same read word line RWL. For example, the memory cell group of the first and second memory cell rows shares a single read word line RWL1. In the other memory cell rows as well, the read word lines RWL are arranged similarly.

In order to conduct the data read operation normally, a plurality of memory cells selected by the same read word line RWL must not be simultaneously connected to the same bit line BL. Accordingly, as in the first modification of the first embodiment, the memory cells MC are arranged alternately.

The reference voltage line SL is provided in every memory cell column. However, as in the structure of FIG. 5, every set of adjacent two memory cell columns may alternatively share a single reference voltage line SL.

Since the structure of the other portions and the memory cell operation in reading and writing the data are the same as those of the first embodiment, detailed description thereof will not be repeated.

With such a structure, the pitch of the read word lines RWL in the memory array 10 can be widened. As a result, the memory cells MC can be efficiently arranged, whereby improved integration of the memory array 10 as well as reduced chip area of the MRAM device can be achieved.

Fourth Modification of First Embodiment

Figure 10:
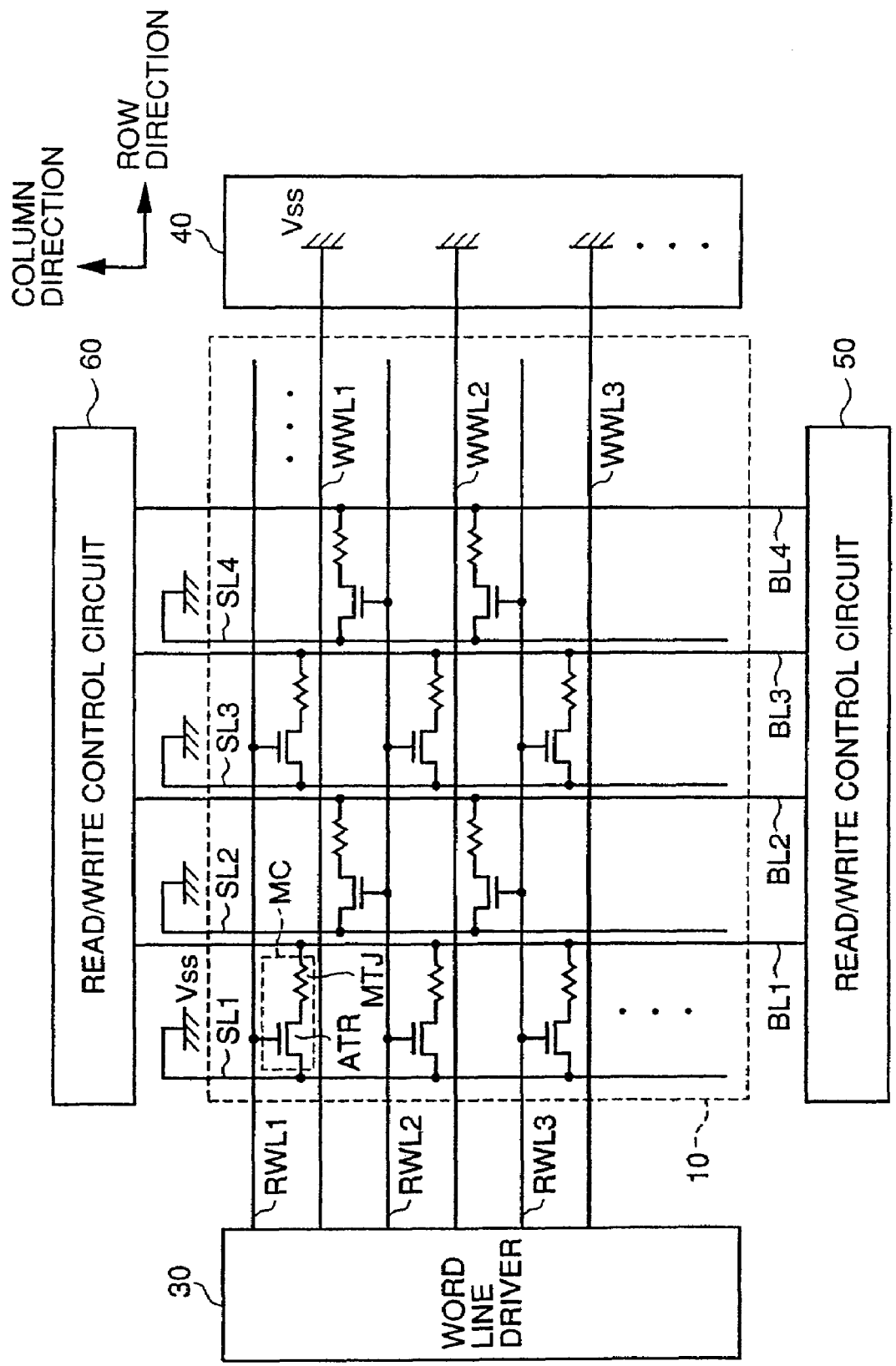
FIG. 10 is a block diagram showing the structure of a memory array according to a fourth modification of the first embodiment.

Referring to FIG. 10, in the memory array 10 according to the fourth modification of the first embodiment, adjacent memory cells in the column direction share the same write word line WWL, as in the second modification of the first embodiment. For example, the memory cell group of the first and second memory cell rows shares a single write word line WWL1. In the other memory cell rows as well, the write word lines WWL are arranged similarly.

Moreover, adjacent memory cells in the column direction share the read word line RWL. For example, the memory cell group of the second and third memory cell rows shares the read word line RWL2. In the following memory cell rows as well, the read word lines RWL are arranged similarly.

As described before, in order to conduct the data read and write operations normally, a plurality of memory cells selected by a single read word line RWL must not be simultaneously coupled to the same bit line BL, as well as a plurality of memory cells simultaneously selected by a single write word line WWL must not simultaneously receive a data write magnetic field from the same bit line BL. Accordingly, in the fourth modification of the first embodiment as well, the memory cells MC are arranged alternately.

The reference voltage line SL is provided in every memory cell column. However, as in the structure of FIG. 5, every set of adjacent two memory cell columns may alternatively share a single reference voltage line SL.

Since the structure of the other portions and the memory cell operation in reading and writing the data are the same as those of the first embodiment, detailed description thereof will not be repeated.

With such a structure, the pitches of the write word lines WWL and read word lines RWL in the memory array 10 can be widened. As a result, the memory cells MC can be more efficiently arranged, whereby further improved integration of the memory array 10 as well as further reduced chip area of the MRAM device can be achieved as compared to the second and third modifications of the first embodiment.

Moreover, as in the second modification of the first embodiment, it is also possible to increase the electromigration resistance of the write word lines WWL in order to improve the reliability of the MRAM device.

Fifth Modification of First Embodiment

Figure 11:
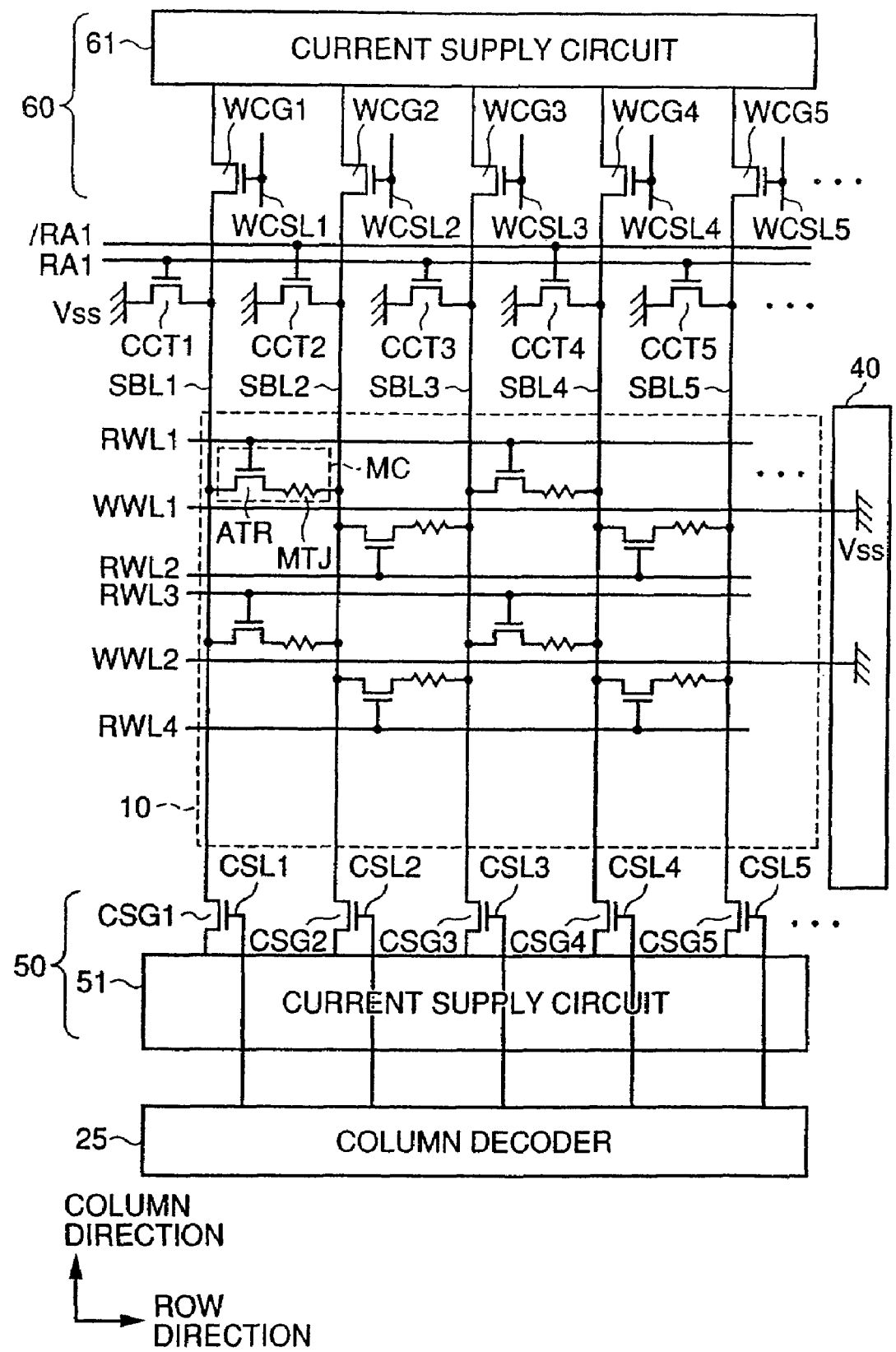
FIG. 11 is a block diagram showing the structure of a memory array and its peripheral circuitry according to a fifth modification of the first embodiment.

Referring to FIG. 11, in the memory array 10 according to the fifth modification of the first embodiment, the reference voltage lines SL and bit lines BL are integrated into common lines SBL. The common lines SBL are provided corresponding to the respective memory cell columns. FIG. 11 exemplarily shows the common lines SBL1 to SBL5 respectively corresponding to the first to fifth memory cell columns.

The read/write control circuit 50 includes a current supply circuit 51 for supplying a data write current and sense current, and column selection gates corresponding to the respective memory cell columns. FIG. 11 exemplarily shows the column selection gates CSG1 to CSG5 respectively corresponding to the common lines SBL1 to SBL5. Hereinafter, such a plurality of column selection gates are also generally referred to as column selection gates CSG.

The column decoder 25 activates one of a plurality of column selection lines to the selected state according to the column selection result. The plurality of column selection lines are provided corresponding to the respective memory cell columns. FIG. 1 exemplarily shows the column selection lines CSL1 to CSL5 respectively corresponding to the common lines SBL1 to SBL5. Hereinafter, such a plurality of column selection lines are also generally referred to as column selection lines CSL.

The column selection gate CSG is turned ON according to the voltage level on a corresponding column selection line CSL.

The read/write control circuit 60 includes a current supply circuit 61 for supplying a data write current, and write column selection gates corresponding to the respective memory cell columns. A plurality of common line control transistors are also provided corresponding to the respective memory cell columns. FIG. 11 exemplarily shows the write column selection gates WCG1 to WCG5 and common line control transistors CCT1 to CCT5 respectively corresponding to the common lines SBL1 to SBL5. Hereinafter, such a plurality of write column selection gates and a plurality of common line control transistors are also generally referred to as write column selection gates WCG and common line control transistors CCT, respectively.

The column decoder 25 also activates one of a plurality of write column selection lines to the selected state according to the decode result of the column address CA. The plurality of write column selection lines are provided corresponding to the respective memory cell columns. The write column selection lines are activated only in the data write operation. FIG. 11 exemplarily shows the write column selection lines WCSL1 to WCSL5 respectively corresponding to the common lines SBL1 to SBL5. Hereinafter, such a plurality of write column selection lines are also generally referred to as write column selection lines WCSL.

The write column selection gate WCG is turned ON according to the voltage level on a corresponding write column selection line WCSL.

The common line control transistor CCT is provided in order to allow the common line SBL to have both functions of the reference voltage line SL and bit line BL.

Since the common line SBL also functions as bit line BL, the memory cells MC must be arranged so as to prevent the data from being read from or written to a plurality of memory cells of the same common line SBL. Accordingly, in the memory array 10 according to the fifth modification of the first embodiment as well, the memory cells MC are arranged alternately.

Figure 3:
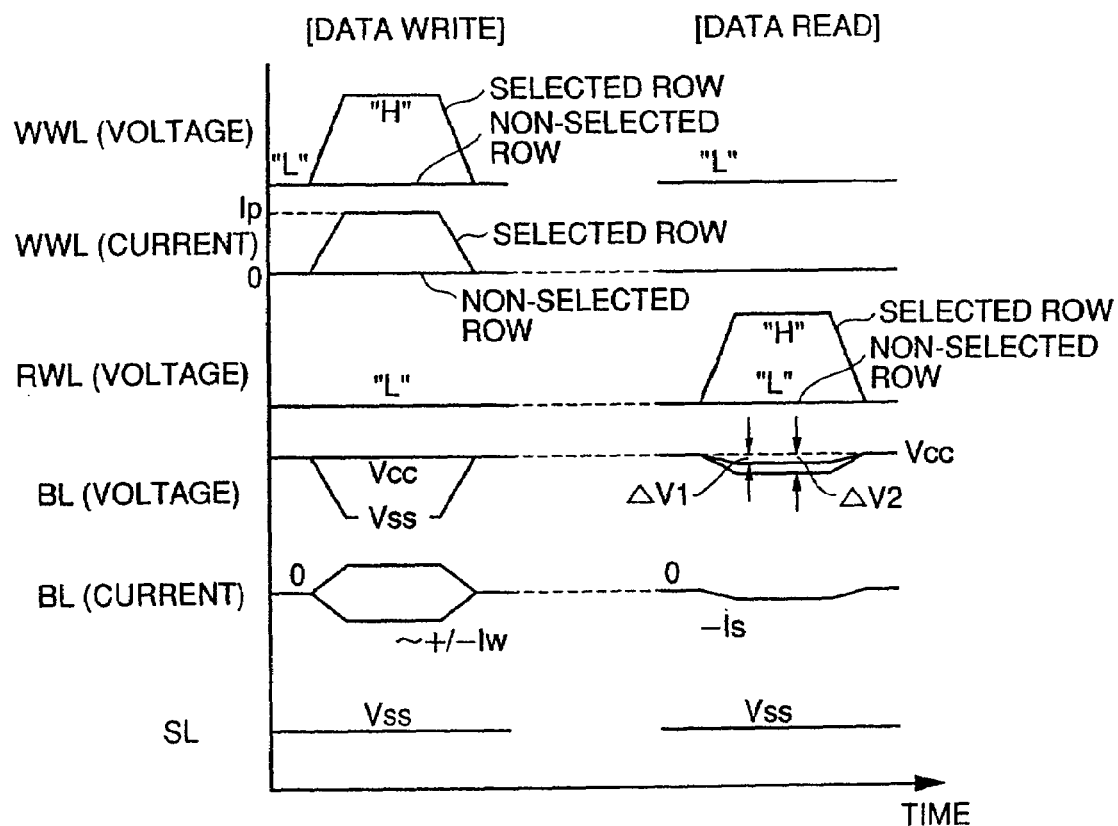
FIG. 3 is a timing chart illustrating the data read and write operations from and to the memory cell according to the first embodiment.
Figure 12:
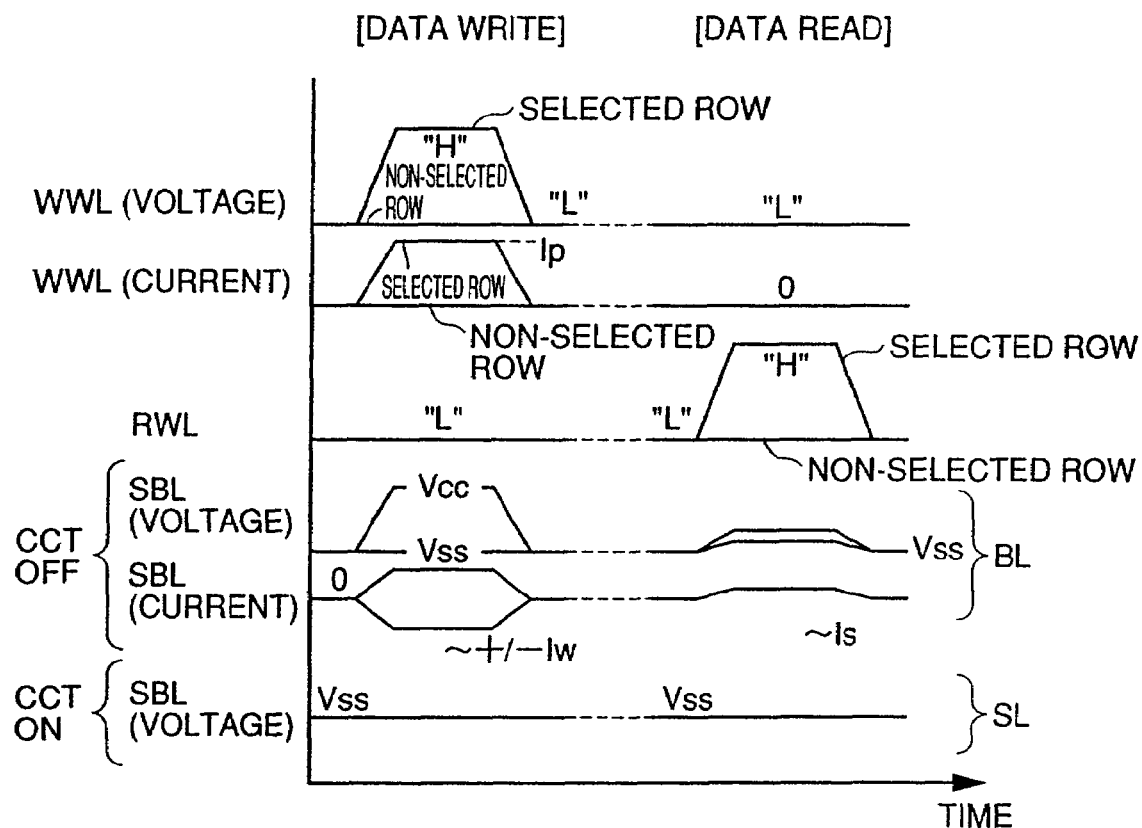
FIG. 12 is a timing chart illustrating the operation of a common line SBL corresponding to turning-ON/OFF of a common line control transistor CCT.

Referring to FIG. 12, the operation of the write word line WWL and read word line RWL in writing and reading the data is the same as that described in FIG. 3.

When the common line control transistor CCT is turned ON, a corresponding common line SBL is coupled to the ground voltage Vss to function as reference voltage line SL.

When a corresponding common line control transistor CCT is turned OFF, the common line SBL is coupled between the current supply circuits 51 and 61 through a corresponding column selection gate CSG and write column selection gate WCG.

In writing the data, the column selection gate CSG and write column selection gate WCG are turned ON according to the column selection result, so that the same data write current as that of FIG. 3 flows through the common line SBL.

In reading the data, the column selection gate CSG is turned ON according to the column selection result, so that the sense current flows through the common line SBL. In the structure using the common lines SBL, the common lines SBL are precharged to the ground voltage Vss prior to the data read operation. Thus, the common line SBL can smoothly functions as bit line BL and reference voltage line SL. Accordingly, the storage data level retained in the memory cell to be read is sensed according to the amount of voltage rise from the ground voltage Vss.

Whether each common line SBL is operated as reference voltage line SL or bit line BL in the data read operation must be determined according to the row decode result. More specifically, in the memory cell MC of the selected row, it is required that the common line SBL coupled to the access transistor ATR functions as reference voltage line SL and the common line SBL coupled to the magnetic tunnel junction MTJ functions as bit line BL.

The common line control transistors CCT1, CCT3, . . . corresponding to the odd memory cell columns receive a control signal RA1 at their gates. The control signal RA1 is activated to H level when an odd memory cell row is selected in the data read operation.

The common line control transistors CCT2, CCT4, . . . corresponding to the even memory cell columns receive a control signal /RA1 at their gates. The control signal /RA1 is activated to H level when an even memory cell row is selected in the data read operation.

In the data write operation, both control signals RA1 and /RA1 are inactivated to L level. Thus, each common line control transistor CCT is turned OFF, so that the data write current ±Iw can be supplied to the common line SBL according to the column selection result.

With such a structure, the same data read and write operations as those of the first embodiment can be conducted using the common line SBL integrating the respective functions of reference voltage line SL and bit line BL.

As a result, the pitch of signal lines in the column direction can be widened. Thus, the memory cells MC can be efficiently arranged, so that improved integration of the memory array 10 can be achieved.

Moreover, in FIG. 11, adjacent memory cells in the column direction share the same write word line WWL as in the second modification of the first embodiment.

This can widened the pitch of the write word lines WWL in the memory array 10. As a result, further improved integration of the memory array 10 as well as reduced chip area of the MRAM device can be achieved. In is also possible to increase the electromigration resistance of the write word lines WWL in order to improve the reliability of the MRAM device.

Note that such integration of reference voltage line SL and bit line BL into common line SBL as shown in this modification may also be applied in combination with either sharing of the read word line RWL between adjacent memory cell rows or sharing of both read word line RWL and write word line WWL between adjacent memory rows as respectively described in the third and fourth modifications of the first embodiment.

Second Embodiment

In the second embodiment, application of a folded bit line structure will be described.

Figure 13:
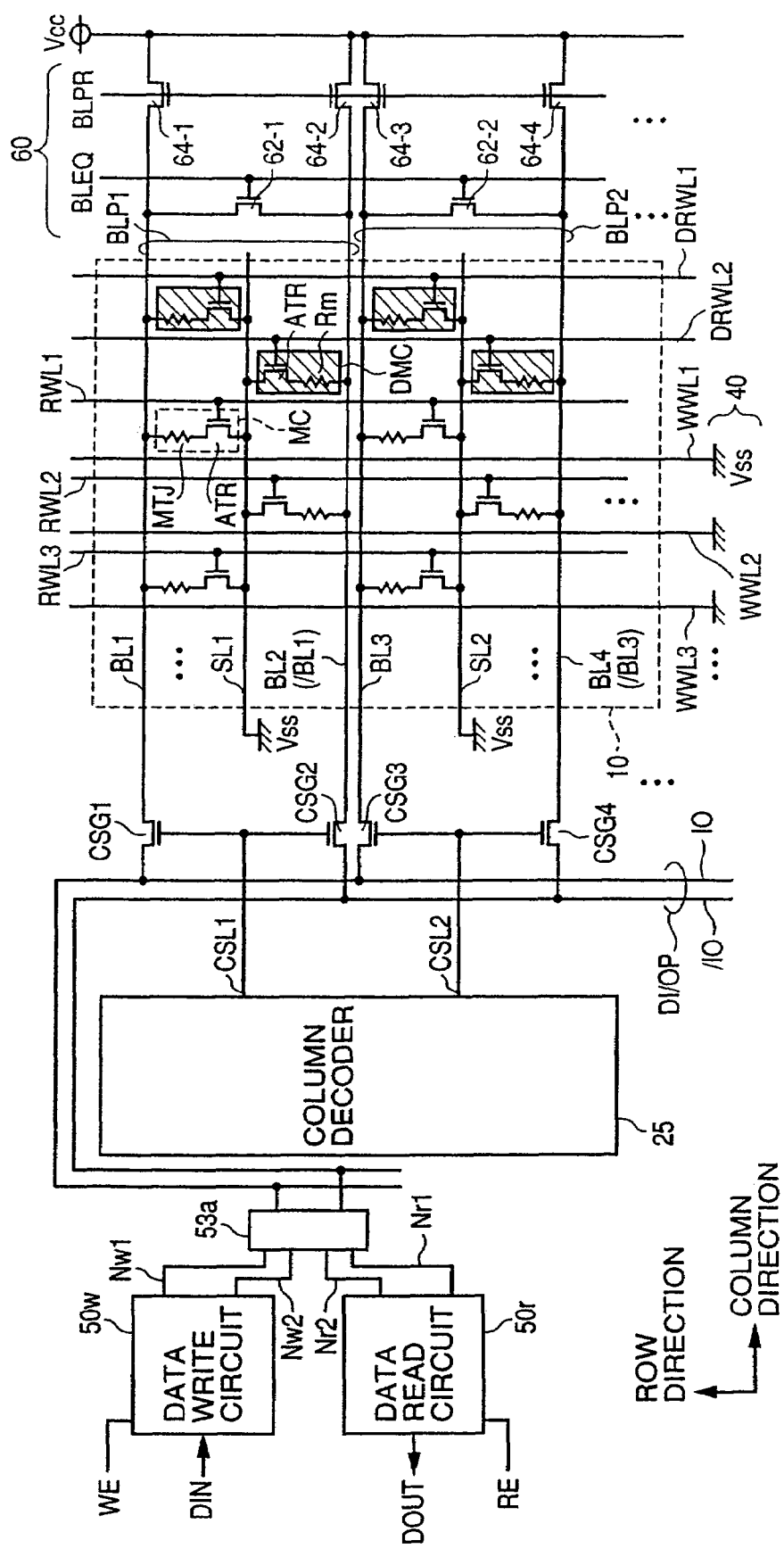
FIG. 13 is a block diagram showing the structure of a memory array and its peripheral circuitry according to a second embodiment.

Referring to FIG. 13, the memory array 10 according to the second embodiment has a plurality of memory cells MC arranged in rows and columns. The read word lines RWL and write word lines WWL extend in the row direction so as to correspond to the respective memory cell rows. The bit lines BL extend in the column direction so as to correspond to the respective memory cell columns. The reference voltage lines SL are provided so as to correspond to the respective sets of two adjacent memory cell columns. Thus, the memory cell columns of the same set share a single reference voltage line SL. The word line current control circuit 40 couples each write word line WWL to the ground voltage Vss. Thus, the data write current Ip can be supplied to the write word line WWL when it is activated to the selected state (H level, power supply voltage Vcc).

The memory cells MC are arranged alternately, that is, provided in every other memory cell row and every other memory cell column. Therefore, the memory cell MC is connected to the bit line BL in every other row. Thus, a bit line pair can be formed from two bit lines in each set of adjacent two memory cell columns. For example, a bit line pair BLP1 can be formed from the bit lines BL1 and BL2 respectively corresponding to the first and second memory cell columns. In this case, the bit line BL2 is also referred to as bit line /BL1 because it transmits the data complementary to that of the bit line BL1. In the following memory cell columns as well, the bit lines are similarly arranged such that the bit lines in each set of memory cell columns form a bit line pair.

Hereinafter, one bit line of each bit line pair corresponding to an odd memory cell column is also generally referred to as bit line BL, and the other bit line corresponding to an even memory cell column is also generally referred to as bit line /BL. Thus, the data read and write operations can be conducted based on a so-called folded bit line structure.

The read/write control circuit 60 has equalizing transistors that are turned ON/OFF in response to a bit line equalizing signal BLEQ, and precharging transistors that are turned ON/OFF in response to a bit line precharging signal BLPR.

The equalizing transistors are provided corresponding to the respective bit line pairs, i.e., the respective sets of memory cell columns. FIG. 13 exemplarily shows an equalizing transistor 62-1 corresponding to the bit lines BL1 and BL2 (/BL1), and an equalizing transistor 62-2 corresponding to the bit lines BL3 and BL4 (/BL3). For example, the equalizing transistor 62-1 electrically couples the bit lines BL1 and BL2 (/BL1) to each other in response to activation (H level) of the bit line equalizing signal BLEQ. Hereinafter, such a plurality of equalizing transistors are also generally referred to as equalizing transistors 62.

Similarly, the equalizing transistors 62 corresponding to the other bit line pairs each electrically couples the bit lines BL and /BL of a corresponding bit line pair to each other in response to activation of the bit line equalizing signal BLEQ.

The bit line equalizing signal BLEQ is produced by the control circuit 5. The bit line equalizing signal BLEQ is activated to H level when the MRAM device 1 is in the stand-by state, when the memory array 10 is in the non-selected state during active period of the MRAM device 1, and when the data write operation is conducted during active period of the MRAM device 1. The bit line equalizing signal BLEQ is activated to H level in order to short-circuit the bit lines of each bit line pair.

The bit line equalizing signal BLEQ is inactivated to L level when the data read operation is conducted during active period of the MRAM device. In response to this, the bit lines BL and /BL of each bit line pair are disconnected from each other.

The precharging transistors are provided corresponding to the respective bit lines. FIG. 13 exemplarily shows the precharging transistors 64-1 to 64-4 respectively corresponding to the bit lines BL1 to BL4. Hereinafter, such a plurality of precharging transistors are also generally referred to as precharging transistors 64. For the other bit lines as well, the precharging transistors 64 are arranged similarly.

The bit line precharging signal BLPR is produced by the control circuit 5. The bit line precharging signal BLPR is activated to H level prior to the start of the data read operation during active period of the MRAM device 1. In response to this, each precharging transistor 64 is turned ON, whereby each bit line is precharged to a prescribed precharge voltage. FIG. 13 exemplarily shows the case where the precharge voltage is the power supply voltage Vcc.

The column selection lines are provided corresponding to the respective bit line pairs, i.e., the respective sets of memory cell columns. FIG. 13 exemplarily shows a column selection line CSL1 corresponding to the first and second memory cell columns, and a column selection line CSL2 corresponding to the third and fourth memory cell columns.

The column decoder 25 activates one of the plurality of column selection lines CSL to the selected state (H level) according to the column selection result.

A data input/output (I/O) line pair DI/OP includes data lines IO and /IO, and transmits the data write current ±Iw in the data write operation, and the sense current Is in the data read operation. In other words, the data I/O line pair DI/OP is common to the data read and write operations.

Hereinafter, the respective structures of column selection gates, data write circuit 50w, data read circuit 50r and current switching circuit 53a that are included in the read/write control circuit 50 will be described.

The column selection gates are provided corresponding to the respective memory cell columns. FIG. 13 exemplarily shows the column selection gates CSG1 to CSG4 respectively corresponding to the first to fourth memory cell columns.

Two column selection gates CSG corresponding to the same bit line pair are turned ON in response to their common column selection line CSL. For example, the column selection gates CSG1 and CSG2 corresponding to the bit line pair BLP1 are turned ON/OFF according to the voltage level of their common column selection line CSL1.

One of the bit line pairs is selected according to the decode result of the column address CA, i.e., the column selection result. In response to the column selection line CSL activated according to the column selection result, corresponding column selection gates CSG are turned ON. As a result, the bit lines BL and /BL of the selected bit line pair are electrically coupled to the respective data lines IO and /IO of the data I/O line pair DI/OP.

Figure 14:
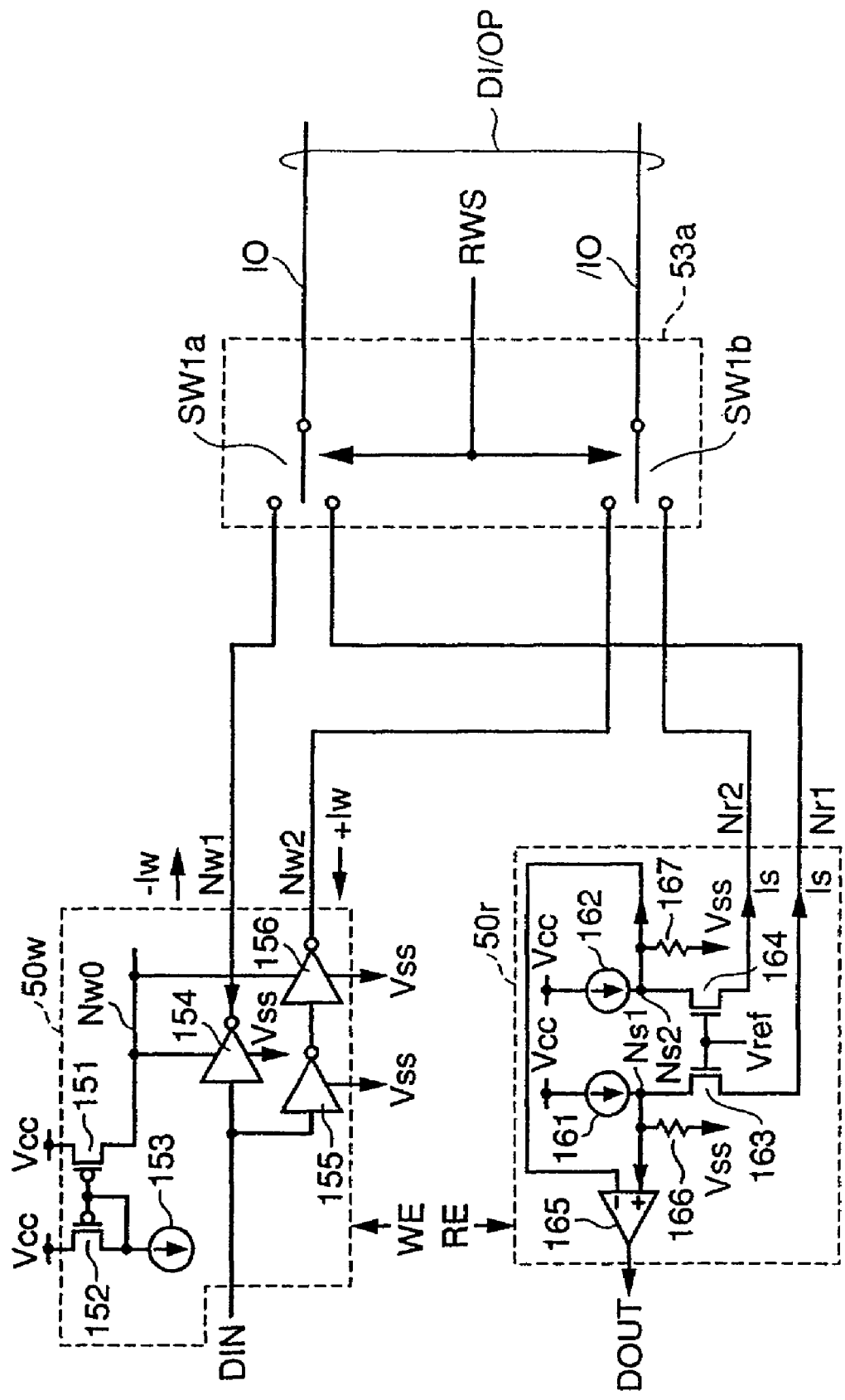
FIG. 14 is a circuit diagram showing the structure of a data write circuit 50w and a data read circuit 50r.

Referring to FIG. 14, the data write circuit 50w operates in response to a control signal WE that is activated in the data write operation. The data write circuit 50w includes a P-type MOS transistor 151 for supplying a constant current to a node Nw0, a P-type MOS transistor 152 forming a current mirror circuit for controlling a passing current of the transistor 151, and a current source 153.

The data write circuit 50w further includes inverters 154, 155 and 156 operating in response to an operating current supplied from the node Nw0. The inverter 154 inverts the voltage level of write data DIN for transmission to a node Nw1. The inverter 155 inverts the voltage level of the write data DIN for transmission to an input node of the inverter 156. The inverter 156 inverts the output of the inverter 154 for transmission to a node Nw2. Thus, the data write circuit 50w sets the voltage level on the node Nw1 to one of the power supply voltage Vcc and ground voltage Vss, and the voltage level on the node Nw2 to the other voltage, according to the voltage level of the write data DIN.

The data read circuit 50r operates in response to a control signal RE that is activated in the data read operation, and outputs read data DOUT.

The data read circuit 50r includes current source 161 and 162 for receiving the power supply voltage Vcc and supplying a constant current to nodes Ns1 and Ns2, respectively, an N-type MOS transistor 163 electrically coupled between the node Ns1 and a node Nr1, an N-type MOS transistor 164 electrically coupled between the node Ns2 and a node Nr2, and an amplifier 165 for amplifying the voltage difference between the nodes Ns1 and Ns2 to output the read data DOUT.

A reference voltage Vref is applied to the gates of the transistors 163 and 164. The reference voltage Vref and the current supply amount of the current sources 161 and 162 are set according to the amount of the sense current Is. Resistances 166 and 167 are provided in order to pull down the nodes Ns1 and Ns2 to the ground voltage Vss, respectively. Such a structure enables the data read circuit 50r to supply the sense current Is from each of the nodes Nr1 and Nr2.

The data read circuit 50r also amplifies the difference in voltage change between the nodes Nr1 and Nr2 as produced according to the storage data level in the memory cell connected thereto through the corresponding column selection gate and bit line pair, and outputs the read data DOUT.

The current switching circuit 53a has a switch SW1a for selectively coupling one of the node Nw1 of the data write circuit 50w and the node Nr1 of the data read circuit 50r to the data line 10, and a switch SW1b for selectively coupling one of the node Nw2 of the data write circuit 50w and the node Nr2 of the data read circuit 50r to the data line /IO.

The switches SW1a and SW1b operate according to a control signal RWS having different signal levels for the data read and write operations.

In the data read operation, the switches SW1a and SW1b respectively couple the output nodes Nr1 and Nr2 of the data read circuit 50r to the data lines IO and /IO. In the data write operation, the switches SW1a and SW1b respectively couple the nodes Nw1 and Nw2 of the data write circuit 50w to the data lines IO and /IO.

Referring back to FIG. 13, the data read and write operations will now be described. The following description is given for the case where the third memory cell column is selected.

First, the data write operation will be described. In response to the column selection result, the column selection line CSL2 is activated to the selected state (H level), and the column selection gates CSG3 and CSG4 are turned ON. Thus, the data lines IO and /IO are electrically coupled to the bit lines BL3 and BL4 (/BL3) of the bit line pair BLP2, respectively. In the data write operation, each equalizing transistor 62 is turned ON, whereby the bit lines BL3 and BL4 (/BL3) are short-circuited.

The data write circuit 50w sets the voltage level of the data line IO to one of the power supply voltage Vcc and ground voltage Vss, and the voltage level of the data line /IO to the other voltage. For example, in the case where the write data DIN is at L level, the outputs of the inverters 154 and 155 shown in FIG. 14 are respectively set to the power supply voltage Vcc (high voltage state) and ground voltage Vss (low voltage state). Therefore, a data write current −Iw for writing the L level data flows through the data line 10.

The data write current −Iw is supplied to the bit line BL3 through the column selection gate CSG3. The data write current −Iw transmitted to the bit line BL3 is turned around by the equalizing transistor 62-2 so as to be transmitted along the other bit line BL4 (/BL3) as a data write current +Iw of the opposite direction. The data write current +Iw flowing through the bit line BL4 (/BL3) is transmitted to the data line /IO through the column selection gate CSG4. Accordingly, the read/write control circuit 60 need not have a current sink means, whereby the structure thereof can be simplified.

In the data write operation, one of the write word lines WWL is activated to the selected state (H level), and the data write current Ip flows therethrough. Accordingly, in the memory cell column corresponding to the bit line BL3, the L-level data is written to the memory cell corresponding to the selected write data line WWL having the data write current Ip flowing therethrough.

On the other hand, in the case where the write data DIN is at H level, the respective voltage levels at the nodes Nw1 and Nw2 become opposite to those described above. Therefore, the data write current flows through the bit lines BL3 and BL4 (/BL3) in the direction opposite to that described above, whereby the opposite data level is written. Thus, the data write current ±Iw having a direction corresponding to the data level of the write data DIN is turned around by the equalizing transistor 62 and supplied to the bit lines BL and /BL.

In the foregoing description, it is assumed that an odd memory cell column is selected for writing the data. In this case, the data level of the write data DIN is directly written to the memory cell MC coupled to the bit line BL.

The data write current flows through the bit line /BL in the direction opposite to that of the bit line BL. Therefore, in the case where an even memory cell column is selected, the data level opposite to that of the write data DIN is written to the memory cell MC coupled to the bit line /BL. As will be appreciated from the following description, however, in this case as well, the data level of the write data DIN can be read correctly.

Next, the data read operation will be described.

The memory cells MC in each row are coupled to either the bit lines BL or the bit lines /BL. For example, the memory cells of the first memory cell row are coupled to the bit lines BL1, BL3, . . . , i.e., the bit lines BL, whereas the memory cells in the second memory cell row are coupled to the bit lines BL2, BL4, . . . , i.e., the bit lines /BL. Similarly, the memory cells in the odd rows are each connected to one bit line BL of a corresponding bit line pair, and the memory cells in the even rows are each connected to the other bit line /BL of the corresponding bit line pair.

Therefore, when the read word line RWL is selectively activated according to the row selection result, either the bit line BL or /BL of each bit line pair is coupled to a corresponding memory cell MC.

The memory array 10 further has a plurality of dummy memory cells DMC corresponding to the respective memory cell columns. The dummy memory cells DMC are each coupled to either a dummy read word line DRWL1 or DRWL2, and are arranged in two rows by a plurality of columns. The dummy memory cells coupled to the dummy read word line DRWL1 are respectively coupled to the bit lines BL1, BL3, . . . (i.e., one bit line BL of each bit line pair). The remaining dummy memory cells coupled to the dummy read word line DRWL2 are respectively coupled to the bit lines BL2, BL4, . . . (i.e., the other bit line /BL of each bit line pair).

The dummy read word line DRWL1, DRWL2 is selectively activated such that the bit lines that are not connected to the memory cells MC of the selected memory cell row, i.e., either the bit lines BL or /BL, are respectively coupled to the dummy memory cells DMC. For example, in the case where an odd memory cell row is selected according to the row selection result, the dummy read word line DRWL2 is activated to the selected state in order to connect the bit line /BL of each bit line pair to the corresponding dummy memory cell DMC. On the contrary, in the case where an even memory cell row is selected, the dummy read word line DRWL1 is activated to the selected state.

As a result, the bit lines BL and /BL of the bit line pairs are respectively coupled to the memory cells corresponding to the selected memory cell row, and dummy memory cells DMC.

The data read operation is also described for the case where the third memory cell column is selected.

Prior to the data read operation, the bit line precharging signal BLPR is activated to H level for a fixed time period, so that each bit line is precharged to the power supply voltage Vcc.

After precharging, the column selection line CSL2 is activated to the selected state (H level) in response to the column selection result. In response to this, the column selection gates CSG3 and CSG4 are turned ON. As a result, the data lines IO and /IO of the data I/O line pair DI/OP are respectively coupled to the bit lines BL3 and BL4 (/BL3) like in the data write operation.

The data read circuit 50r supplies the sense current Is of the same direction to the data lines IO and /IO through the current switching circuit 53a. In the data read operation, the equalizing transistor 62-2 is turned OFF. Therefore, the sense current Is supplied from the data read circuit 50r flows through the bit lines BL3 and BL4 (/BL3) in the same direction.

The read word line RWL is activated to the selected state (H level) according to the row selection result, so that a corresponding memory cell is coupled to one of the bit lines BL3 and BL4 (/BL3). Moreover, one of the dummy read word lines DRWL1 and DRWL2 is activated, so that the other of the bit lines BL3 and BL4 (/BL3), i.e., the bit line that is not connected to the memory cell, is coupled to the dummy memory cell DMC.

As described before, the resistance value of the memory cell MC varies according to the storage data level. Assuming that the memory cell MC storing H-level data has a resistance value Rh and the memory cell MC storing L-level data has a resistance value Rl, a resistance value Rm of the dummy memory cell DMC is set to an intermediate value of Rl and Rh.

Thus, the storage data level to be read can be sensed by comparison between voltage changes caused by the sense current Is, i.e., between a voltage change on one bit line coupled to the dummy memory cell DMC and a voltage change on the other bit line coupled to the memory cell MC. This comparison is conducted by the data read circuit 50r.

The voltage difference between the bit lines BL3 and BL4 (/BL3) is transmitted through the data I/O line pair DI/OP to the nodes Ns1 and Ns2 of the data read circuit 50r. The voltage difference between the nodes Ns1 and Ns2 is amplified by the amplifier 165 and is output as read data DOUT.

Accordingly, in the case where L-level data is stored in the memory cell coupled to the bit line BL3 (BL), and in the case where H-level data is stored in the memory cell MC coupled to the bit line BL4 (/BL), L-level is output as read data DOUT. On the contrary, in the case where H-level data is stored in the memory cell coupled to the bit line BL3 (BL), and in the case where L-level data is stored in the memory cell MC coupled to the bit line BL4 (/BL), H-level data is output as read data DOUT.

The data read and write operations can thus be conducted based on the folded bit line structure. As a result, the read and write operation margins can be ensured.

Moreover, the data write current is turned around by the equalizing transistor 62 so as to be supplied to the bit lines BL and /BL of the bit line pair. Therefore, the data write operation can be conducted without using a voltage of different polarity (negative voltage). Moreover, the direction of the data write current can be switched by merely setting the voltage on the data line 10 to one of the power supply voltage Vcc and ground voltage Vss as well as setting the voltage on the other data line /IO to the other voltage. As a result, the structure of the data write circuit 50w can be simplified. The read/write control circuit 60 also need not have a current sink means, and therefore can be formed simply with the equalizing transistors 62.

The data write current is turned around and thus supplied as complementary data write currents. These complementary data write currents respectively generate magnetic field noises in such directions that cancel each other. Therefore, reduction in data write noise can be achieved.

First Modification of Second Embodiment

In the first modification of the second embodiment, the write word line WWL is shared between adjacent memory cells, in addition to the folded bit line structure shown in the second embodiment.

Figure 15:
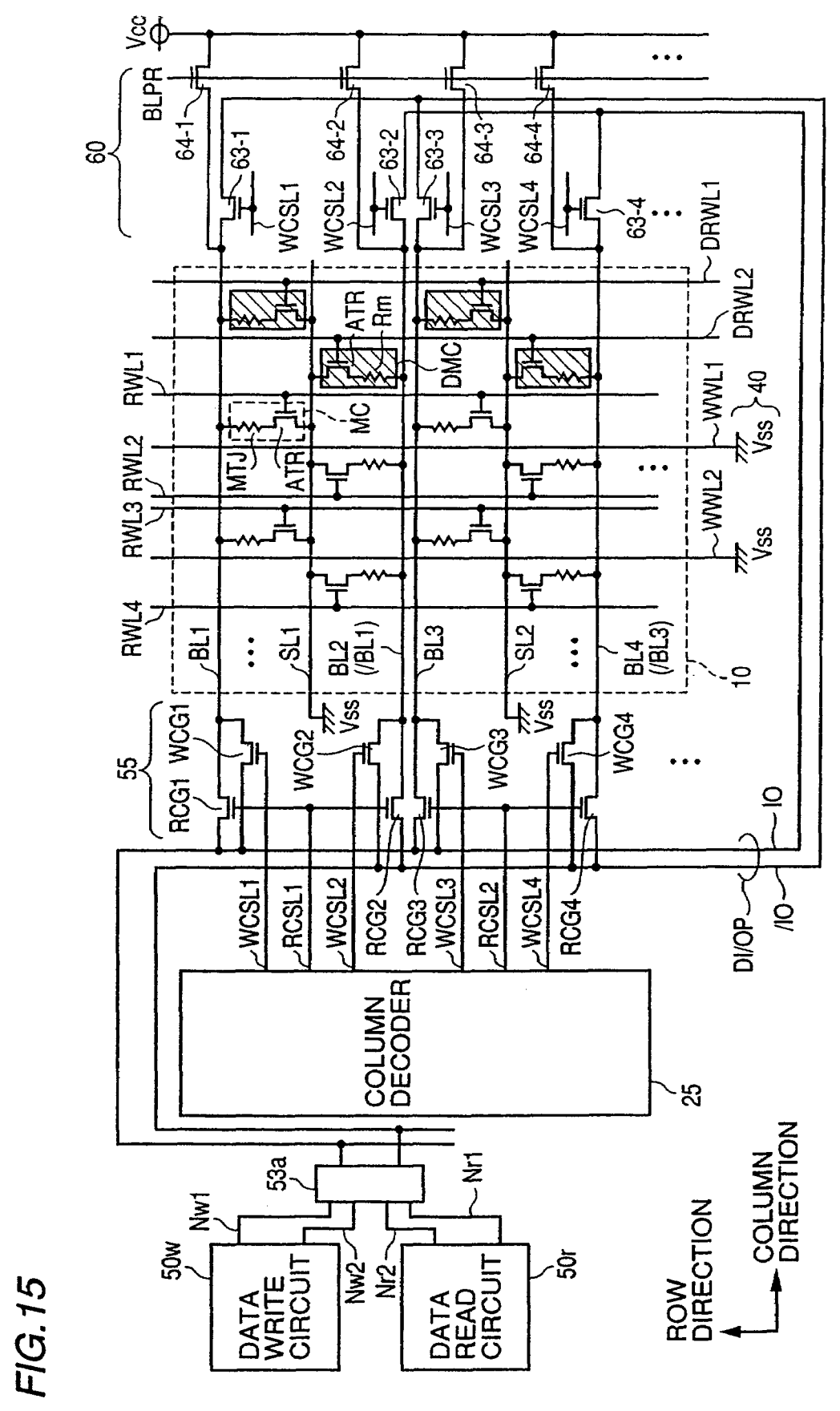

Referring to FIG. 15, in the memory array 10 according to the first modification of the second embodiment, adjacent memory cells in the column direction share the same write word line WWL.

In the read operation, the read word line RWL is activated. The memory cells are connected to every other bit line. Therefore, every set of adjacent two memory cell columns form a bit line pair, so that the data read operation based on the folded bit line structure can be conducted in the same manner as that of the second embodiment.

On the other hand, in the data write operation, the write word line WWL shared by the memory cells of different rows is activated. Therefore, the data write operation based on the folded bit line structure is not possible. Accordingly, the column selection must be conducted separately for the data read operation and data write operation.

In the first modification of the second embodiment, the column selection gates are divided into read column selection gates RCG and write column selection gates WCG. Similarly, the column selection lines are divided into read column selection lines RCSL and write column selection lines WCSL.

The read column selection lines RCSL and read column selection gates RCG are arranged in the same manner as that of the column selection lines CSL and column selection gates CSG of FIG. 13, and controlled on the basis of a set of memory cell columns corresponding to a bit line pair. Accordingly, the read operation margin can be ensured as in the case of the structure of the second embodiment.

On the other hand, the write column selection lines WCSL and write column selection gates WCG are provided corresponding to the respective memory cell columns, and controlled independently on a column-by-column basis.

The write column selection gates WCG1, WCG3, . . . corresponding to the odd memory cell columns each electrically couples a corresponding bit line BL1, BL3, . . . to the data line IO according to the column selection result. The write column selection gates WCG2, WCG4, . . . corresponding to the even memory cell columns each electrically couples a corresponding bit line BL2, BL4, . . . to the data line /IO according to the column selection result.

The read/write control circuit 60 includes write current control transistors corresponding to the respective memory cell columns. The write current control transistor is turned ON in response to activation of a corresponding write column selection line. FIG. 11 exemplarily shows the write current control transistors 63-1 to 63-4 respectively corresponding to the first to fourth memory cell columns, i.e., the bit lines BL1 to BL4. Hereinafter, such a plurality of write current control transistors are also generally referred to as write current control transistors 63. The precharging transistors 64 are arranged in the same manner as that of FIG. 13.

The write current control transistors 63-1, 63-3, . . . corresponding to the odd memory cell columns each electrically couples a corresponding bit line BL1, BL3, . . . to the data line /IO according to the column selection result. The write current control transistors 63-2, 63-4, . . . corresponding to the even memory cell columns each electrically couples a corresponding bit line BL2, BL4, . . . to the data line IO according to the column selection result.

Accordingly, in the selected memory cell column, the data write current ±Iw can be supplied to the path formed by the data line IO (/IO), write column selection gate WCG, bit line BL, write current control transistor 63, and data line /IO (IO). Note that it is possible to control the direction of the data write current ±Iw by setting the respective voltages of the data lines IO and /IO in the same manner as that of the second embodiment. Accordingly, like the second embodiment, the structure of the peripheral circuitry associated with the data write operation, i.e., the data write circuit 50w and read/write control circuit 60, can be simplified.

Although the data write operation based on the folded bit line structure is not possible, the pitch of the write word lines WWL in the memory array 10 can be widened. As a result, like the second modification of the first embodiment, improved integration of the memory array 10 and thus reduced chip area of the MRAM device can be achieved. Improved reliability of the MRAM device can also be achieved by increasing the electromigration resistance of the write word lines WWL.

Second Modification of Second Embodiment

In the second modification of the second embodiment, the read word line RWL is shared between adjacent memory cells, in addition to the folded bit line structure of the second embodiment.

Figure 16:
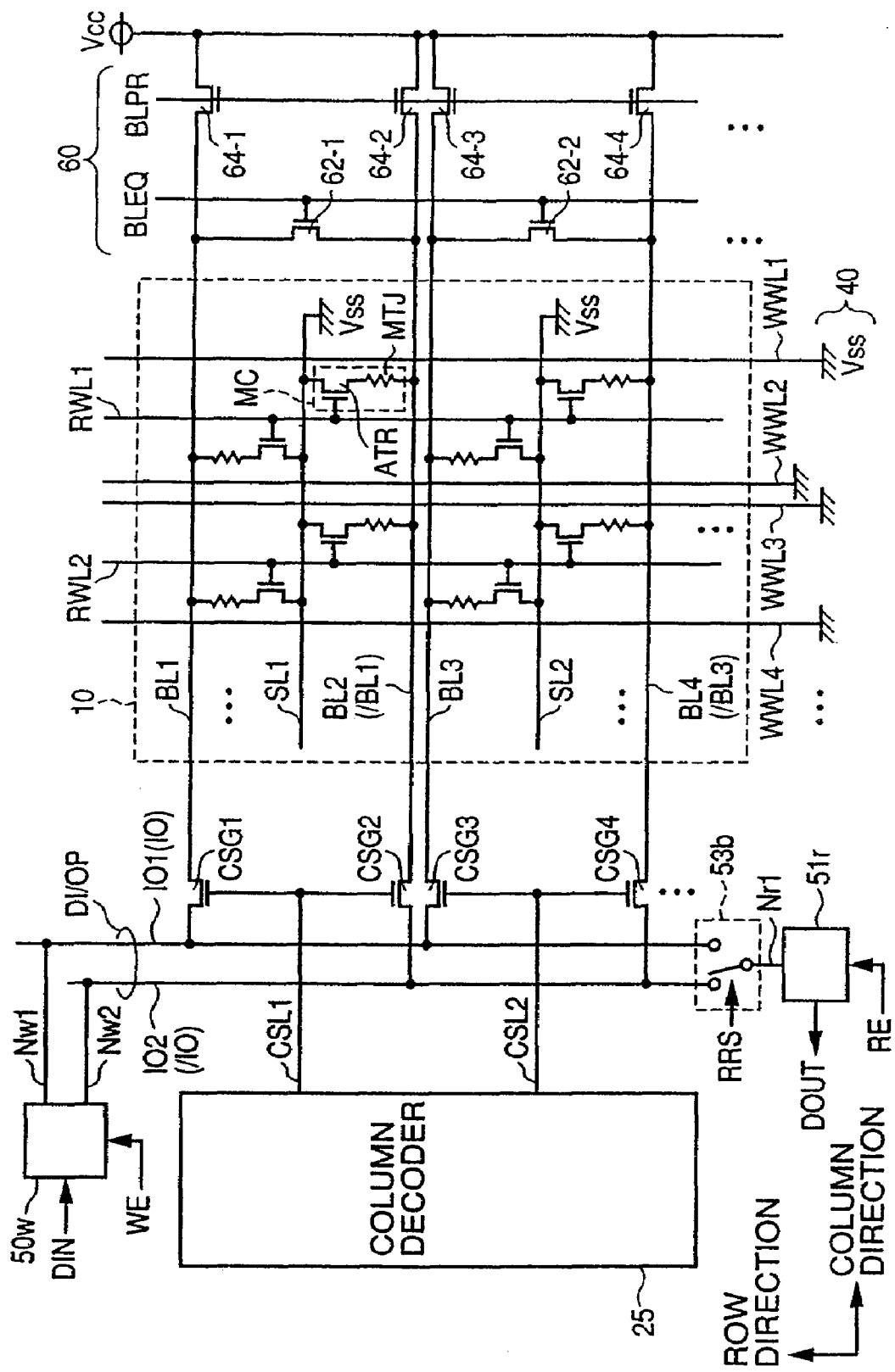
FIG. 16 is a block diagram showing the structure of a memory array and its peripheral circuitry according to a second modification of the second embodiment.

Referring to FIG. 16, in the memory array 10 according to the second modification of the second embodiment, adjacent memory cells in the column direction share the same read word line RWL.

The read/write control circuit 60 has equalizing transistors 62 and precharging transistors 64. The transistors 62 and 64 are arranged in the same manner as that of the second embodiment.

In the data write operation, the write word line WWL is activated. The memory cells are connected to every other bit line. Therefore, every set of adjacent two memory cell columns form a bit line pair, so that the data write operation based on the folded bit line structure can be conducted in the same manner as that of the second embodiment. Accordingly, the write operation margin can be ensured as in the second embodiment. Moreover, the structure of the peripheral circuitry associated with the data write operation, i.e., the data write circuit 50w and read/write control circuit 60, can be simplified as well as the data write noise can be reduced.

On the other hand, in the data read operation, the read word line RWL shared by a plurality of memory cell rows is activated. In this case, the data read operation based on the folded bit line structure is not possible. In the data read operation, the sense current must be supplied to one of the data lines IO and /IO that corresponds to the selected memory cell column, but the other data line may be in the floating state. In other words, such a floating state of the other data line does not adversely affect the data read operation. Accordingly, the column selection lines and column selection gates can be arranged in the same manner as that of FIG. 13.

In other words, in the data read operation, the data lines IO and /IO respectively operate as independent data lines IO1 and IO2, and the sense current is supplied to one of these data lines according to the column selection result.

On the other hand, in the data read operation, the data lines IO and /IO form a data I/O line pair DI/OP as in the case of FIG. 13 so as to serve as complementary data write current supply lines.

Note that as in the case of the first modification of the second embodiment shown in FIG. 15, the column selection gates and column selection lines may be independently provided for the data read operation and data write operation. In this case, the arrangement of the read column selection gates RCG and write column selection gates WCG as well as the arrangement of the read column selection lines RCSL and write column selection lines WCSL need only be inversed from those of FIG. 15.

In the structure according to the second modification of the second embodiment, a current switching circuit 53b and data read circuit 51r are substituted for the current switching circuit 53a and data read circuit 50r, respectively.

Figure 17:
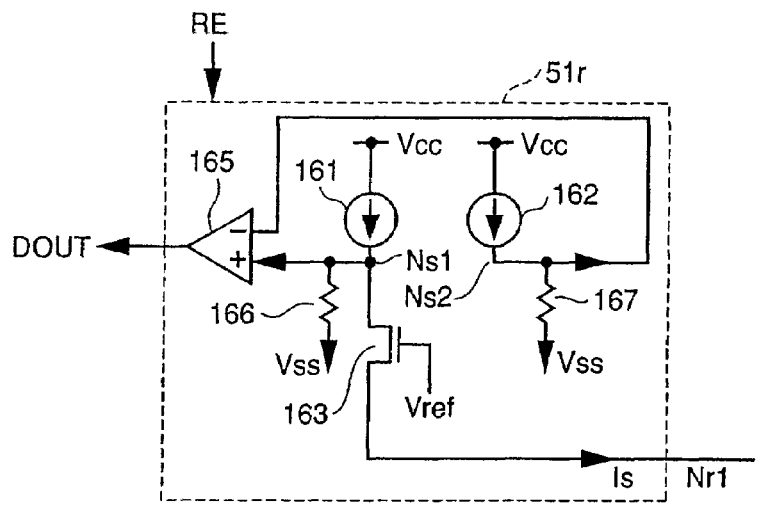
FIG. 17 is a circuit diagram showing the structure of a data read circuit 51r.

FIG. 17 is a circuit diagram showing the structure of the data read circuit 51r.

Referring to FIG. 17, the data read circuit 51r is different from the data read circuit 50r of FIG. 14 in that the data read circuit 51r supplies the sense current Is only to the node Nr1. Accordingly, the transistor 164 shown in FIG. 14 is eliminated, and the reference voltage Vref is applied only to the gate of the transistor 163.

The data read circuit 51r senses the level of the read data DOUT by comparing a voltage drop caused by the sense current Is with a reference voltage drop $\Delta$Vr. Provided that the data line has a voltage drop $\Delta$Vh when the H level data is read and a voltage drop $\Delta$Vl when the L level data is read, $\Delta$Vr is set to an intermediate value of $\Delta$Vh and $\Delta$Vl.

Accordingly, in the data read circuit 51r, the resistance value of the resistance 167 is set so that the node Ns2 has a voltage level (Vcc−$\Delta$Vr).

Referring back to FIG. 16, the current switching circuit 53b controls connection between the output node Nr1 of the data read circuit 51r and the data line IO1 (IO), IO2 (/IO) in response to a control signal RRS. In the data read operation, the current switching circuit 53b connects the output node Nr1 of the data read circuit 50r to one of the data lines IO1 (IO) and IO2 (/IO) according to the column selection result.

More specifically, when an odd memory cell column is selected, the current switching circuit 53b connects the node Nr1 to the data line IO1 (IO) in order to supply the sense current Is to the data line IO1 (IO). The data line IO2 (/IO) is retained in the floating state at the precharge voltage.

On the contrary, when an even memory cell column is selected, the current switching circuit 53b connects the node Nr1 to the data line IO2 (/IO) in order to supply the sense current Is to the data line IO2 (/IO). The data line IO1 (IO) is retained in the floating state at the precharge voltage.

In the data write operation, the data write circuit 50w supplies the data write current to the data line IO, /IO. Therefore, the current switching circuit 53b does not connect the output node Nr1 to the data lines IO and /IO.

Such a structure cannot ensure the read operation margin by the folded bit line structure, but can widen the pitch of the read word lines RWL in the memory array 10. Therefore, the data read operation can be conducted normally. Moreover, the data write operation can be conducted based on the folded bit line structure, as well as improved integration of the memory array 10 and thus reduced chip area of the MRAM device can be achieved as in the case of the third modification of the first embodiment.

Third Embodiment

In the third embodiment and the following embodiments, sharing of the signal lines in other memory cell arrangements will be described.

Figure 18:
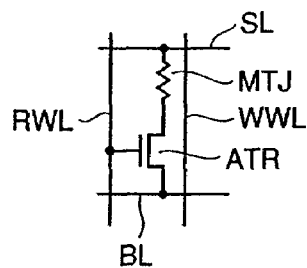
FIG. 18 is a circuit diagram showing the connection between a memory cell and signal wirings according to a third embodiment.

Referring to FIG. 18, a memory cell according to the third embodiment includes a magnetic tunnel junction MTJ and an access transistor ATR, which are coupled in series with each other. The access transistor ATR is electrically coupled between the magnetic tunnel junction MTJ and bit line BL. The access transistor ATR has its gate coupled to the read word line RWL.

The magnetic tunnel junction MTJ is electrically coupled between the access transistor ATR and the reference voltage line SL for supplying the ground voltage Vss. Accordingly, the bit line BL is not directly coupled to the magnetic tunnel junction MTJ, but is connected thereto through the access transistor ATR.

The memory cell of the third embodiment corresponds to the memory cell of the first embodiment with its reference voltage line SL and bit line BL switched in position with respect to the magnetic tunnel junction MTJ and access transistor ATR. Accordingly, the kinds of signal lines are the same as those of the first embodiment, and each signal line has the same voltage and current waveform as those of the first embodiment in the data read and write operations. Therefore, detailed description thereof will not be repeated.

Figure 19:
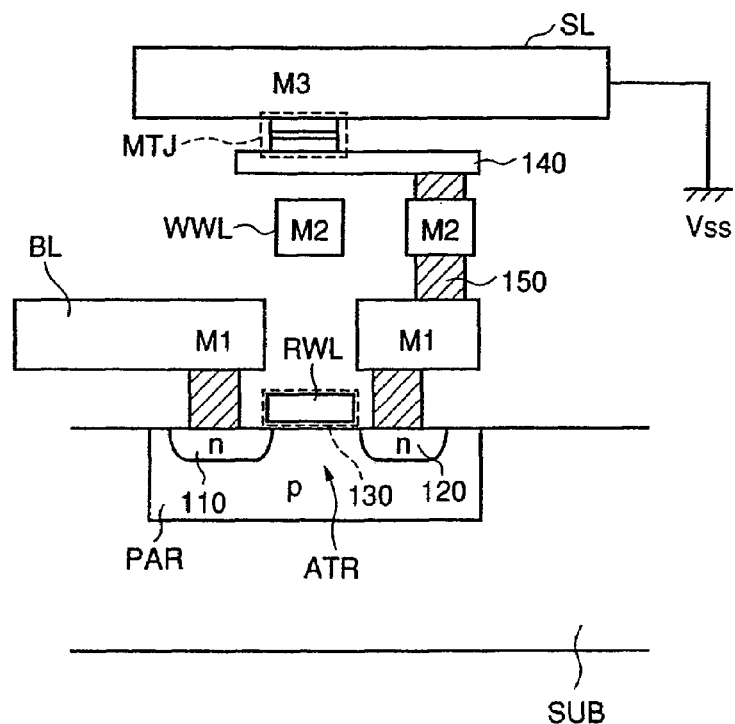
FIG. 19 is a structural diagram illustrating the arrangement of the memory cell according to the third embodiment.

Referring to FIG. 19, the access transistor ATR is formed in a p-type region PAR of a semiconductor main substrate SUB. The bit line BL is formed in a first metal wiring layer M1 so as to be electrically coupled to one source/drain region 110 of the access transistor ATR.

The other source/drain region 120 is coupled to the magnetic tunnel junction MTJ through the metal wirings respectively provided in the first and second metal wiring layers M1 and M2, a metal film 150 formed in a contact hole, and a banner metal 140. The write word line WWL is provided in the second metal wiring layer M2 near the magnetic tunnel junction MTJ. The read word line RWL is provided in the same layer as that of the gate 130 of the access transistor ATR.

The reference voltage line SL is provided in an independent metal wiring layer, i.e., a third metal wiring layer M3. The reference voltage line SL is coupled to a node for supplying the ground voltage Vss among the nodes on the semiconductor substrate.

Thus, in the memory cell of the third embodiment, the magnetic tunnel junction MTJ is not directly coupled to the bit line BL, but is coupled thereto through the access transistor ATR. Therefore, each bit line BL is not directly coupled to a multiplicity of magnetic tunnel junctions MTJ of a corresponding memory cell column, but is electrically coupled only to the memory cell to be read, i.e., the memory cell of the memory cell row corresponding to the read word line RWL activated to the selected state (H level). Accordingly, the capacitance of the bit line BL can be suppressed, whereby a high-speed operation can be achieved particularly for the read operation.

Figure 20:
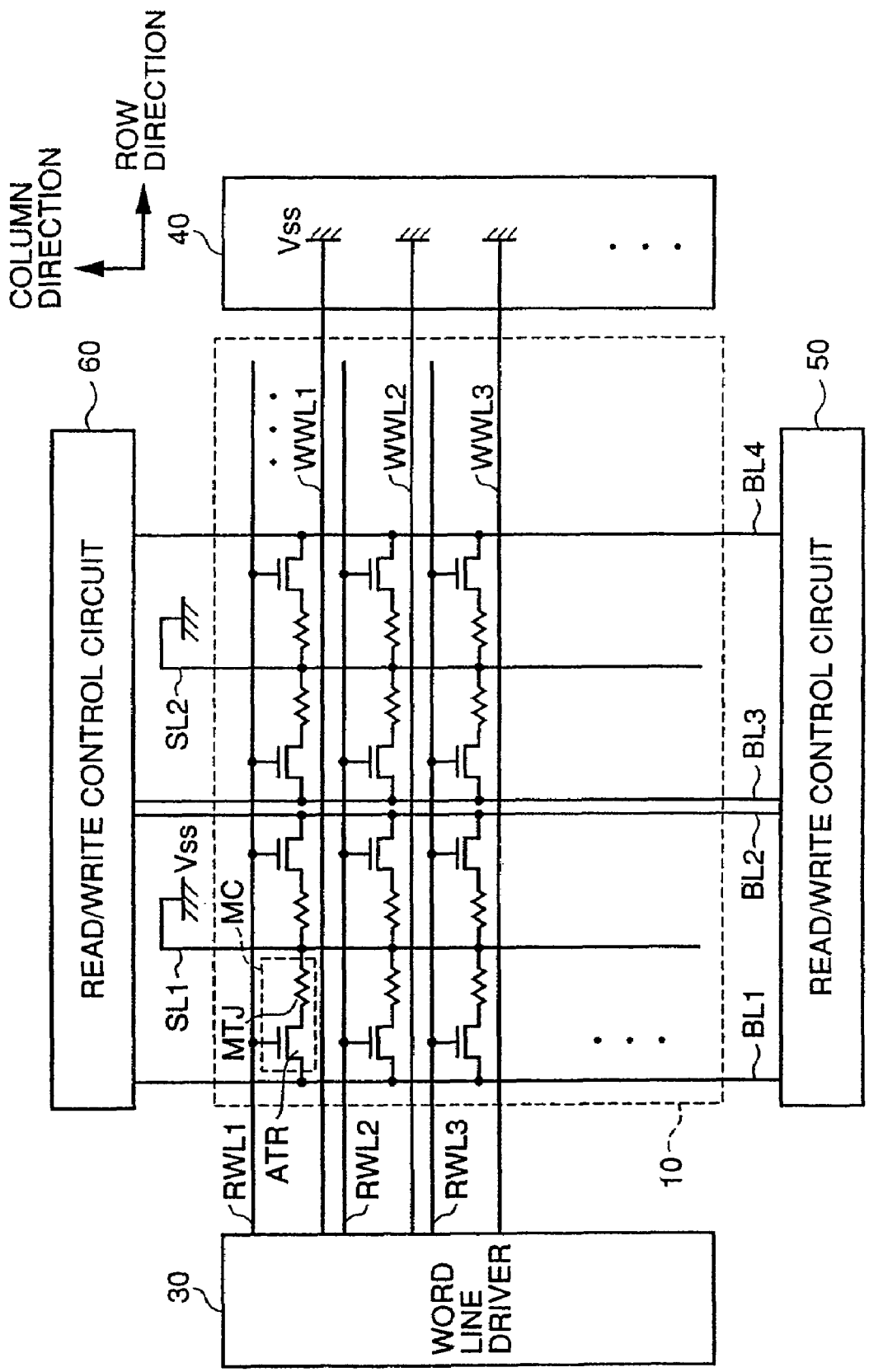
FIG. 20 is a block diagram showing the structure of a memory array according to the third embodiment.

Referring to FIG. 20, in the memory array 10, the memory cells MC having the structure of FIG. 18 are arranged in rows and columns. Moreover, like the structure of the first embodiment shown in FIG. 5, adjacent memory cells in the row direction share the same reference voltage line SL.

The arrangement of the read word lines RWL, write word lines WWL and bit lines BL as well as the structure of the word line current control circuit 40 are the same as those of FIG. 5. Therefore, description thereof will not be repeated.

Thus, in the memory cell arrangement of the third embodiment as well, the reference voltage line SL can be shared by a plurality of memory cell columns. Thus, the number of wirings in the entire memory array 10 can be reduced, whereby improved integration of the memory array 10 and thus reduced chip area of the MRAM device can be achieved.

First Modification of Third Embodiment

Figure 21:
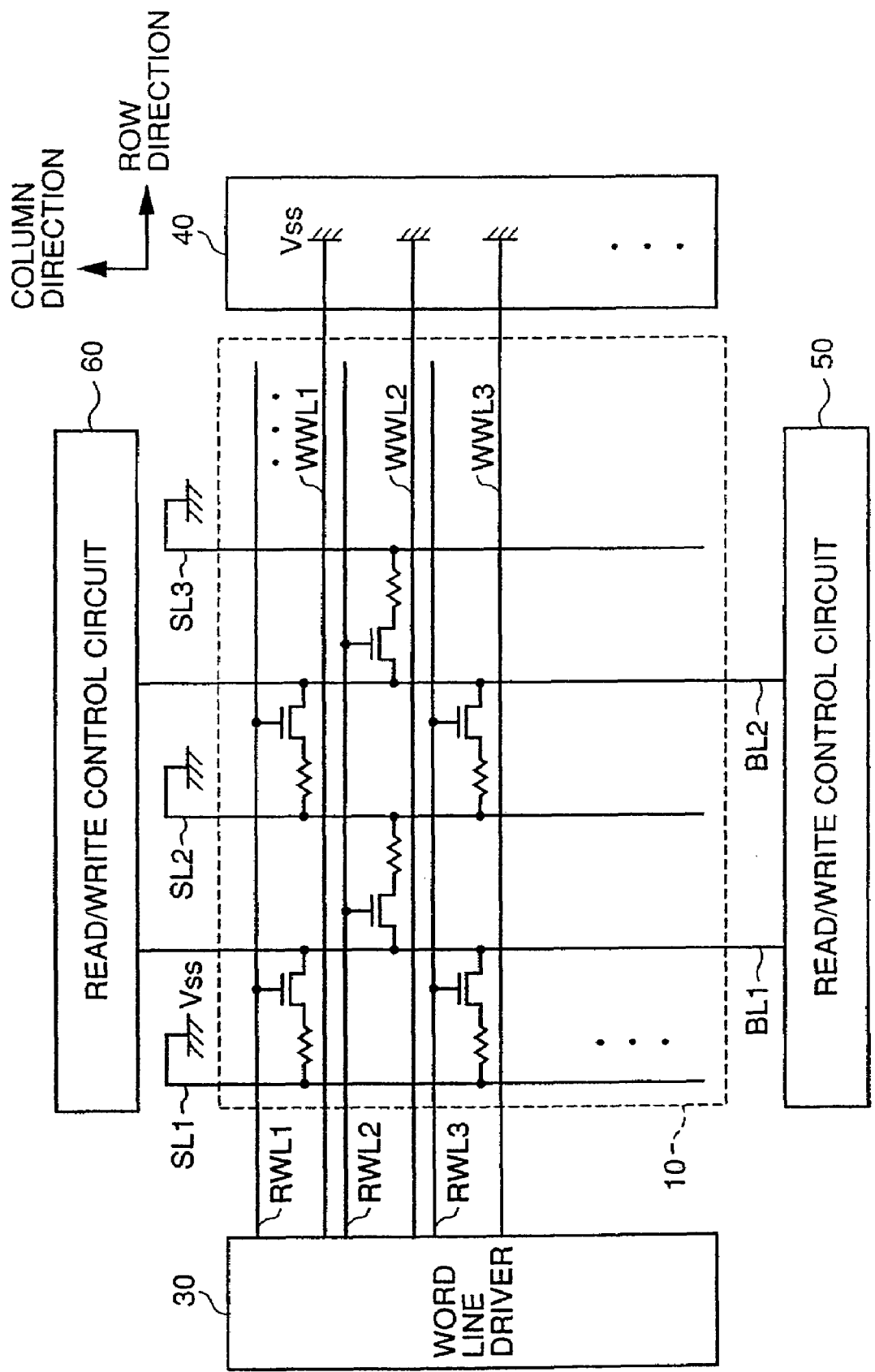
FIG. 21 is a block diagram showing the structure of a memory array according to a first modification of the third embodiment.

Referring to FIG. 21, in the memory array 10 according to the first modification of the third embodiment, adjacent memory cells in the row direction share the same bit line BL as in the case of FIG. 6. The reference voltage lines SL are provided corresponding to the respective memory cell columns.

Since the structure of the other portions and the memory cell operation in reading and writing the data are the same as those of the third embodiment, detailed description thereof will not be repeated.

With such a structure, the pitch of the bit lines BL in the memory array 10 can be widened also in the memory cell arrangement of the third embodiment capable of achieving a high-speed data read operation. As a result, the memory cells MC can be efficiently arranged, whereby improved integration of the memory array 10 as well as reduced chip area of the MRAM device can be achieved.

In the memory cell structure of the third embodiment, the distance between the bit line BL and magnetic tunnel junction MTJ is larger than that between the write word line WWL and magnetic tunnel junction MTJ. This requires a larger data write current to be supplied to the bit line BL. Accordingly, increased electromigration resistance of the bit lines BL is effective for improved reliability of the MRAM device.

More specifically, in the memory cell arrangement of the third embodiment, increased electromigration resistance of the bit line BL can be achieved by making the line width (cross-sectional area) of the bit line BL larger than that of the write word line WWL having a shorter distance to the magnetic tunnel junction. As a result, the reliability of the MRAM device can be improved. Regarding a material as well, it is desirable to form the bit line BL from a highly electromigration-resistant material.

Second Modification of Third Embodiment

Figure 22:
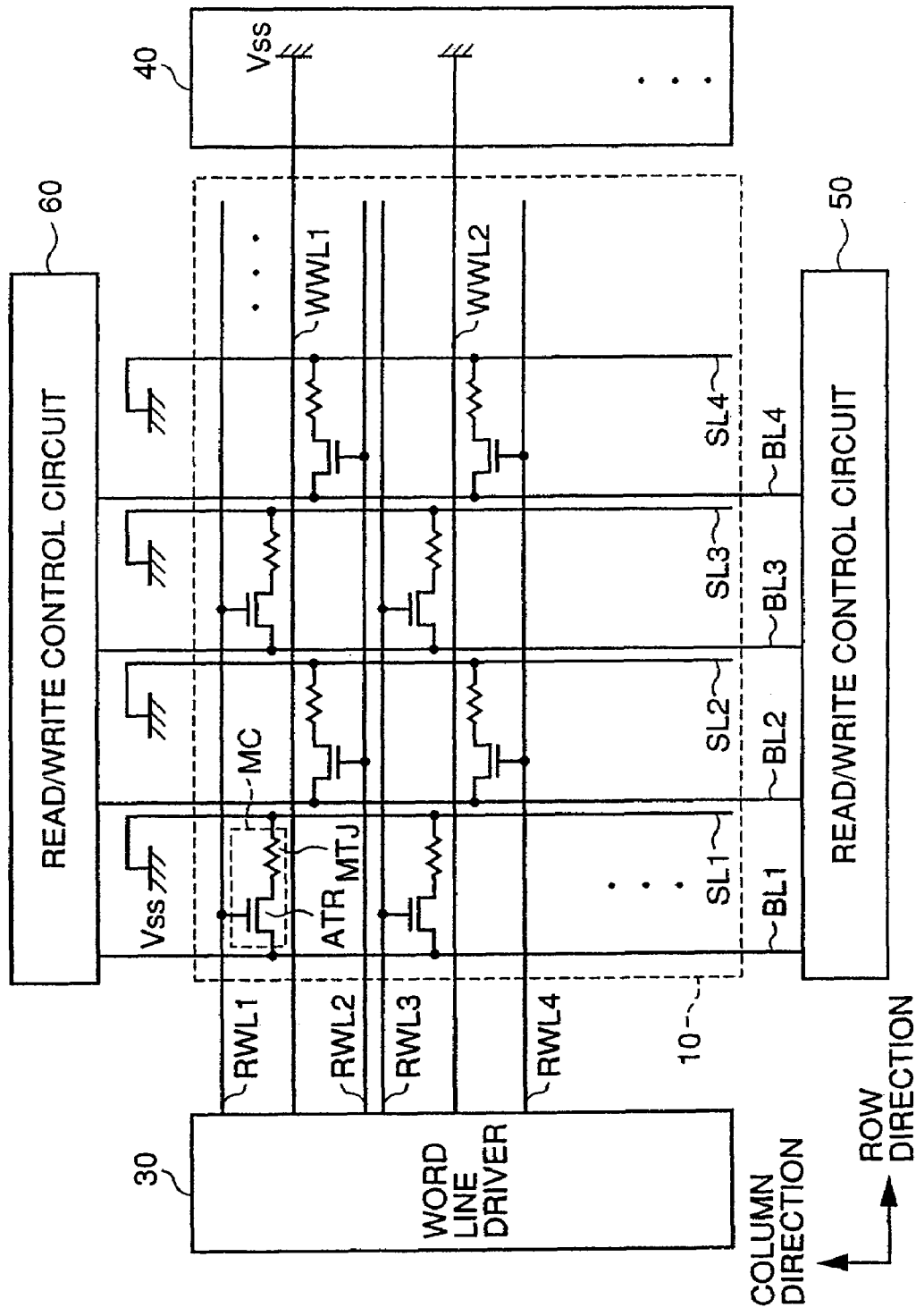
FIG. 22 is a block diagram showing the structure of a memory array according to a second modification of the third embodiment.

Referring to FIG. 22, in the memory array 10 according to the second modification of the third embodiment, adjacent memory cells in the column direction share the same write word line WWL as in the case of FIG. 7. The memory cells MC are arranged alternately for the same reason as that of FIG. 7. The reference voltage lines SL are provided corresponding to the respective memory cell columns in FIG. 22. However, adjacent memory cells in the row direction may alternatively share a single reference voltage line SL as in the structure of FIG. 20.

Since the structure of the other portions and the memory cell operation in reading and writing the data are the same as those of the third embodiment, detailed description thereof will not be repeated.

With such a structure, the pitch of the write word lines WWL in the memory array 10 can be widened also in the memory cell arrangement of the third embodiment. As a result, the memory cells MC can be efficiently arranged, whereby improved integration of the memory array 10 as well as reduced chip area of the MRAM device can be achieved.

Third Modification of Third Embodiment

Figure 23:
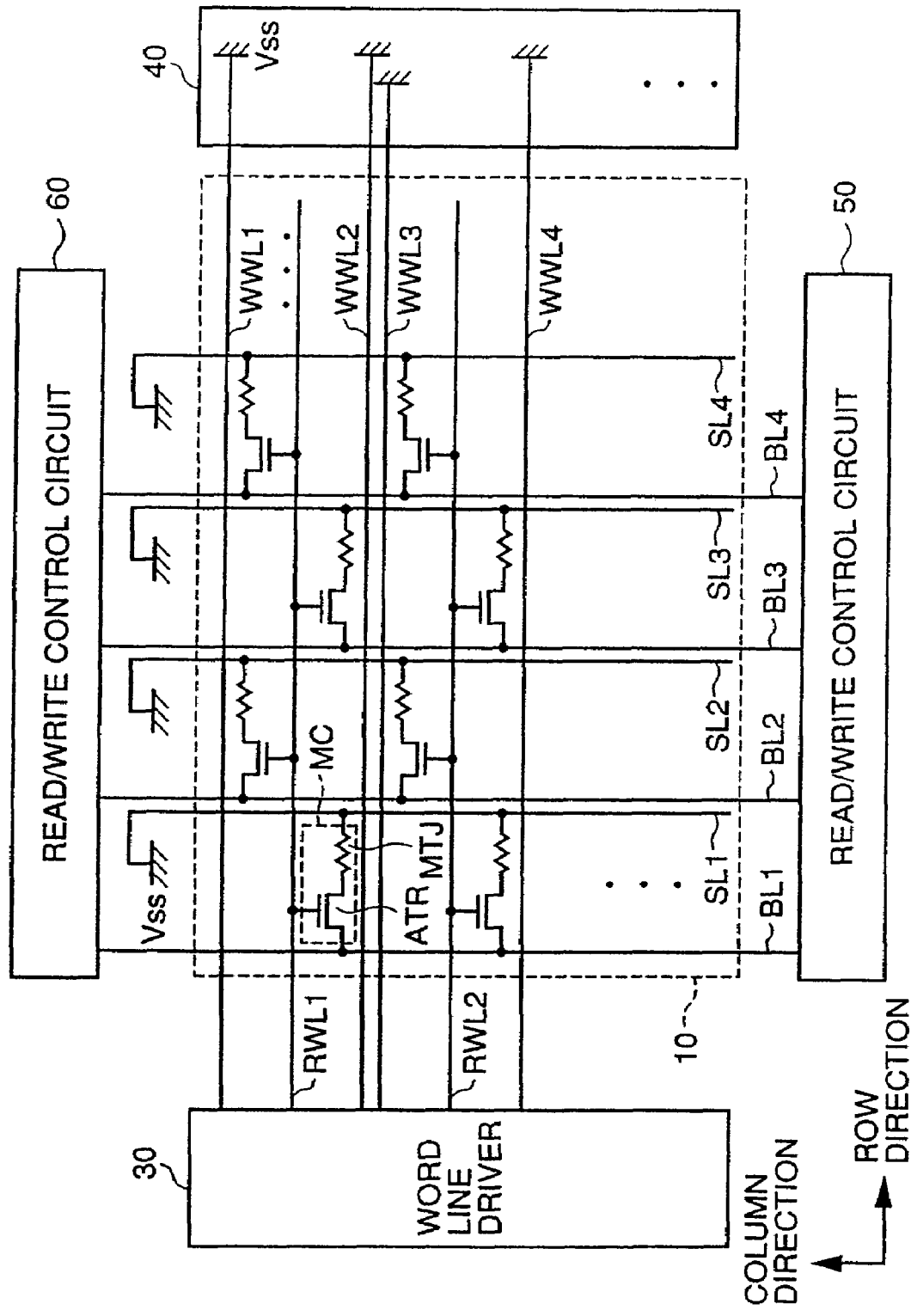
FIG. 23 is a block diagram showing the structure of a memory array according to a third modification of the third embodiment.

Referring to FIG. 23, in the memory array 10 according to the third modification of the third embodiment, adjacent memory cells in the column direction share the same read word line RWL as in the case of FIG. 9. The memory cells MC are arranged alternately for the same reason as that of FIG. 9. The reference voltage lines SL are provided corresponding to the respective memory cell columns in FIG. 23. However, every set of adjacent two memory cell columns may alternatively share a single reference voltage line SL as in the structure of FIG. 20.

Since the structure of the other portions and the memory cell operation in reading and writing the data are the same as those of the third embodiment, detailed description thereof will not be repeated.

With such a structure, the pitch of the read word lines WWL in the memory array 10 can be widened also in the memory cell arrangement of the third embodiment. As a result, the memory cells MC can be efficiently arranged, whereby improved integration of the memory array 10 as well as reduced chip area of the MRAM device can be achieved.

Fourth Modification of Third Embodiment

Figure 24:
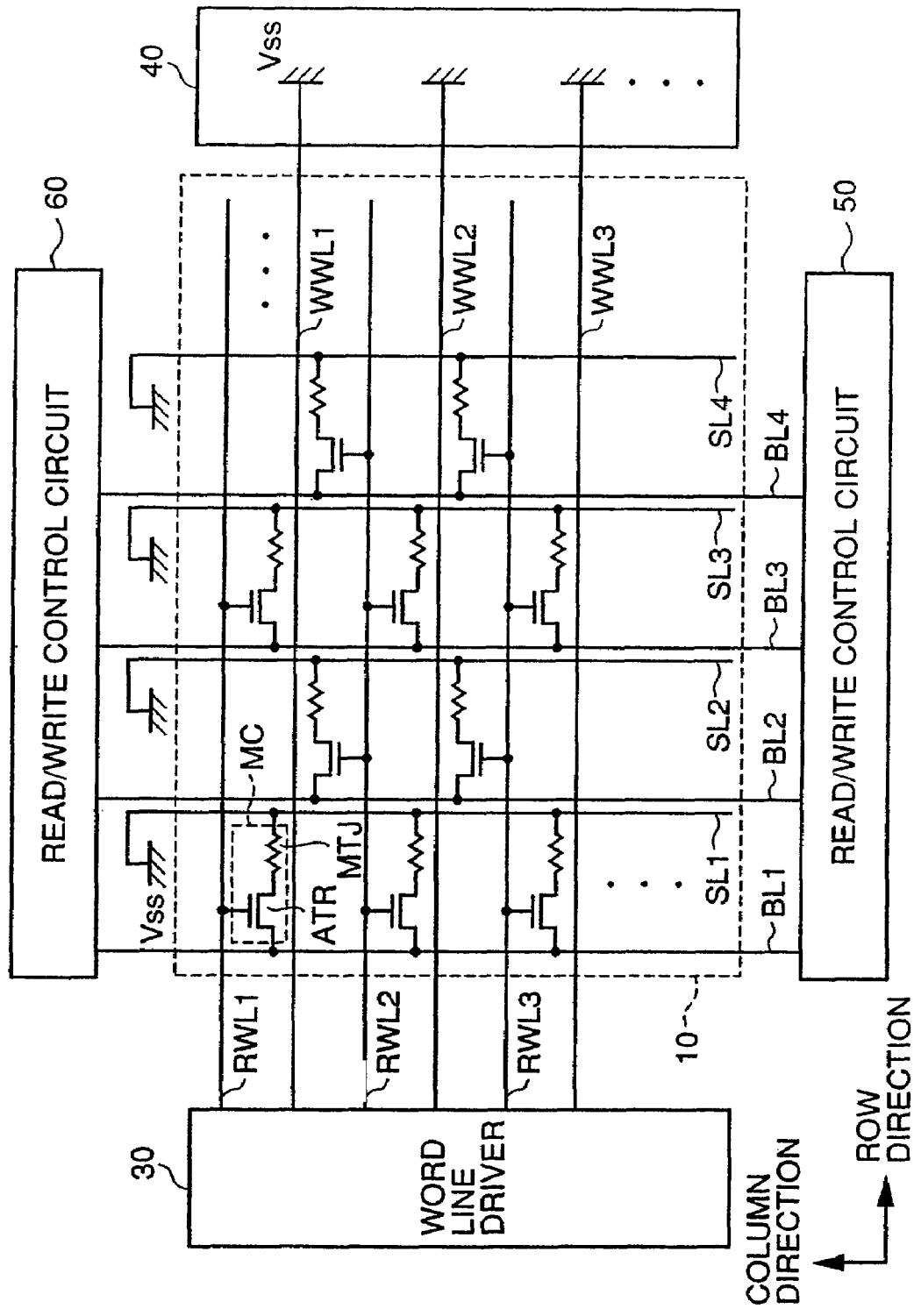
FIG. 24 is a block diagram showing the structure of a memory array according to a fourth modification of the third embodiment.

Referring to FIG. 24, in the memory array 10 according to the fourth modification of the third embodiment, adjacent memory cells in the column direction share the same write word line. WWL as in the second modification of the third embodiment. Moreover, the read word line RWL is also shared between adjacent memory cells in the column direction. For example, the memory cell group of the second and third memory cell rows shares the same read word line RWL2. In the following memory cell rows as well, the read word lines RWL and write word lines WWL are arranged similarly.

The memory cells MC are arranged alternately for the same reason as that of FIG. 10. The reference voltage lines SL are provided corresponding to the respective memory cell columns in FIG. 24. However, adjacent memory cells in the column direction may alternatively share a single reference voltage line SL as in the structure of FIG. 20.

Since the structure of the other portions and the memory cell operation in reading and writing the data are the same as those of the third embodiment, detailed description thereof will not be repeated.

With such a structure, the pitches of the write word lines WWL and read word lines RWL in the memory array 10 can be widened also in the memory cell arrangement of the third embodiment. As a result, the memory cells MC can be efficiently arranged, whereby further improved integration of the memory array 10 as well as further reduced chip area of the MRAM device can be achieved as compared to the second and third modifications of the third embodiment.

Fifth Modification of Third Embodiment

Figure 25:
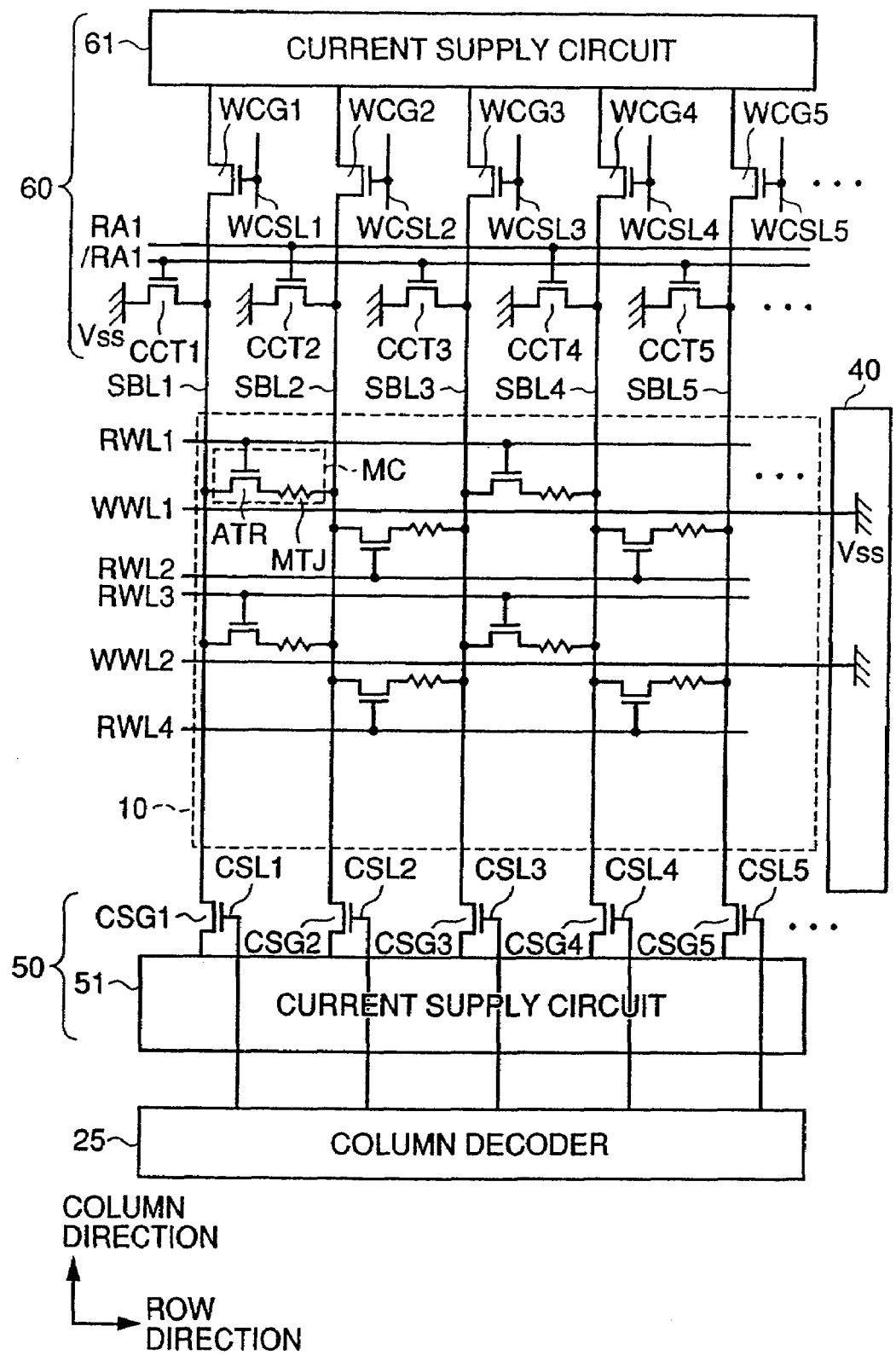
FIG. 25 is a block diagram showing the structure of a memory array and its peripheral circuitry according to a fifth modification of the third embodiment.

Referring to FIG. 25, the structure of the memory array 10 and peripheral circuitry according to the fifth modification of the third embodiment is similar to that of the fifth modification of the first embodiment shown in FIG. 11.

In the memory cell of the third embodiment, it is required in the data read operation that the common line SBL coupled to the access transistor ATR functions as bit line BL and the common line SBL coupled to the magnetic tunnel junction MTJ functions as reference voltage line SL. This is opposite to the function of the common line. SBL in the fifth modification of the first embodiment.

More specifically, it is required that turning ON/OFF of the common line control transistor CCT according to the row selection result is conducted in the manner opposite to that of the fifth modification of the first embodiment. Accordingly, in the fifth modification of the third embodiment, a control signal /RA1 is applied to the gates of the common line control transistors CCT1, CCT3, . . . corresponding to the odd memory cell columns. A control signal RA1 is applied to the gates of the common line control transistors CCT2, CCT4, . . . corresponding to the even memory cell columns. The control signals RA1 and /RA1 are set in the same manner as that of the fifth modification of the first embodiment.

Since the fifth modification of the third embodiment is the same as the fifth modification of the first embodiment except for control of the common line control transistors CCT, detailed description thereof will not be repeated.

With such a structure, in the memory cell arrangement of the third embodiment as well, the same data read and write operations as those of the first embodiment can be conducted using the common line SBL integrating the respective functions of reference voltage line SL and bit line BL.

As a result, the pitch of signal lines in the column direction can be widened. Thus, the memory cells MC can be arranged efficiently, so that improved integration of the memory array 10 can be achieved. Moreover, increased electromigration resistance of the common line SBL can be achieved by ensuring a sufficient line width, i.e., cross-sectional area, of the common line SBL that receives a large data write current in the data write operation. As a result, the reliability of the MRAM device can be improved.

Moreover, in FIG. 25, adjacent memory cells in the column direction share a single write word line WWL as in the second modification of the third embodiment.

Accordingly, the pitch of the write word lines WWL in the memory array 10 can be widened. As a result, further improved integration of the memory array 10 as well as reduced chip area of the MRAM device can be achieved.

Note that such integration of reference voltage line SL and bit line BL into common line SBL as shown in this modification may also be applied in combination with either sharing of the read word line RWL between adjacent memory cell rows or sharing of both read word line RWL and write word line WWL between adjacent memory rows as respectively described in the third and fourth modifications of the third embodiment.

Sixth Modification of Third Embodiment

Figure 26:
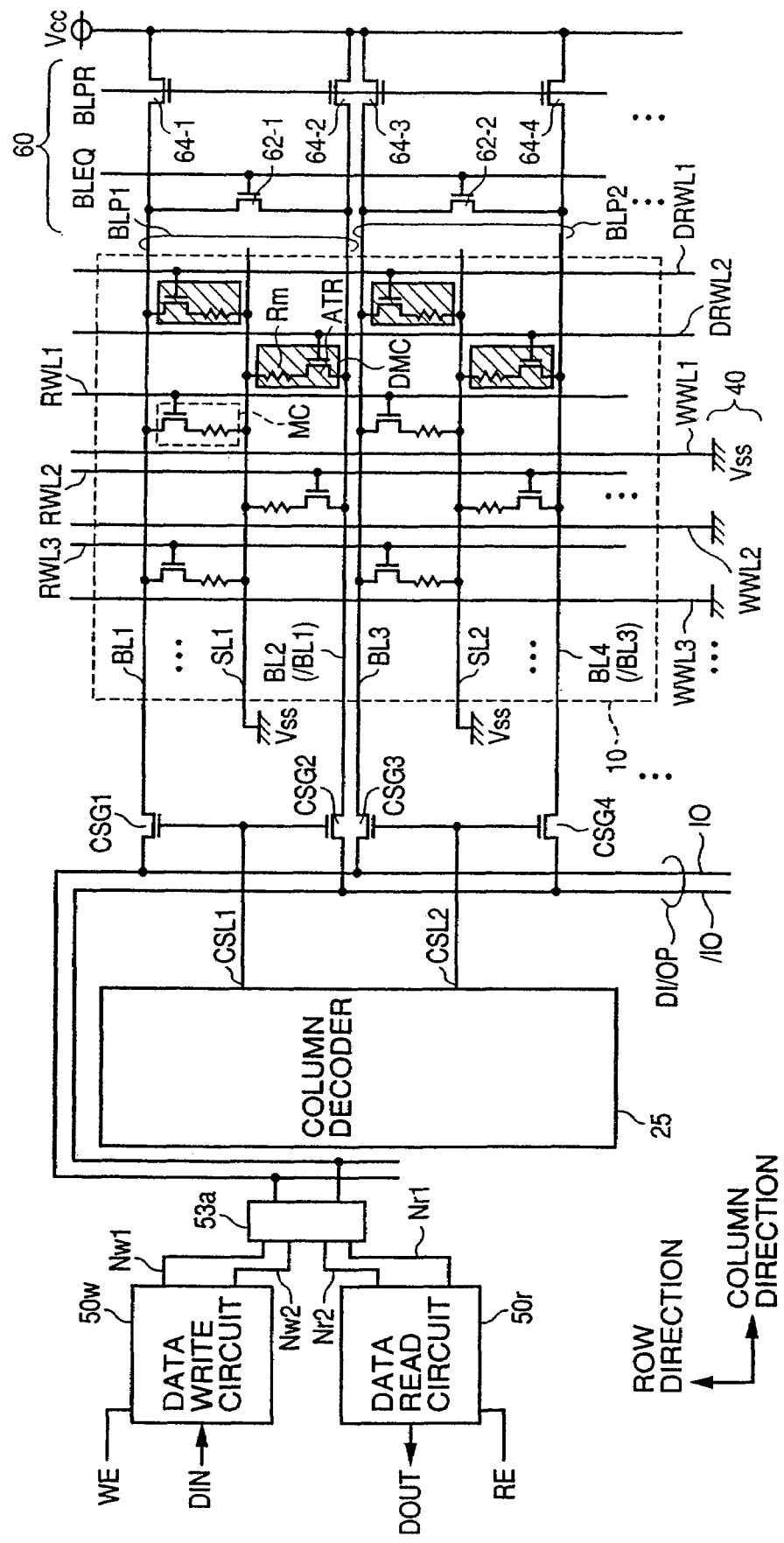
FIG. 26 is a block diagram showing the structure of a memory array and its peripheral circuitry according to a sixth modification of the third embodiment.

Referring to FIG. 26, in the memory cells of the third embodiment arranged in rows and columns, the folded bit line structure is applied using two bit lines of each set of adjacent two memory cell columns, as in the case of the second embodiment.

The structure of FIG. 26 is different from that of FIG. 13 in that, in each memory cell MC, the access transistor ATR is connected to the bit line and the magnetic tunnel junction MTJ is connected to the reference voltage line SL.

Since the structure of the other portions and the operation in reading and writing the data are the same as those of FIG. 13, detailed description thereof will not be repeated.

Accordingly, in the memory cell arrangement of the third embodiment as well, the read and write operation margins can be ensured by the folded bit line structure. Moreover, like the second embodiment, the structure of the peripheral circuitry can be simplified as well as the data write noise can be reduced.

Seventh Modification of Third Embodiment

In the seventh modification of the third embodiment, the write word line WWL is shared between adjacent memory cell rows, in addition to the folded bit line structure of the sixth modification of the third embodiment.

Figure 27:
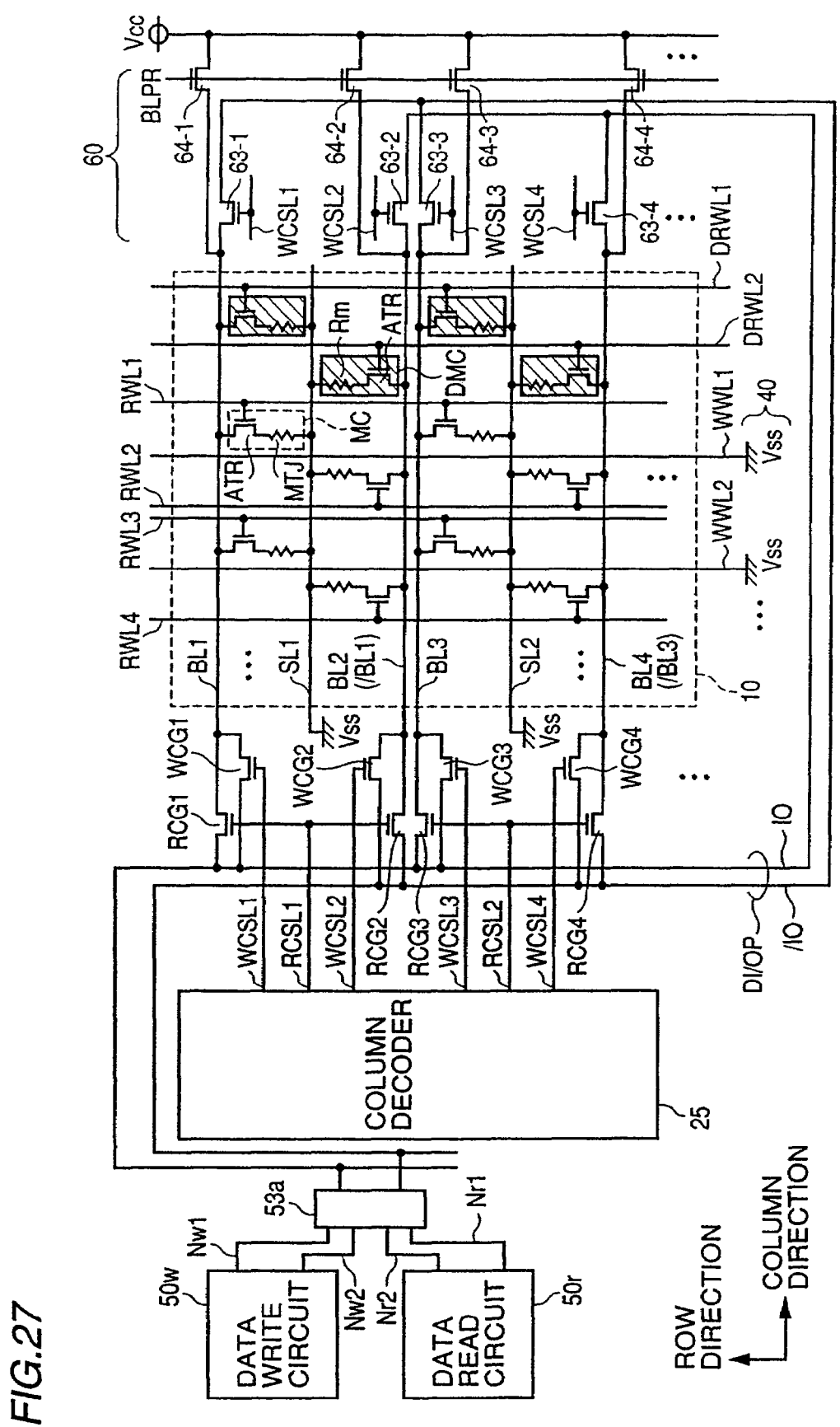
FIG. 27 is a block diagram showing the structure of a memory array and its peripheral circuitry according to a seventh modification of the third embodiment.

The structure of FIG. 27 is different from that of FIG. 15 in that, in each memory cell MC, the access transistor ATR is connected to the bit line BL and the magnetic tunnel junction MTJ is connected to the reference voltage line SL.

Since the structure of the other portions and the operation in reading and writing the data are the same as those of FIG. 15, detailed description thereof will not be repeated.

Accordingly, in the memory cell arrangement of the third embodiment as well, the data read operation based on the folded bit line structure ensures the operation margin. At the same time, sharing the write word lines achieves improved integration of the memory array 10.

Eighth Modification of Third Embodiment

In the eighth modification of the third embodiment, the read word line RWL is shared between adjacent memory cell rows, in addition to the folded bit line structure of the sixth modification of the third embodiment.

Figure 28:
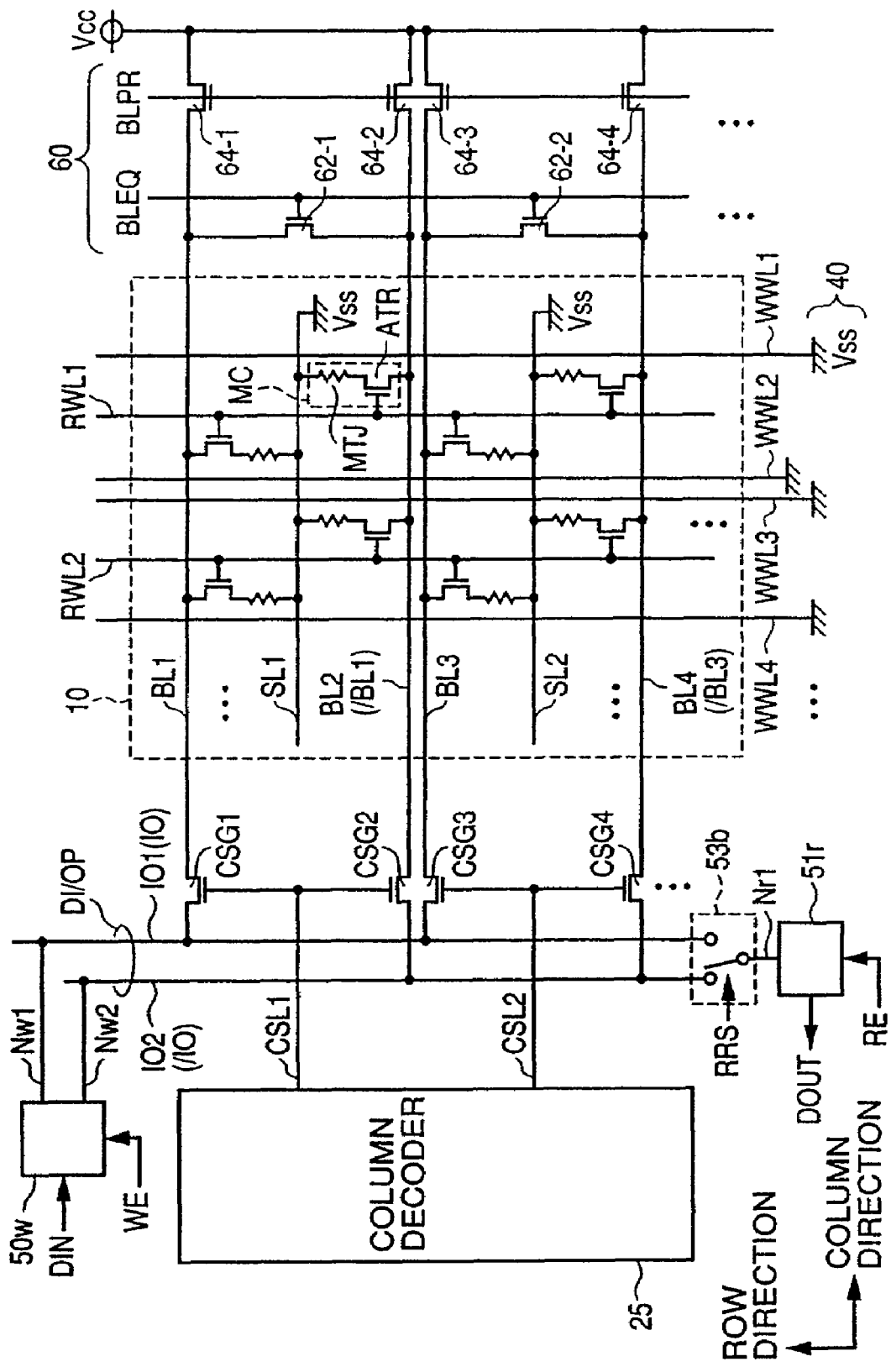
FIG. 28 is a block diagram showing the structure of a memory array and its peripheral circuitry according to an eighth modification of the third embodiment.

The structure of FIG. 28 is different from that of FIG. 16 in that, in each memory cell MC, the access transistor ATR is connected to the bit line BL and the magnetic tunnel junction MTJ is connected to the reference voltage line SL.

Since the structure of the other portions and the operation in reading and writing the data are the same as those of FIG. 16, detailed description thereof will not be repeated.

Accordingly, in the memory cell arrangement of the third embodiment as well, the data write operation based on the folded bit line structure ensures the operation margin, simplifies the structure of the peripheral circuitry and reduces the data write noise. At the same time, sharing the read word lines achieves improved integration of the memory array 10.

Fourth Embodiment

Figure 29:
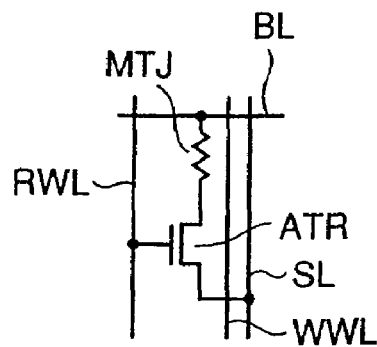
FIG. 29 is a circuit diagram showing the connection between a memory cell and signal wirings according to a fourth embodiment.

Referring to FIG. 29, a read word line RWL, write word line WWL, bit line BL and reference voltage line SL are provided for the memory cell of the fourth embodiment.

The access transistor ATR is electrically coupled between the magnetic tunnel junction MTJ and the reference voltage line SL for supplying the ground voltage Vss. The access transistor ATR has its gate coupled to the read word line RWL. The magnetic tunnel junction MTJ is coupled to the bit line BL.

The read word line RWL extends in the memory cell row direction. The write word line WWL extending in parallel with the read word line RWL is provided near the magnetic tunnel junction MTJ. The reference voltage line SL extends in parallel with the write word line WWL and read word line RWL.

The memory cell of the fourth embodiment is different from that of the first embodiment only in that the reference voltage line SL extends in the row direction, i.e., in parallel with the read word line RWL and write word line WWL. Accordingly, the kinds of signal lines are the same as those of the first embodiment, and each signal line has the same voltage and current waveform as those of the first embodiment in the data read and write operations. Therefore, detailed description thereof will not be repeated.

Figure 30:
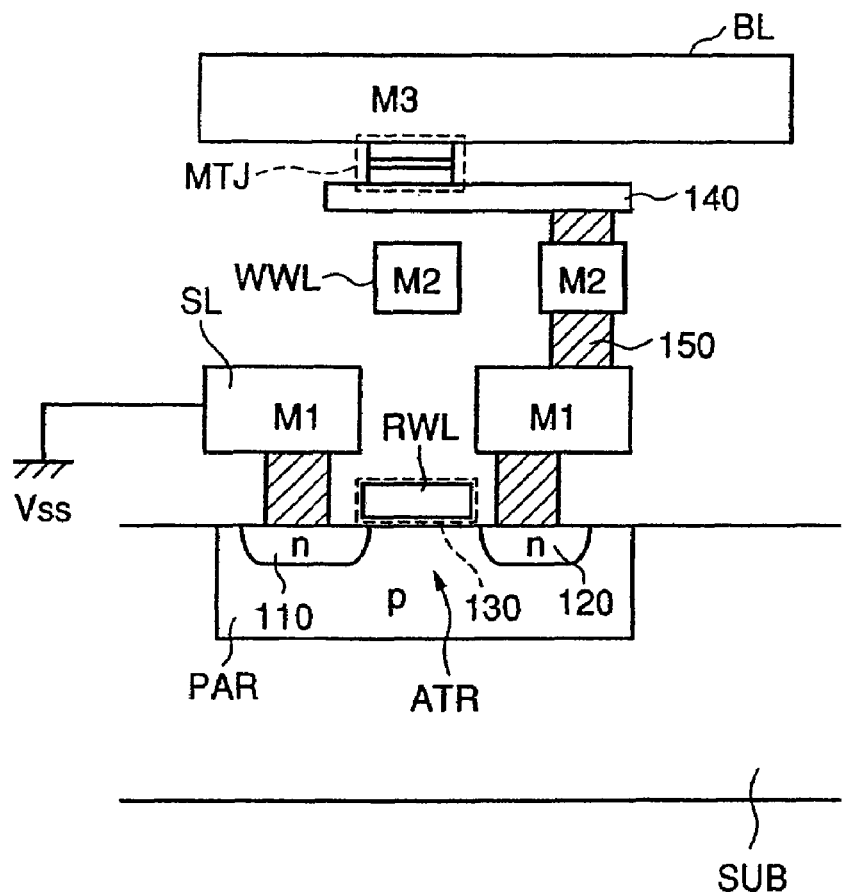
FIG. 30 is a structural diagram illustrating the arrangement of the memory cell according to the fourth embodiment.

Referring to FIG. 30, the access transistor ATR is formed in a p-type region PAR of a semiconductor main substrate SUB. The reference voltage line SL is formed in a first metal wiring layer M1 so as to be electrically coupled to one source/drain region 110 of the access transistor ATR. The reference voltage line SL is coupled to a node for supplying the ground voltage Vss among the nodes on the semiconductor substrate.

The other source/drain region 120 is coupled to the magnetic tunnel junction MTJ through the metal wirings respectively provided in the first and second metal wiring layers M1 and M2, a metal film 150 formed in a contact hole, and a banner metal 140. The w word line WWL is provided in the second metal wiring layer M2 near the magnetic tunnel junction MTJ. The read word line RWL is provided in the same layer as that of the gate 130 of the access transistor ATR.

The bit line BL is provided in an independent metal wiring layer, i.e., a third metal wiring layer M3, so as to be electrically coupled to the magnetic tunnel junction MTJ.

Figure 31:
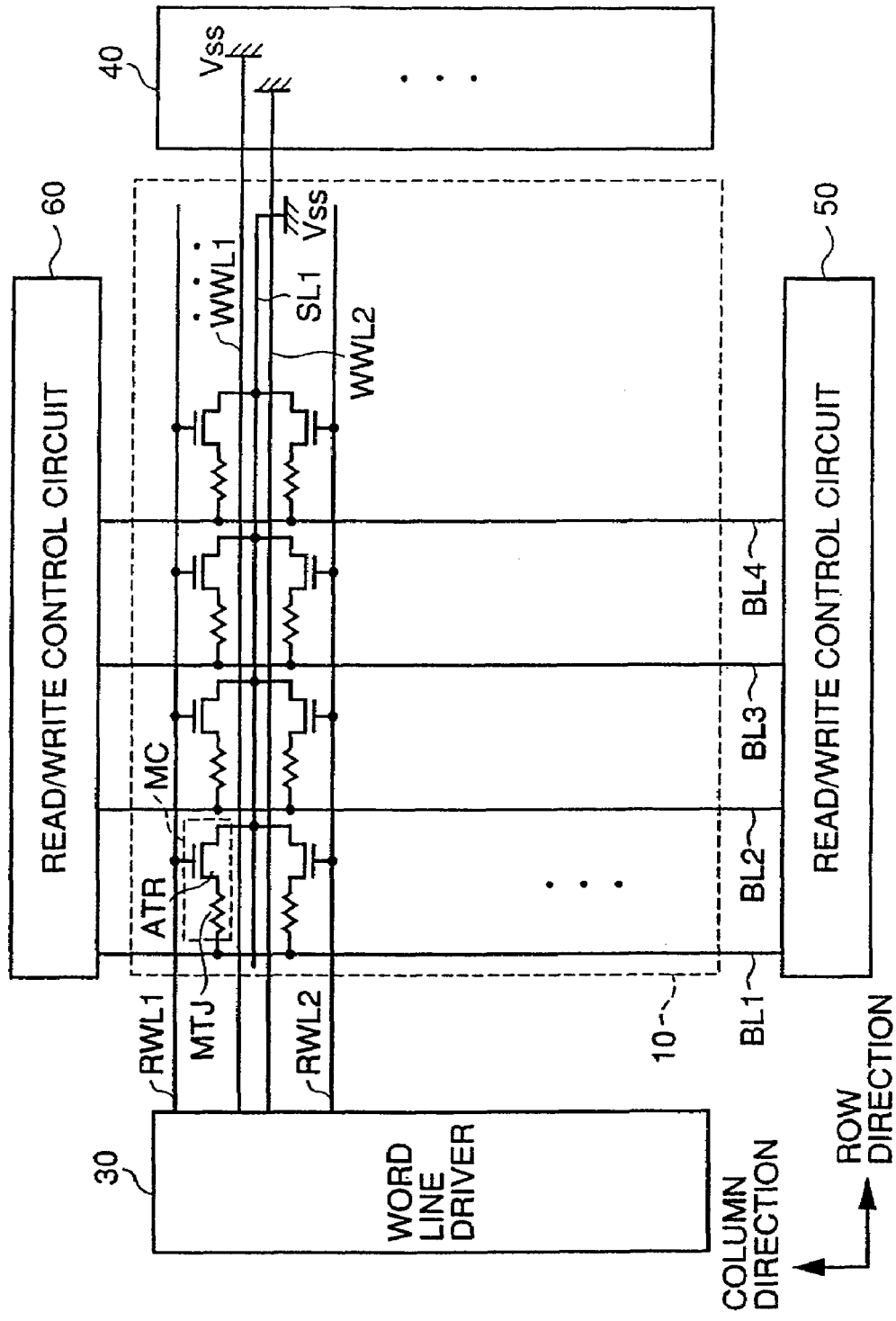
FIG. 31 is a block diagram showing the structure of a memory array according to the fourth embodiment.

Referring to FIG. 31, in the memory array 10, the memory cells MC having the structure of FIG. 29 are arranged in rows and columns. Adjacent memory cells in the column direction share the same reference voltage line SL. For example, the memory cell group of the first and second memory cell rows shares a single reference voltage line SL1. In the other memory cell columns as well, the reference voltage lines SL are arranged similarly. Basically, the reference voltage lines SL supply a constant voltage (ground voltage Vss in the present embodiment). Therefore, the reference voltage lines BL can be shared as such without any special voltage control or the like.

The arrangement of the read word lines RWL, write word lines WWL and bit lines BL as well as the structure of the word line current control circuit 40 are the same as those of FIG. 5. Therefore, description thereof will not be repeated.

Thus, even in the memory cell arrangement of the fourth embodiment, i.e., the memory cell arrangement having the reference voltage lines SL extending in the row direction, the reference voltage line SL can be shared by a plurality of memory cells. Thus, the number of wirings in the entire memory array 10 can be reduced, whereby improved integration of the memory array 10 as well as reduced chip area of the MRAM device can be achieved.

First Modification of Fourth Embodiment

Figure 32:
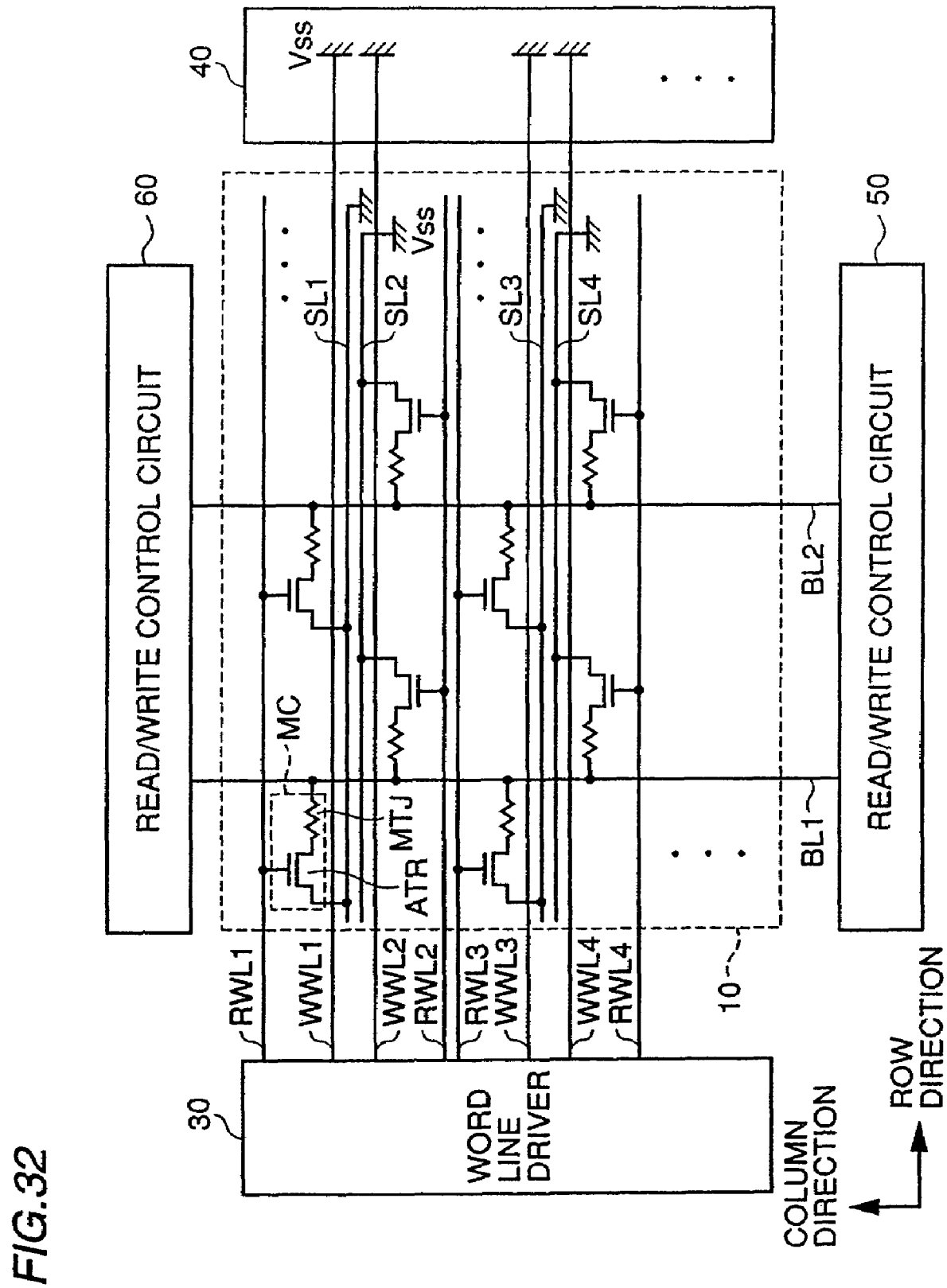
FIG. 32 is a block diagram showing the structure of a memory array according to a first modification of the fourth embodiment.

Referring to FIG. 32, in the memory array 10 according to the first modification of the fourth embodiment, adjacent memory cells in the row direction share the same bit line BL. For example, the memory cell group of the first and second memory cell columns shares the same bit line BL1. The reference voltage lines SL are provided corresponding to the respective memory cell columns.

Since the structure of the other portions and the memory cell operation in reading and writing the data are the same as those of the fourth embodiment, detailed description thereof will not be repeated.

With such a structure, the pitch of the bit lines BL in the memory array 10 can be widened also in the memory cell arrangement of the fourth embodiment. As a result, the memory cells MC can be efficiently arranged, whereby improved integration of the memory array 10 as well as reduced chip area of the MRAM device can be achieved.

Second Modification of Fourth Embodiment

Figure 33:
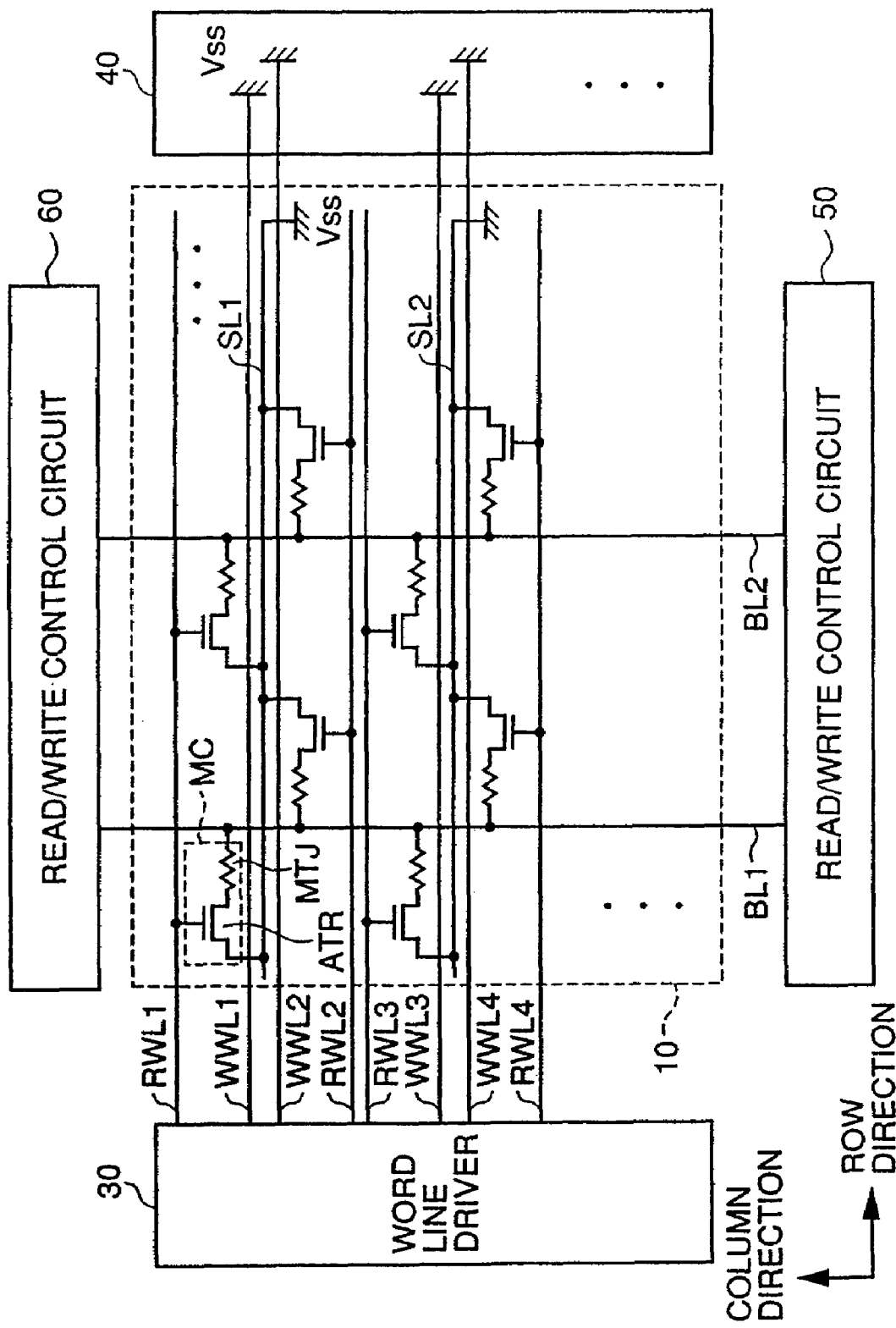
FIG. 33 is a block diagram showing the structure of a memory array according to a second modification of the fourth embodiment.

Referring to FIG. 33, in the memory array 10 according to the second modification of the fourth embodiment, both the reference voltage line SL and bit line BL are shared. The reference voltage line SL is shared between adjacent memory cells in the column direction as in the case of FIG. 31, whereas the bit line BL is shared between adjacent memory cells in the row direction as in the case of FIG. 32.

With such a structure, the respective numbers of wirings in the row and column directions can be reduced, whereby further improved integration of the memory array 10 as well as further reduced chip area of the MRAM device can be achieved.

Third Modification of Fourth Embodiment

Figure 34:
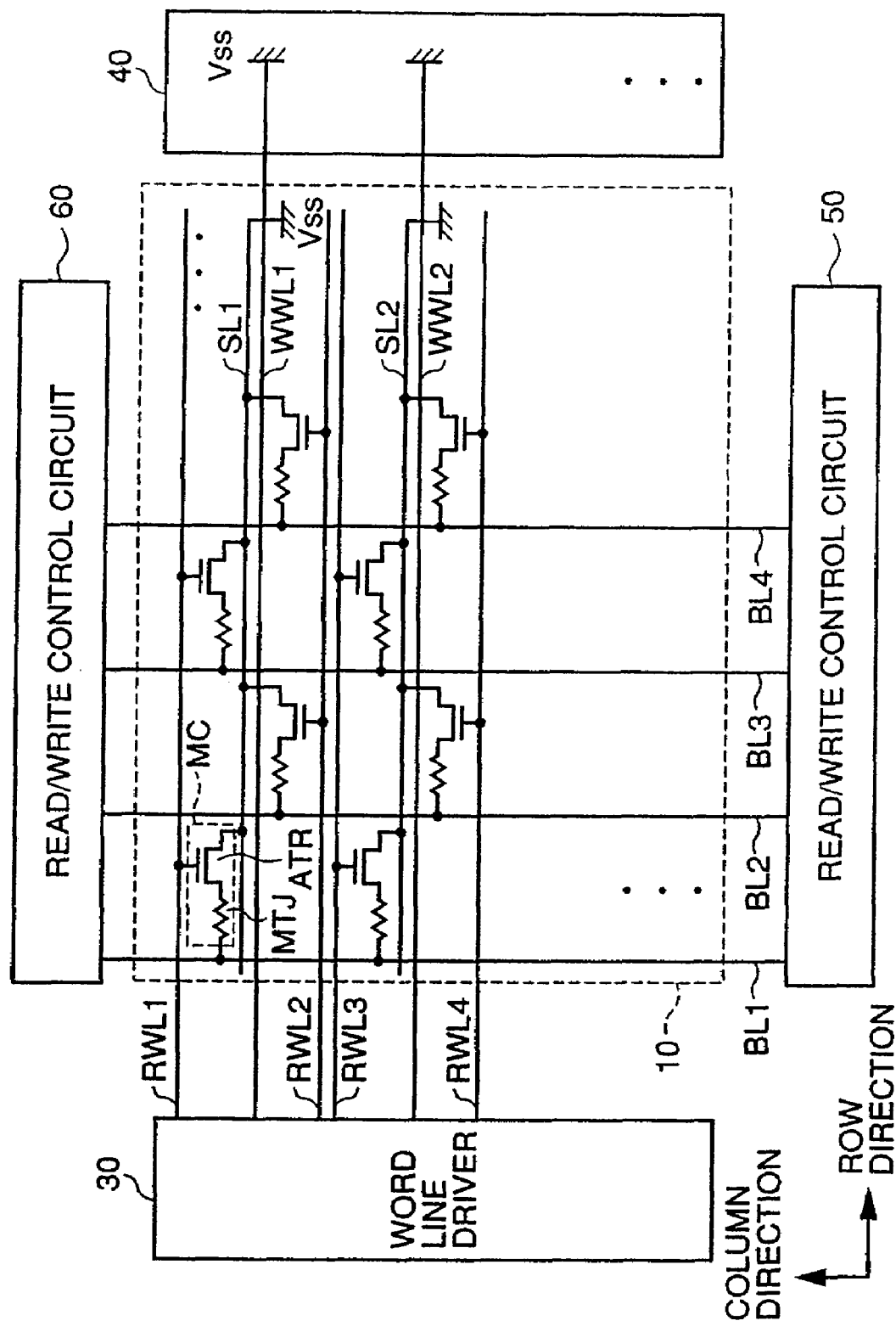
FIG. 34 is a block diagram showing the structure of a memory array according to a third modification of the fourth embodiment.

Referring to FIG. 34, in the memory array 10 according to the third modification of the fourth embodiment, adjacent memory cells in the column direction share the same write word line WWL, in addition to the structure of FIG. 31 in which the reference voltage line SL is shared. The memory cells MC are arranged alternately for the same reason as that of FIG. 7.

Since the structure of the other portions and the memory cell operation in reading and writing the data are the same as those of the fourth embodiment, detailed description thereof will not be repeated.

With such a structure, the pitch of the write word lines WWL in the memory array 10 can be widened also in the memory cell arrangement of the fourth embodiment. As a result, the memory cells MC can be efficiently arranged, whereby improved integration of the memory array 10 as well as reduced chip area of the MRAM device can be achieved.

In the memory cell structure of the fourth embodiment, the write word line WWL has a larger distance to the magnetic tunnel junction MTJ. This requires a large data write current to be applied to the write word line WWL as in the case of the memory cell of the first embodiment.

With such reduction in limitations on pitch of the write word lines WWL, a sufficient cross-sectional area of the write word line WWL is ensured, so that the current density thereof is reduced. As a result, electromigration resistance thereof is increased, whereby improved reliability of the MRAM device can be achieved. Regarding a material as well, it is desirable to form the write word line WWL from a material having higher electromigration resistance than that of the bit line BL.

Fourth Modification of Fourth Embodiment

Figure 35:
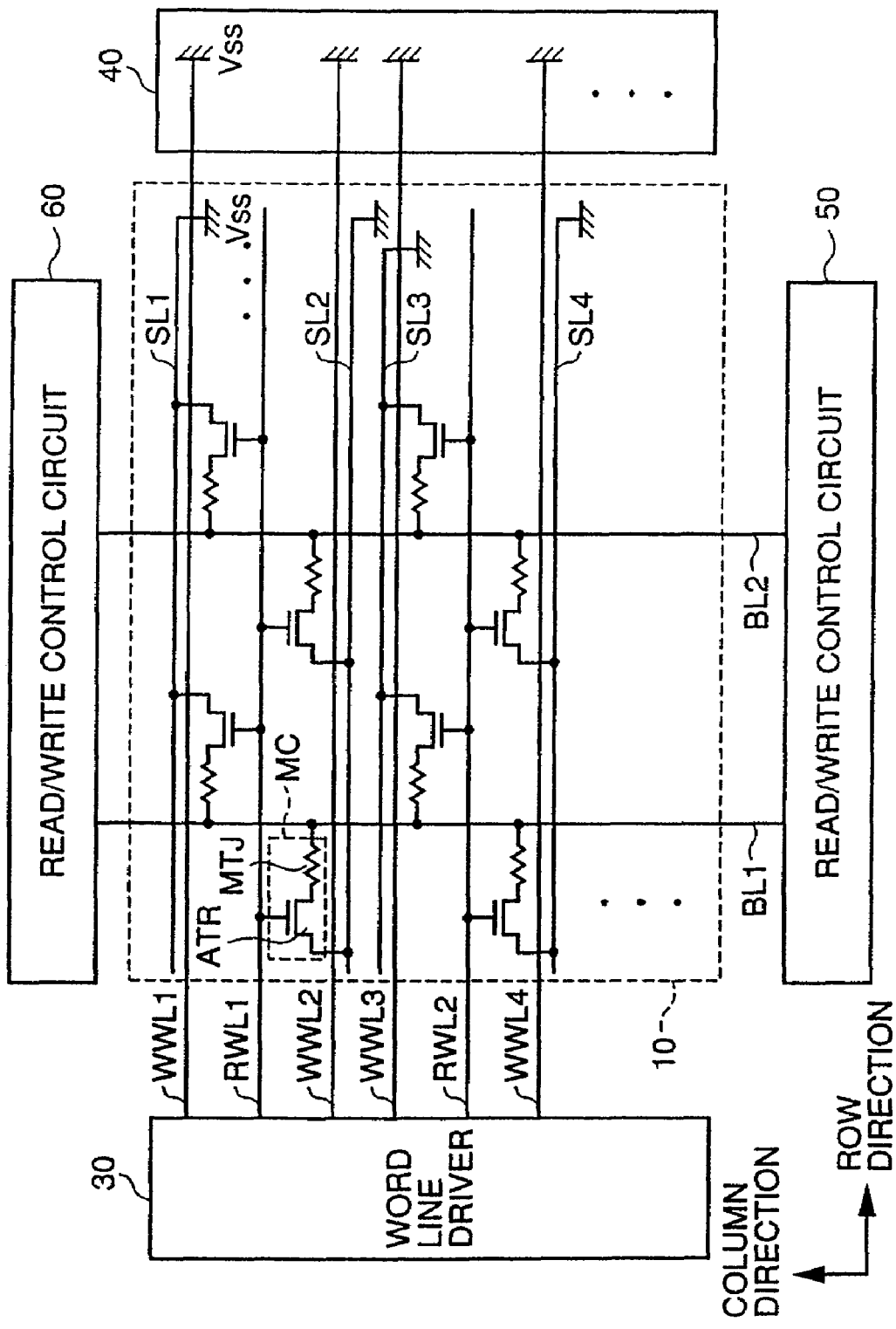
FIG. 35 is a block diagram showing the structure of a memory array according to a fourth modification of the fourth embodiment.

Referring to FIG. 35, in the memory array 10 according to the fourth modification of the fourth embodiment, adjacent memory cells in the column direction share the same read word line RWL, in addition to the structure of FIG. 33 in which the reference voltage line SL and bit line BL are shared. For example, the memory cell group of the first and second memory cell rows shares the same read word line RWL1. The memory cells MC are arranged alternately for the same reason as that of FIG. 9.

Since the structure of the other portions and the memory cell operation in reading and writing the data are the same as those of the fourth embodiment, detailed description thereof will not be repeated.

With such a structure, the pitch of the read word lines RWL in the memory array 10 can be widened also in the memory cell arrangement of the fourth embodiment. As a result, the memory cells MC can be efficiently arranged, whereby improved integration of the memory array 10 as well as reduced chip area of the MRAM device can be achieved.

Fifth Modification of Fourth Embodiment

Figure 36:
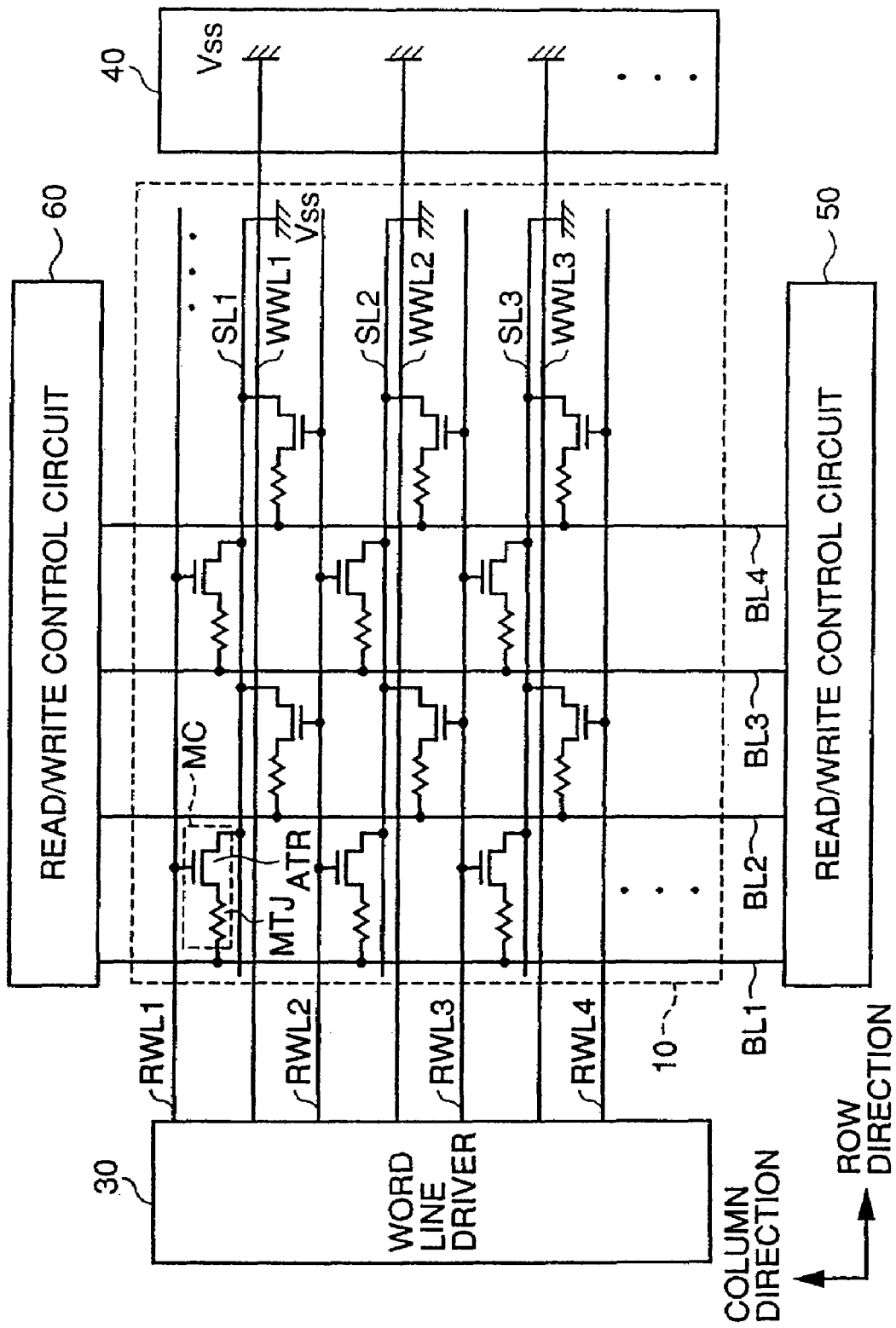
FIG. 36 is a block diagram showing the structure of a memory array according to a fifth modification of the fourth embodiment.

Referring to FIG. 36, in the memory array 10 according to the fifth modification of the fourth embodiment, adjacent memory cells in the column direction share the same write word line WWL and the same reference voltage line SL, as in the third modification of the fourth embodiment.

In the fifth modification of the fourth embodiment, the read word line RWL is also shared between adjacent memory cells in the column direction. For example, the memory cell group of the second and third memory cell rows shares the same read word line RWL2. In the following memory cell rows as well, the write word lines WWL and read word lines RWL are arranged similarly.

The memory cells MC are arranged alternately for the same reason as that of FIG. 10. Like the write word line WWL, the reference voltage line SL is also shared between adjacent memory cells in the column direction.

Since the structure of the other portions and the memory cell operation in reading and writing the data are the same as those of the fourth embodiment, detailed description thereof will not be repeated.

With such a structure, the pitches of the write word lines WWL and read word lines RWL in the memory array 10 can be widened also in the memory cell arrangement of the fourth embodiment. As a result, the memory cells MC can be arranged more efficiently, whereby further improved integration of the memory array 10 as well as further reduced chip area of the MRAM device can be achieved as compared to the third and fourth modifications of the fourth embodiment.

Sixth Modification of Fourth Embodiment

Figure 37:
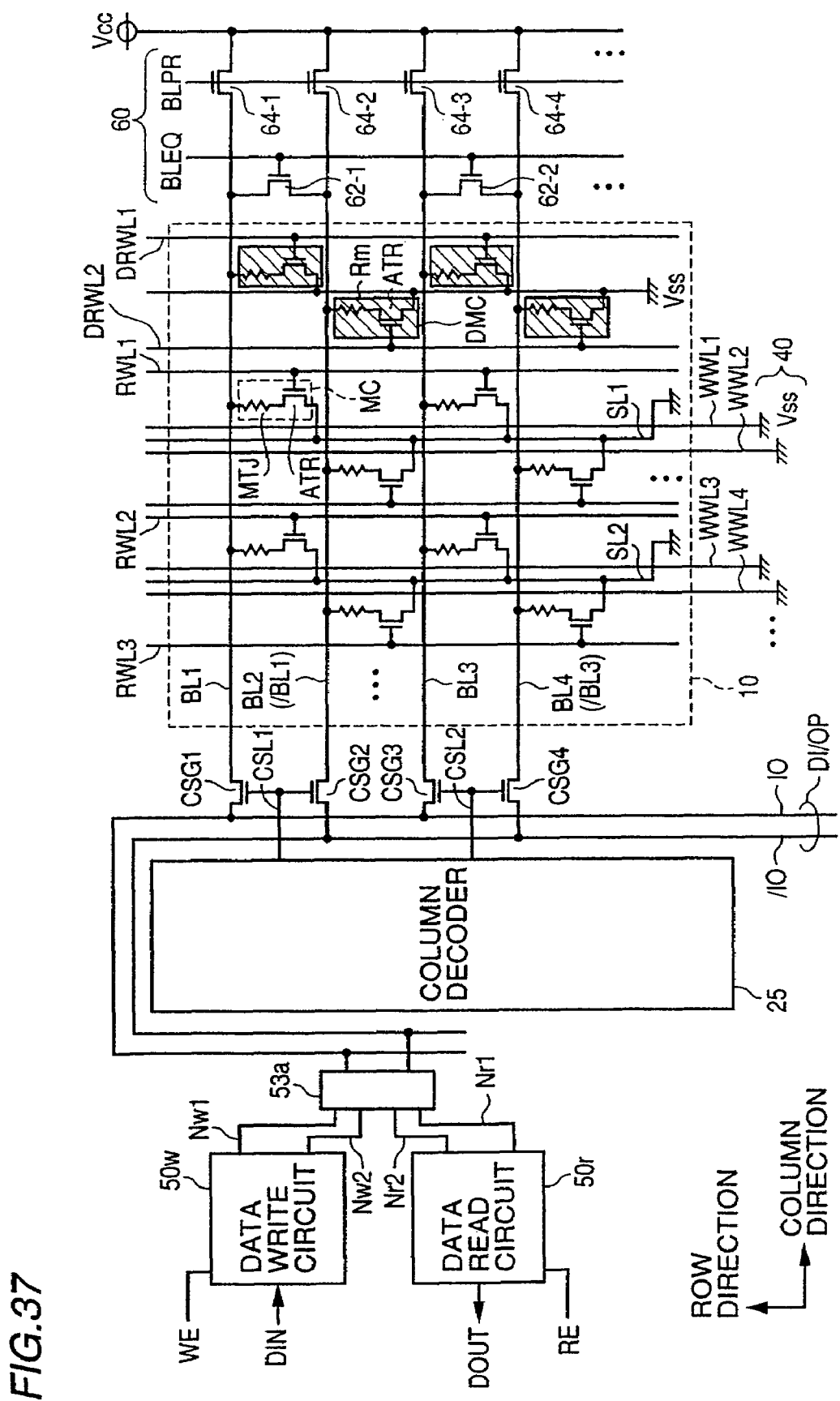
FIG. 37 is a block diagram showing the structure of a memory array and its peripheral circuitry according to a sixth modification of the fourth embodiment.

Referring to FIG. 37, in the memory cells of the fourth embodiment arranged in rows and columns, the folded bit line structure is applied using two bit lines of each set of adjacent two memory cell columns, as in the case of the second embodiment.

The structure of FIG. 37 is different from that of FIG. 13 in that the reference voltage lines SL extend in the row direction.

Since the structure of the other portions and the operation in reading and writing the data are the same as those of FIG. 13, detailed description thereof will not be repeated.

Accordingly, in the memory cell arrangement of the fourth embodiment as well, the read and write operation margins can be ensured by the folded bit line structure. Moreover, like the second embodiment, the structure of the peripheral circuitry including data write circuit 50*w* and read/write control circuit 60 can be simplified as well as the data write noise can be reduced.

Seventh Modification of Fourth Embodiment

In the seventh modification of the fourth embodiment, the write word line WWL is shared between adjacent memory cell rows, in addition to the folded bit line structure of the sixth modification of the third embodiment.

Figure 38:
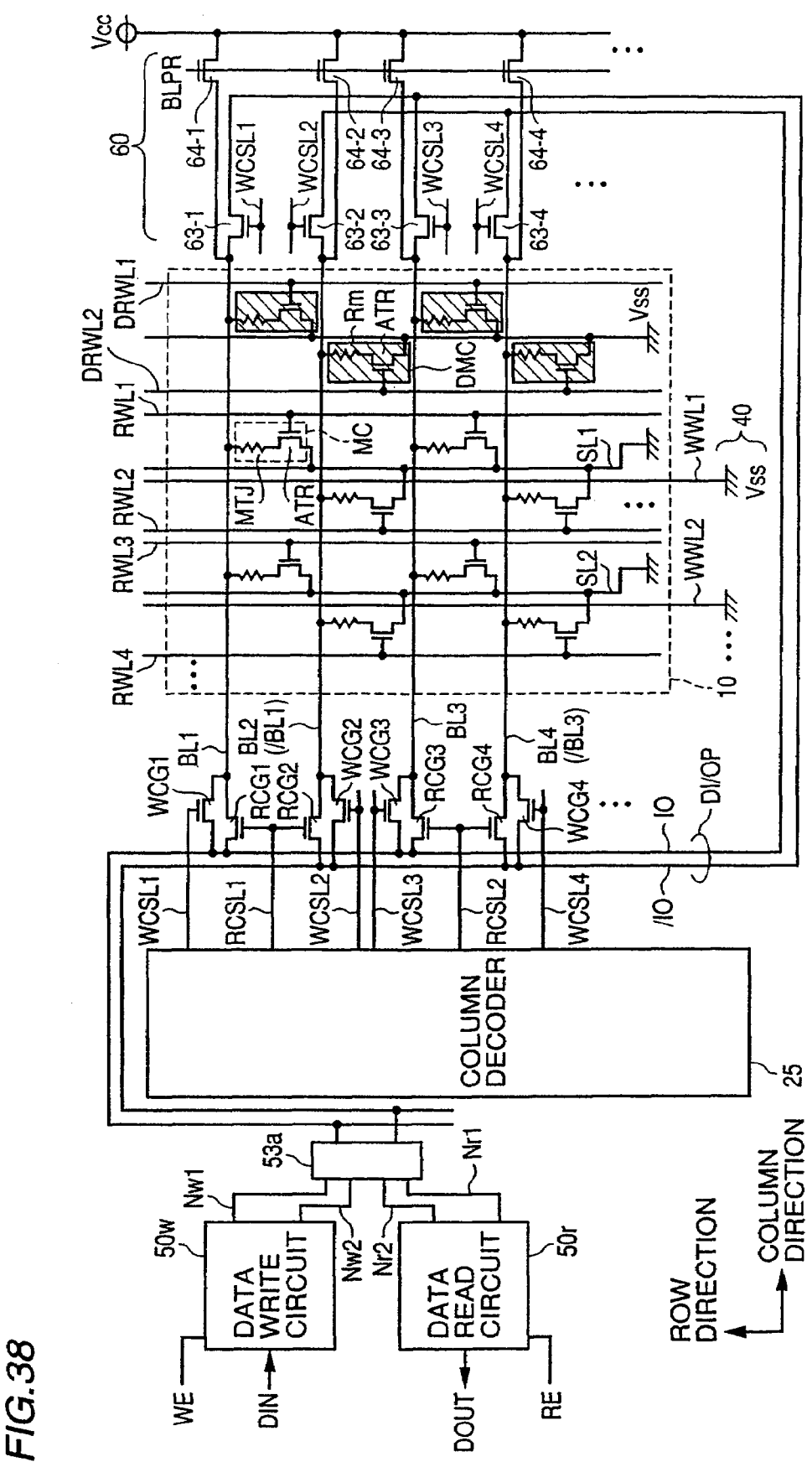
FIG. 38 is a block diagram showing the structure of a memory array and its peripheral circuitry according to a seventh modification of the fourth embodiment.

The structure of FIG. 38 is different from that of FIG. 15 in that the reference voltage lines SL extend in the row direction.

Since the structure of the other portions and the operation in reading and writing the data are the same as those of FIG. 15, detailed description thereof will not be repeated.

Accordingly, in the memory cell arrangement of the fourth embodiment as well, the data read operation based on the folded bit line structure ensures the operation margin. At the same time, sharing the write word lines achieves improved integration of the memory array 10.

Eighth Modification of Fourth Embodiment

In the eighth modification of the fourth embodiment, the read word line RWL is shared between adjacent memory cell rows, in addition to the folded bit line structure of the sixth modification of the fourth embodiment.

Figure 39:
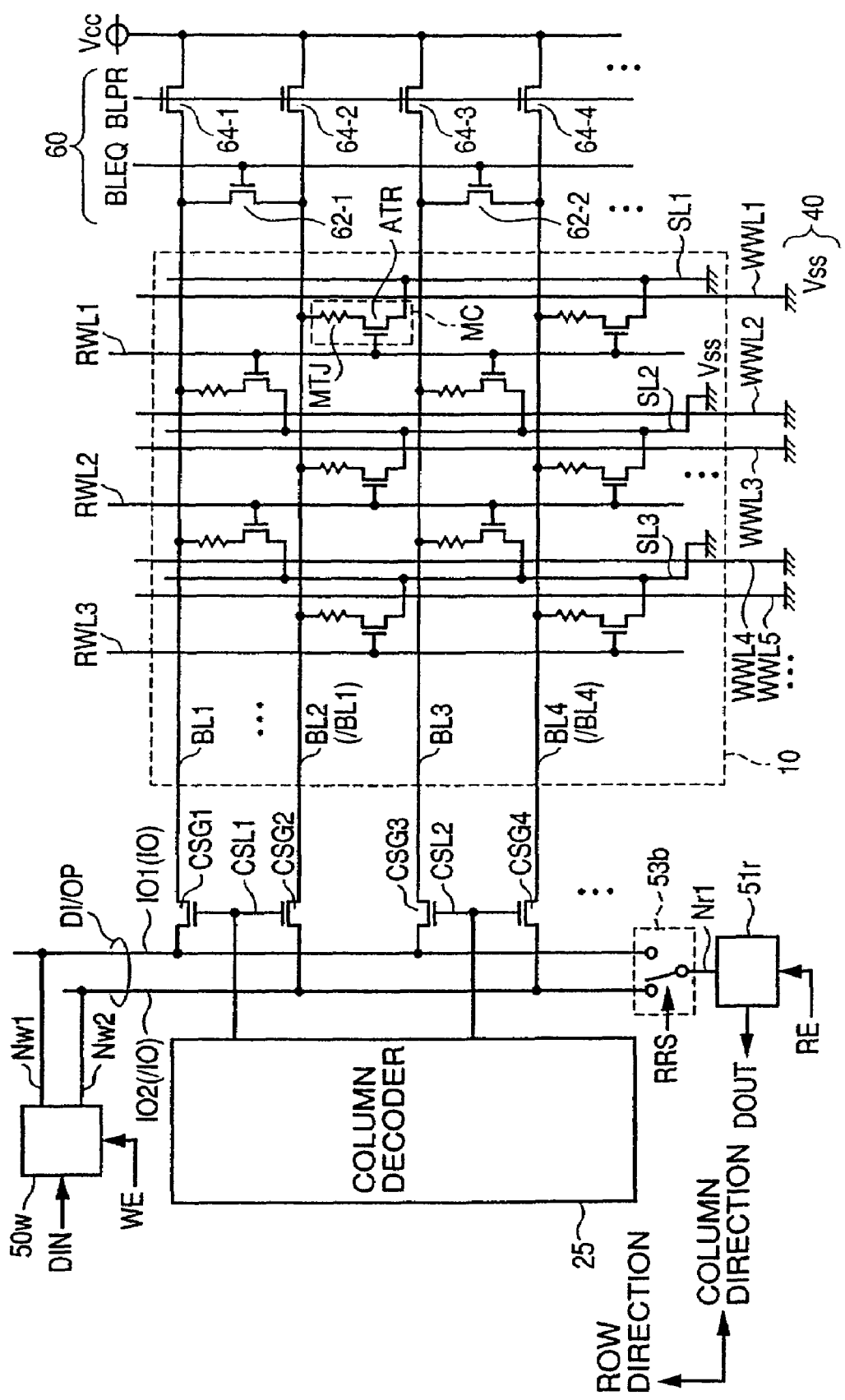
FIG. 39 is a block diagram showing the structure of a memory array and its peripheral circuitry according to an eighth modification of the fourth embodiment.

The structure of FIG. 39 is different from that of FIG. 16 in that the reference voltage lines SL extend in the row direction.

Since the structure of the other portions and the operation in reading and writing the data are the same as those of FIG. 16, detailed description thereof will not be repeated.

Accordingly, in the memory cell arrangement of the fourth embodiment as well, the data write operation based on the folded bit line structure ensures the operation margin, simplifies the structure of the peripheral circuitry and reduces the data write noise. At the same time, sharing the read word lines achieves improved integration of the memory array 10.

Fifth Embodiment

Figure 40:
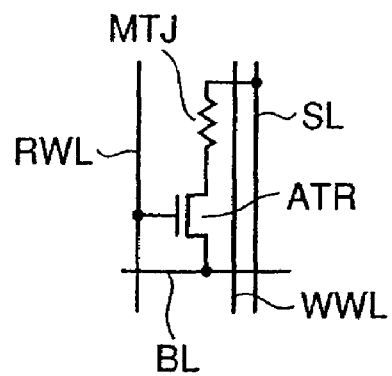
FIG. 40 is a circuit diagram showing the connection between a memory cell and signal wirings according to a fifth embodiment.

Referring to FIG. 40, a memory cell according to the fourth embodiment includes a magnetic tunnel junction MTJ and an access transistor ATR, which are coupled in series with each other. The access transistor ATR is electrically coupled between the magnetic tunnel junction MTJ and bit line BL. The access transistor ATR has its gate coupled to the read word line RWL. Like the fourth embodiment, the reference voltage lines SL extend in the row direction.

The magnetic tunnel junction MTJ is electrically coupled between the access transistor ATR and the reference voltage line SL for supplying the ground voltage Vss. Accordingly, the bit line BL is not directly coupled to the magnetic tunnel junction MTJ, but is connected thereto through the access transistor ATR.

The memory cell of the fifth embodiment corresponds to the memory cell of the fourth embodiment with its reference voltage line SL and bit line BL switched in position with respect to the magnetic tunnel junction MTJ and access transistor ATR. Accordingly, the kinds of signal lines are the same as those of the first embodiment, and each signal line has the same voltage and current waveform as those of the first embodiment in the data read and write operations. Therefore, detailed description thereof will not be repeated.

Figure 41:
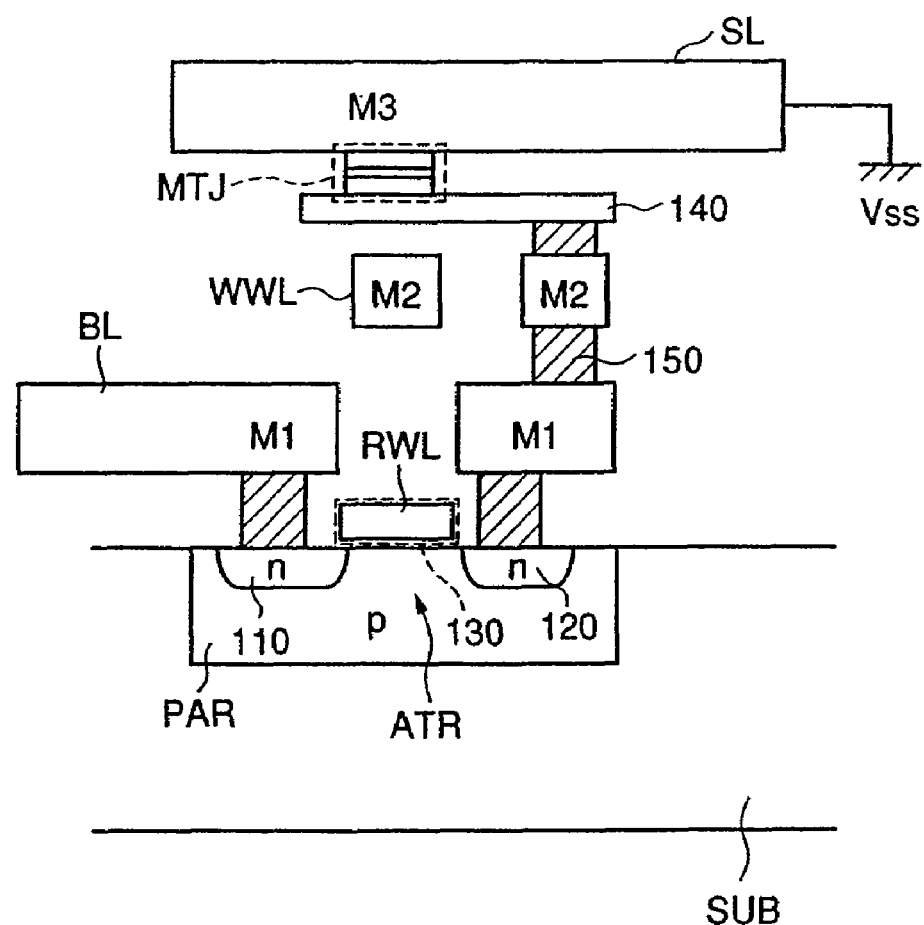
FIG. 41 is a structural diagram illustrating the arrangement of the memory cell according to the fifth embodiment.

Referring to FIG. 41, the access transistor ATR is formed in a p-type region PAR of a semiconductor main substrate SUB. The bit line BL is formed in a first metal wiring layer M1 so as to be electrically coupled to one source/drain region 110 of the access transistor ATR.

The other source/drain region 120 is coupled to the magnetic tunnel junction MTJ through the metal wirings respectively provided in the first and second metal wiring layers M1 and M2, a metal film 150 formed in a contact hole, and a banner metal 140. The write word line WWL is provided in the second metal wiring layer M2 near the magnetic tunnel junction MTJ. The read word line RWL is provided in the same layer as that of the gate 130 of the access transistor ATR.

The reference voltage line SL is provided in an independent metal wiring layer, i.e., a third metal wiring layer M3. The reference voltage line SL is coupled to a node for supplying the ground voltage Vss among the nodes on the semiconductor substrate.

Thus, in the memory cell of the fifth embodiment, the magnetic tunnel junction MTJ is not directly coupled to the bit line BL, but is coupled thereto through the access transistor ATR. Therefore, each bit line BL is not directly coupled to a multiplicity of magnetic tunnel junctions MTJ of a corresponding memory cell column, but is electrically coupled only to the memory cell to be read, i.e., the memory cell of the memory cell row corresponding to the read word line RWL activated to the selected state (H level). Accordingly, the capacitance of the bit line BL can be suppressed, whereby a high-speed operation can be achieved particularly for the read operation.

Figure 42:
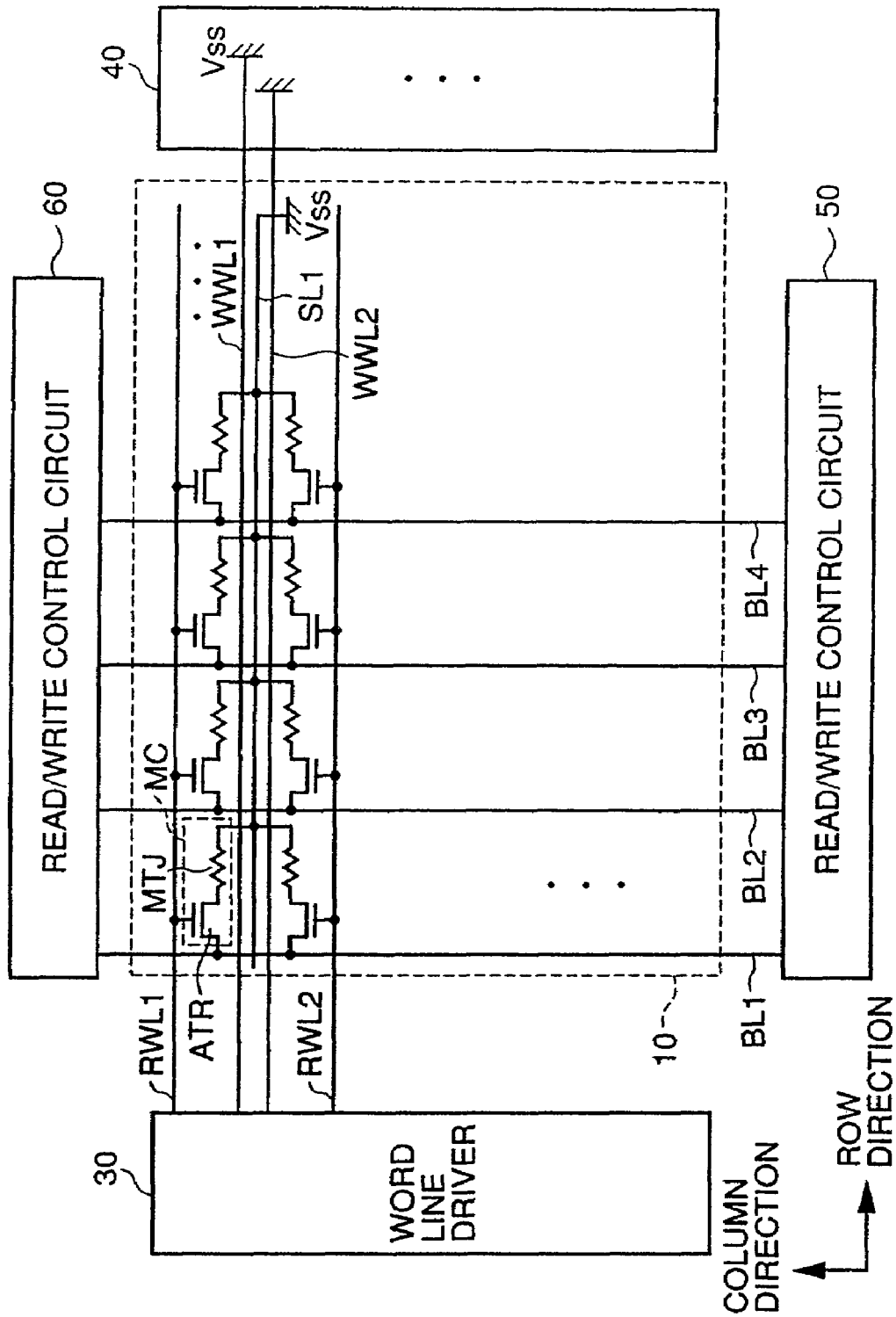
FIG. 42 is a block diagram showing the structure of a memory array according to the fifth embodiment.

Referring to FIG. 42, in the memory array 10, the memory cells MC having the structure of FIG. 40 are arranged in rows and columns. Moreover, like the structure of the fourth embodiment shown in FIG. 31, adjacent memory cells in the column direction share the same reference voltage line SL.

The arrangement of the read word lines RWL, write word lines WWL and bit lines BL as well as the structure of the word line current control circuit 40 are the same as those of FIG. 31. Therefore, description thereof will not be repeated.

Thus, in the memory cell arrangement of the fifth embodiment as well, the reference voltage line SL can be shared between adjacent memory cells in the column direction. Thus, the number of wirings in the entire memory array 10 can be reduced, whereby improved integration of the memory array 10 as well as reduced chip area of the MRAM device can be achieved.

First Modification of Fifth Embodiment

Figure 43:
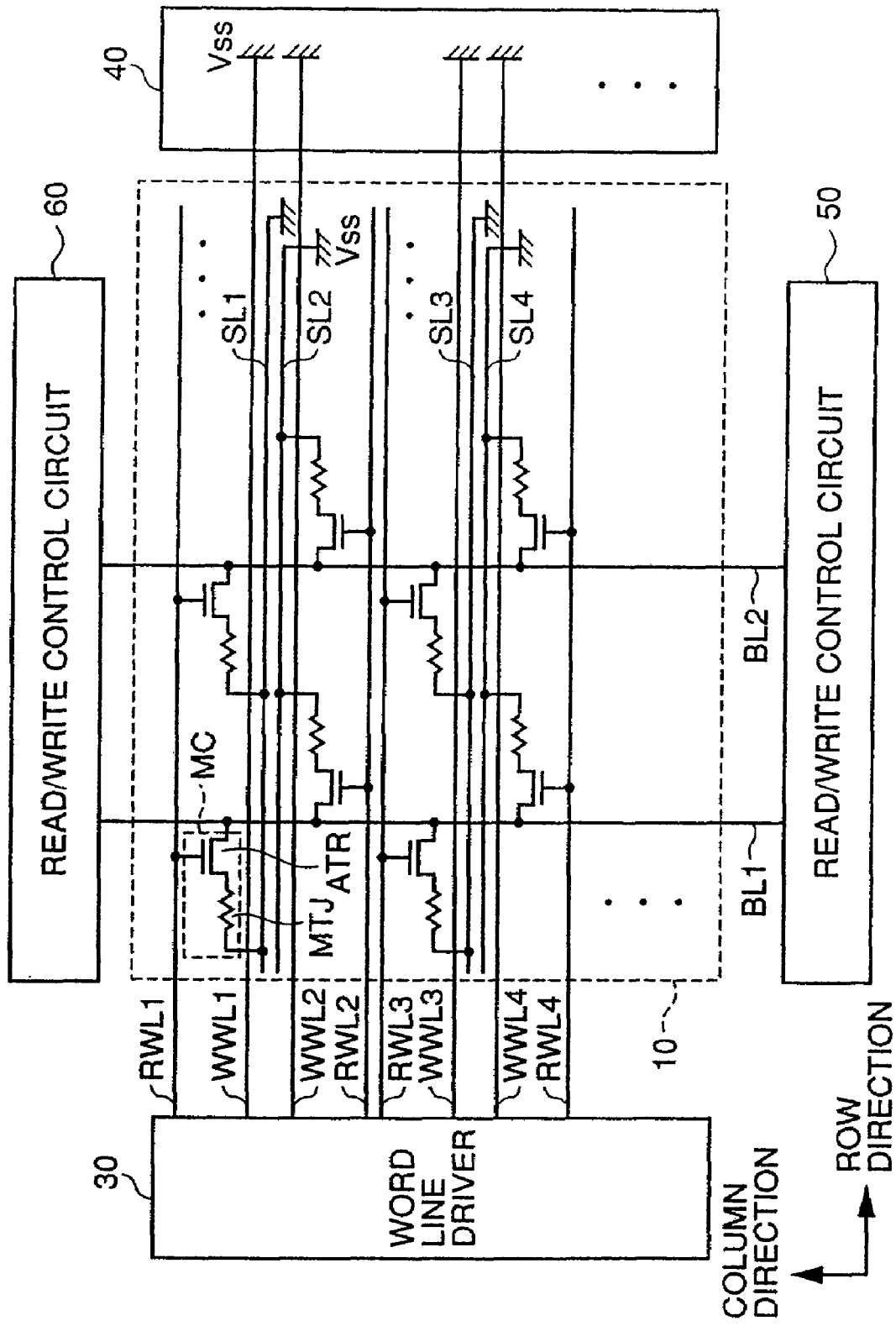
FIG. 43 is a block diagram showing the structure of a memory array according to a first modification of the fifth embodiment.

Referring to FIG. 43, in the memory array 10 according to the first modification of the fifth embodiment, adjacent memory cells in the row direction share the same bit line BL as in the case of FIG. 32. The reference voltage lines SL are provided corresponding to the respective memory cell columns.

Since the structure of the other portions and the memory cell operation in reading and writing the data are the same as those of the fifth embodiment, detailed description thereof will not be repeated.

With such a structure, the pitch of the bit lines BL in the memory array 10 can be widened also in the memory cell arrangement of the fifth embodiment capable of achieving a high-speed data read operation. As a result, the memory cells MC can be efficiently arranged, whereby improved integration of the memory array 10 as well as reduced chip area of the MRAM device can be achieved.

As in the case of the third embodiment, in the memory cell structure of the fifth embodiment, the distance between the bit line BL and magnetic tunnel junction MTJ is larger than that between the write word line WWL and magnetic tunnel junction MTJ. This requires a larger data write current to be supplied to the bit line BL. Accordingly, increased electromigration resistance of the bit lines BL is effective for improved reliability of the MRAM device.

More specifically, in the memory cell arrangement of the fifth embodiment, increased electromigration resistance of the bit line BL can be achieved by making the line width (cross-sectional area) of the bit line BL larger than that of the write word line WWL having a shorter distance to the magnetic tunnel junction. As a result, the reliability of the MRAM device can be improved. Regarding the material as well, it is desirable to form the bit line BL from a highly electromigration-resistant material.

Second Modification of Fifth Embodiment

Figure 44:
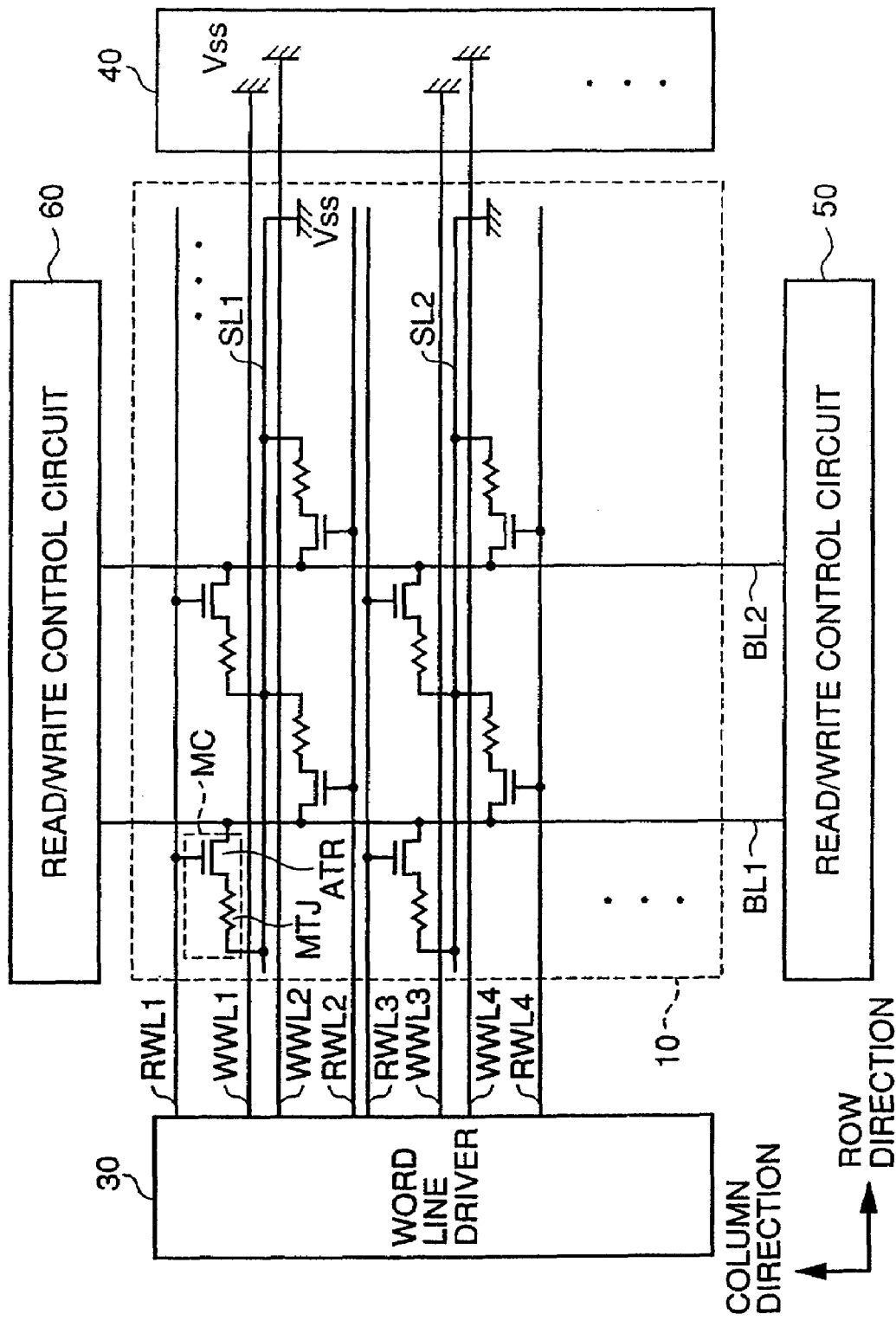
FIG. 44 is a block diagram showing the structure of a memory array according to a second modification of the fifth embodiment.

Referring to FIG. 44, in the memory array 10 according to the second modification of the fifth embodiment, both the reference voltage line SL and bit line BL are shared, as in the case of FIG. 33. The reference voltage line SL is shared between adjacent memory cells in the column direction, as in the case of FIG. 42. The bit line BL is shared between adjacent memory cells in the row direction, as in the case of FIG. 43.

Since the structure of the other portions and the memory cell operation in reading and writing the data are the same as those of the fifth embodiment, detailed description thereof will not be repeated.

With such a structure, the respective numbers of wirings in the row and column directions can be reduced, whereby further improved integration of the memory array 10 as well as further reduced chip area of the MRAM device can be achieved.

Third Modification of Fifth Embodiment

Figure 45:
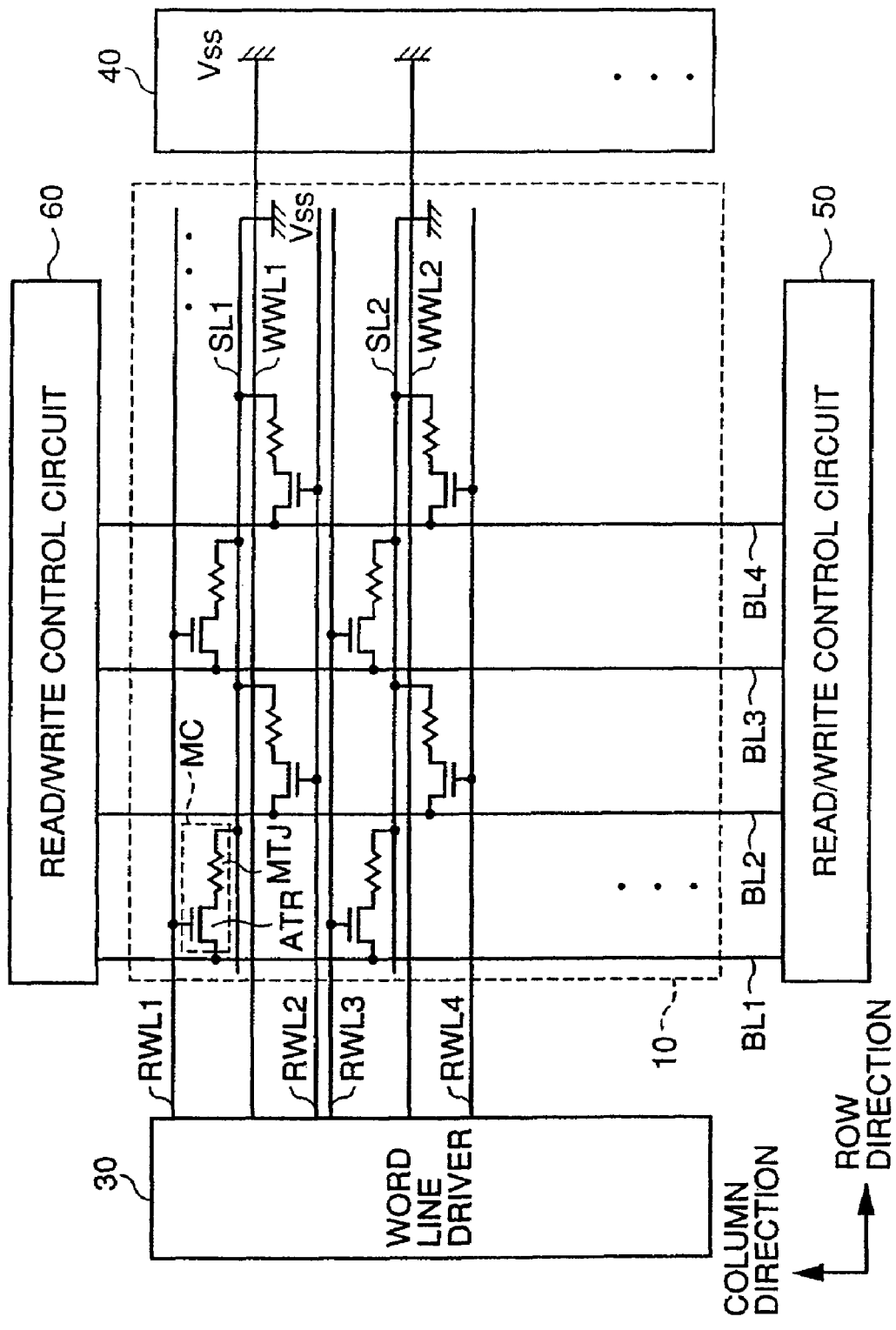
FIG. 45 is a block diagram showing the structure of a memory array according to a third modification of the fifth embodiment.

Referring to FIG. 45, in the memory array 10 according to the third modification of the fifth embodiment, adjacent memory cells in the column direction share the same write word line WWL, in addition to the structure of FIG. 42 in which the reference voltage line SL is shared. The memory cells MC are arranged alternately for the same reason as that of FIG. 7.

Since the structure of the other portions and the memory cell operation in reading and writing the data are the same as those of the fifth embodiment, detailed description thereof will not be repeated.

With such a structure, the pitch of the write word lines WWL in the memory array 10 can be widened in the memory cell arrangement of the fifth embodiment. As a result, the memory cells MC can be efficiently arranged, whereby improved integration of the memory array 10 as well as reduced chip area of the MRAM device can be achieved.

Fourth Modification of Fifth Embodiment

Figure 46:
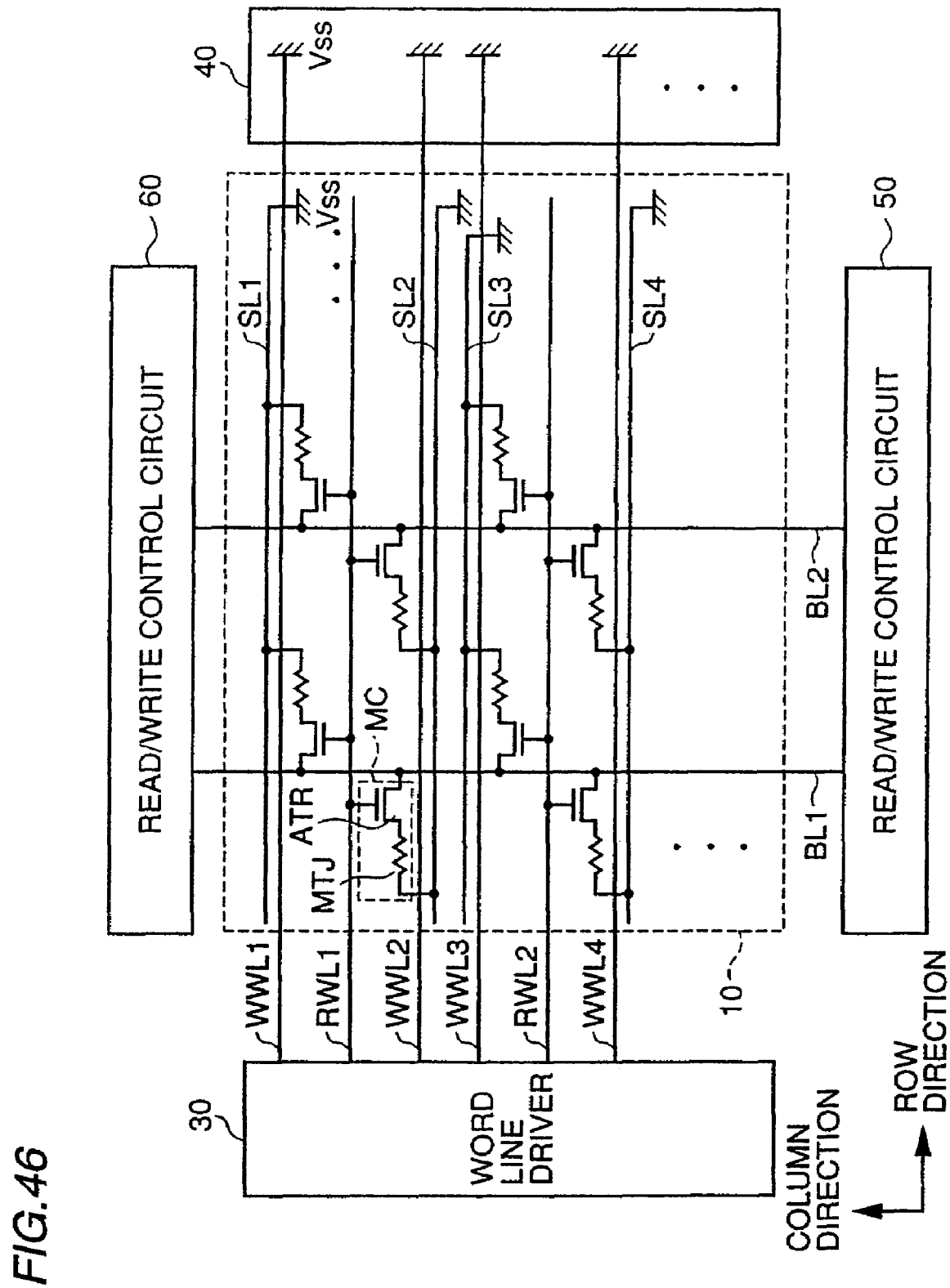
FIG. 46 is a block diagram showing the structure of a memory array according to a fourth modification of the fifth embodiment.

Referring to FIG. 46, in the memory array 10 according to the fourth modification of the fifth embodiment, adjacent memory cells in the column direction share the same read word line RWL. The memory cells MC are arranged alternately for the same reason as that of FIG. 9.

Since the structure of the other portions and the memory cell operation in reading and writing the data are the same as those of the fifth embodiment, detailed description thereof will not be repeated.

With such a structure, the pitch of the read word lines RWL in the memory array 10 can be widened also in the memory cell arrangement of the fifth embodiment. As a result, the memory cells MC can be efficiently arranged, whereby improved integration of the memory array 10 as well as reduced chip area of the MRAM device can be achieved.

Fifth Modification of Fifth Embodiment

Figure 47:
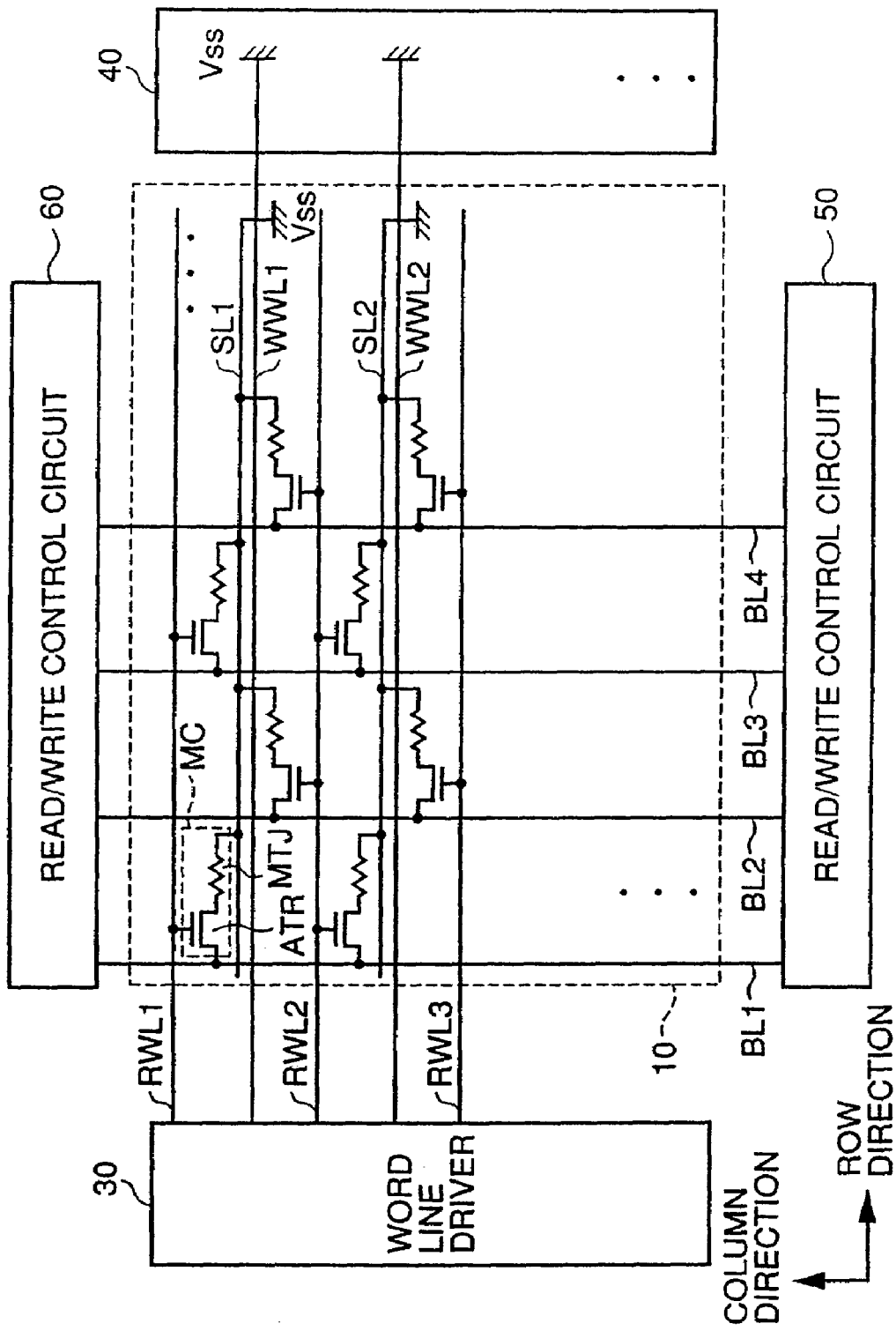
FIG. 47 is a block diagram showing the structure of a memory array according to a fifth modification of the fifth embodiment.

Referring to FIG. 47, in the memory array 10 according to the fifth modification of the fifth embodiment, adjacent memory cells in the column direction share the same write word line WWL as in the third modification of the fifth embodiment. In addition, the read word line RWL is also shared between adjacent memory cells in the column direction. For example, the memory cell group of the second and third memory cell rows shares the same read word line RWL2. In the following memory cell rows as well, the read word lines RWL and write word lines WWL are arranged similarly. The memory cells MC are arranged alternately for the same reason as that of FIG. 10. Like the write word line WWL, the reference voltage line SL is shared between adjacent memory cells in the column direction.

Since the structure of the other portions and the memory cell operation in reading and writing the data are the same as those of the fifth embodiment, detailed description thereof will not be repeated.

With such a structure, the pitches of the write word lines WWL and read word lines RWL in the memory array 10 can be widened also in the memory cell arrangement of the fifth embodiment. As a result, the memory cells MC can be arranged more efficiently, whereby further improved integration of the memory array 10 as well as further reduced chip area of the MRAM device can be achieved as compared to the third and fourth modifications of the fifth embodiment.

Sixth Modification of Fifth Embodiment

Figure 48:
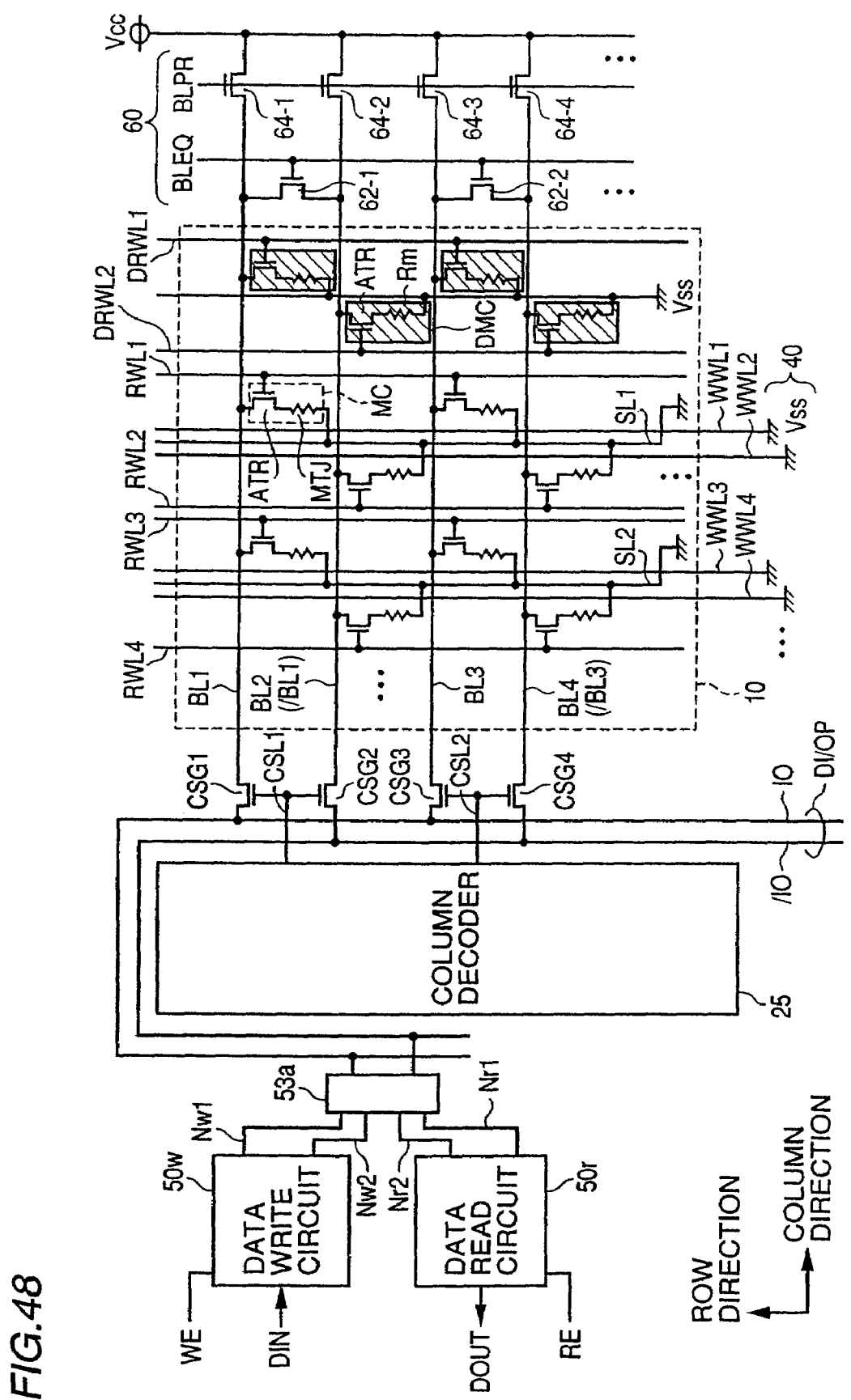
FIG. 48 is a block diagram showing the structure of a memory array and its peripheral circuitry according to a sixth modification of the fifth embodiment.

Referring to FIG. 48, in the memory cells of the fifth embodiment arranged in rows and columns, the folded bit line structure is applied using two bit lines of each set of adjacent two memory cell columns, as in the case of the second embodiment.

The structure of FIG. 48 is different from that of FIG. 13 in that the access transistor ATR and magnetic tunnel junction MTJ of each memory cell MC are respectively connected to the bit line BL and reference voltage line SL, and in that the reference voltage lines SL extend in the row direction.

Since the structure of the other portions and the operation in reading and writing the data are the same as those of FIG. 13, detailed description thereof will not be repeated.

Accordingly, in the memory cell arrangement of the fourth embodiment as well, the read and write operation margins can be ensured by the folded bit line structure. Moreover, like the second embodiment, the structure of the peripheral circuitry including data write circuit 50w and read/write control circuit 60 can be simplified as well as the data write noise can be reduced.

Seventh Modification of Fifth Embodiment

In the seventh modification of the fifth embodiment, the write word line WWL is shared between adjacent memory cell rows, in addition to the folded bit line structure of the sixth modification of the fifth embodiment.

Figure 49:
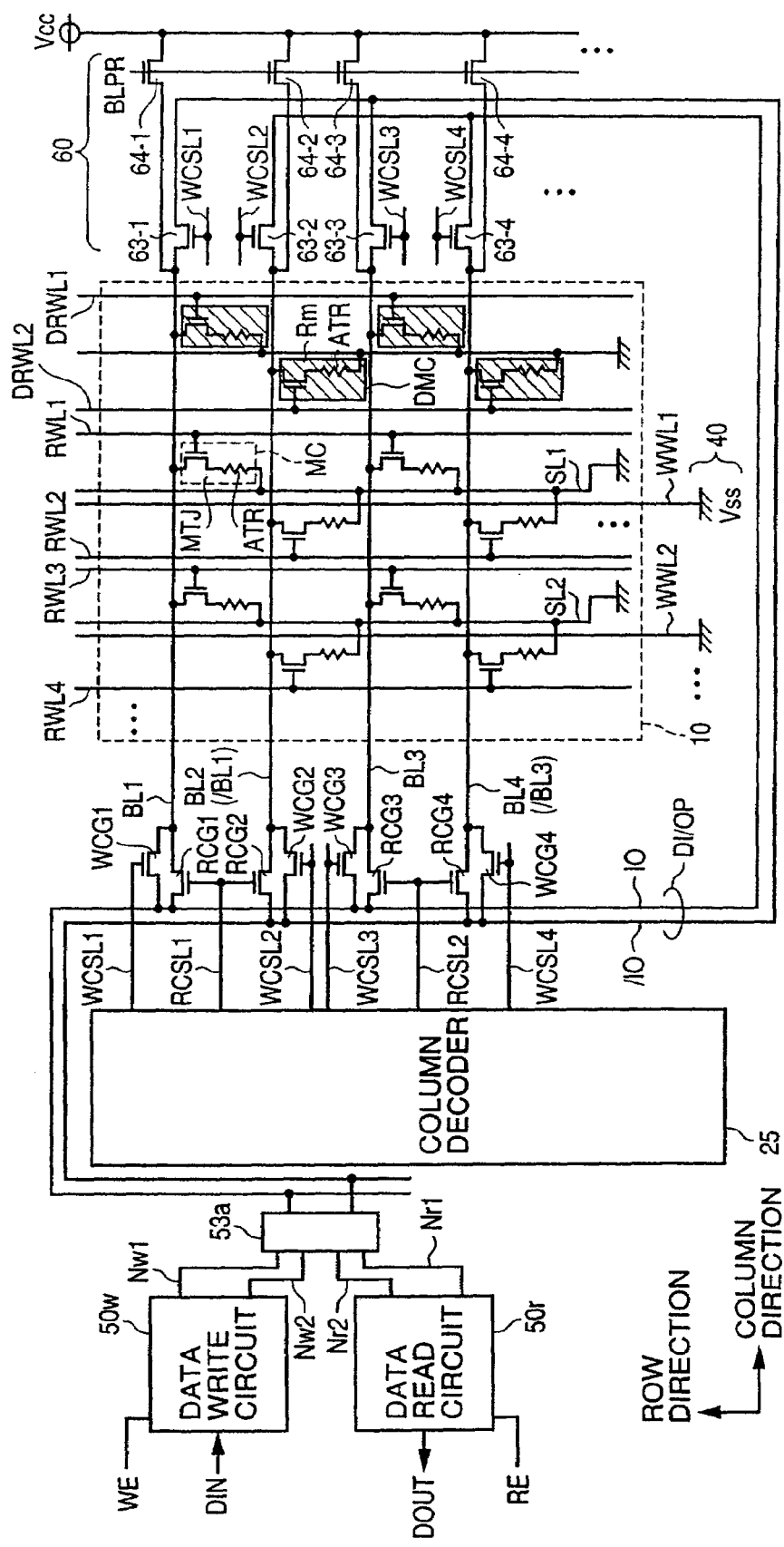
FIG. 49 is a block diagram showing the structure of a memory array and its peripheral circuitry according to a seventh modification of the fifth embodiment.

The structure of FIG. 49 is different from that of FIG. 15 in that the access transistor ATR and magnetic tunnel junction MTJ in each memory cell MC are respectively connected to the bit line BL and reference voltage line SL, and in that the reference voltage lines SL extend in the row direction.

Since the structure of the other portions and the operation in reading and writing the data are the same as those of FIG. 15, detailed description thereof will not be repeated.

Accordingly, in the memory cell arrangement of the fifth embodiment as well, the data read operation based on the folded bit line structure ensures the operation margin. At the same time, sharing the write word lines achieves improved integration of the memory array 10.

Eighth Modification of Fifth Embodiment

In the eighth modification of the fifth embodiment, the read word line RWL is shared between adjacent memory cell rows, in addition to the folded bit line structure of the sixth modification of the fifth embodiment.

Figure 50:
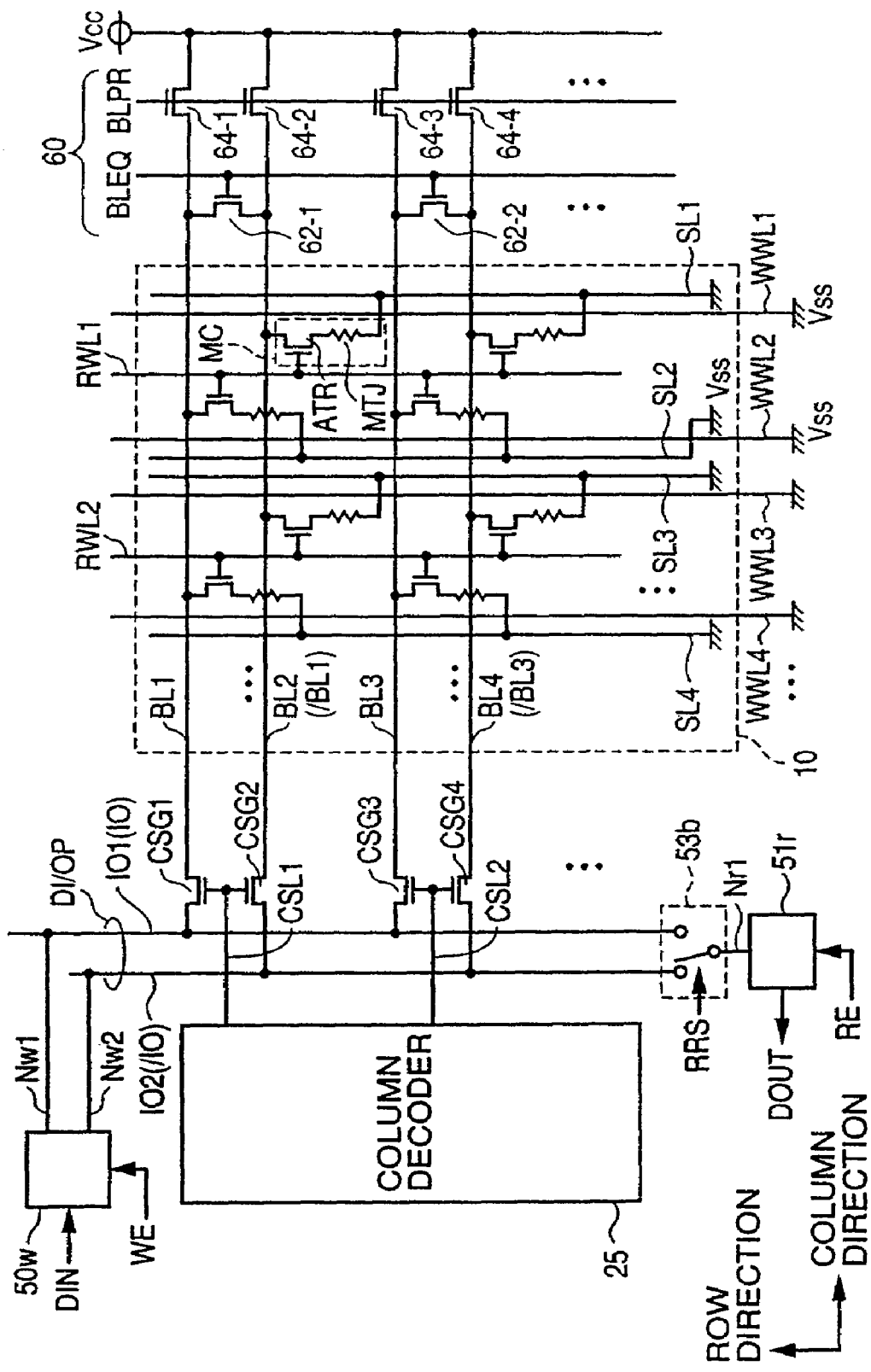
FIG. 50 is a block diagram showing the structure of a memory array and its peripheral circuitry according to an eighth modification of the fifth embodiment.

The structure of FIG. 50 is different from that of FIG. 16 in that the access transistor ATR and magnetic tunnel junction MTJ in each memory cell MC are respectively connected to the bit line BL and reference voltage line SL, and in that the reference voltage lines SL extend in the row direction.

Since the structure of the other portions and the operation in reading and writing the data are the same as those of FIG. 16, detailed description thereof will not be repeated.

Accordingly, in the memory cell arrangement of the fifth embodiment as well, the data write operation based on the folded bit line structure ensures the operation margin, simplifies the structure of the peripheral circuitry and reduces the data write noise. At the same time, sharing the read word lines achieves improved integration of the memory array 10.

Sixth Embodiment

Figure 51:
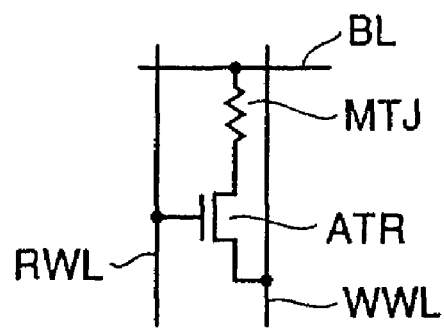
FIG. 51 is a circuit diagram showing the connection between an MTJ memory cell and signal wirings according to a sixth embodiment.

Referring to FIG. 51, the access transistor ATR is electrically coupled between the magnetic tunnel junction MTJ and write word line WWL. The magnetic tunnel junction MTJ is coupled between the access transistor ATR and bit line BL. The access transistor ATR has its gate coupled to the read word line RWL.

The write word line WWL is set to the ground voltage Vss in the data read operation. Thus, when the read word line RWL is activated to the selected state (H level) in the data read operation, the access transistor ATR is responsively turned ON, whereby the sense current Is can be supplied to the path formed by the bit line BL, magnetic tunnel junction MTJ, access transistor ATR, and write word line WWL.

In the data write operation, the access transistor ATR is turned OFF, whereby the data write current is supplied to the bit line BL and write word line WWL. Thus, a magnetic field corresponding to the storage level data to be written to the magnetic tunnel junction MTJ can be generated.

Figure 52:
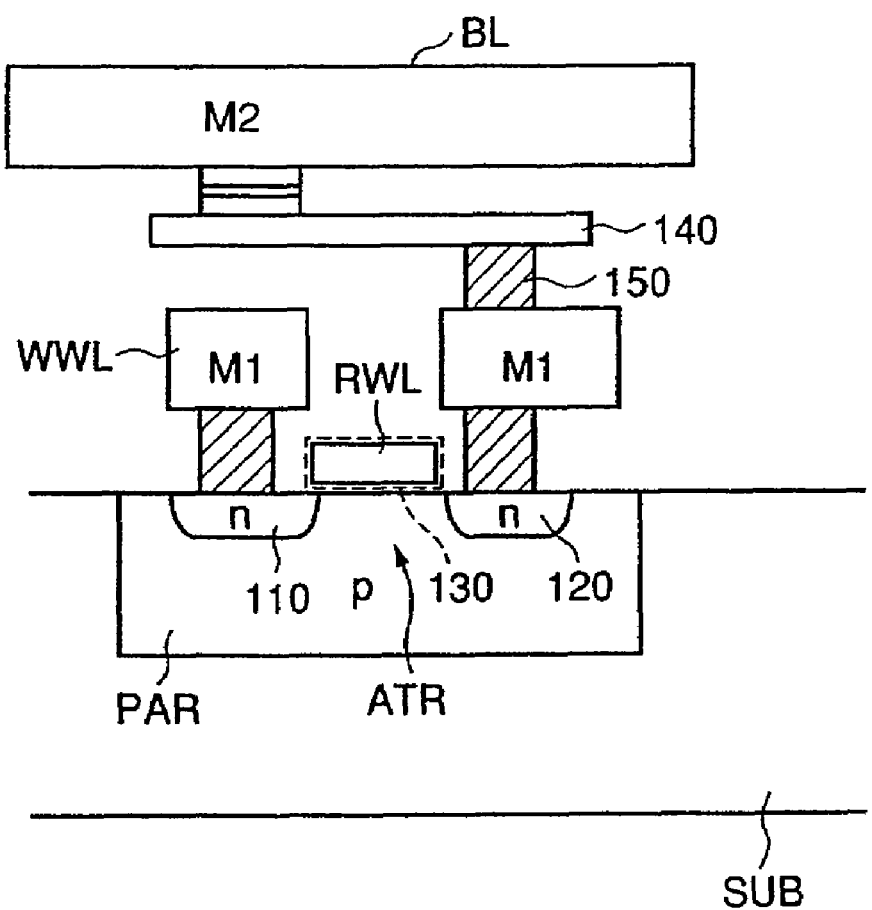
FIG. 52 is a structural diagram illustrating the arrangement of the MTJ memory cell according to the sixth embodiment.

Referring to FIG. 52, the write word line WWL and bit line BL are respectively provided in the first and second metal wiring layers M1 and M2. The read word line RWL is provided in the same layer as that of the gate 130 of the access transistor ATR.

By setting the write word line WWL to the ground voltage Vss in the data read operation, the MTJ memory cell can be provided by the two metal wiring layers M1 and M2 without providing the reference voltage line SL. As a result, the number of metal wiring layers can be reduced, resulting in reduction in manufacturing cost.

Hereinafter, the data read and write operations to and from the MTJ memory cell according to the sixth embodiment will be described.

Referring back to FIG. 3, in the data read operation, the write word line WWL is retained in the non-selected state (L level). Since the word line current control circuit 40 couples each write word line WWL to the ground voltage Vss, the voltage level on the write word line WWL in the data read operation is the same as that on the reference voltage line SL, i.e., the ground voltage Vss. In the data write operation, no current flows through the reference voltage line SL. Therefore, no magnetic field is generated at the MTJ memory cell.

Accordingly, even if the reference voltage line SL is eliminated, the data read and write operations to and from the MTJ memory cell of the sixth embodiment can be conducted by setting the voltage and current on the write word line WWL, read word line RWL and bit line BL in the same manner as that of FIG. 3.

Figure 53:
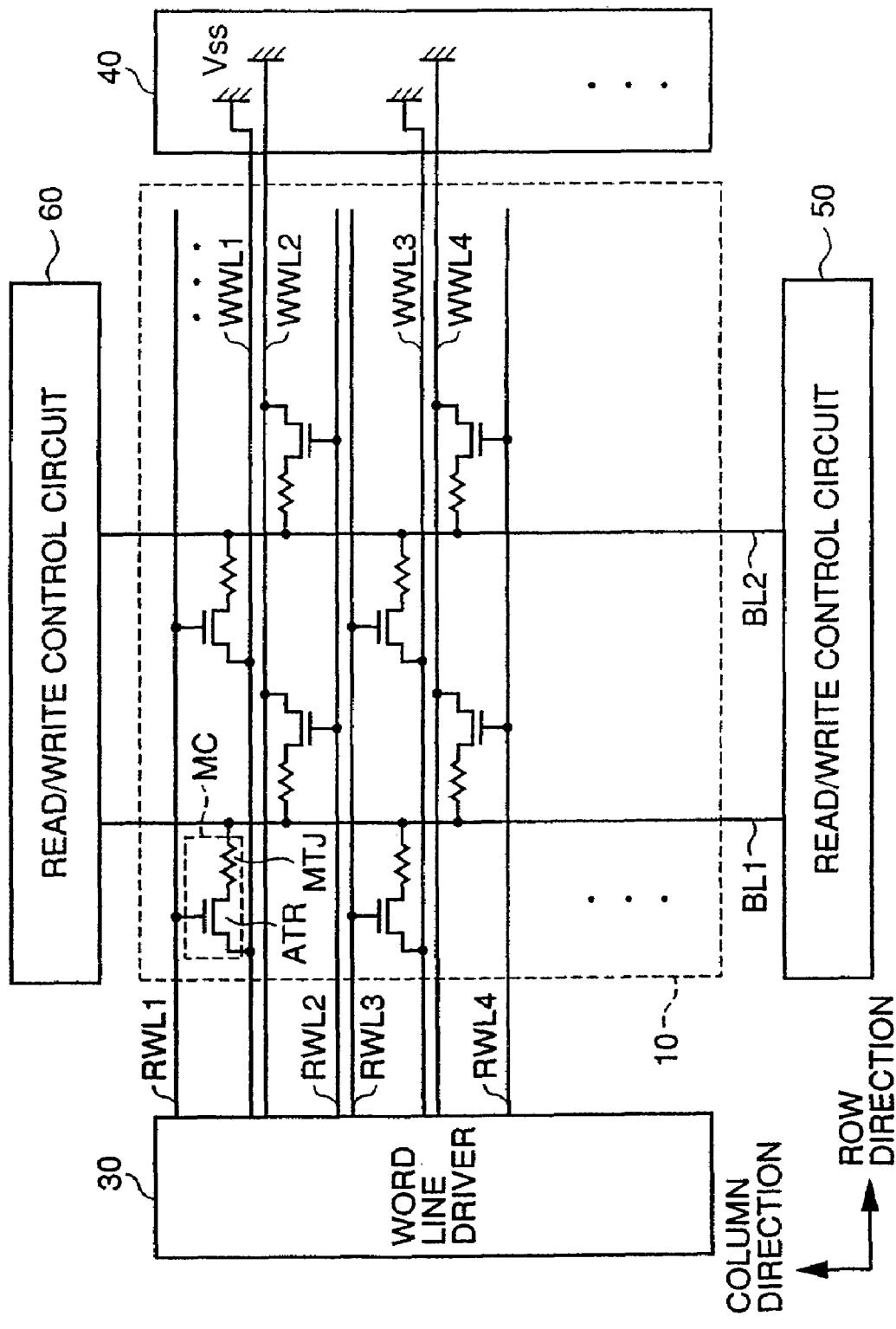
FIG. 53 is a block diagram showing the structure of a memory array according to the sixth embodiment.

Referring to FIG. 53, in the memory cell 10 according to the sixth embodiment, adjacent memory cells in the row direction share the same bit line BL. For example, the memory cell group of the first and second memory cell columns shares the same bit line BL1. Since the respective structures of the read word line RWL, write word line WWL and word line current control circuit 40 as well as the memory cell operation in reading and writing the data are the same as those of FIG. 5, description thereof will not be repeated.

With such a structure, the pitch of the bit lines BL in the memory array 10 can be widened also in the memory cell arrangement of the sixth embodiment capable of conducting the data read and write operations with a reduced number of wirings. As a result, the memory cells MC are efficiently arranged, whereby improved integration of the memory array 10 as well as reduced chip area of the MRAM device can be achieved.

First Modification of Sixth Embodiment

Figure 54:
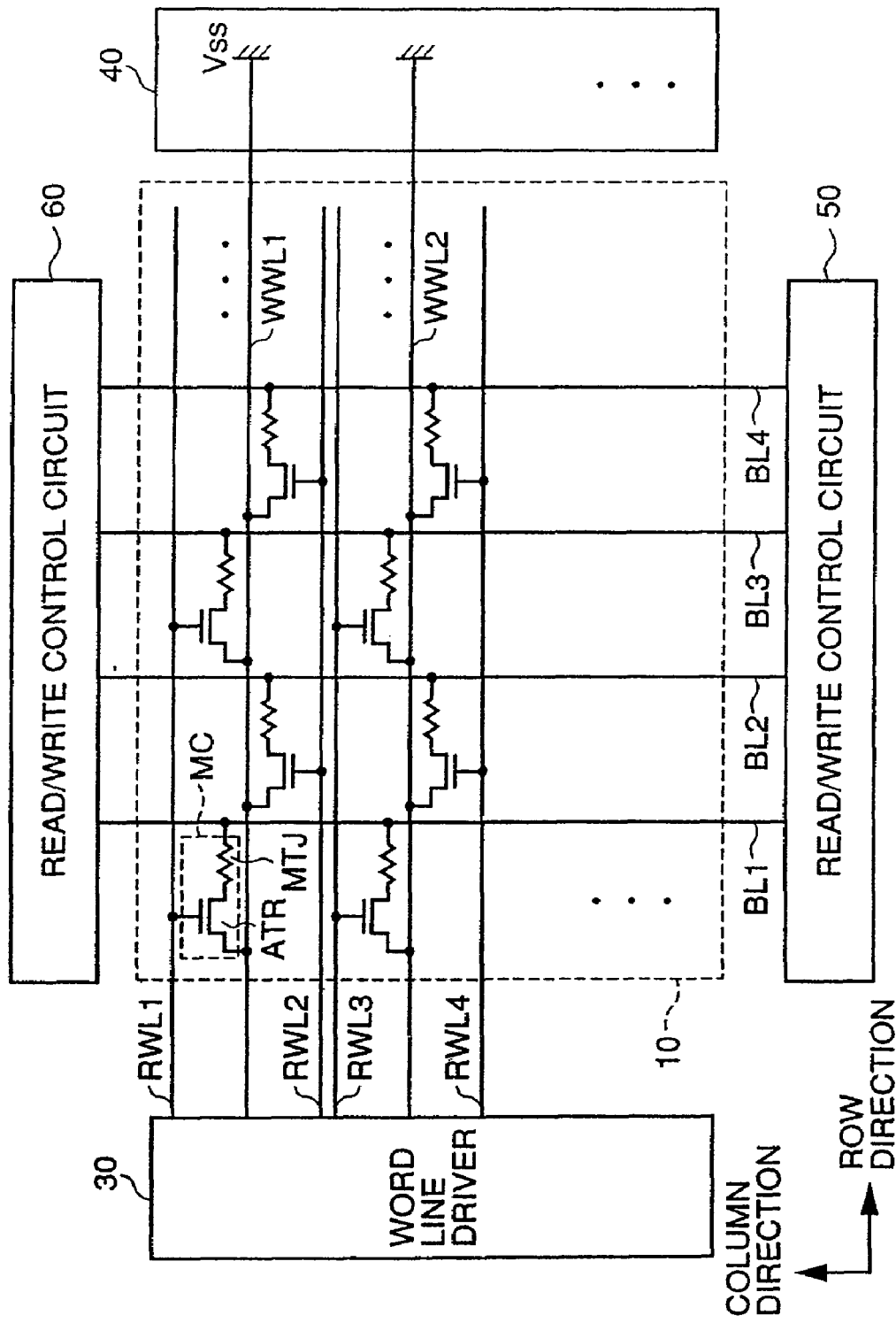
FIG. 54 is a block diagram showing the structure of a memory array according to a first modification of the sixth embodiment.

Referring to FIG. 54, in the memory array 10 according to the first modification of the sixth embodiment, adjacent memory cells in the column direction share the same write word line WWL. Accordingly, the memory cells MC are arranged alternately for the same reason as that of FIG. 7.

Since the structure of the other portions and the memory cell operation in reading and writing the data are the same as those of the sixth embodiment, detailed description thereof will not be repeated.

With such a structure, the pitch of the write word lines WWL in the memory array 10 can be widened also in the memory cell arrangement of the sixth embodiment. As a result, the memory cells MC can be efficiently arranged, whereby improved integration of the memory array 10 as well as reduced chip area of the MRAM device can be achieved.

As in the case of the first embodiment, in the memory cell structure of the sixth embodiment, the distance between the write word line WWL and magnetic tunnel junction MTJ is larger than that between the bit line BL and magnetic tunnel junction MTJ. This requires a larger data write current to be supplied to the write word line WWL. Accordingly, increased electromigration resistance of the write word lines WWL is effective for improved reliability of the MRAM device.

More specifically, in the memory cell arrangement of the sixth embodiment as well, increased electromigration resistance of the write word line WWL can be achieved by making the line width (cross-sectional area) of the write word line WWL larger than that of the bit line BL having a shorter distance to the magnetic tunnel junction. As a result, the reliability of the MRAM device can be improved. Regarding a material as well, it is desirable to form the write word line WWL from a highly electromigration-resistant material.

Second Modification of Sixth Embodiment

Figure 55:
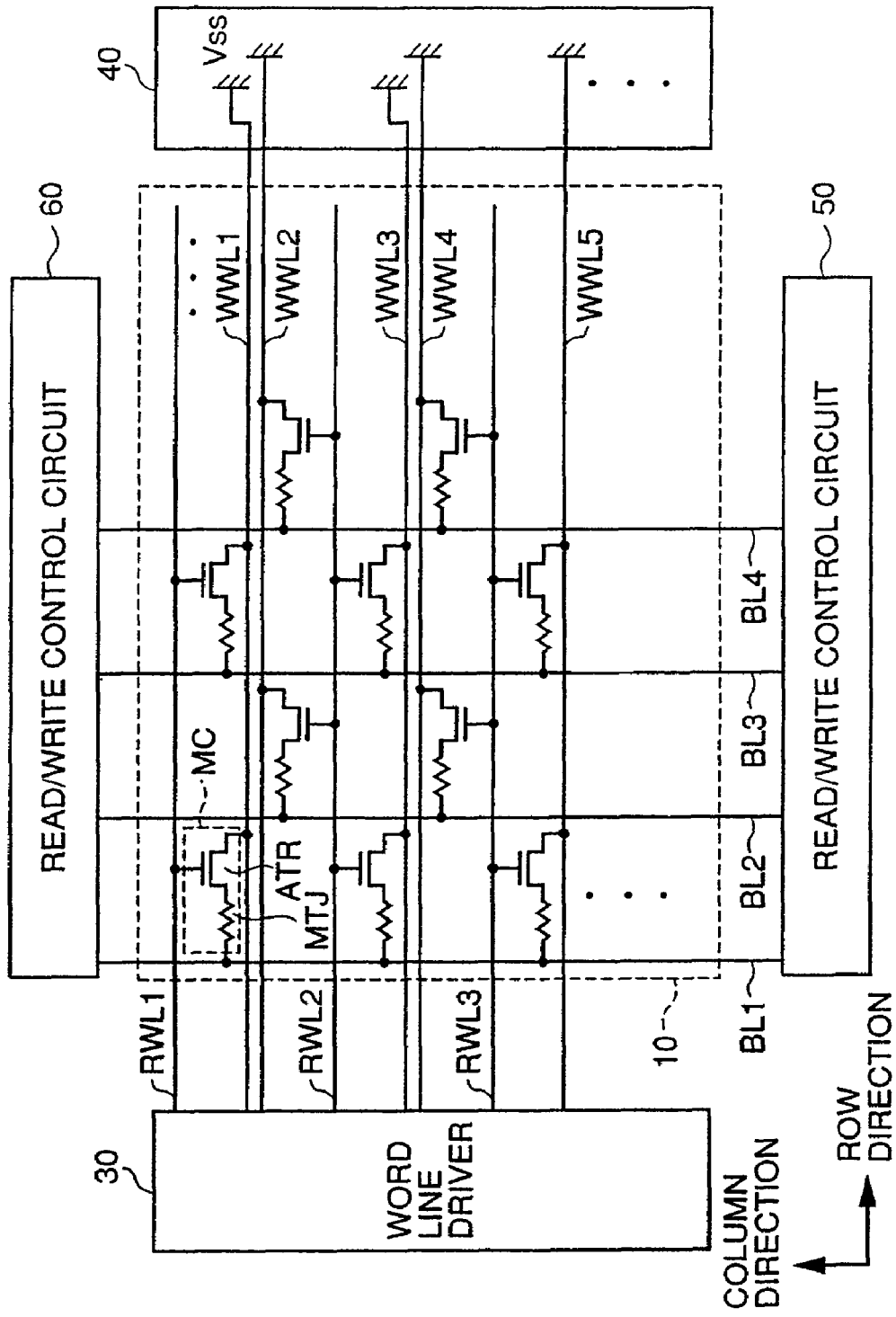
FIG. 55 is a block diagram showing the structure of a memory array according to a second modification of the sixth embodiment.

Referring to FIG. 55, in the memory array 10 according to the second modification of the sixth embodiment, adjacent memory cells in the column direction share the same read word line RWL. Accordingly, the memory cells MC are arranged alternately for the same reason as that of FIG. 9. Since the structure of the other portions and the memory cell operation in reading and writing the data are the same as those of the sixth embodiment, detailed description thereof will not be repeated.

With such a structure, the pitch of the read word lines RWL in the memory array 10 can be widened also in the memory cell arrangement of the sixth embodiment. As a result, the memory cells MC can be efficiently arranged, whereby improved integration of the memory array 10 as well as reduced chip area of the MRAM device can be achieved.

Third Modification of Sixth Embodiment

Figure 56:
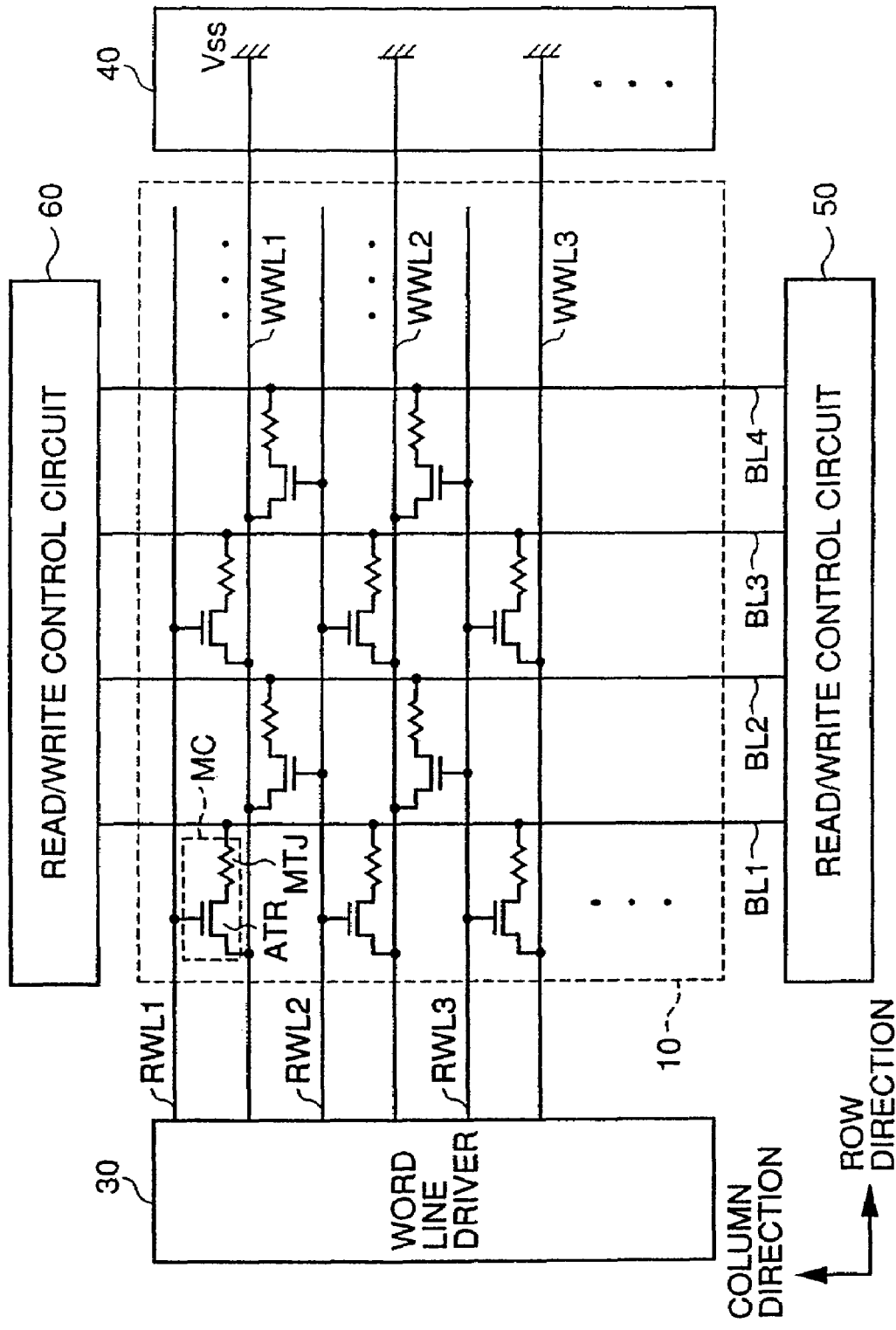
FIG. 56 is a block diagram showing the structure of a memory array according to a third modification of the sixth embodiment.

Referring to FIG. 56, in the memory array 10 according to the third modification of the sixth embodiment, adjacent memory cells in the column direction share the same write word line WWL as in the first modification of the sixth embodiment. Moreover, the read word line RWL is also shared between adjacent memory cells in the column direction. For example, the memory cell group of the second and third memory cell rows shares the same read word line RWL2. In the following memory cell rows as well, the read word lines RWL and write word lines WWL are arranged similarly.

Accordingly, the memory cells MC are arranged alternately for the same reason as that of FIG. 10. Since the structure of the other portions and the memory cell operation in reading and writing the data are the same as those of the sixth embodiment, detailed description thereof will not be repeated.

With such a structure, the pitches of the write word lines WWL and read word lines RWL in the memory array 10 can be widened also in the memory cell arrangement of the sixth embodiment. As a result, the memory cells MC can be more efficiently arranged, whereby further improved integration of the memory array 10 as well as further reduced chip area of the MRAM device can be achieved as compared to the first and second modifications of the sixth embodiment.

Fourth Modification of Sixth Embodiment

Figure 57:
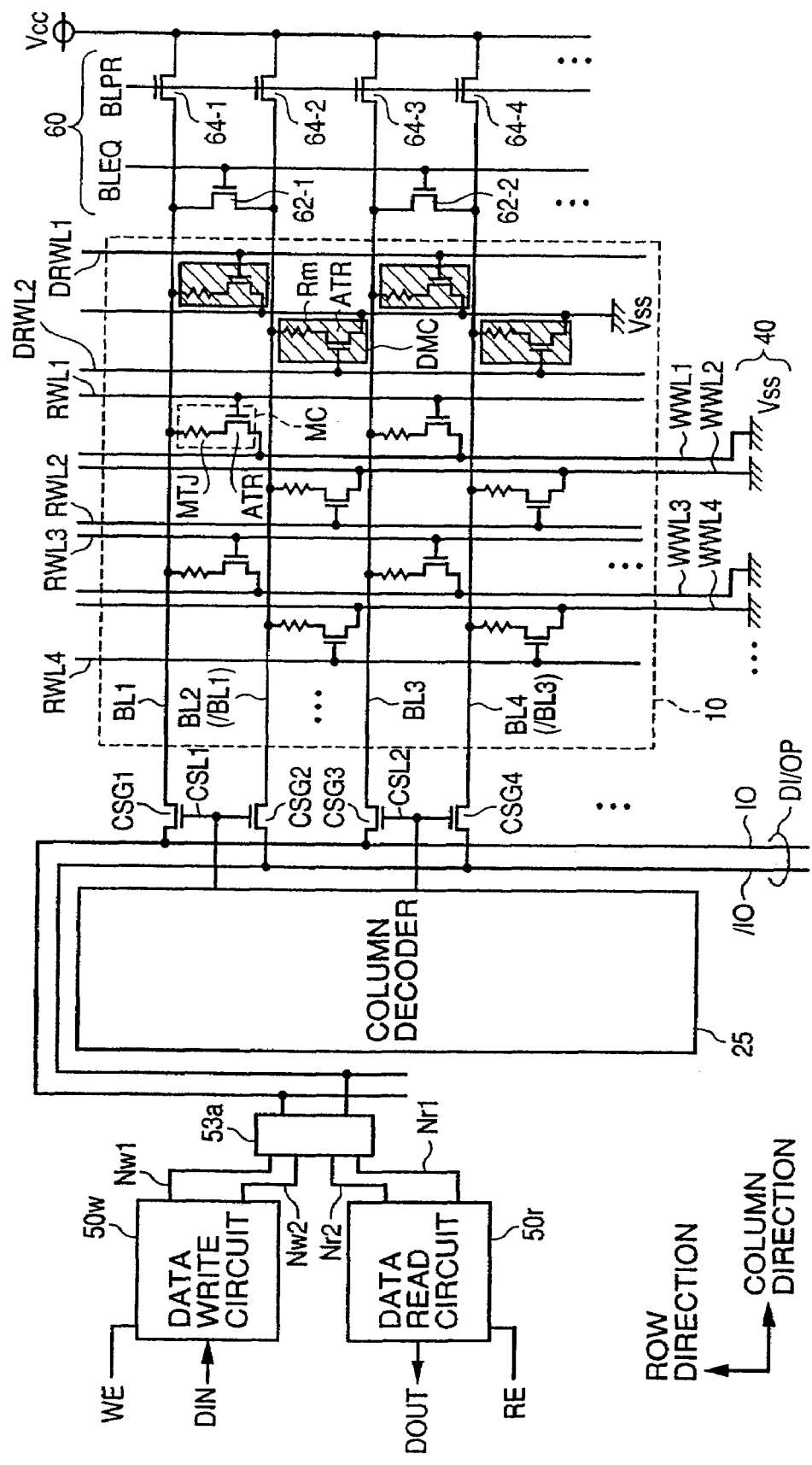
FIG. 57 is a block diagram showing the structure of a memory array and its peripheral circuitry according to a fourth modification of the sixth embodiment.

Referring to FIG. 57, in the memory cells of the sixth embodiment arranged in rows and columns, the folded bit line structure is applied using two bit lines of each set of adjacent two memory cell columns, as in the case of the second embodiment.

The structure of FIG. 57 is different from that of FIG. 13 in that the reference voltage lines SL are eliminated, and in the connection between the memory cell MC and the read word line RWL, write word line WWL and bit line BL. Since the structure of the peripheral circuitry for supplying the data write current and sense current to the bit line BL, and the operation in reading and writing the data are the same as those of FIG. 13, detailed description thereof will not be repeated.

Accordingly, in the memory cell arrangement of the sixth embodiment as well, the read and write operation margins can be ensured by the folded bit line structure. Moreover, like the second embodiment, the structure of the peripheral circuitry including the data write circuit 50w and read/write control circuit 60 can be simplified as well as the data write noise can be reduced.

Fifth Modification of Sixth Embodiment

In the fifth modification of the sixth embodiment, the write word line WWL is shared between adjacent memory cell rows, in addition to the folded bit line structure of the fourth modification of the sixth embodiment.

Figure 58:
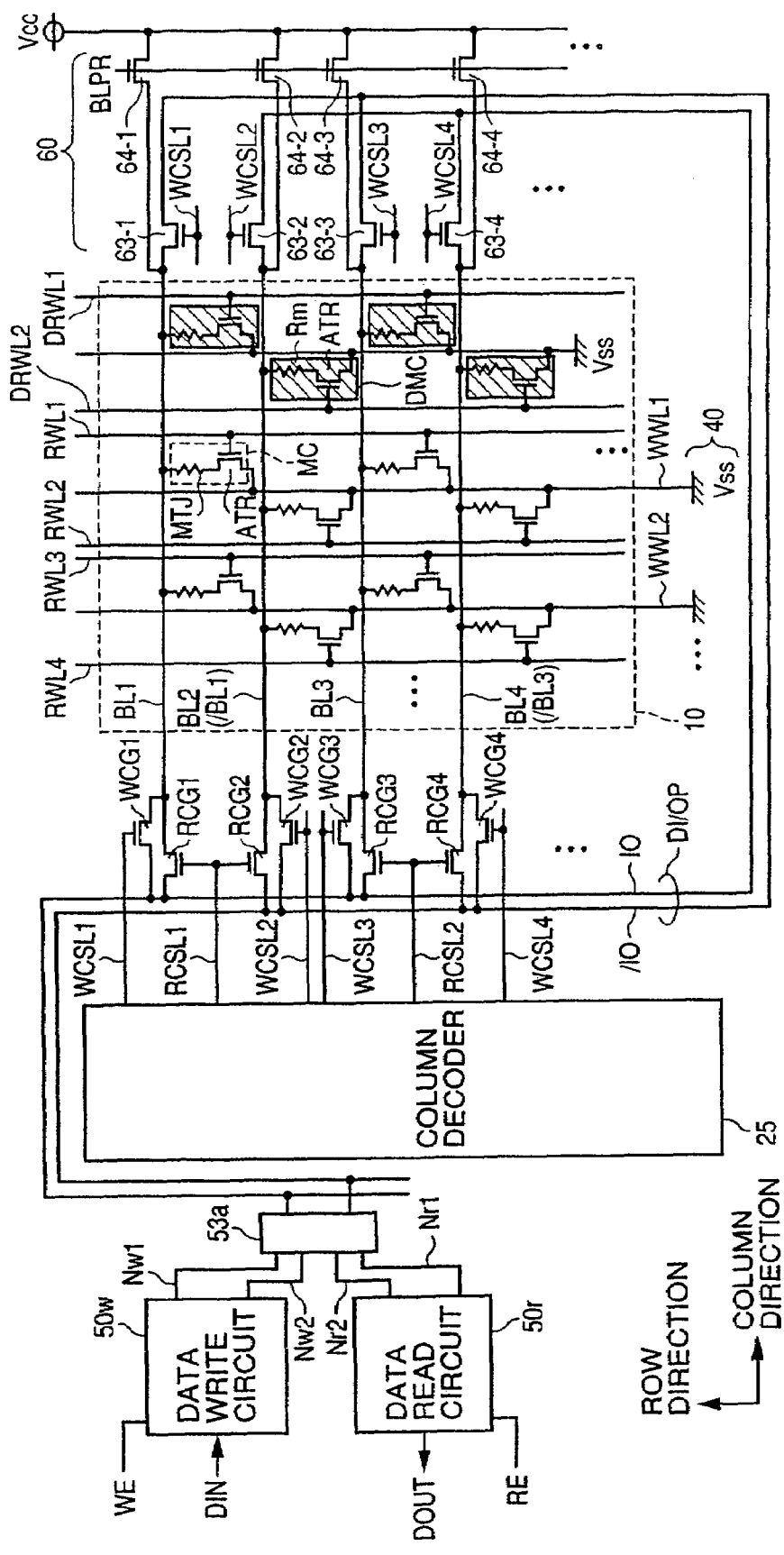
FIG. 58 is a block diagram showing the structure of a memory array and its peripheral circuitry according to a fifth modification of the sixth embodiment.

The structure of FIG. 58 is different from that of FIG. 15 in that the reference voltage lines SL are eliminated, and in the connection between the memory cell MC and the read word line RWL, write word line WWL and bit line BL. Since the structure of the peripheral circuitry for supplying the data write current and sense current to the bit line BL, and the operation in reading and writing the data are the same as those of FIG. 15, detailed description thereof will not be repeated.

Accordingly, in the memory cell arrangement of the sixth embodiment as well, the data read operation based on the folded bit line structure ensures the operation margin. At the same time, sharing the write word lines achieves improved integration of the memory array 10.

Sixth Modification of Sixth Embodiment

In the sixth modification of the sixth embodiment, the read word line RWL is shared between adjacent memory cell rows, in addition to the folded bit line structure of the fourth modification of the sixth embodiment.

Figure 59:
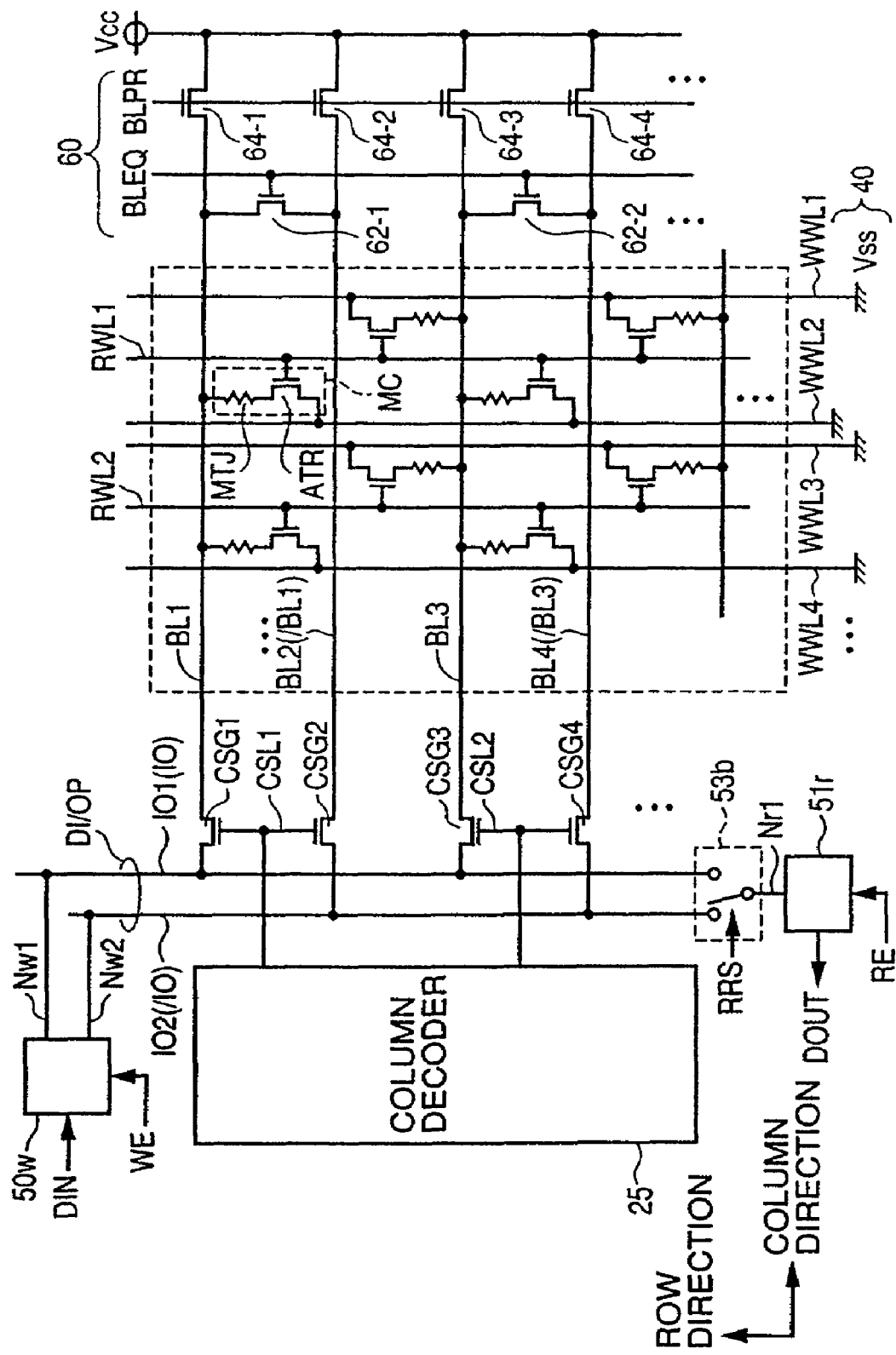
FIG. 59 is a block diagram showing the structure of a memory array and its peripheral circuitry according to a sixth modification of the sixth embodiment.

The structure of FIG. 59 is different from that of FIG. 16 in that the reference voltage lines SL are eliminated, and in the connection between the memory cell MC and the read word line RWL, write word line WWL and bit line BL. Since the structure of the peripheral circuitry for supplying the data write current and sense current to the bit line BL, and the operation in reading and writing the data are the same as those of FIG. 16, detailed description thereof will not be repeated.

Accordingly, in the memory cell arrangement of the sixth embodiment as well, the data write operation based on the folded bit line structure ensures the operation margin, simplifies the structure of the peripheral circuitry and reduces the data write noise. At the same time, sharing the read word lines achieves improved integration of the memory array 10.

Seventh Embodiment

Figure 60:
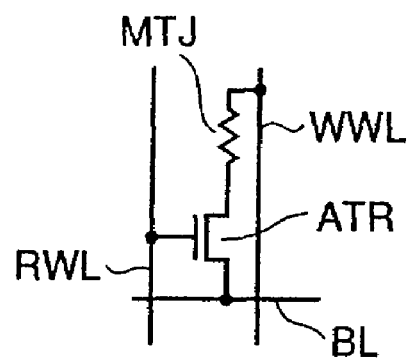
FIG. 60 is a circuit diagram showing the connection between a memory cell and signal wirings according to a seventh embodiment.

Referring to FIG. 60, the bit line BL is electrically coupled to the magnetic tunnel junction MTJ through the access transistor ATR. The magnetic tunnel junction MTJ is coupled between the write word line WWL and access transistor ATR. The read word line RWL is coupled to the gate of the access transistor ATR. The read word line RWL and write word line WWL extend in parallel with each other, and the bit line BL extends in such a direction as to cross the read and write word lines.

The memory cell of the seventh embodiment corresponds to the memory cell of the sixth embodiment with its bit line BL and write word line WWL switched in position with respect to the magnetic tunnel junction MTJ and access transistor ATR. Accordingly, the kinds of signal lines are the same as those of the sixth embodiment, and each signal line has the same voltage and current waveform as those of the sixth embodiment in the data read and write operations. Therefore, detailed description thereof will not be repeated.

Figure 61:
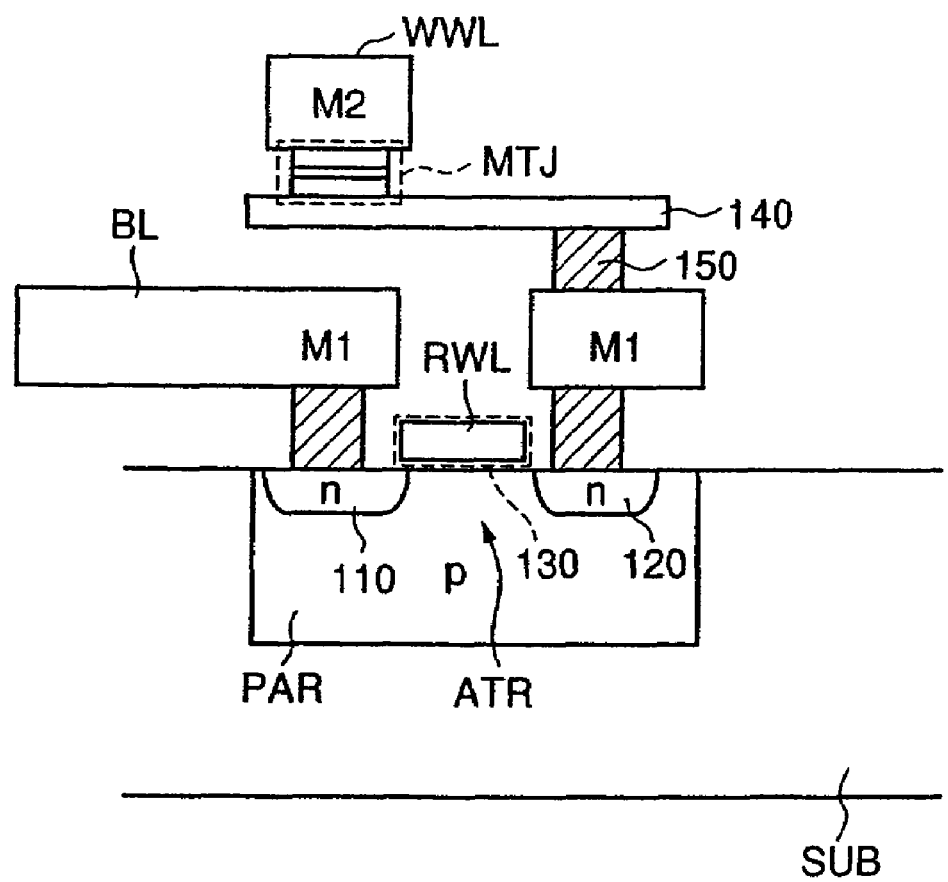
FIG. 61 is a structural diagram illustrating the arrangement of the memory cell according to the seventh embodiment.

Referring to FIG. 61, the bit line BL and write word line WWL are respectively provided in the first and second metal wiring layers M1 and M2. The read word line RWL is provided in the same layer as that of the gate 130 of the access transistor ATR. The magnetic tunnel junction MTJ is directly coupled to the write word line WWL.

Thus, in the memory cell structure of the seventh embodiment as well, the MTJ memory cell can be provided by the two metal wiring layers M1 and M2 without providing the reference voltage line SL.

Moreover, the bit line BL is coupled to the magnetic tunnel junction MTJ through the access transistor ATR. Therefore, each bit line BL is electrically coupled only to the MTJ memory cell to be read, i.e., the MTJ memory cell of the memory cell row corresponding to the read word line RWL activated to the selected state (H level). Accordingly, as in the third embodiment, the capacitance of the bit line BL can be suppressed, whereby a high-speed operation can be achieved particularly for the read operation.

Figure 62:
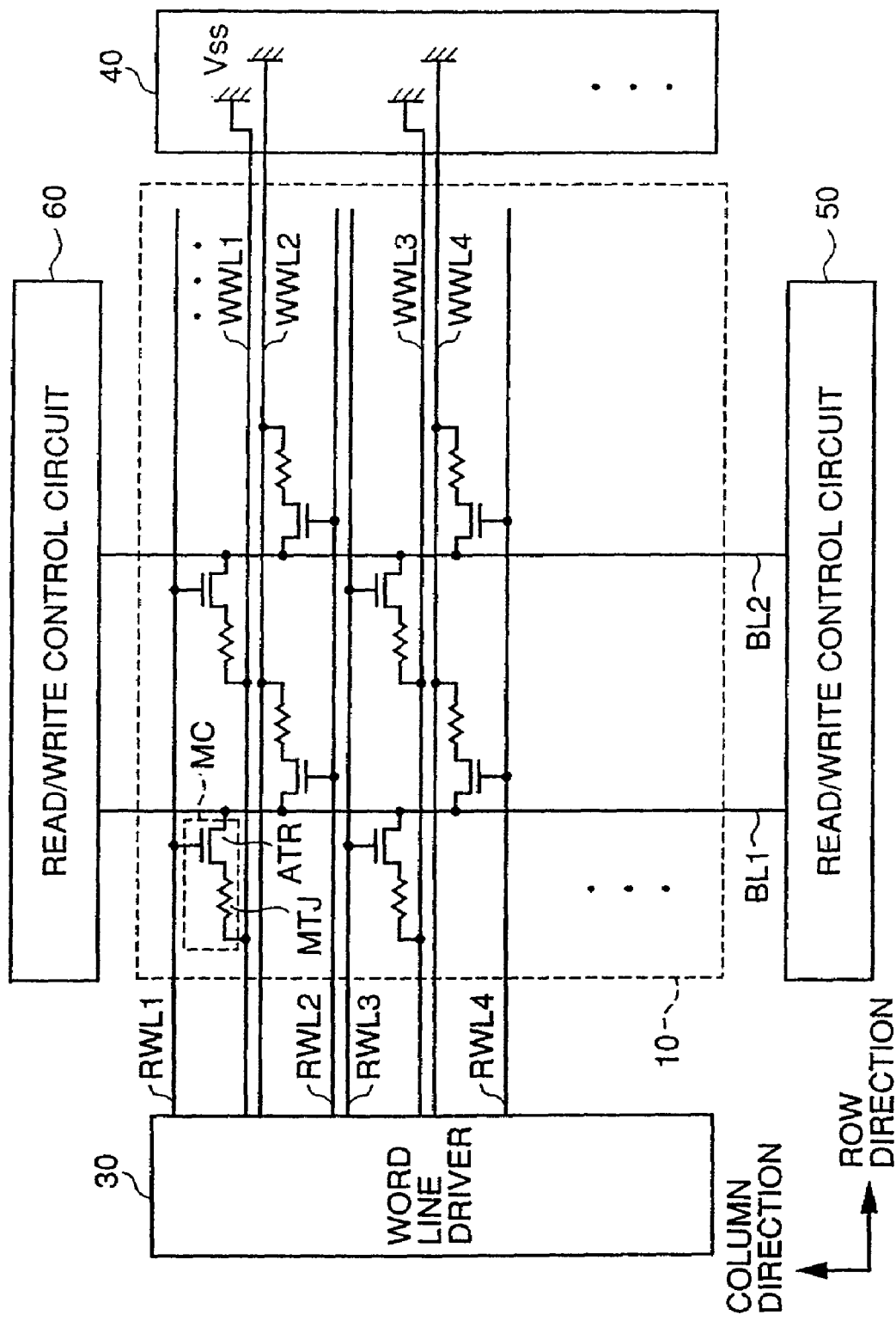
FIG. 62 is a block diagram showing the structure of a memory array according to the seventh embodiment.

Referring to FIG. 62, in the memory array 10 of the seventh embodiment, adjacent memory cells in the row direction share the same bit line BL.

Since the respective structures of the read word line RWL, write word line WWL and word line current control circuit 40 as well as the memory cell operation in reading and writing the data are the same as those of the sixth embodiment, description thereof will not be repeated.

With such a structure, the pitch of the bit lines BL in the memory array 10 can be widened also in the memory cell arrangement of the seventh embodiment capable of reducing the number of signal wirings as well as achieving a high-sped data read operation. As a result, the memory cells MC are efficiently arranged, whereby improved integration of the memory array 10 as well as reduced chip area of the MRAM device can be achieved.

As in the third embodiment, in the memory cell structure of the seventh embodiment, the distance between the bit line BL and magnetic tunnel junction MTJ is larger than that between the write word line WWL and magnetic tunnel junction MTJ. This requires a larger data write current to be supplied to the bit line BL. Accordingly, increased electromigration resistance of the bit lines BL is effective for improved reliability of the MRAM device.

More specifically, in the memory cell arrangement of the seventh embodiment as well, increased electromigration resistance of the bit line BL can be achieved by making the line width (cross-sectional area) of the bit line BL larger than that of the write word line WWL having a shorter distance to the magnetic tunnel junction. As a result, the reliability of the MRAM device can be improved. Regarding a material as well, it is desirable to form the bit line BL from a highly electromigration-resistant material.

First Modification of Seventh Embodiment

Figure 63:
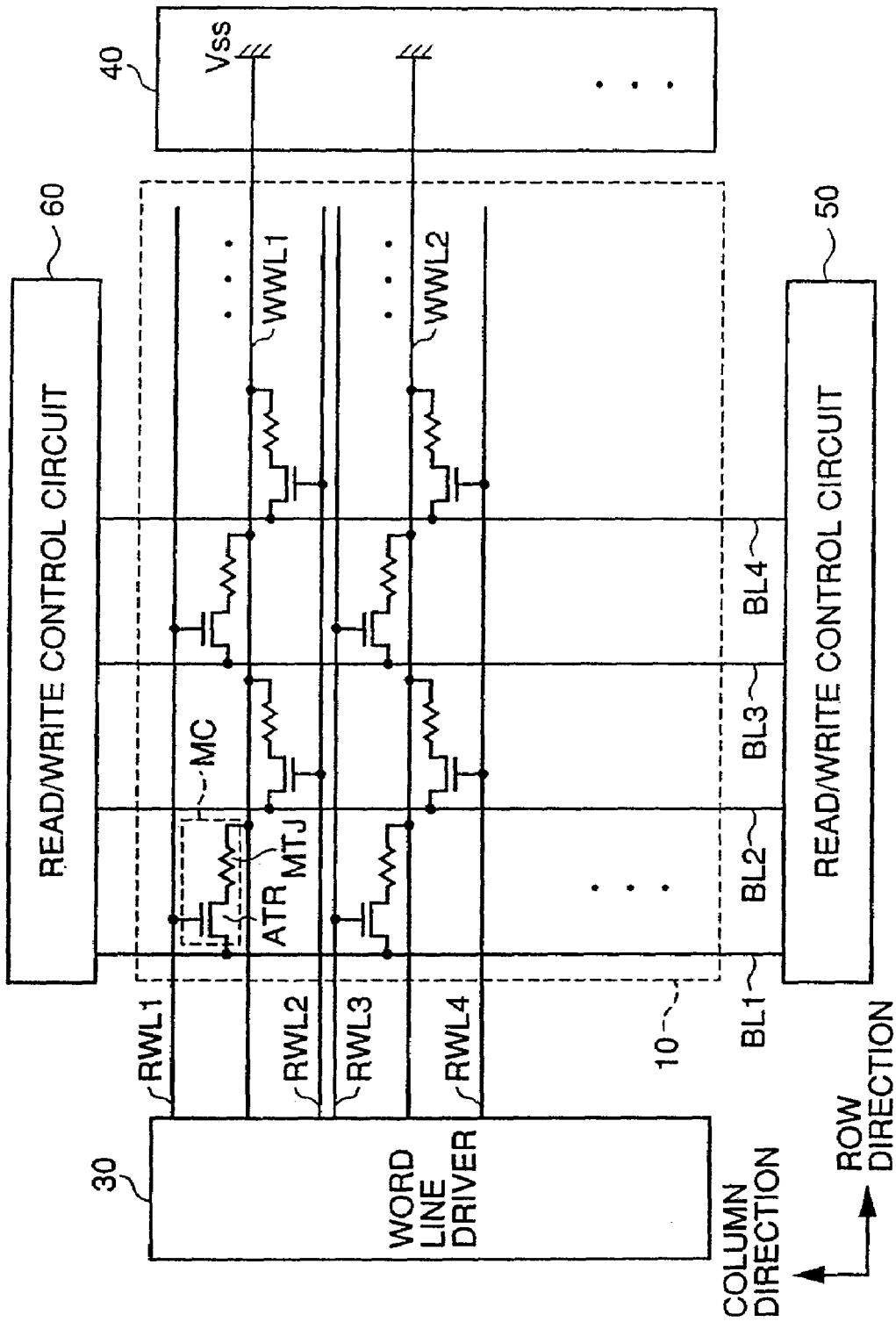
FIG. 63 is a block diagram showing the structure of a memory array according to a first modification of the seventh embodiment.

Referring to FIG. 63, in the memory array 10 according to the first modification of the seventh embodiment, adjacent memory cells in the column direction share the same write word line WWL, as in the case of FIG. 54. Accordingly, the memory cells MC are arranged alternately for the same reason as that of FIG. 7.

Since the structure of the other portions and the memory cell operation in reading and writing the data are the same as those of the seventh embodiment, detailed description thereof will not be repeated.

With such a structure, the pitch of the write word lines WWL in the memory array 10 can be widened also in the memory cell arrangement of the seventh embodiment. As a result, the memory cells MC can be efficiently arranged, whereby improved integration of the memory array 10 as well as reduced chip area of the MRAM device can be achieved.

Second Modification of Seventh Embodiment

Figure 64:
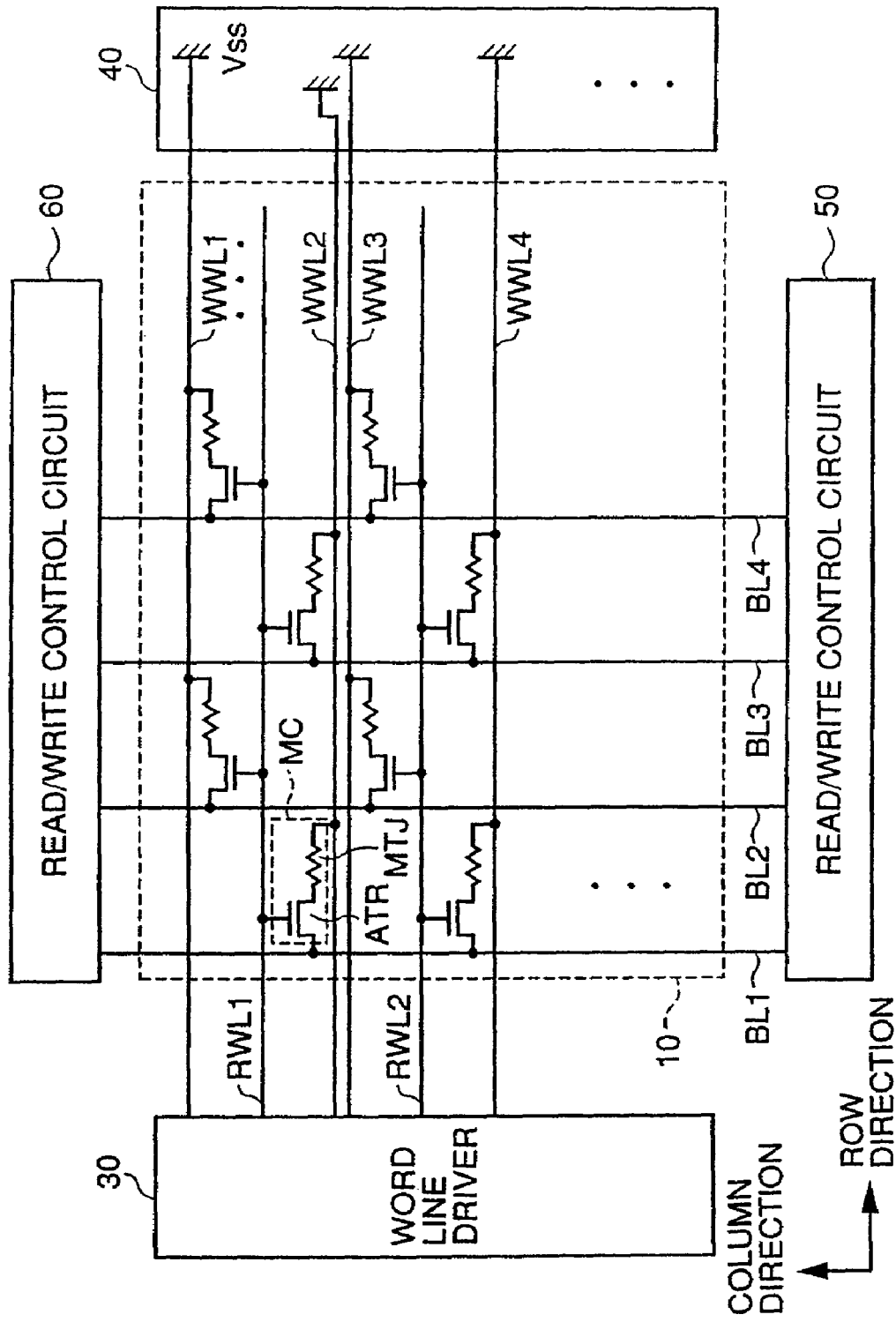
FIG. 64 is a block diagram showing the structure of a memory array according to a second modification of the seventh embodiment.

Referring to FIG. 64, in the memory array 10 according to the second modification of the seventh embodiment, adjacent memory cells in the column direction share the same read word line RWL as in the case of FIG. 55. The memory cells MC are arranged alternately as in the case of FIG. 9.

Since the structure of the other portions and the memory cell operation in reading and writing the data are the same as those of the seventh embodiment, detailed description thereof will not be repeated.

With such a structure, the pitch of the read word lines RWL in the memory array 10 can be widened also in the memory cell arrangement of the seventh embodiment. As a result, the memory cells MC can be efficiently arranged, whereby improved integration of the memory array 10 as well as reduced chip area of the MRAM device can be achieved.

Third Modification of Seventh Embodiment

Figure 65:
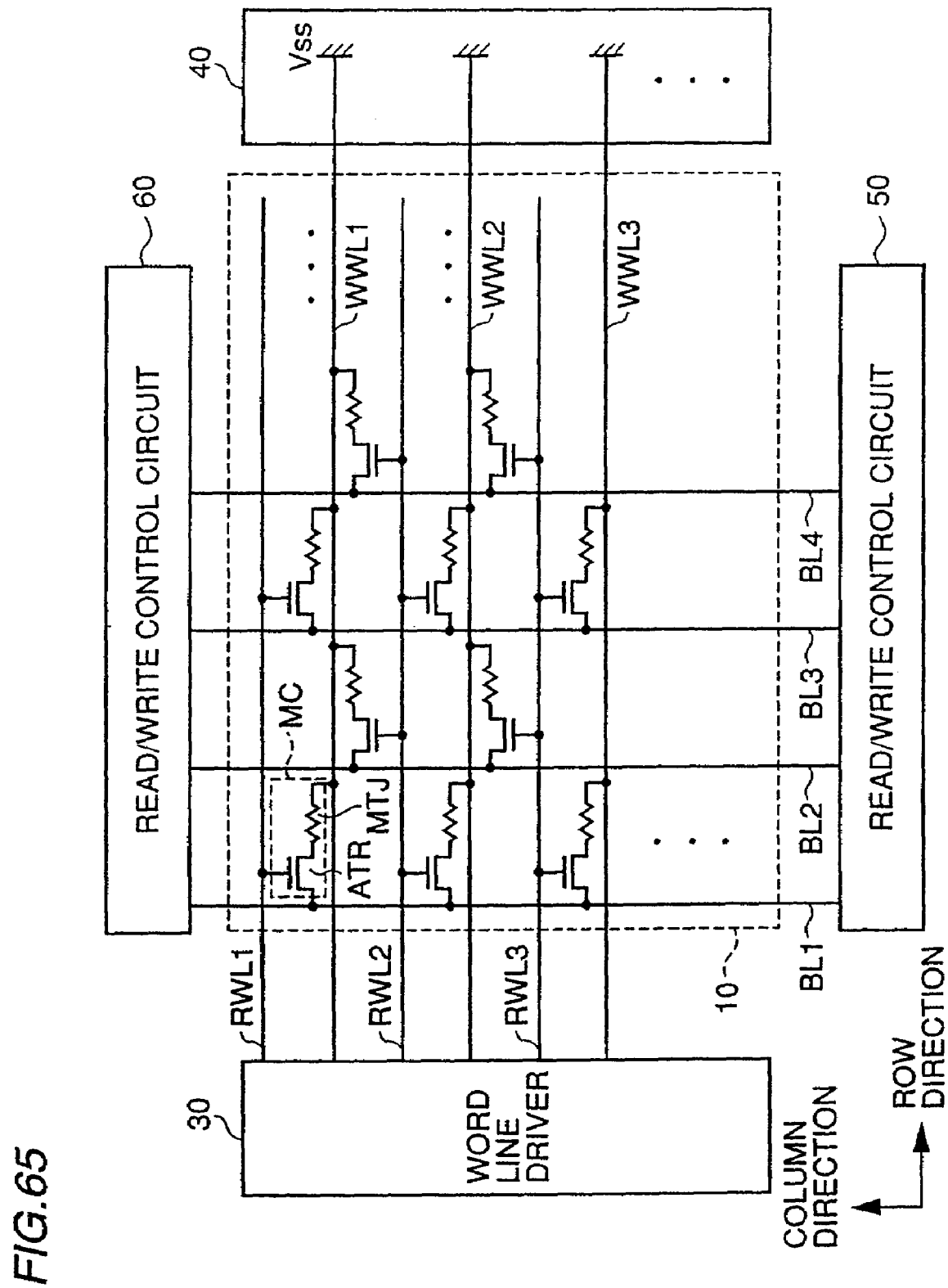
FIG. 65 is a block diagram showing the structure of a memory array according to a third modification of the seventh embodiment.

Referring to FIG. 65, in the memory array 10 according to the third modification of the seventh embodiment, adjacent memory cells in the column direction share the same write word line WWL as in the first modification of the seventh embodiment. Moreover, the read word line RWL is also shared between adjacent memory cells in the column direction. For example, the memory cell group of the second and third memory cell rows shares the same read word line RWL2. In the following memory cell rows as well, the read word lines RWL and write word lines WWL are arranged similarly. The memory cells MC are arranged alternately as in the case of FIG. 10.

Since the structure of the other portions and the memory cell operation in reading and writing the data are the same as those of the seventh embodiment, detailed description thereof will not be repeated.

With such a structure, the pitches of the write word lines WWL and read word lines RWL in the memory array 10 can be widened also in the memory cell arrangement of the seventh embodiment. As a result, the memory cells MC can be more efficiently arranged, whereby further improved integration of the memory array 10 as well as further reduced chip area of the MRAM device can be achieved as compared to the first and second modifications of the seventh embodiment.

Fourth Modification of Seventh Embodiment

Figure 66:
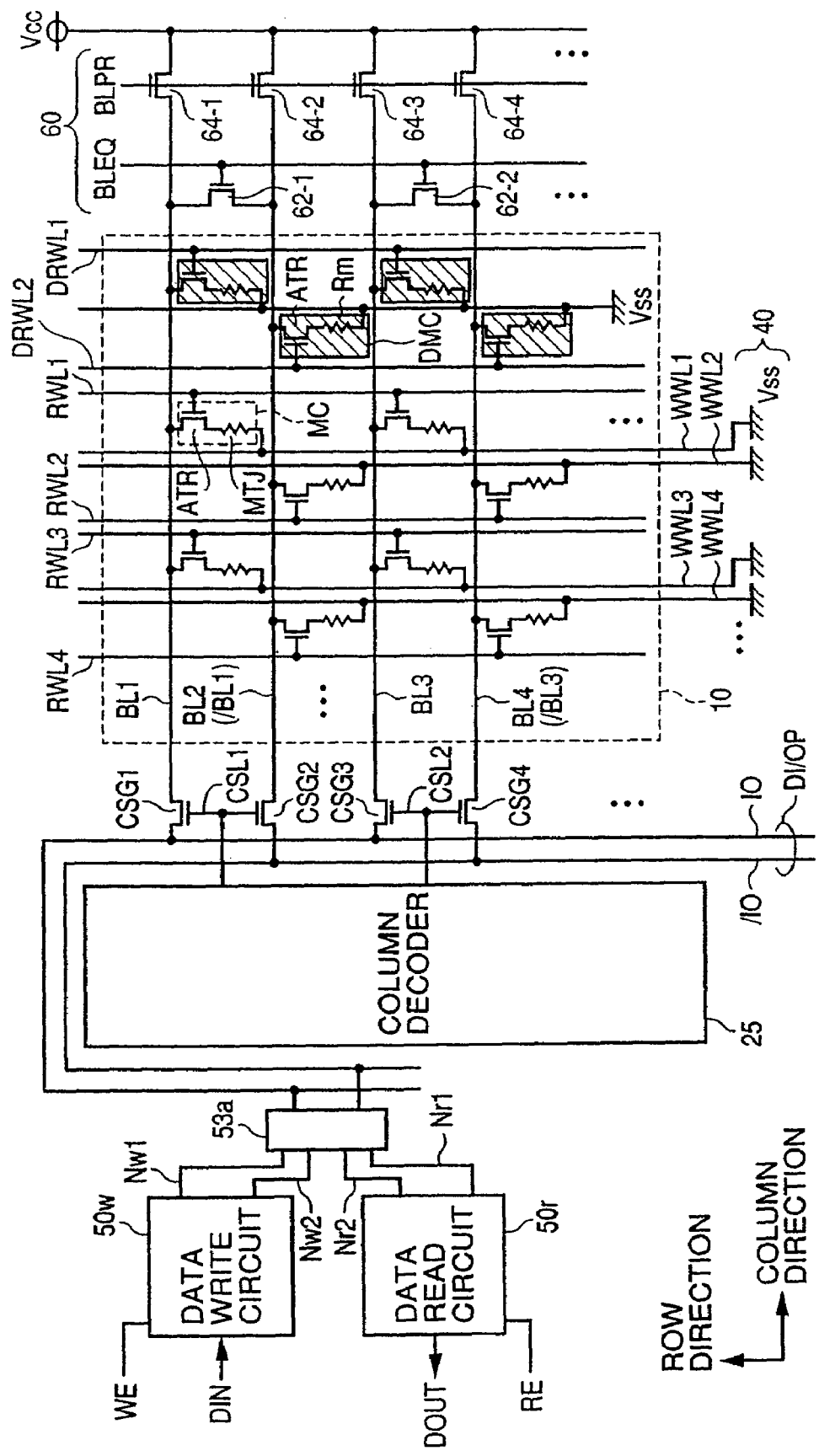
FIG. 66 is a block diagram showing the structure of a memory array and its peripheral circuitry according to a fourth modification of the seventh embodiment.

Referring to FIG. 66, in the memory cells of the seventh embodiment arranged in rows and columns, the folded bit line structure is applied using two bit lines of each set of adjacent two memory cell columns, as in the case of the second embodiment.

The structure of FIG. 66 is different from that of FIG. 57 in that, in each memory cell MC, the access transistor ATR is connected to the bit line BL and the magnetic tunnel junction MTJ is connected to the write word line WWL.

Since the structure of the other portions and the operation in reading and writing the data are the same as those of FIG. 57, detailed description thereof will not be repeated.

Accordingly, in the memory cell arrangement of the seventh embodiment as well, the read and write operation margins can be ensured by the folded bit line structure. Moreover, like the second embodiment, the structure of the peripheral circuitry including the data write circuit 50w and read/write control circuit 60 can be simplified as well as the data write noise can be reduced.

Fifth Modification of Seventh Embodiment

In the fifth modification of the seventh embodiment, the write word line WWL is shared between adjacent memory cell rows, in addition to the folded bit line structure of the fourth modification of the seventh embodiment.

Figure 67:
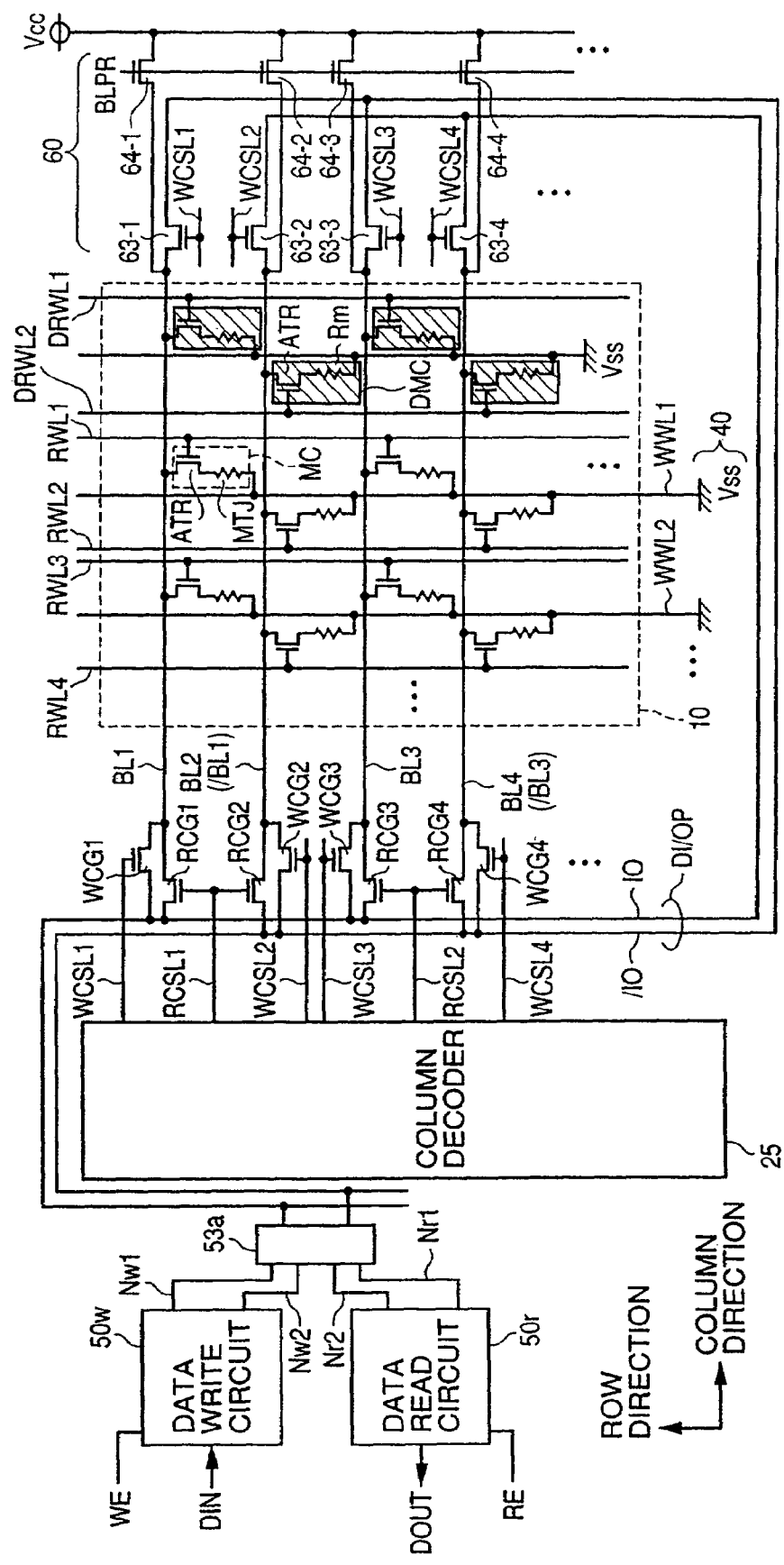
FIG. 67 is a block diagram showing the structure of a memory array and its peripheral circuitry according to a fifth modification of the seventh embodiment.

The structure of FIG. 67 is different from that of FIG. 58 in that, in each memory cell MC, the access transistor ATR is connected to the bit line and the magnetic tunnel junction MTJ is connected to the write word line WWL.

Since the structure of the other portions and the operation in reading and writing the data are the same as those of FIG. 58, detailed description thereof will not be repeated.

Accordingly, in the memory cell arrangement of the seventh embodiment as well, the data read operation based on the folded bit line structure ensures the operation margin. At the same time, sharing the write word lines achieves improved integration of the memory array 10.

Sixth Modification of Seventh Embodiment

In the sixth modification of the seventh embodiment, the read word line RWL is shared between adjacent memory cell rows, in addition to the folded bit line structure of the fourth modification of the seventh embodiment.

Figure 68:
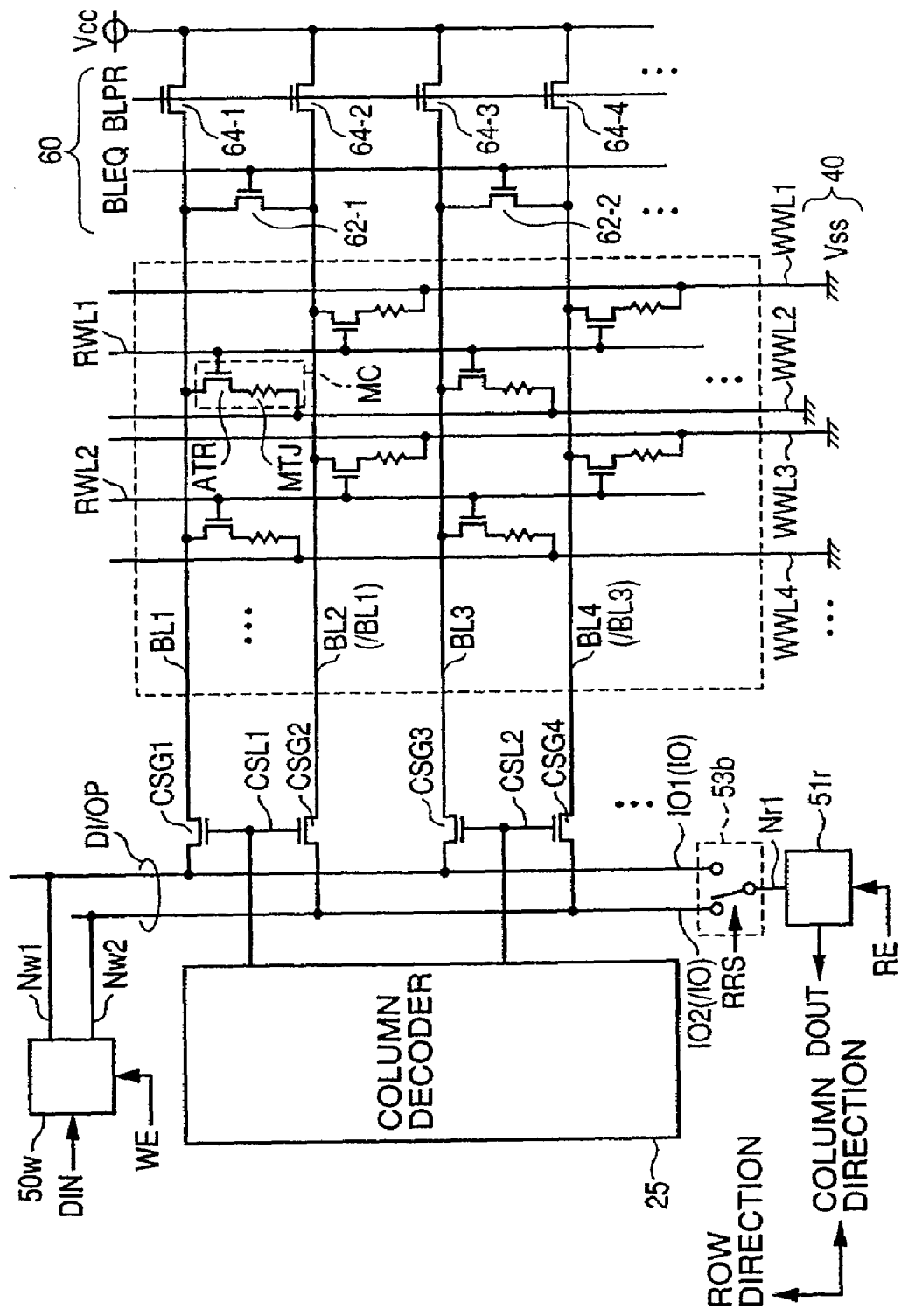
FIG. 68 is a block diagram showing the structure of a memory array and its peripheral circuitry according to a sixth modification of the seventh embodiment.

The structure of FIG. 68 is different from that of FIG. 59 in that, in each memory cell MC, the access transistor ATR is connected to the bit line and the magnetic tunnel junction MTJ is connected to the write word line WWL.

Since the structure of the other portions and the operation in reading and writing the data are the same as those of FIG. 59, detailed description thereof will not be repeated.

Accordingly, in the memory cell arrangement of the seventh embodiment as well, the data write operation based on the folded bit line structure ensures the operation margin, simplifies the structure of the peripheral circuitry and reduces the data write noise. At the same time, sharing the read word lines achieves improved integration of the memory array 10.

Eighth Embodiment

Figure 69:
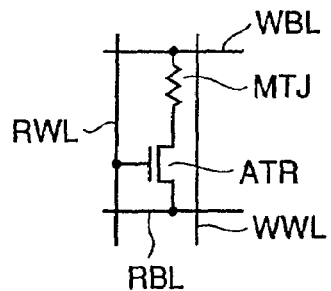
FIG. 69 is a circuit diagram showing the connection between a memory cell and signal wirings according to an eighth embodiment.

Referring to FIG. 69, in the eighth embodiment, a read bit line RBL for supplying the sense current Is in the data read operation and a write bit line WBL for supplying the data write current ±Iw in the data write operation are provided separately.

The access transistor ATR is electrically coupled between the magnetic tunnel junction MTJ and read bit line RBL. In other words, the read bit line RBL is electrically coupled to the magnetic tunnel junction MTJ through the access transistor ATR.

The magnetic tunnel junction MTJ is coupled to the access transistor ATR and write bit line WBL. The read word line RWL and write word line WWL extend in such a direction as to cross the read bit line RBL and write bit line WBL. The read word line RWL is coupled to the gate of the access transistor ATR.

First, the data write operation will be described with reference to FIG. 70.

According to the row selection result of the row decoder 20, the word line driver 30 drives the voltage on the write word line WWL corresponding to the selected row to the selected state (H level). In the non-selected rows, the voltage level on the write word lines WWL is retained in the non-selected state (L level). The word line current control circuit 40 couples each write word line WWL to the ground voltage Vss. Thus, the data write current Ip can be supplied to the write word line WWL of the selected row.

Moreover, the voltage on the write bit line WBL is controlled in the same manner as that of the voltage on the bit line BL in the data write operation as described in FIG. 3, whereby the data write current ±Iw corresponding to the storage data level to be written can be supplied to the write bit line WBL. Thus, the data can be written to the MTJ memory cell.

In the data write operation, the read word lines RWL are retained in the non-selected state (L level). The read bit lines RBL are precharged to the high voltage state (Vcc). Since the access transistors ATR are retained in the OFF state, no current flows through the read bit lines RBL in the data write operation.

In the data read operation, the write word lines WWL are retained in the non-selected state (L level), and the voltage level thereof is fixed to the ground voltage Vss by the word line current control circuit 40.

According to the row selection result of the row decoder 20, the word line driver 30 drives the read word line RWL corresponding to the selected row to the selected state (H level). In the non-selected rows, the voltage level of the read word lines RWL is retained in the non-selected state (L level). The read/write control circuits 50 and 60 supply a fixed amount of sense current Is for conducting the data read operation to the read bit line RBL, and sets the voltage on the write bit lines WBL to the ground voltage Vss.

The read bit lines RBL are precharged to the high voltage state (Vcc) prior to the data read operation. Therefore, when the access transistor ATR is turned ON (actuated) in response to activation of the read word line RWL, a current path of the sense current Is is formed by the read bit line RBL, access transistor ATR, magnetic tunnel junction MTJ and write bit line WBL (ground voltage Vss). Thus, the read bit line RBL is subjected to the voltage drop corresponding to the storage data, enabling the same data read operation as that shown in FIG. 3.

Figure 71:
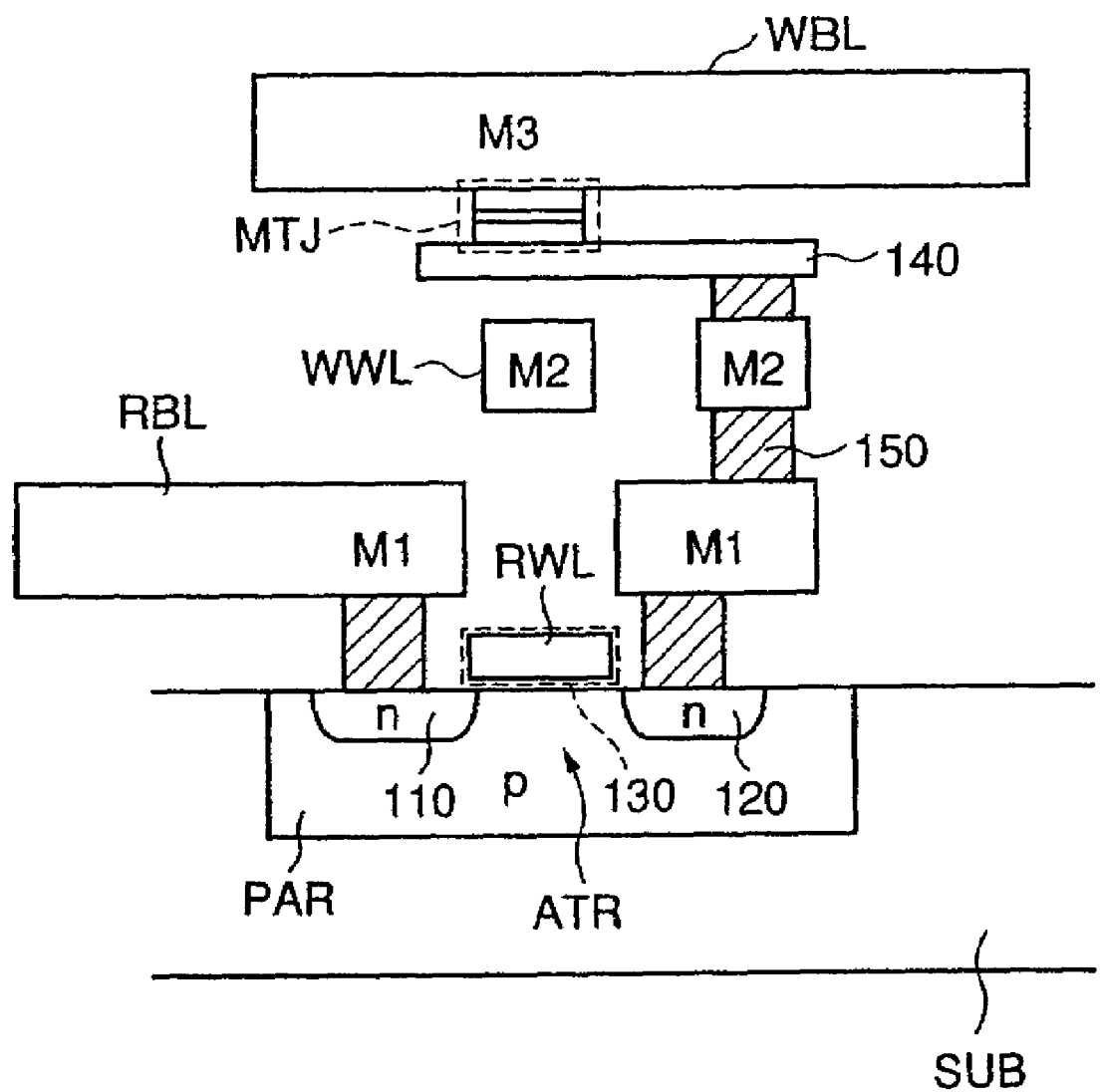
FIG. 71 is a structural diagram illustrating the arrangement of the MTJ memory cell according to the eighth embodiment.

Referring to FIG. 71, the read bit line RBL is provided in the first metal wiring layer M1 so as to be coupled to the source/drain region 110 of the access transistor ATR. The write word line WWL is provided in the second metal wiring layer M2. The write bit line WBL is provided in the third metal wiring layer M3 so as to be coupled to the magnetic tunnel junction MTJ. The MTJ memory cell is coupled to the source/drain region 120 of the access transistor ATR through the first and second metal wiring layers M1, M2, metal film 150, and barrier metal 140.

The read bit line RBL is not directly coupled to the magnetic tunnel junction MTJ, but can be connected through the access transistor ATR only to the magnetic tunnel junction MTJ of the MTJ memory cell to be read. Thus, the capacitance of the read bit line RBL can be suppressed, achieving a high-speed data read operation.

The write bit line WBL has a smaller distance to the magnetic tunnel junction MTJ. Therefore, the magnetic coupling in the data write operation can be increased, so that the data write current ±Iw flowing through the write bit line WBL in the data write operation can be reduced. As a result, the magnetic noise due to the data write current can be reduced as well as the current density of the write bit line can be suppressed, achieving a more reliable operation.

The aforementioned effects can be simultaneously obtained by providing the read bit lines RBL and write bit lines WBL separately.

Figure 72:
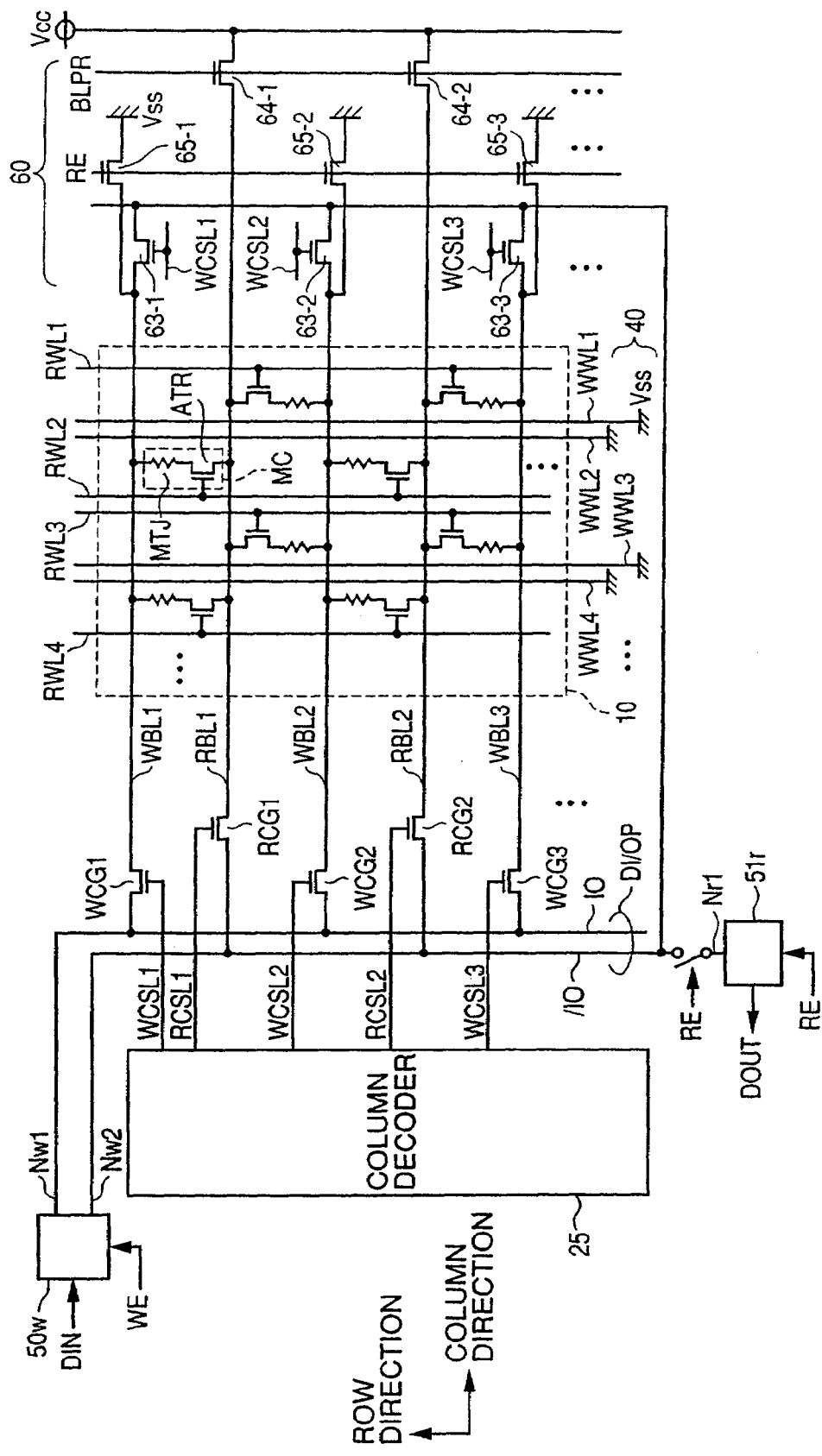
FIG. 72 is a block diagram showing the structure of a memory array according to the eighth embodiment.

Referring to FIG. 72, in the memory array 10 according to the eighth embodiment, the memory cells MC having the structure of FIG. 69 are arranged in rows and columns. The read word lines RWL and write word lines WWL extend in the row direction, whereas the read bit lines RBL and write bit lines RBL extend in the column direction.

The word line current control circuit 40 couples each write word line WWL to the ground voltage Vss. Thus, the voltage and current on the write word line WWL in the data read and write operations can be controlled as shown in FIG. 70.

Adjacent memory cells in the row direction share either the read bit line RBL or write bit line WBL.

For example, the memory cell group of the first and second memory cell columns shares a single read bit line RBL1, and the memory cell group of the second and third memory cell columns share a single write bit line WBL2. In the following memory cell columns as well, the read bit lines RBL and write bit lines WBL are arranged alternately in the same manner.

If the data is to be read from or written to a plurality of memory cells MC corresponding to the same read bit line RBL or write bit line WBL, data conflict occurs. Therefore, the memory cells MC are arranged alternately.

With such a structure, the pitches of the read bit lines RBL and write bit lines WBL in the memory array 10 can be widened. As a result, the memory cells MC can be arranged efficiently, whereby improved integration of the memory array 10 as well as reduced chip area of the MRAM device can be achieved.

Hereinafter, the structure of the peripheral circuitry for supplying the data write current ±Iw and sense current Is will be described.

The column selection lines are provided corresponding to the respective memory cell columns, i.e., the respective bit lines, separately for the data read operation and write operation. FIG. 72 exemplarily shows the read column selection lines RCSL1 and RCSL2 respectively corresponding to the first and second memory cell columns, and the write column selection lines WCSL1 to WCSL3 respectively corresponding to the first to third memory cell columns. Hereinafter, such a plurality of read column selection lines and a plurality of write column selection lines are also generally referred to as read column selection lines RCSL and write column selection lines WCSL, respectively.

In the data read operation, the column decoder 25 activates one of the plurality of read column selection lines RCSL to the selected state (H level) according to the column selection result. In the data write operation, the column decoder 25 activates one of the plurality of write column selection lines WCSL to the selected state (H level) according to the column selection result.

Like the column selection lines, the column selection gates are also provided corresponding to the respective memory cell columns, separately for the data read operation and write operation. FIG. 72 exemplarily shows the read column selection gates RCG1 and RCG2 respectively corresponding to the first and second memory cell columns, and the write column selection gates WCG1 to WCG3 respectively corresponding to the first to third memory cell columns.

The write column selection gate WCG is electrically coupled between a corresponding write bit line WBL and data line 10. The read column selection gate RCG is electrically coupled between a corresponding read bit line RBL and data line /IO.

The data I/O line pair DI/OP formed from the data lines IO and /IO transmits the data write current ±Iw in the data write operation. In the data read operation, the sense current is transmitted through one data line /IO.

The data write circuit 50w for supplying the data write current ±Iw has its nodes Nw1 and Nw2 connected to the data lines IO and /IO, respectively. The data read circuit 51r has its node Nr1 connected to the data line /IO. Since the structure and operation of the data write circuit 50w and data read circuit 51r are the same as those described in FIGS. 14 and 17, detailed description thereof will not be repeated.

The read column selection lines RCSL are provided corresponding to the respective read column selection gates RCG. Similarly, the write column selection lines WCLS are provided corresponding to the respective write column selection gates WCG. For example, the read column selection gate RCG1 and write column selection gate WCG1 both corresponding to the bit line BL1 are tuned ON/OFF according to the voltage level on the read column selection line RCSL1 and write column selection line WCSL1, respectively.

One of the bit lines is selected according to the decode result of the column address CA, i.e., the column selection result. In response to the read column selection lines RCSL or write column selection lines WCSL activated according to the column selection result, corresponding write column selection gates WCG or read column selection gates RCG are turned ON. As a result, the selected bit line is electrically coupled to one of the data lines IO and /IO of the data I/O line pair DI/OP.

The read/write control circuit 60 includes write current control transistors, precharging transistors, and write bit line voltage control transistors, which are provided corresponding to the respective memory cell columns. FIG. 72 exemplarily shows the write current control transistors 63-1 to 63-3 and write bit line voltage control transistors 65-1 to 65-3, which are provided respectively corresponding to the first to third memory cell columns, i.e., the write bit lines WBL1 to WBL3, and the precharging transistors 64-1 to 64-3 provided respectively corresponding to the read bit lines RBL1 to RBL3. Hereinafter, such a plurality of write bit line voltage control transistors are also generally referred to as write bit line voltage control transistors 65.

In the data read operation, each write bit line voltage control transistor 65 is turned ON and couples a corresponding write bit line WBL to the ground voltage Vss in order to ensure the current path of the sense current Is. In the operation other than the data read operation, each write bit line voltage control transistor 65 is turned OFF, so that each write bit line WBL is disconnected from the ground voltage Vss. Since the arrangement and operation of the write current control transistors 63 and precharging transistors 64 are the same as those of FIG. 15, description thereof will not be repeated.

With such a structure, in the data write operation, the data write current ±Iw can be supplied to the path formed by the data line IO, write column selection gate WCG, write bit line WBL, write current control transistor 63, and data line /IO in the selected memory cell column. Note that it is possible to control the direction of the data write current ±Iw by setting the respective voltages on the data lines IO and /IO in the same manner as that of the second embodiment. Accordingly, like the second embodiment, the structure of the peripheral circuitry associated with the data write operation, i.e., the data write circuit 50w and read/write control circuit 60, can be simplified.

Figure 70:
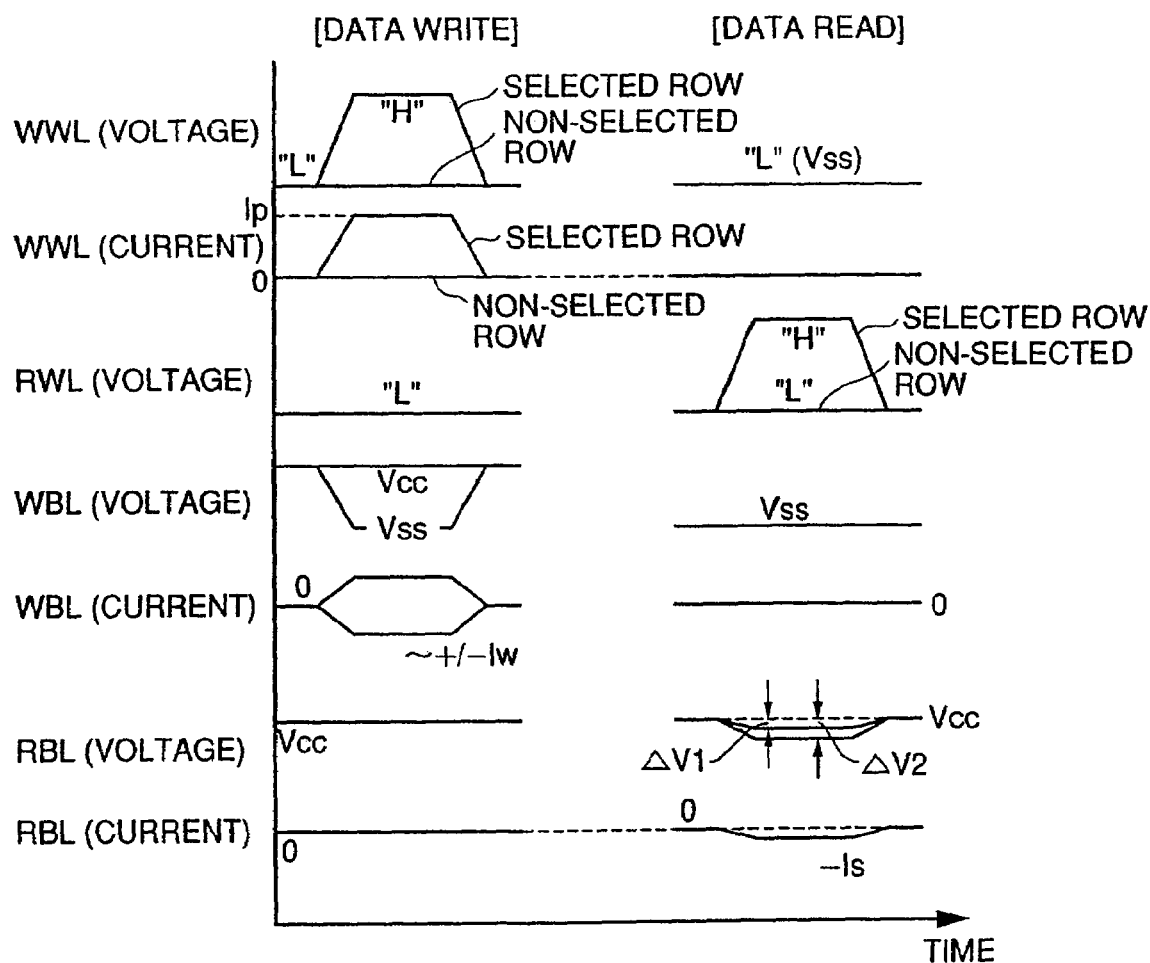
FIG. 70 is a timing chart illustrating the data write and read operations to and from the MTJ memory cell according to the eighth embodiment.

Thus, even in the structure having the read bit lines RBL and write bit lines WBL separately, the data read and write operations as shown in FIG. 70 can be conducted according to the row and column selection results.

First Modification of Eighth Embodiment

Figure 73:
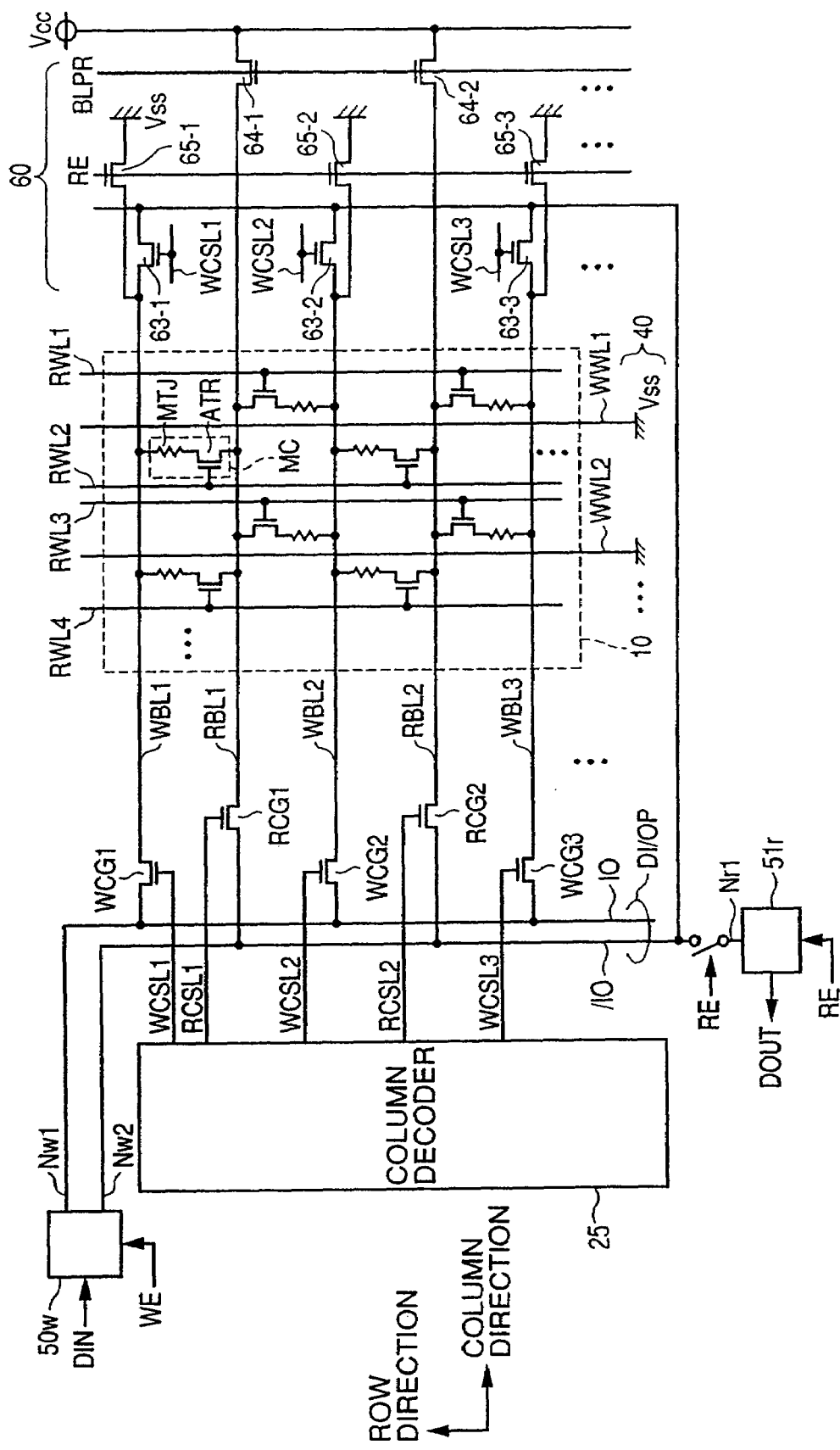
FIG. 73 is a block diagram showing the structure of a memory array according to a first modification of the eighth embodiment.

Referring to FIG. 73, in the memory array 10, adjacent memory cells in the row direction share either the read bit line RBL or write bit line WBL as in the eighth embodiment. Moreover, in the first modification of the eighth embodiment, adjacent memory cells in the column direction share the same write word line WWL. For example, the memory cell group of the first and second memory cell rows share the same write word line WWL1. The memory cells MC are arranged alternately.

Since the structure of the other portions and the memory cell operation in reading and writing the data are the same as those of the eighth embodiment, detailed description thereof will not be repeated.

With such a structure, the pitch of the write word lines WWL in the memory array 10 can be widened also in the memory cell arrangement of the eighth embodiment having the read bit lines RBL and write bit lines WBL separately. As a result, the memory cells MC can be arranged efficiently, whereby improved integration of the memory array 10 as well as reduced chip area of the MRAM device can be achieved.

In the memory cell structure of the eighth embodiment, the distance between the write word line WWL and magnetic tunnel junction MTJ is larger than that between the write bit line WBL and magnetic tunnel junction MTJ. This requires a larger data write current to be supplied to the write word line WWL, as in the case of the memory cell of the first embodiment.

Accordingly, the limitations on pitch of the write word lines WWL are reduced to ensure the cross-sectional area thereof. Thus, the current density of the write word line WWL can be reduced. As a result, the electromigration resistance of the write word line WWL receiving a large data write current is increased, whereby the reliability of the MRAM device can be improved. Regarding a material as well, it is desirable to form the write word line WWL from a material having higher electromigration resistance than that of the write bit line WBL.

Second Modification of Eighth Embodiment

Figure 74:
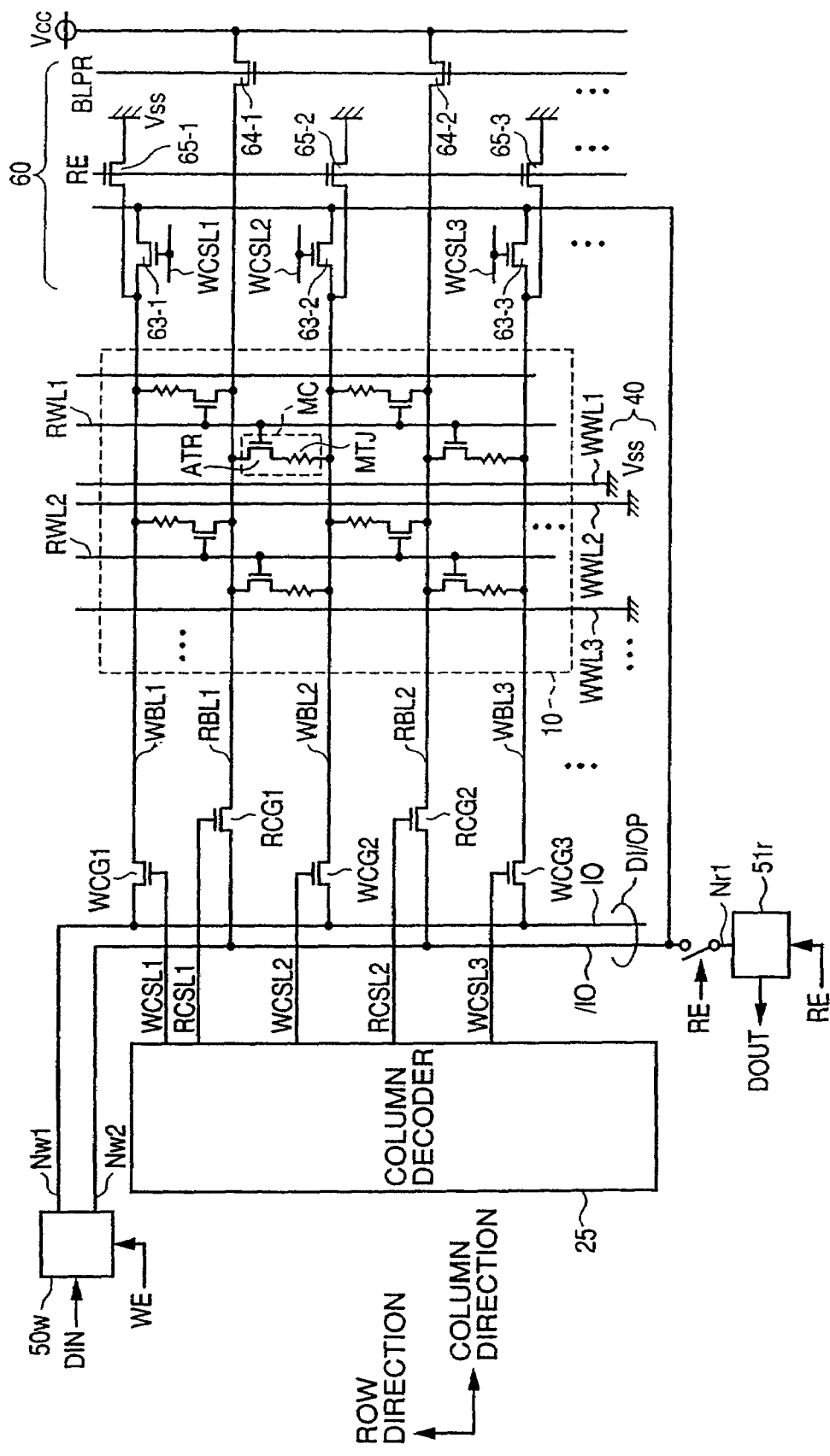
FIG. 74 is a block diagram showing the structure of a memory array according to a second modification of the eighth embodiment.

Referring to FIG. 74, in the memory array 10 according to the second modification of the eighth embodiment, adjacent memory cells in the row direction share either the same read bit line RBL or write bit line WBL as in the case of the eighth embodiment. Moreover, in the second modification of the eighth embodiment, adjacent memory cells in the column direction share the same read word line RWL. For example, the memory cell group of the first and second memory cell rows share the same read word line RWL1. The memory cells MC are arranged alternately.

Since the structure of the other portions and the memory cell operation in reading and writing the data are the same as those of the eighth embodiment, detailed description thereof will not be repeated.

With such a structure, the pitch of the read word lines RWL in the memory array 10 can be widened also in the memory cell arrangement of the eighth embodiment having the read bit lines RBL and write bit lines WBL separately. As a result, the memory cells MC can be efficiently arranged, whereby improved integration of the memory array 10 as well as reduced chip area of the MRAM device can be achieved.

Third Modification of Eighth Embodiment

Figure 75:
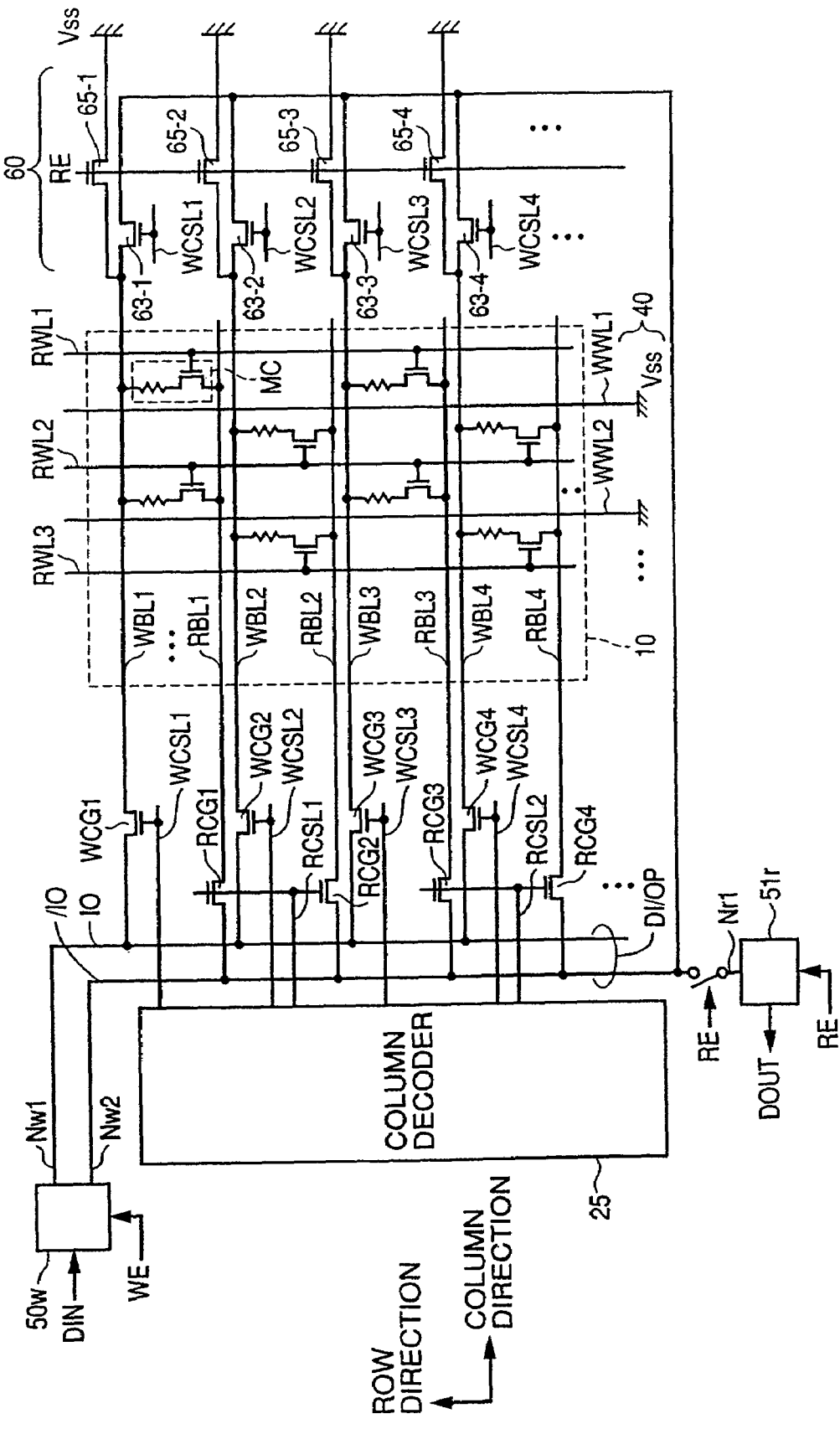
FIG. 75 is a block diagram showing the structure of a memory array according to a third modification of the eighth embodiment.

Referring to FIG. 75, in the memory array 10 according to the third modification of the eighth embodiment, adjacent memory cells in the row direction share the same write word line WWL, as in the first modification of the eighth embodiment. Moreover, the read word line RWL is also shared between adjacent memory cells in the column direction. For example, the memory cell group of the second and third memory cell rows share the same read word line RWL2. In the following memory cell rows as well, the read word lines RWL and write word lines WWL are arranged similarly.

However, in the case where both the read word line RWL and write word line WWL are shared, it is not possible to share the read bit line RBL and write bit line WBL between adjacent memory cells in the column direction. Accordingly, in FIG. 75, the read bit lines RBL and write bit lines WBL are both provided corresponding to the respective memory cell columns.

Since the structure of the other portions and the memory cell operation in reading and writing the data are the same as those of the eighth embodiment, detailed description thereof will not be repeated. Note that, although not shown in FIG. 75 for convenience, the precharging transistors 64 are provided corresponding to the respective read bit lines RBL, as in the case of FIGS. 72 to 74.

With such a structure, the pitches of the write word lines WWL and read word lines RWL in the memory array 10 can be widened also in the memory cell arrangement of the eighth embodiment. As a result, the memory cells MC can be arranged with the limitations on wiring pitch in the row direction being intensively reduced. Thus, improved integration of the memory array 10 as well as reduced chip area of the MRAM device can be achieved.

Fourth Modification of Eighth Embodiment

Figure 76:
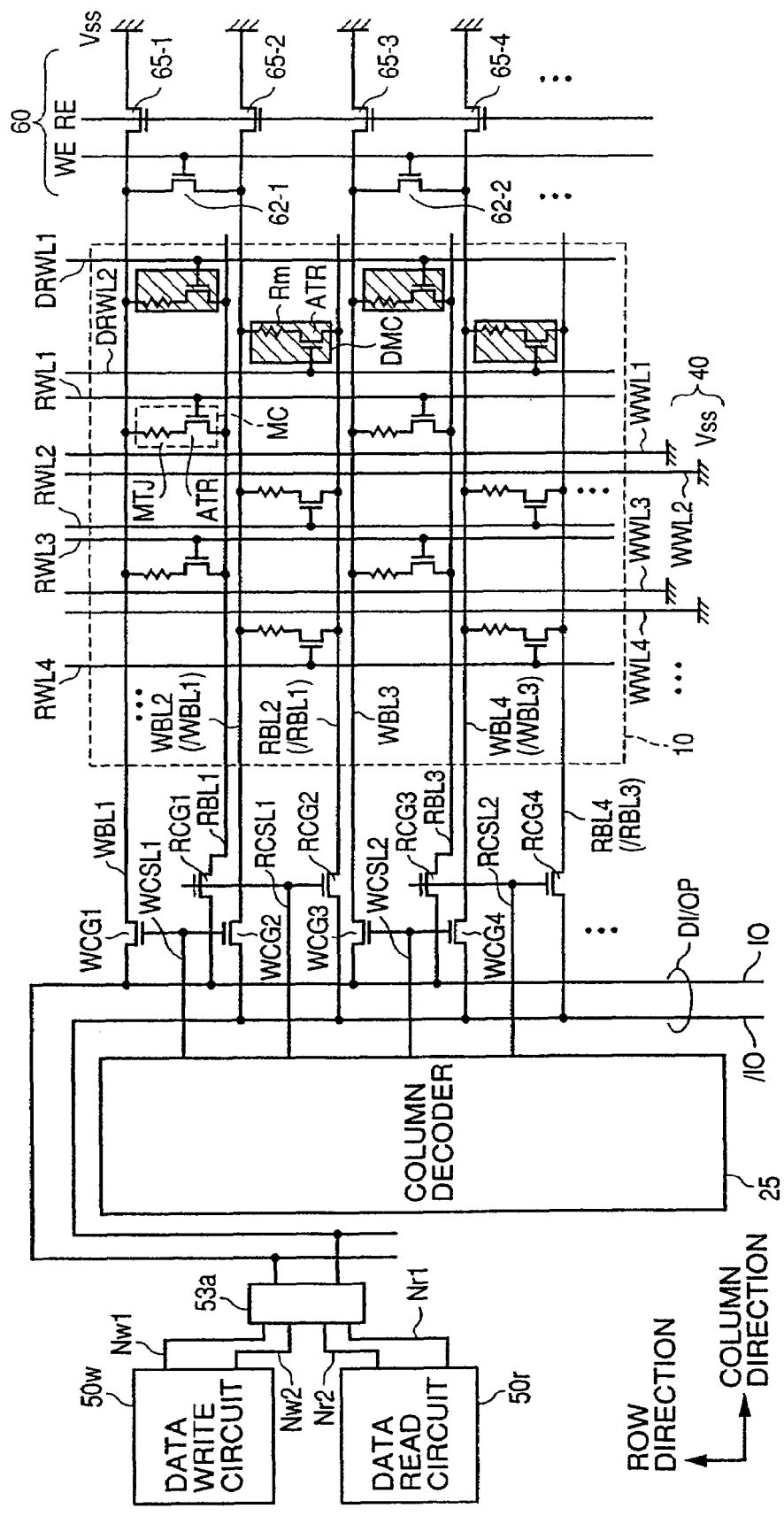
FIG. 76 is a block diagram showing the structure of a memory array and its peripheral circuitry according to a fourth modification of the eighth embodiment.

Referring to FIG. 76, in the memory cells of the eighth embodiment arranged in rows and columns, the folded bit line structure is applied using two read bit lines and two write bit lines of each set of adjacent two memory cell columns, as in the case of the second embodiment. For example, a write bit line pair can be formed from the write bit lines WBL1 and WBL2 respectively corresponding to the first and second memory cell columns. In this case, the write bit line WBL2 is also referred to as write bit line /WBL1 because it transmits the data complementary to that of the write bit line WBL1. Similarly, a read bit line pair can be formed from the read bit lines RBL1 and RBL2 (/RBL1) respectively corresponding to the first and second memory cell columns.

In the following memory cell columns as well, the read bit lines RBL and write bit lines WBL are similarly arranged such that the read bit lines and write bit lines in each set of memory cell columns form a read bit line pair and a write bit line pair, respectively.

Hereinafter, one write bit line of each write bit line pair corresponding to an odd memory cell column is also generally referred to as write bit line WBL, and the other write bit line corresponding to an even memory cell column is also generally referred to as write bit line /WBL. Thus, the data write operation can be conducted based on the folded bit line structure.

Similarly, one read bit line of each read bit line pair corresponding to an odd memory cell column is also generally referred to as read bit line RBL, and the other read bit line corresponding to an even memory cell column is also generally referred to as read bit line /RBL. The data read operation is conducted using the dummy memory cells provided for the read bit lines RBL in the same manner as that of the second embodiment. Thus, the data read operation can be conducted based on the folded bit line structure.

The read column selection lines and write column selection lines are provided corresponding to the respective read bit line pairs and write bit line pairs, i.e., the respective sets of memory cell columns. Accordingly, two read column selection gates RCG corresponding to the same set are turned ON/OFF in response to a common read column selection line RCSL, and two write column selection gates WCG corresponding to the same set are turned ON/OFF in response to a common write column selection line WCSL.

For example, the read column selection gates RCG1 and RCG2 corresponding to the first and second memory cell columns operate according to the common read column selection line RCSL1. Similarly, the write column selection gates WCG1 and WCG2 operate according to the common write column selection line WCSL1.

The write column selection gates WCG1, WCG3, . . . corresponding to the write bit lines WBL of the odd columns are each electrically coupled between a corresponding write bit line WBL and data line IO. The write column selection gates WCG2, WCG4, . . . corresponding to the write bit lines /WBL of the even columns are each electrically coupled between a corresponding write bit line /WBL and data line /IO.

Similarly, the read column selection gates RCG1, RCG3, corresponding to the read bit lines RBL of the odd columns are each electrically coupled between a corresponding read bit line RBL and data line IO. The read column selection gates RCG2, RCG4, . . . corresponding to the read bit lines RBL of the even columns are each electrically coupled between a corresponding read bit line /RBL and data line /IO.

The data I/O line pair DI/OP formed from the data lines IO and /IO transmits the data write current ±Iw in the data write operation, and transmits the sense current in the data read operation.

The data read circuit 50r and the data write circuit 50w for supplying the data write current ±Iw are connected to the data lines IO and /IO though the current switching circuit 53a. Since the structure and operation of the data write circuit 50w, data read circuit 50r and current switching circuit 53a have been described in FIG. 14, detailed description thereof will not be repeated.

In response to the read column selection line RCSL or write column selection line WCSL activated according to the decode result of the column address CA, i.e., the column selection result, corresponding two read column selection gates RCG or write column selection gates WCG are turned ON. As a result, the read bit lines RBL and /RBL of the selected read bit line pair or the write bit lines WBL and /WBL of the selected write bit line pair are electrically coupled to the data lines IO and /IO of the data I/O line pair DI/OP, respectively.

The read/write control circuit 60 includes equalizing transistors 62 provided corresponding to the respective write bit line pairs and turned ON/OFF in response to the control signal WE, and write bit line voltage control transistors 65 provided corresponding to the respective write bit lines WBL for electrically coupling a corresponding write bit line to the ground voltage Vss in the data read operation. Although not shown in FIG. 76, precharging transistors 64 that are turned ON/OFF in response to the bit line precharging signal BLPR are also provided corresponding to the respective read bit lines RBL, as in the case of FIGS. 72 to 74.

With such a structure, a selected read bit line pair supplies the sense current for the data read operation in the same manner as that of the bit line pair of the second embodiment in the data read operation. Similarly, a selected write word line pair supplies the data write current thorough a corresponding equalizing transistor 62 for the data write operation in the same manner as that of the bit line pair of the second embodiment in the data write operation.

Accordingly, in the memory cell arrangement of the eighth embodiment as well, the read and write operation margins can be ensured by the folded bit line structure. Moreover, like the second embodiment, the structure of the peripheral circuitry including the data write circuit 50w and read/write control circuit 60 is simplified, as well as the data write noise can be reduced.

Fifth Modification of Eighth Embodiment

In the fifth modification of the eighth embodiment, the write word line WWL is shared between adjacent memory cell rows, in addition to the folded bit line structure shown in the fourth modification of the eighth embodiment.

Figure 77:
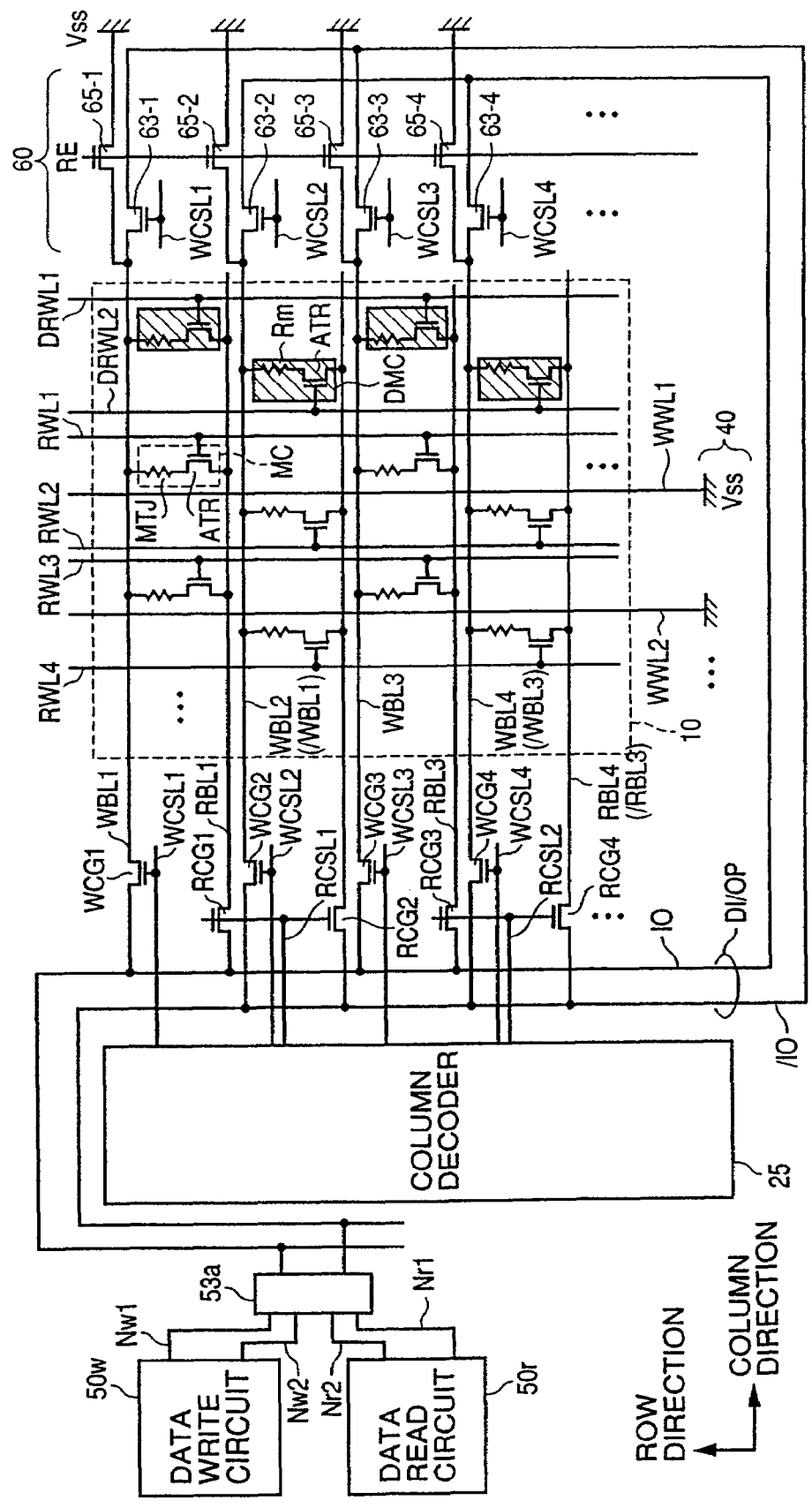
FIG. 77 is a block diagram showing the structure of a memory array and its peripheral circuitry according to a fifth modification of the eighth embodiment.

Referring to FIG. 77, in the memory array 10 according to the fifth modification of the eighth embodiment, adjacent memory cells in the column direction share the same write word line WWL.

In the read operation, the read word line RWL is activated. The memory cells are connected to every other read bit line RBL. Therefore, every set of adjacent two memory cell columns form a bit line pair, so that the data read operation based on the folded bit line structure can be conducted in the same manner as that of the fourth modification of the eighth embodiment.

On the other hand, in the data write operation, the write word line WWL shared by a plurality of memory cell rows is activated. Therefore, the data write operation based on the folded bit line structure is not possible. Accordingly, in the fifth modification of the eighth embodiment, activation of the column selection line in the data write operation is controlled on a column-by-column basis.

The read/write control circuit 60 includes write current control transistors 63 instead of the equalizing transistors 62. The write current control transistors 63 are provided corresponding to the respective memory cell columns. The write current control transistor 63 is turned ON in response to activation of a corresponding write column selection line. FIG. 77 exemplarily shows the write current control transistors 63-1 to 63-4 respectively corresponding to the first to fourth memory cell columns, i.e., the write bit lines WBL1 to WBL4. Although not shown in the figure, the precharging transistors 64 are provided corresponding to the respective read bit lines RBL, as in the case of FIGS. 72 to 74.

The write current control transistors 63-1, 63-3, . . . corresponding to the odd memory cell columns each electrically couples a corresponding write bit line WBL1, WBL3, . . . to the data line, /IO according to the column selection result. The write current control transistors 63-2, 63-4, . . . corresponding to the even memory cell columns each electrically couples a corresponding write bit line WBL2, WBL4, . . . to the data line 10 according to the column selection result.

Accordingly, in the selected memory cell column, the data write current ±Iw can be supplied to the path formed by the data line IO (/IO), write column selection gate WCG, write bit line WBL, write current control transistor 63, and data line /IO (IO). It is possible to control the direction of the data write current ±Iw by setting the respective voltages on the data lines IO and /IO in the same manner as that of the second embodiment. Accordingly, like the second embodiment, the structure of the peripheral circuitry associated with the data write operation, i.e., the data write circuit 50w and read/write control circuit 60, can be simplified.

Although the data write operation based on the folded bit line structure is not possible, the pitch of the write word lines WWL in the memory array 10 can be widened. As a result, like the first modification of the eighth embodiment, improved integration of the memory array 10 and thus reduced chip area of the MRAM device can be achieved. Improved reliability of the MRAM device can also be achieved by increasing the electromigration resistance of the write word lines WWL.

Sixth Modification of Eighth Embodiment

In the sixth modification of the eighth embodiment, the read word line RWL is shared between adjacent memory cells, in addition to the folded bit line structure of the fourth modification of the eighth embodiment.

Figure 78:
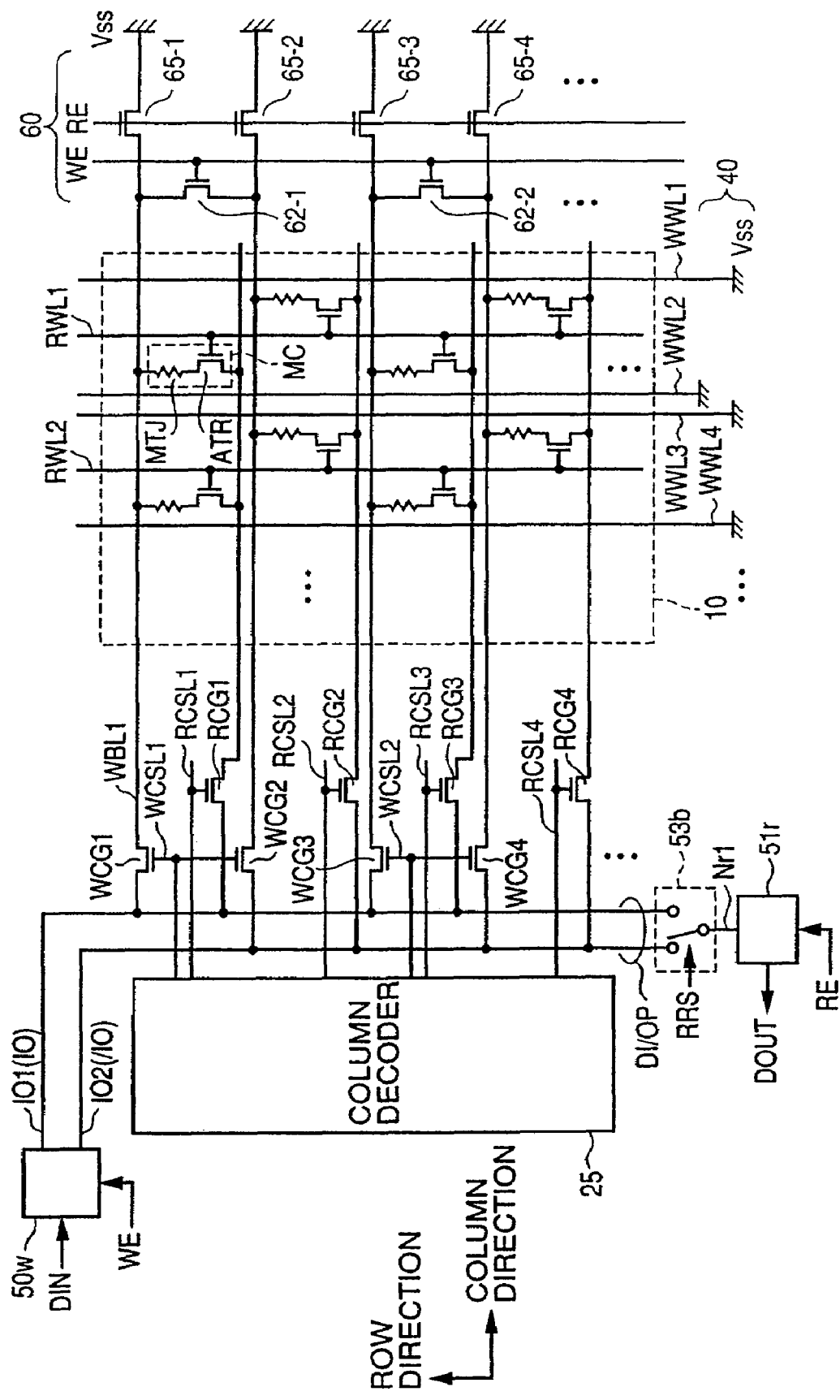
FIG. 78 is a block diagram showing the structure of a memory array and its peripheral circuitry according to a sixth modification of the eighth embodiment.

Referring to FIG. 78, in the memory array 10 according to the sixth modification of the eighth embodiment, adjacent memory cells in the column direction share the same read word line RWL.

The read/write control circuit 60 includes equalizing transistors 62 and write bit line voltage control transistors 65, which are provided in the same manner as that of the fourth modification of the eighth embodiment. Although not shown in the figure, the read/write control circuit 60 further includes precharging transistors 64 corresponding to the respective read bit lines RBL as in the case of FIGS. 72 to 74.

In the data write operation, the write word line WWL is activated. The memory cells are connected to every other write bit line WBL. Therefore, every set of adjacent two memory cell columns form a write bit line pair, so that the data write operation based on the folded bit line structure can be conducted in the same manner as that of the fourth modification of the eighth embodiment. Accordingly, the write operation margin can be ensured as in the second embodiment. Moreover, the structure of the peripheral circuitry associated with the data write operation, i.e., the data write circuit 50w and read/write control circuit 60, can be simplified as well as the magnetic noise produced in writing the data can be reduced.

On the other hand, in the data read operation, the read word line RWL shared by a plurality of memory cell rows is activated. In this case, the data read operation based on the folded bit line structure is not possible.

According to the sixth modification of the eighth embodiment, the current switching circuit 53b and data read circuit 51r are provided instead of the current switching circuit 53a and data read circuit 50r. Since the structure and operation of the current switching circuit 53b and data read circuit 51r have been described in FIGS. 16 and 17, detailed description thereof will not be repeated.

Such a structure cannot ensure the read operation margin by the folded bit line structure, but can reduce the pitch of the read word lines RWL in the memory array 10. Therefore, the data read operation can be conducted normally. As a result, improved integration of the memory array 10 and thus reduced chip area of the MRAM device can be achieved as in the case of the third modification of the second embodiment.

Accordingly, in the memory cell arrangement of the eighth embodiment as well, the data write operation based on the folded bit line structure ensures the operation margin, simplifies the structure of the peripheral circuitry and reduces the data write noise. At the same time, sharing the read word lines RWL achieves improved integration of the memory array 10.

Ninth Embodiment

Figure 79:
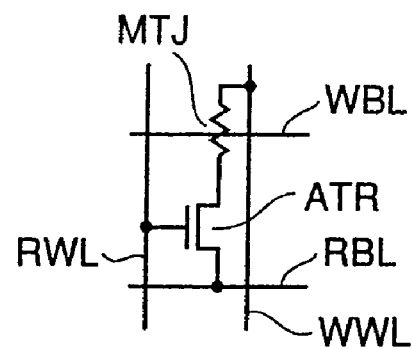
FIG. 79 is a circuit diagram showing the connection between a memory cell and signal wirings according to a ninth embodiment.

Referring to FIG. 79, in the memory cell according to the ninth embodiment, the access transistor ATR is electrically coupled between the read bit line RBL and magnetic tunnel junction MTJ. The magnetic tunnel junction MTJ is coupled between the access transistor ATR and write word line WWL. The access transistor ATR has its gate coupled to the read word line RWL.

As described in FIG. 70, the voltage level on the write word line WWL is set to the ground voltage Vss in the data read operation. This enables the write word line WWL to be coupled to the magnetic tunnel junction MTJ instead of the read bit line RBL. Thus, in the data read operation, the access transistor ATR is turned ON in response to activation of the read word line RWL, so that a current path of the sense current Is is formed by the read bit line RBL, access transistor ATR, magnetic tunnel junction MTJ and write word line WWL. Thus, a voltage change corresponding to the storage data in the magnetic tunnel junction MTJ can be produced on the read bit line RBL.

On the other hand, in the data write operation, the data write currents respectively flowing through the write word line WWL and write bit line WBL cause the magnetic fields orthogonal to each other to be generated at the magnetic tunnel junction MTJ.

Accordingly, it is possible to conduct the data write and read operations to and from the MTJ memory cell of the ninth embodiment by setting the voltage and current on the read word line RWL, write word line WWL, read bit line RBL and write bit line WBL in the same manner as that of FIG. 70.

Figure 80:
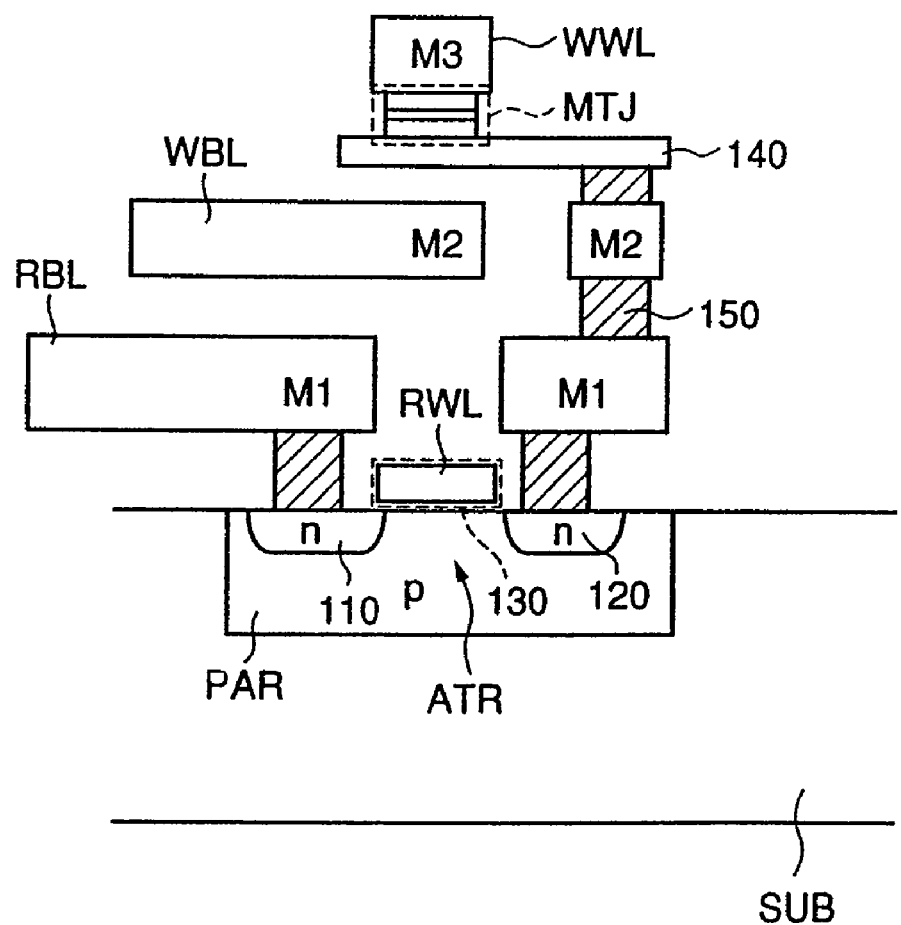
FIG. 80 is a structural diagram illustrating the arrangement of the MTJ memory cell according to the ninth embodiment.

Referring to FIG. 80, in the ninth embodiment, the write bit line WBL need not be coupled to another wiring and MTJ memory cell. Therefore, the write bit line WBL can be arbitrarily arranged so as to improve the magnetic coupling with the magnetic tunnel junction MTJ. For example, the write bit line WBL can be provided directly under the magnetic tunnel junction MTJ by using the second metal wiring layer M2.

The write word line WWL is provided in the third metal wiring layer M3 so as to be electrically coupled to the magnetic tunnel junction MTJ. Since the read word line RWL, access transistor ATR and read bit line RBL are provided in the same manner as that of FIG. 71, description thereof will not be repeated.

With such a structure, the read bit line RBL is coupled to the magnetic tunnel junction MTJ through the access transistor ATR. Therefore, the read bit line RBL is not directly connected to a multiplicity of magnetic tunnel junctions MTJ of the same memory cell column, whereby the capacitance of the read bit line RBL can be suppressed. As a result, a high-speed read operation can be achieved.

Moreover, the reduced distance between the magnetic tunnel junction MTJ and write word line WWL enables increased magnetic coupling in the data write operation. Therefore, the data write current Ip on the write word line WWL can be set to a smaller value. As a result, the magnetic noise due to the data write current is reduced as well as the current density on the write bit line is suppressed, whereby a more reliable operation can be achieved.

Accordingly, the aforementioned effects can be simultaneously obtained in both the data read and write operations by providing the read bit lines RBL and write bit lines WBL separately as in the case of the memory cell of the eighth embodiment.

Figure 81:
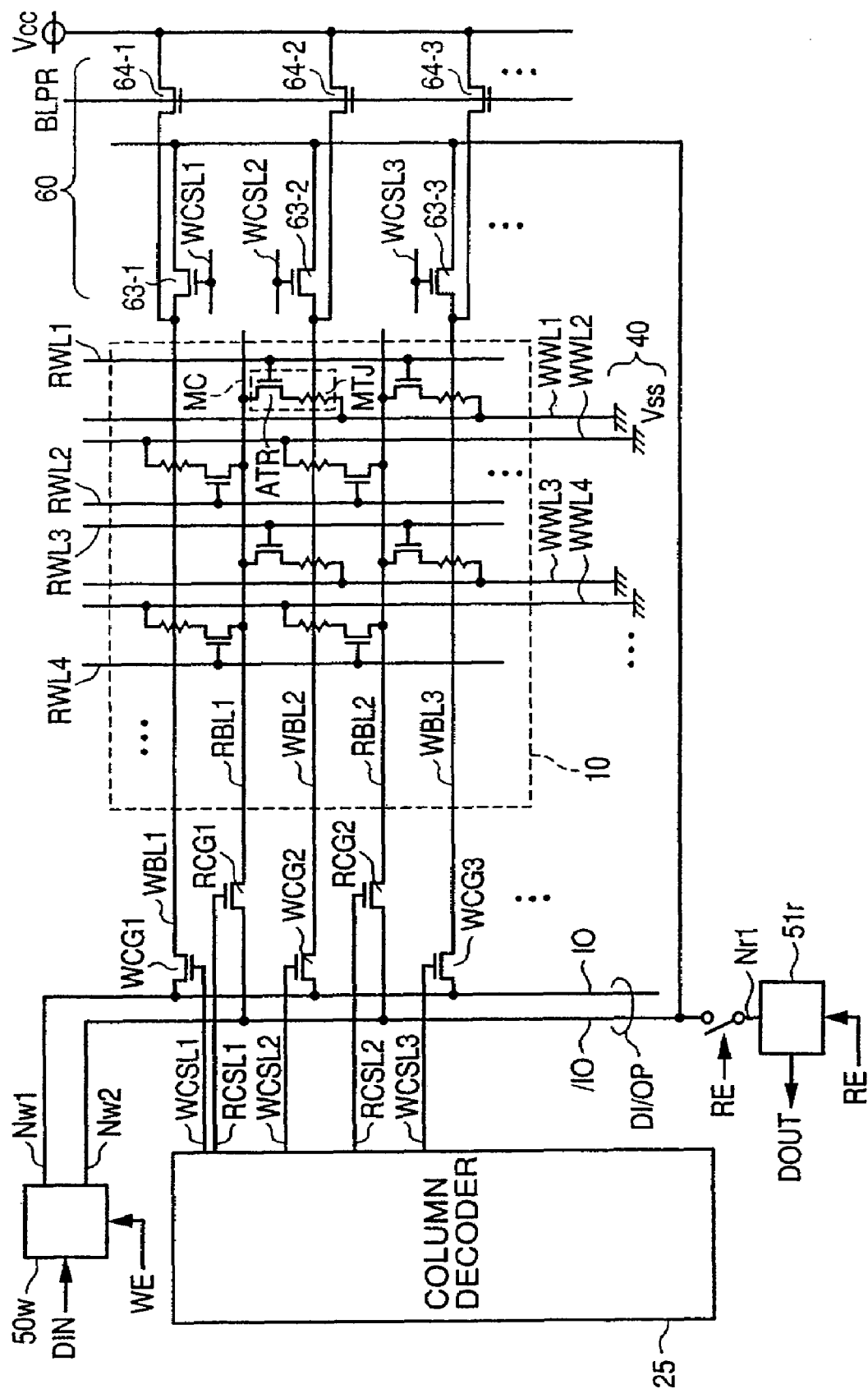
FIG. 81 is a block diagram showing the structure of a memory array according to the ninth embodiment.

Referring to FIG. 81, in the memory array 10 of the ninth embodiment, adjacent memory cells in the row direction share either the read bit line RBL or write bit line WBL, as in the case of FIG. 72.

For example, the memory cell group of the first and second memory cell columns shares a single read bit line RBL1, and the memory cell group of the second and third memory cell columns shares a single write bit line WBL2. In the following memory cell columns as well, the read bit lines RBL and write bit lines WBL are arranged alternately in the same manner.

Moreover, this memory cell structure eliminates the need to provide the write bit line voltage control transistors 65 in the read/write control circuit 60.

Since the respective arrangements and structures of the memory cell MC, read word line RWL, write word line WWL, word line current control circuit 40, and peripheral circuitry for supplying the data write current and sense current according to the column selection result are the same as those of the eighth embodiment, description thereof will not be repeated.

With such a structure, pitches of the read bit lines RBL and write bit lines WBL in the memory array 10 can be widened also in the memory cell arrangement of the ninth embodiment. As a result, the memory cells MC can be efficiently arranged, whereby improved integration of the memory array 10 as well as reduced chip area of the MRAM device can be achieved.

Moreover, in the memory cell structure of the ninth embodiment, the distance between the write bit line WBL and magnetic tunnel junction MTJ is larger than that between the write word line WWL and magnetic tunnel junction MTJ. This requires a larger data write current to be supplied to the write bit line WBL. Accordingly, increased electromigration resistance of the write bit lines WBL is effective for improved reliability of the MRAM device.

More specifically, in the memory cell arrangement of the ninth embodiment as well, increased electromigration resistance of the write bit line WBL can be achieved by making the line width (cross-sectional area) of the write bit line WBL larger than that of the write word line WWL having a shorter distance to the magnetic tunnel junction. As a result, the reliability of the MRAM device can be improved. Regarding a material as well, it is desirable to form the write bit line WBL from a highly electromigration-resistant material.

First Modification of Ninth Embodiment

Figure 82:
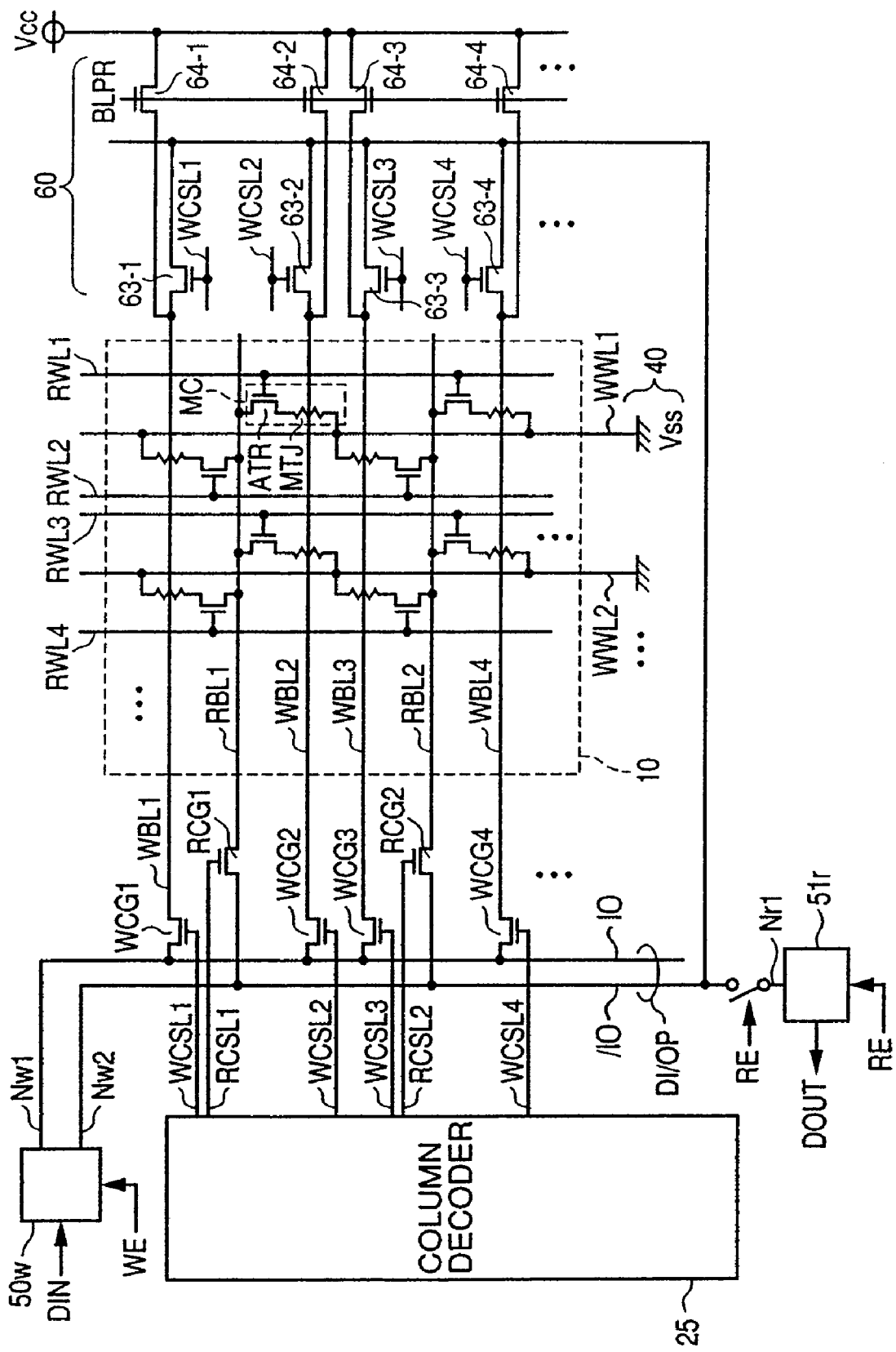
FIG. 82 is a block diagram showing the structure of a memory array according to a first modification of the ninth embodiment.

Referring to FIG. 82, in the memory array 10 according to the first modification of the ninth embodiment, adjacent memory cells in the column direction share the same write word line WWL as in the case of FIG. 73.

Since the structure of the other portions and the memory cell operation in reading and writing the data are the same as those of the ninth embodiment, detailed description thereof will not be repeated.

With such a structure, the pitch of the write word lines WWL in the memory array 10 can be widened also in the memory cell arrangement of the ninth embodiment. As a result, the memory cells MC can be efficiently arranged, whereby improved integration of the memory array 10 as well as reduced chip area of the MRAM device can be achieved.

Second Modification of Ninth Embodiment

Figure 83:
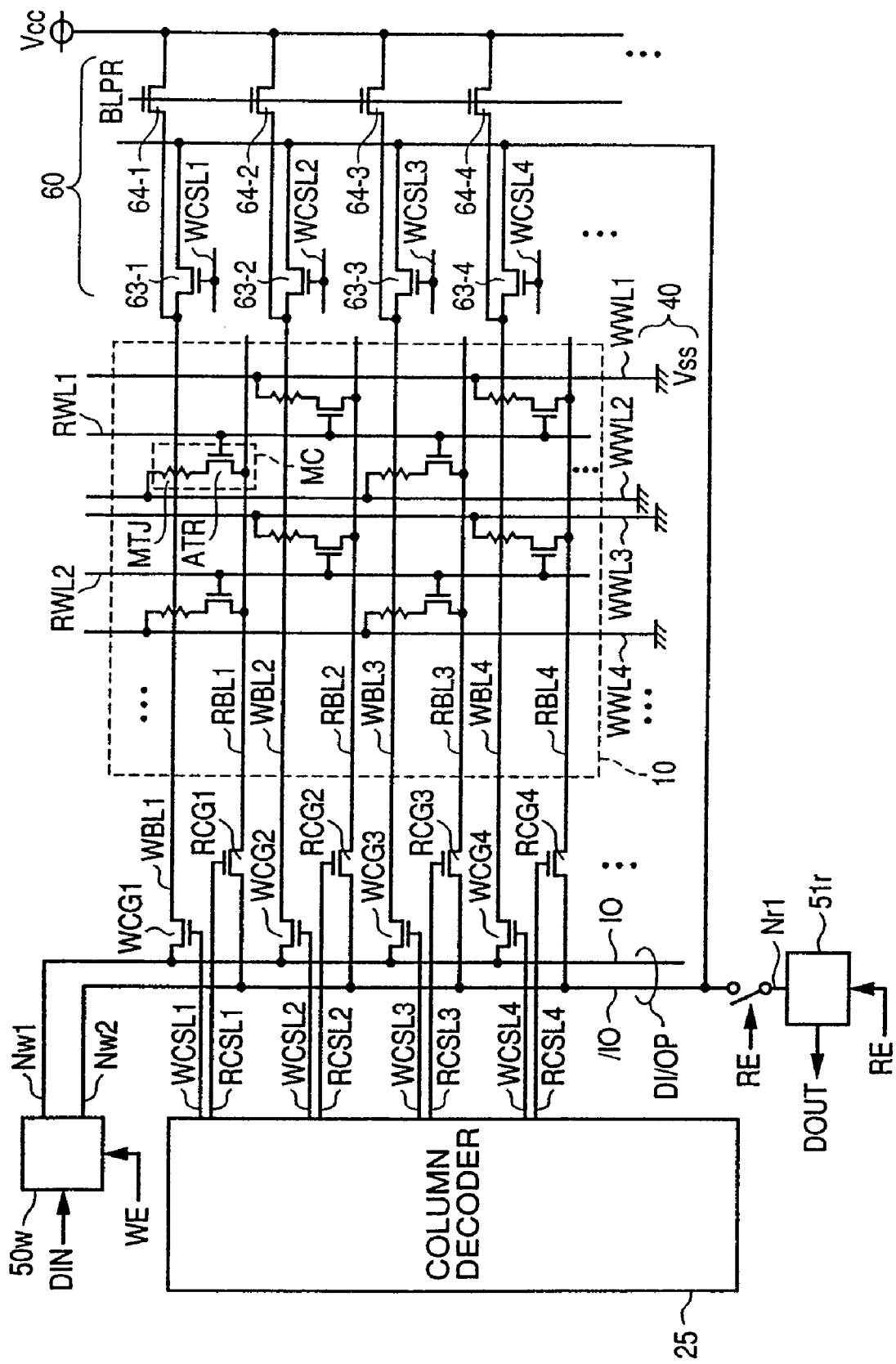
FIG. 83 is a block diagram showing the structure of a memory array according to a second modification of the ninth embodiment.

Referring to FIG. 83, in the memory array 10 according to the second modification of the ninth embodiment, adjacent memory cells in the column direction share the same read word line RWL as in the case of FIG. 74.

Since the structure of the other portions and the memory cell operation in reading and writing the data are the same as those of the ninth embodiment, detailed description thereof will not be repeated.

With such a structure, the widened pitch of the read word lines RWL in the memory array 10 can be reduced also in the memory cell arrangement of the ninth embodiment. As a result, the memory cells MC can be efficiently arranged, whereby improved integration of the memory array 10 as well as reduced chip area of the MRAM device can be achieved.

Third Modification of Ninth Embodiment

Figure 84:
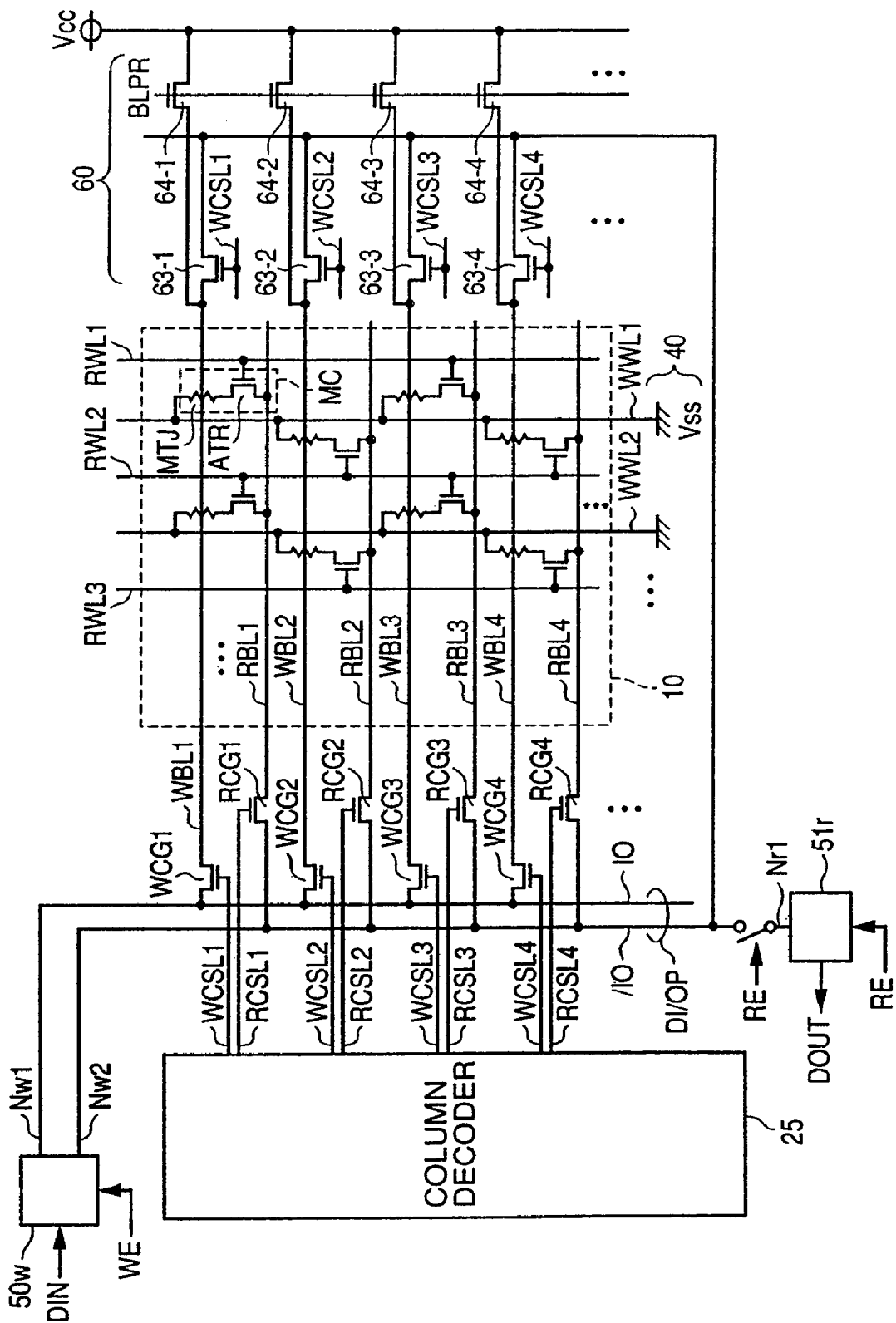
FIG. 84 is a block diagram showing the structure of a memory array according to a third modification of the ninth embodiment.

Referring to FIG. 84, in the memory array 10 according to the third modification of the ninth embodiment, adjacent memory cells in the column direction share the same write word line WWL as in the first modification of the ninth embodiment. The read word line RWL is also shared between adjacent memory cells in the column direction. For example, the memory cell group of the second and third memory cell rows share the same read word line RWL2. In the following memory cell rows as well, the read word lines RWL and write word lines WWL are arranged similarly.

As in the case of FIG. 75, in the case where both the read word line RWL and write word line WWL are shared, it is not possible to share the read bit line RBL and write bit line WBL between adjacent memory cells in the row direction. Accordingly, the read bit lines RBL and write bit lines WBL are both provided corresponding to the respective memory cell columns.

Since the structure of the other portions and the memory cell operation in reading and writing the data are the same as those of the ninth embodiment, detailed description thereof will not be repeated.

With such a structure, the pitches of the write word lines WWL and read word lines RWL in the memory array 10 can be widened also in the memory cell arrangement of the ninth embodiment. As a result, the memory cells MC can be arranged with the limitations on wiring pitch in the row direction being intensively reduced. Thus, improved integration of the memory array 10 as well as reduced chip area of the MRAM device can be achieved.

Fourth Modification of Ninth Embodiment

Figure 85:
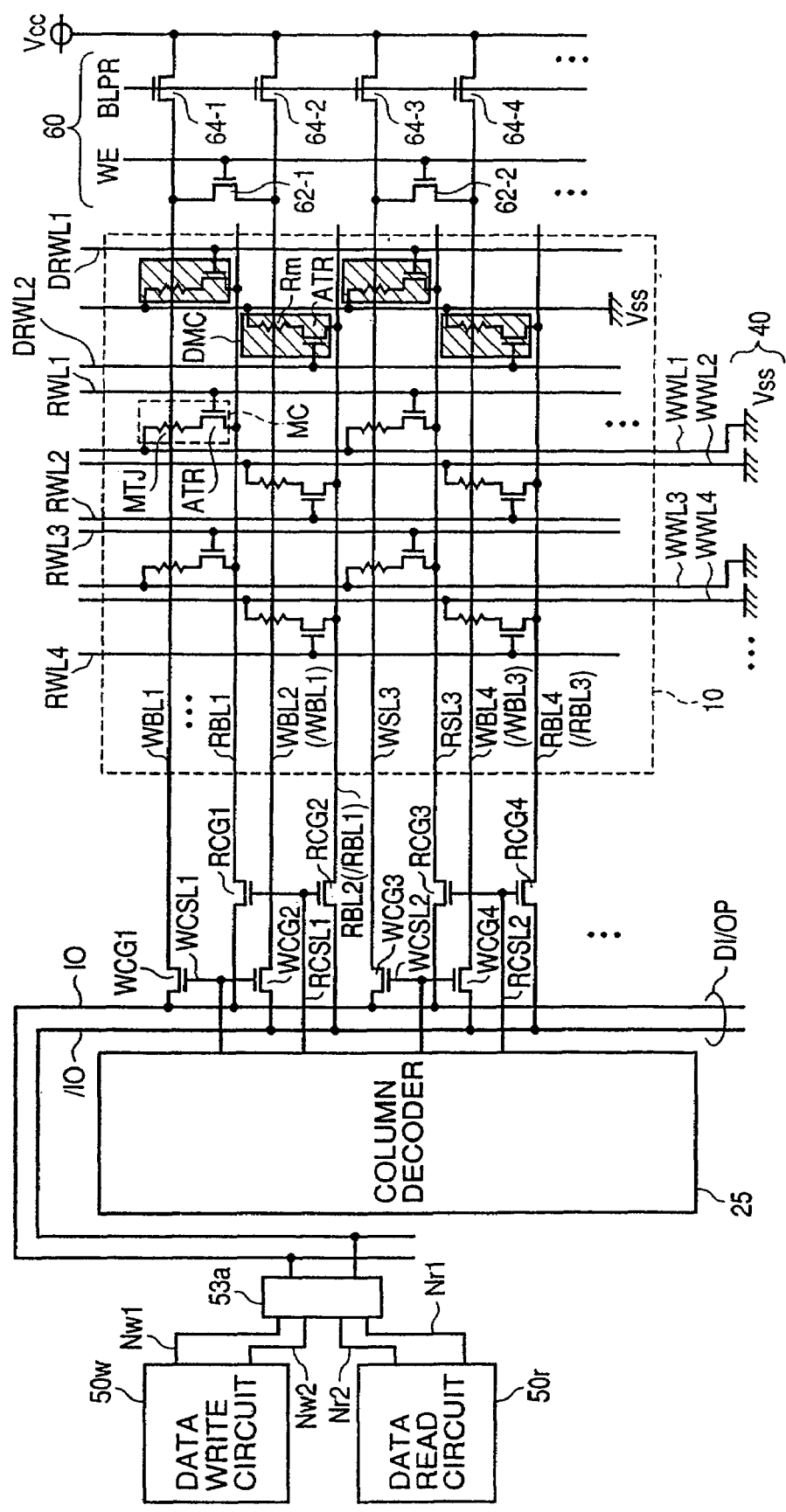
FIG. 85 is a block diagram showing the structure of a memory array and its peripheral circuitry according to a fourth modification of the ninth embodiment.

Referring to FIG. 85, in the memory cells of the seventh embodiment arranged in rows and columns, the folded bit line structure is applied using two read bit lines and two write bit lines of each set of adjacent two memory cell columns, as in the case of the fourth modification of the eighth embodiment.

The structure of FIG. 85 is different from that of the fourth modification of the eighth embodiment shown in FIG. 76 in that, in each memory cell MC, the write word line WWL is connected to the magnetic tunnel junction MTJ and the write bit line WBL is not connected to the magnetic tunnel junction MTJ. Moreover, this memory cell structure eliminates the need to provide the write bit line voltage control transistors 65 in the read/write control circuit 60.

Since the structure of the other portions and the operation in reading and writing the data are the same as those of FIG. 76, detailed description thereof will not be repeated.

Accordingly, in the memory cell arrangement of the fourth embodiment as well, the read and write operation margins can be ensured by the folded bit line structure. Moreover, like the second embodiment, the structure of the peripheral circuitry including data write circuit 50w and read/write control circuit 60 can be simplified as well as the data write noise can be reduced.

Fifth Modification of Ninth Embodiment

In the fifth modification of the ninth embodiment, the write word line WWL is shared between adjacent memory cell rows, in addition to the folded bit line structure of the fourth modification of the ninth embodiment.

Figure 86:
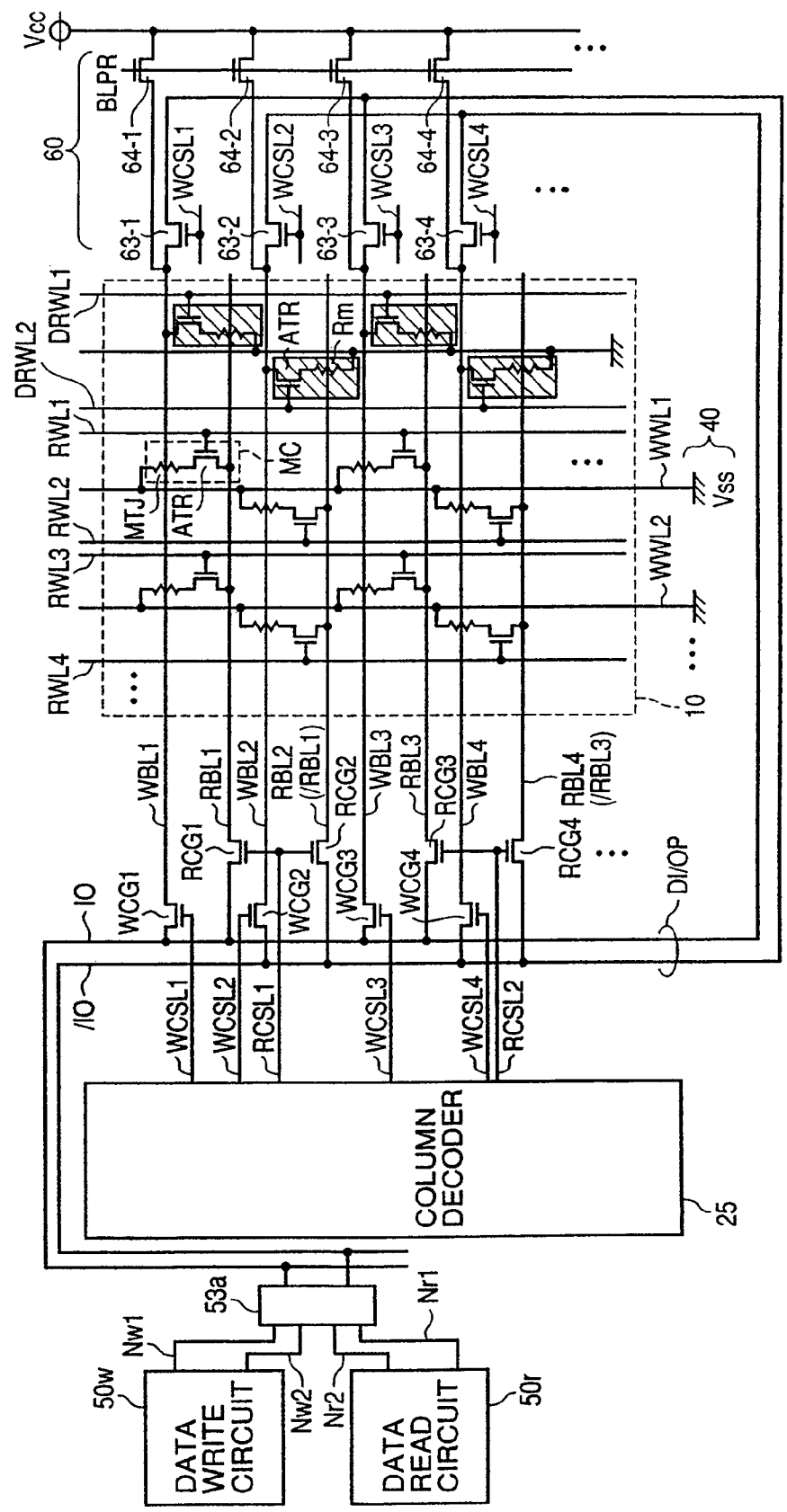
FIG. 86 is a block diagram showing the structure of a memory array and its peripheral circuitry according to a fifth modification of the ninth embodiment.

The structure of FIG. 86 is different from that of the fifth modification of the eighth embodiment shown in FIG. 77 in that, in each memory cell MC, the write word line WWL is connected to the magnetic tunnel junction MTJ and the write bit line WBL is not connected to the magnetic tunnel junction MTJ. Moreover, this memory cell structure eliminates the need to provide the write bit line voltage control transistors 65 in the read/write control circuit 60.

Since the structure of the other portions and the operation in reading and writing the data are the same as those of FIG. 77, detailed description thereof will not be repeated.

Accordingly, in the memory cell arrangement of the ninth embodiment as well, the data read operation based on the folded bit line structure ensures the operation margin. At the same time, sharing the write word lines achieves improved integration of the memory array 10.

Sixth Modification of Ninth Embodiment

In the sixth modification of the ninth embodiment, the read word line RWL is shared between adjacent memory cell rows, in addition to the folded bit line structure of the fourth modification of the ninth embodiment.

Figure 87:
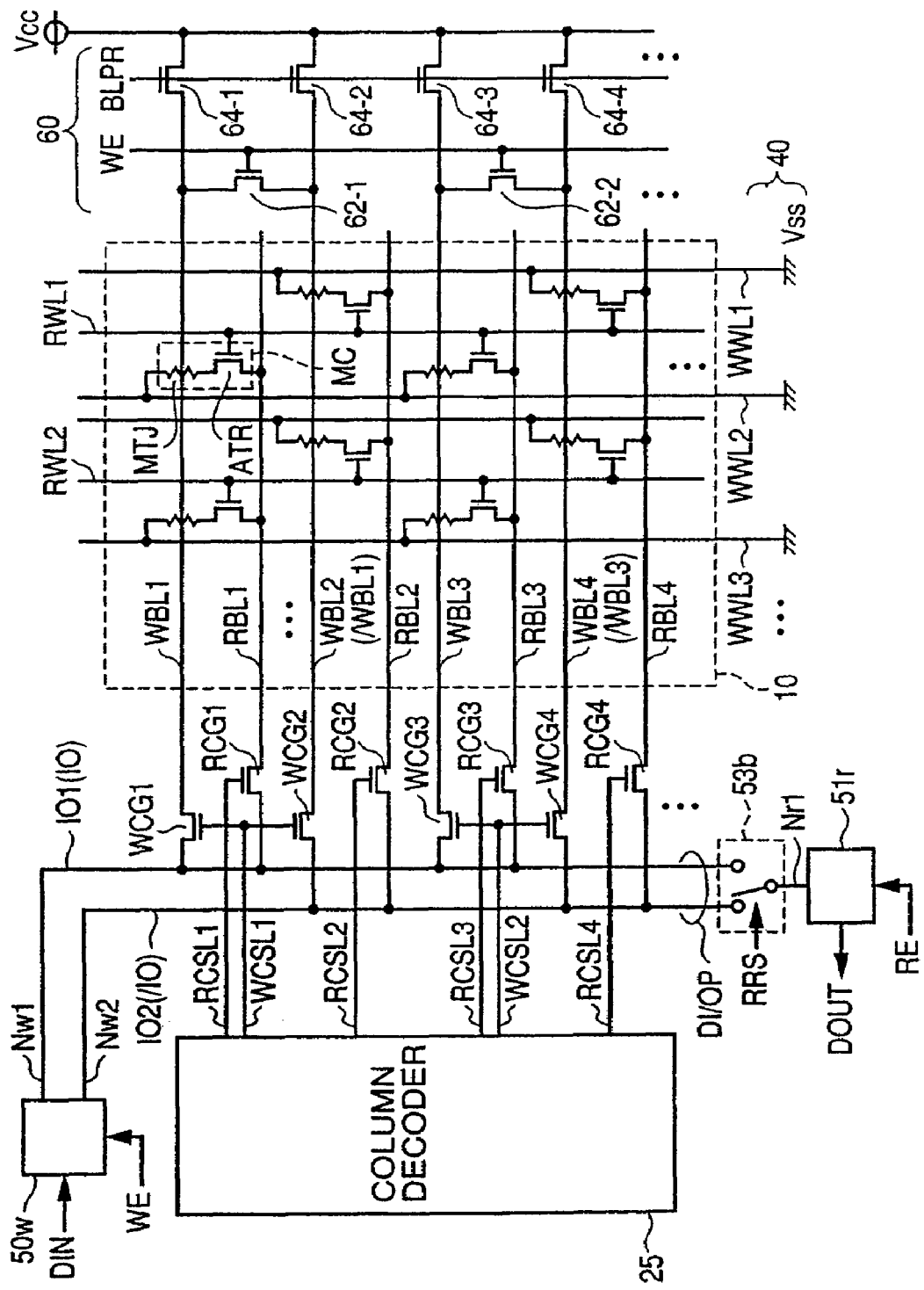
FIG. 87 is a block diagram showing the structure of a memory array and its peripheral circuitry according to a sixth modification of the ninth embodiment.
Figure 88:
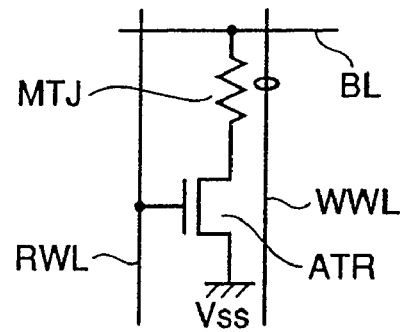
FIG. 88 is a schematic diagram showing the structure of a memory cell having a magnetic tunnel junction.
Figure 89:
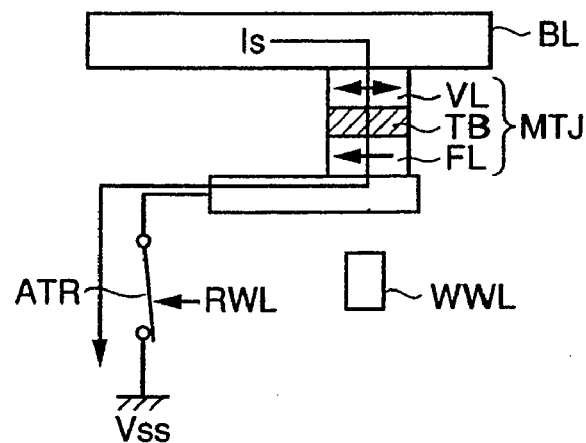
FIG. 89 is a conceptual diagram illustrating the data read operation from the MTJ memory cell.
Figure 90:
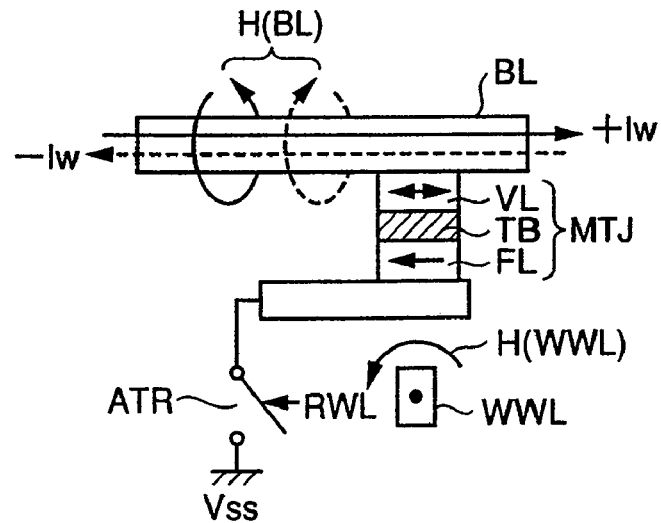
FIG. 90 is a conceptual diagram illustrating the data write operation to the MTJ memory cell.
Figure 91:
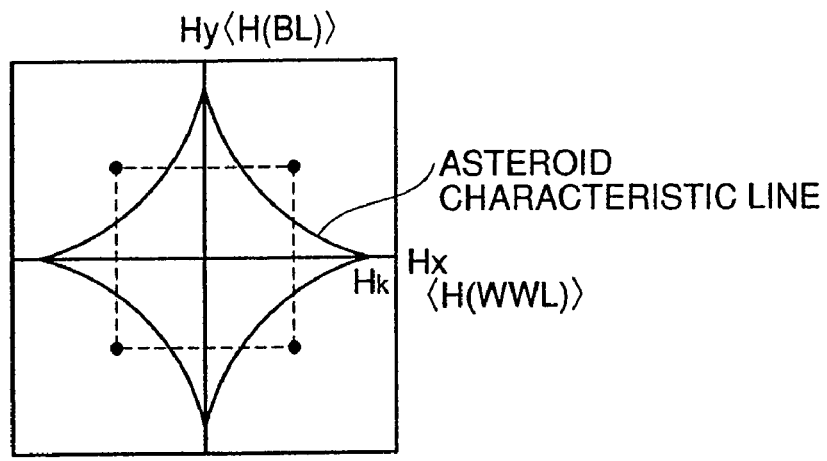
FIG. 91 is a conceptual diagram illustrating the relation between the direction of a data write current and the direction of a magnetic field in the data write operation.
Figure 92:
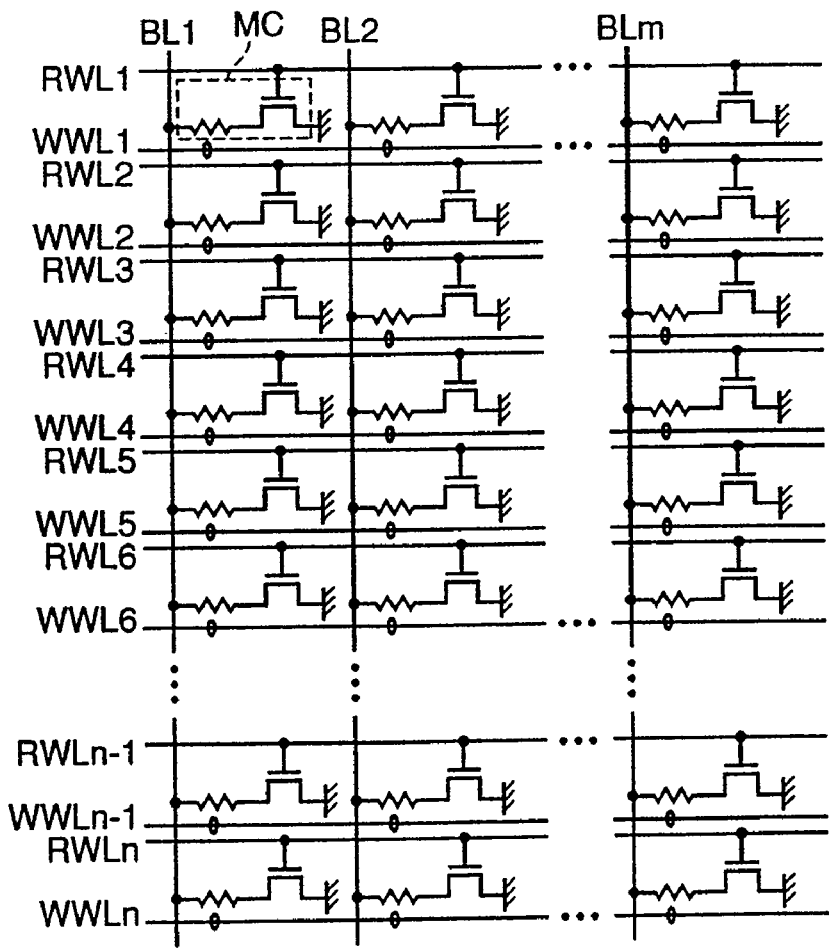
FIG. 92 is a conceptual diagram showing the MTJ memory cells arranged in rows and columns in an integrated manner.
Figure 93:
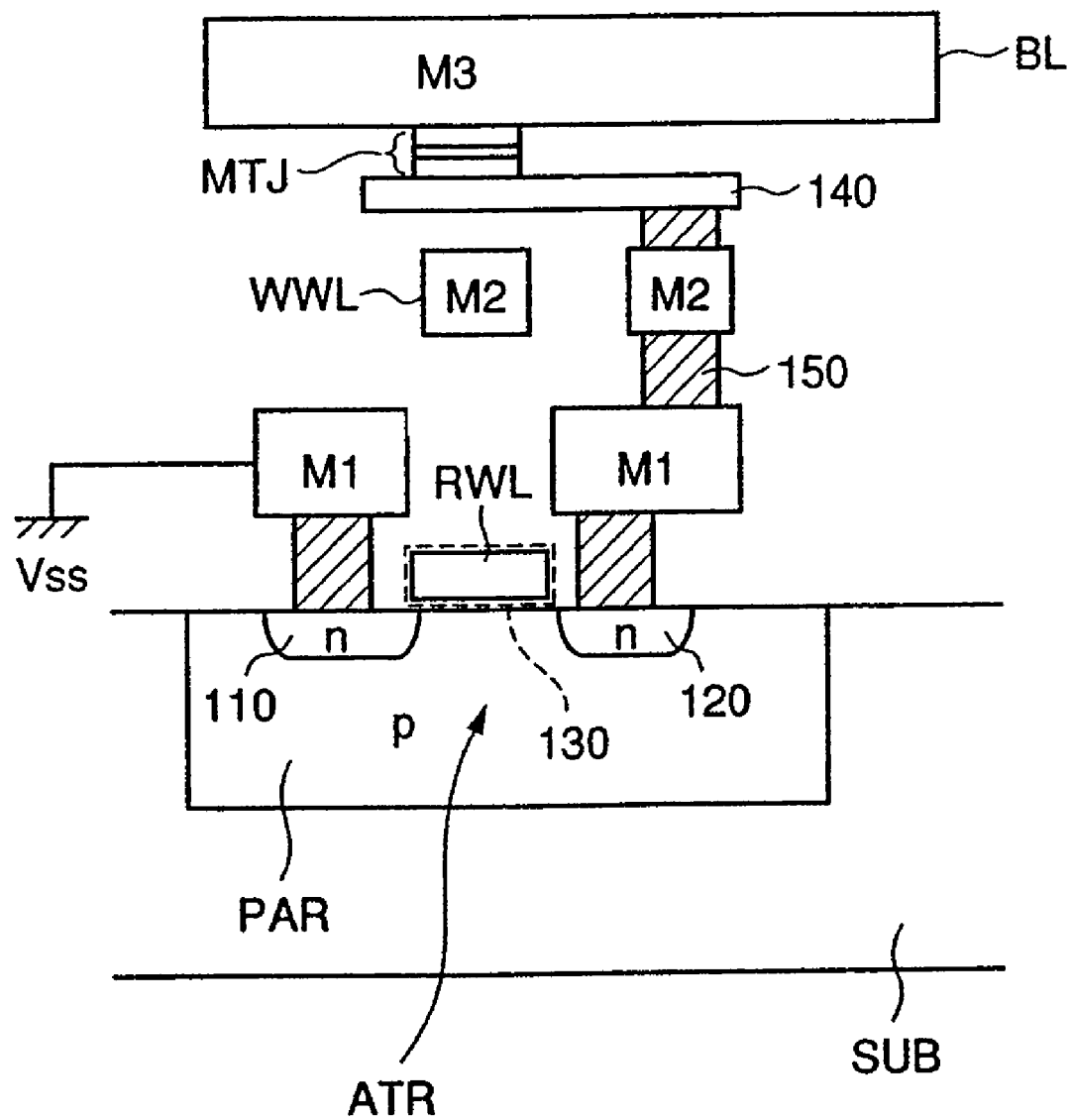
FIG. 93 is a structural diagram of an MTJ memory cell provided on a semiconductor substrate.

The structure of FIG. 87 is different from that of the sixth modification of the eighth embodiment shown in FIG. 78 in that, in each memory cell MC, the write word line WWL is connected to the magnetic tunnel junction MTJ and the write bit line WBL is not connected to the magnetic tunnel junction MTJ. Moreover, this memory cell structure eliminates the need to provide the write bit line voltage control transistors 65 in the read/write control circuit 60.

Since the structure of the other portions and the operation in reading and writing the data are the same as those of FIG. 78, detailed description thereof will not be repeated.

Accordingly, in the memory cell arrangement of the ninth embodiment as well, the data write operation based on the folded bit line structure ensures the operation margin, simplifies the structure of the peripheral circuitry and reduces the data write noise. At the same time, sharing the read word lines achieves improved integration of the memory array 10.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

first, second and third bit lines arranged adjacent each other;

a first memory cell connected between said first and said second bit lines, said first memory cell including a first magneto-resistive element having a resistance value that varies according to a level of storage data and a first selection gate transistor connected in series with said first magneto-resistive element, and for passing a data read current through said first magneto-resistive element in a data read operation;

a second memory cell connected between said second and said third bit lines, said second memory cell including a second magneto-resistive element having a resistance value that varies according to a level of storage data and a second selection gate transistor connected in series with said second magneto-resistive element, and for passing said data read current through said second magneto-resistive element in said data read operation;

a first control transistor connected between said first bit line and a reference potential for said data read operation;

a second control transistor connected between said second bit line and said reference potential;

a third control transistor connected between said third bit line and said reference potential;

a first word line connected to a gate of said first selection gate transistor; and a second word line connected to a gate of said second selection gate transistor; and a controller supplying said data read current to said first bit line and turning on said second control transistor in order to set said second bit line at said reference potential, when said first memory cell is selected in accordance with an address signal;

said controller supplying said data read current to said second bit line and turning on said third control transistor in order to set said third bit line at said reference potential, when said second memory cell is selected in accordance with said address signal.

* * * * *